US008672605B2

(12) United States Patent
van der Meulen et al.

(10) Patent No.: US 8,672,605 B2
(45) Date of Patent: Mar. 18, 2014

(54) SEMICONDUCTOR WAFER HANDLING AND TRANSPORT

(75) Inventors: Peter van der Meulen, Newburyport, MA (US); Christopher C Kiley, Carlisle, MA (US); Patrick D. Pannese, Lynnfield, MA (US); Raymond S. Ritter, Boxborough, MA (US); Thomas A. Schaefer, Groveland, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 308 days.

(21) Appl. No.: 12/025,477

(22) Filed: Feb. 4, 2008

(65) Prior Publication Data
US 2008/0187417 A1 Aug. 7, 2008

Related U.S. Application Data

(63) Continuation of application No. 11/679,829, filed on Feb. 27, 2007, now abandoned, which is a continuation-in-part of application No. 10/985,834, filed on Nov. 10, 2004, now Pat. No. 7,458,763.

(60) Provisional application No. 60/777,443, filed on Feb. 27, 2006, provisional application No. 60/779,684, filed on Mar. 5, 2006, provisional application No. 60/779,707, filed on Mar. 5, 2006, provisional application No. 60/779,478, filed on Mar. 5, 2006, provisional application No. 60/779,463, filed on Mar. 5, 2006, provisional application No. 60/779,609, filed on Mar. 5, 2006, provisional application No. 60/784,832, filed on Mar. 21, 2006, provisional application No. 60/746,163, filed on May 1, 2006, provisional application No. 60/807,189, filed on Jul. 12, 2006, provisional application No. 60/823,454, filed on Aug. 24, 2006, provisional application No. 60/518,823, filed on Nov. 10, 2003, provisional application No. 60/607,649, filed on Sep. 7, 2004.

(51) Int. Cl.
*H01L 21/677* (2006.01)

(52) U.S. Cl.
USPC .......................................... 414/805; 414/939

(58) Field of Classification Search
USPC ................................................ 414/805, 939
See application file for complete search history.

(56) References Cited

U.S. PATENT DOCUMENTS 3,294,670 A 12/1966 Charschan et al.
3,310,227 A 3/1967 Milleron
(Continued)

FOREIGN PATENT DOCUMENTS

EP 506045 3/1992
EP 597637 5/1994
(Continued)

OTHER PUBLICATIONS

Final Office Action of U.S. Appl. No. 12/025,516 mailed May 25, 2012.

(Continued)

*Primary Examiner* — James Keenan
(74) *Attorney, Agent, or Firm* — Perman & Green, LLP; Colin C. Durham

(57) ABSTRACT

Modular wafer transport and handling facilities are combined in a variety of ways deliver greater levels of flexibility, utility, efficiency, and functionality in a vacuum semiconductor processing system. Various processing and other modules may be interconnected with tunnel-and-cart transportation systems to extend the distance and versatility of the vacuum environment. Other improvements such as bypass thermal adjusters, buffering aligners, batch processing, multifunction modules, low particle vents, cluster processing cells, and the like are incorporated to expand functionality and improve processing efficiency.

2 Claims, 114 Drawing Sheets

(56) References Cited

U.S. PATENT DOCUMENTS

| | | | |
|---|---|---|---|
| 3,521,765 A * | 7/1970 | Kauffman et al. | 414/939 |
| 3,581,014 A | 5/1971 | Vogel et al. | |
| 3,584,847 A * | 6/1971 | Hammond et al. | 414/939 |
| 3,740,617 A | 6/1973 | Teramoto et al. | |
| 3,796,163 A | 3/1974 | Meyer et al. | |
| 3,834,555 A | 9/1974 | Bennington et al. | |
| 3,874,525 A | 4/1975 | Hassan et al. | |
| 3,925,182 A | 12/1975 | Carmichael et al. | |
| 3,932,843 A | 1/1976 | Trelut et al. | |
| 3,968,018 A | 7/1976 | Lane et al. | |
| 4,015,558 A | 4/1977 | Small et al. | |
| 4,184,448 A | 1/1980 | Aichert et al. | |
| 4,275,978 A | 6/1981 | Brooks et al. | |
| 4,299,533 A | 11/1981 | Ohnaka | |
| 4,392,776 A | 7/1983 | Shum | |
| 4,398,720 A | 8/1983 | Jones et al. | |
| 4,433,951 A | 2/1984 | Koch et al. | |
| 4,529,460 A | 7/1985 | Hasegawa et al. | |
| 4,584,045 A | 4/1986 | Richards | |
| 4,664,578 A * | 5/1987 | Kakehi | 414/217 |
| 4,666,366 A | 5/1987 | Davis | |
| 4,682,927 A | 7/1987 | Southworth et al. | |
| 4,701,069 A | 10/1987 | Whitney | |
| 4,702,668 A | 10/1987 | Carlisle et al. | |
| 4,712,971 A | 12/1987 | Fyler | |
| 4,722,298 A | 2/1988 | Rubin et al. | |
| 4,724,322 A | 2/1988 | Knowles et al. | |
| 4,730,976 A | 3/1988 | Davis et al. | |
| 4,749,465 A | 6/1988 | Flint et al. | |
| 4,763,276 A | 8/1988 | Perreirra et al. | |
| 4,775,281 A | 10/1988 | Prentakis | |
| 4,813,732 A | 3/1989 | Klem | |
| 4,817,556 A | 4/1989 | Mears et al. | |
| 4,819,167 A | 4/1989 | Cheng et al. | |
| 4,825,808 A | 5/1989 | Takahashi et al. | |
| 4,826,360 A * | 5/1989 | Iwasawa et al. | 414/939 |
| 4,831,270 A | 5/1989 | Weisenberger | |
| 4,836,233 A | 6/1989 | Milgate, III | |
| 4,875,825 A | 10/1989 | Tullis et al. | |
| 4,909,701 A | 3/1990 | Hardegen et al. | |
| 4,917,556 A | 4/1990 | Stark et al. | |
| 4,951,601 A | 8/1990 | Maydan et al. | |
| 5,013,210 A | 5/1991 | Bond | |
| 5,019,233 A | 5/1991 | Blake et al. | |
| 5,020,475 A | 6/1991 | Crabb et al. | |
| 5,036,006 A | 7/1991 | Sanford et al. | |
| 5,044,871 A | 9/1991 | Davis et al. | |
| 5,058,526 A | 10/1991 | Matsushita et al. | |
| 5,064,340 A | 11/1991 | Genov et al. | |
| 5,076,205 A | 12/1991 | Vowles et al. | |
| 5,135,349 A | 8/1992 | Lorenz et al. | |
| 5,180,275 A | 1/1993 | Czech et al. | |
| 5,183,547 A | 2/1993 | Ikeda | |
| 5,218,709 A | 6/1993 | Fijany et al. | |
| 5,227,708 A | 7/1993 | Lowrance | |
| 5,234,303 A | 8/1993 | Koyano | |
| 5,256,204 A | 10/1993 | Wu | |
| 5,259,881 A | 11/1993 | Edwards et al. | |
| 5,280,983 A | 1/1994 | Maydan et al. | |
| 5,286,296 A | 2/1994 | Sato et al. | |
| 5,308,431 A | 5/1994 | Maher et al. | |
| 5,314,541 A | 5/1994 | Saito et al. | |
| 5,314,986 A | 5/1994 | Ooms et al. | |
| 5,340,261 A | 8/1994 | Oosawa et al. | |
| 5,344,365 A | 9/1994 | Scott et al. | |
| 5,344,542 A | 9/1994 | Maher et al. | |
| 5,364,222 A | 11/1994 | Akimoto et al. | |
| 5,372,471 A | 12/1994 | Wu | |
| 5,377,425 A | 1/1995 | Kawakami et al. | |
| 5,382,806 A | 1/1995 | Bacchi et al. | |
| 5,391,035 A | 2/1995 | Krueger | |
| 5,399,531 A | 3/1995 | Wu | |
| 5,405,230 A | 4/1995 | Ono et al. | |
| 5,417,537 A * | 5/1995 | Miller | 414/217 |
| 5,426,865 A | 6/1995 | Ikeda et al. | |
| 5,431,529 A | 7/1995 | Eastman et al. | |
| 5,433,020 A | 7/1995 | Leech, Jr. | |
| 5,435,683 A | 7/1995 | Oosawa et al. | |
| 5,439,547 A | 8/1995 | Kumagai | |
| 5,442,730 A | 8/1995 | Bigus | |
| 5,447,409 A | 9/1995 | Grunes et al. | |
| 5,447,431 A | 9/1995 | Muka | |
| 5,448,681 A | 9/1995 | Khan | |
| 5,452,078 A | 9/1995 | Cheng | |
| 5,474,410 A | 12/1995 | Ozawa et al. | |
| 5,483,138 A | 1/1996 | Shmookler et al. | |
| 5,486,080 A | 1/1996 | Sieradzki | |
| 5,511,005 A | 4/1996 | Abbe et al. | |
| 5,511,147 A | 4/1996 | Abdel-Malek | |
| 5,524,176 A | 6/1996 | Narita et al. | |
| 5,526,254 A | 6/1996 | Sato et al. | |
| 5,534,761 A | 7/1996 | Crippa | |
| 5,538,390 A | 7/1996 | Salzman | |
| 5,539,975 A | 7/1996 | Kukuljan et al. | |
| 5,558,482 A | 9/1996 | Hiroki et al. | |
| 5,562,800 A * | 10/1996 | Kawamura et al. | 414/806 |
| 5,563,798 A | 10/1996 | Berken et al. | |
| 5,571,325 A | 11/1996 | Ueyama et al. | |
| 5,577,879 A | 11/1996 | Eastman et al. | |
| 5,586,585 A | 12/1996 | Bonora et al. | |
| 5,606,646 A | 2/1997 | Khan et al. | |
| 5,609,689 A | 3/1997 | Kato et al. | |
| 5,636,960 A | 6/1997 | Hiroki et al. | |
| 5,636,980 A | 6/1997 | Young et al. | |
| 5,657,553 A | 8/1997 | Tarui et al. | |
| 5,668,056 A | 9/1997 | Wu et al. | |
| 5,668,452 A | 9/1997 | Villarreal et al. | |
| 5,691,897 A | 11/1997 | Brown et al. | |
| 5,695,564 A | 12/1997 | Imahashi | |
| 5,700,127 A | 12/1997 | Harada et al. | |
| 5,701,400 A | 12/1997 | Amado | |
| 5,720,590 A | 2/1998 | Hofmeister | |
| 5,740,062 A | 4/1998 | Berken et al. | |
| 5,751,003 A | 5/1998 | Rose et al. | |
| 5,765,982 A | 6/1998 | Martin et al. | |
| 5,765,983 A | 6/1998 | Caveney et al. | |
| 5,810,549 A | 9/1998 | Wytman | |
| 5,814,733 A | 9/1998 | Khoury | |
| 5,820,679 A | 10/1998 | Yokoyama et al. | |
| 5,882,165 A | 3/1999 | Maydan et al. | |
| 5,882,171 A | 3/1999 | Tinner et al. | |
| 5,882,413 A | 3/1999 | Beaulieu et al. | |
| 5,888,048 A | 3/1999 | Martin et al. | |
| 5,894,348 A | 4/1999 | Bacchi et al. | |
| 5,894,760 A | 4/1999 | Caveney | |
| 5,897,710 A | 4/1999 | Sato | |
| 5,899,658 A | 5/1999 | Hofmeister | |
| 5,900,105 A | 5/1999 | Toshima | |
| 5,917,601 A | 6/1999 | Shimazaki et al. | |
| 5,931,627 A | 8/1999 | Okada et al. | |
| 5,943,659 A | 8/1999 | Giles et al. | |
| 5,944,857 A | 8/1999 | Edwards et al. | |
| 5,957,651 A | 9/1999 | Takebayashi et al. | |
| 5,976,199 A * | 11/1999 | Wu et al. | 414/939 |
| 5,980,194 A | 11/1999 | Freerks et al. | |
| 5,980,195 A | 11/1999 | Miyashita | |
| 5,989,346 A | 11/1999 | Hiroki | |
| 5,997,589 A | 12/1999 | Tien | |
| 6,002,840 A | 12/1999 | Hofmeister | |
| 6,006,016 A | 12/1999 | Faigon et al. | |
| 6,017,820 A | 1/2000 | Ting et al. | |
| 6,042,623 A | 3/2000 | Edwards | |
| 6,045,315 A | 4/2000 | Azumano et al. | |
| 6,048,154 A | 4/2000 | Wytman | |
| 6,048,162 A | 4/2000 | Moslehi | |
| 6,053,686 A | 4/2000 | Kyogoku | |
| 6,053,687 A | 4/2000 | Kirkpatrick et al. | |
| 6,053,980 A | 4/2000 | Suda et al. | |
| 6,059,507 A | 5/2000 | Adams | |
| 6,062,798 A | 5/2000 | Muka | |
| 6,066,210 A | 5/2000 | Yonemitsu et al. | |
| 6,073,366 A | 6/2000 | Aswad | |
| 6,073,828 A | 6/2000 | Ma et al. | |
| 6,079,927 A | 6/2000 | Muka | |

(56) References Cited

U.S. PATENT DOCUMENTS

| | | | |
|---|---|---|---|
| 6,079,928 A | 6/2000 | Theriault et al. | |
| 6,082,950 A | 7/2000 | Altwood et al. | |
| 6,103,055 A | 8/2000 | Maher et al. | |
| 6,108,006 A | 8/2000 | Hoppe | |
| 6,119,532 A | 9/2000 | Park et al. | |
| 6,122,724 A | 9/2000 | Kawasaki et al. | |
| 6,125,551 A | 10/2000 | Bushong et al. | |
| 6,126,380 A | 10/2000 | Hillman | |
| 6,126,381 A | 10/2000 | Bacchi | |
| 6,132,165 A | 10/2000 | Carducci | |
| 6,135,854 A | 10/2000 | Masumura et al. | |
| 6,142,722 A | 11/2000 | Genov et al. | |
| 6,146,077 A | 11/2000 | Shin et al. | |
| 6,149,367 A | 11/2000 | Begin | |
| 6,149,379 A | 11/2000 | Shin et al. | |
| 6,155,131 A | 12/2000 | Suwa et al. | |
| 6,155,768 A | 12/2000 | Bacchi et al. | |
| 6,161,051 A | 12/2000 | Hafemann et al. | |
| 6,166,509 A | 12/2000 | Wyka | |
| 6,167,322 A | 12/2000 | Holbrooks | |
| 6,175,322 B1 | 1/2001 | Eastty et al. | |
| 6,190,037 B1 | 2/2001 | Das et al. | |
| 6,190,104 B1 | 2/2001 | Ikeda et al. | |
| 6,198,074 B1 | 3/2001 | Savas | |
| 6,203,268 B1 | 3/2001 | Miyashita | |
| 6,224,312 B1 | 5/2001 | Sundar | |
| 6,235,634 B1 | 5/2001 | White et al. | |
| 6,238,161 B1 * | 5/2001 | Kirkpatrick et al. | 414/217 |
| 6,242,748 B1 | 6/2001 | Gallagher et al. | |
| 6,250,869 B1 | 6/2001 | Kroeker | |
| 6,253,464 B1 | 7/2001 | Klebanoff et al. | |
| 6,257,045 B1 | 7/2001 | Hosokawa et al. | |
| 6,257,827 B1 | 7/2001 | Hendrickson | |
| 6,260,144 B1 | 7/2001 | Pitchenik et al. | |
| 6,264,748 B1 | 7/2001 | Kuriki et al. | |
| 6,267,546 B1 | 7/2001 | Oxyer et al. | |
| 6,269,351 B1 | 7/2001 | Black | |
| 6,270,306 B1 | 8/2001 | Otwell et al. | |
| 6,277,199 B1 | 8/2001 | Lei et al. | |
| 6,281,651 B1 | 8/2001 | Haanpaa et al. | |
| 6,282,459 B1 | 8/2001 | Ballantine et al. | |
| 6,283,355 B1 | 9/2001 | Ma et al. | |
| 6,286,230 B1 | 9/2001 | White et al. | |
| 6,293,291 B1 | 9/2001 | Sperlich et al. | |
| 6,293,749 B1 | 9/2001 | Raaijmakers et al. | |
| 6,296,735 B1 | 10/2001 | Marxer et al. | |
| 6,299,404 B1 | 10/2001 | Muka et al. | |
| 6,309,161 B1 | 10/2001 | Hofmeister | |
| 6,312,525 B1 | 11/2001 | Bright et al. | |
| 6,313,596 B1 | 11/2001 | Wyka et al. | |
| 6,315,512 B1 | 11/2001 | Tabrizi et al. | |
| 6,318,951 B1 | 11/2001 | Schmidt et al. | |
| 6,338,626 B1 | 1/2002 | Saeki | |
| 6,339,730 B1 | 1/2002 | Matsushima | |
| 6,345,239 B1 | 2/2002 | Bowman-Amuah | |
| 6,366,830 B2 | 4/2002 | Bacchi et al. | |
| 6,374,144 B1 | 4/2002 | Viviani et al. | |
| 6,375,746 B1 | 4/2002 | Stevens et al. | |
| 6,382,895 B1 | 5/2002 | Konishi et al. | |
| 6,390,767 B1 | 5/2002 | Alper et al. | |
| 6,393,337 B1 | 5/2002 | Perlov et al. | |
| 6,396,232 B2 | 5/2002 | Haanpaa et al. | |
| 6,396,516 B1 | 5/2002 | Beatty | |
| 6,400,115 B1 | 6/2002 | Yamazoe | |
| 6,405,101 B1 | 6/2002 | Johanson et al. | |
| 6,425,722 B1 | 7/2002 | Ueda et al. | |
| 6,439,824 B1 | 8/2002 | Harris | |
| 6,440,178 B2 | 8/2002 | Berner et al. | |
| 6,440,261 B1 | 8/2002 | Tepman et al. | |
| 6,443,686 B1 * | 9/2002 | Wiesler et al. | 414/590 |
| 6,446,055 B1 | 9/2002 | Grand | |
| 6,450,750 B1 | 9/2002 | Heyder et al. | |
| 6,453,214 B1 | 9/2002 | Bacchi et al. | |
| 6,467,605 B1 | 10/2002 | Head | |
| 6,471,422 B1 | 10/2002 | Ueda et al. | |
| 6,481,956 B1 | 11/2002 | Hofmeister | |
| 6,485,250 B2 | 11/2002 | Hofmeister | |
| 6,486,444 B1 | 11/2002 | Fairbairn et al. | |
| 6,494,666 B2 | 12/2002 | Wu et al. | |
| 6,501,070 B1 | 12/2002 | Bacchi et al. | |
| 6,502,054 B1 | 12/2002 | Mooring et al. | |
| 6,503,365 B1 | 1/2003 | Kim et al. | |
| 6,506,009 B1 | 1/2003 | Nulman et al. | |
| 6,514,032 B1 | 2/2003 | Saino et al. | |
| 6,517,304 B1 | 2/2003 | Matsumoto | |
| 6,519,504 B1 | 2/2003 | Soraoka et al. | |
| 6,524,051 B2 | 2/2003 | Nering | |
| 6,530,365 B2 | 3/2003 | Vanmoor | |
| 6,530,732 B1 | 3/2003 | Theriault et al. | |
| 6,533,530 B1 | 3/2003 | Zenpo | |
| 6,540,869 B2 | 4/2003 | Saeki et al. | |
| 6,547,510 B1 | 4/2003 | Beaulieu | |
| 6,549,825 B2 | 4/2003 | Kurata | |
| 6,558,509 B2 | 5/2003 | Kraus et al. | |
| 6,575,177 B1 | 6/2003 | Brown et al. | |
| 6,575,689 B2 | 6/2003 | Harris | |
| 6,584,369 B2 | 6/2003 | Patel et al. | |
| 6,584,416 B2 | 6/2003 | Morford | |
| 6,585,828 B1 | 7/2003 | Kurita et al. | |
| 6,586,336 B2 | 7/2003 | Jeong | |
| 6,592,673 B2 | 7/2003 | Welch et al. | |
| 6,601,888 B2 | 8/2003 | McIlwraith et al. | |
| 6,609,876 B2 | 8/2003 | Mages et al. | |
| 6,618,645 B2 | 9/2003 | Bacchi et al. | |
| 6,621,509 B1 | 9/2003 | Eiref et al. | |
| 6,632,065 B1 | 10/2003 | Cameron et al. | |
| 6,637,998 B2 | 10/2003 | Langan et al. | |
| 6,640,151 B1 | 10/2003 | Somekh et al. | |
| 6,641,328 B2 | 11/2003 | Smith et al. | |
| 6,643,563 B2 | 11/2003 | Hosek et al. | |
| 6,663,333 B2 | 12/2003 | Kinnard et al. | |
| 6,669,434 B2 | 12/2003 | Namba et al. | |
| 6,678,572 B1 | 1/2004 | Oh | |
| 6,684,127 B2 | 1/2004 | Fujita et al. | |
| 6,705,816 B2 | 3/2004 | Nguyen et al. | |
| 6,719,516 B2 | 4/2004 | Kroeker | |
| 6,719,517 B2 | 4/2004 | Beaulieu et al. | |
| 6,723,172 B2 | 4/2004 | Mayes | |
| 6,729,824 B2 | 5/2004 | Lei et al. | |
| 6,735,482 B1 | 5/2004 | Erten et al. | |
| 6,736,582 B1 | 5/2004 | Mages et al. | |
| 6,742,977 B1 | 6/2004 | Okayama et al. | |
| 6,742,980 B2 | 6/2004 | Sasaki | |
| 6,744,228 B1 | 6/2004 | Cahill et al. | |
| 6,758,113 B2 | 7/2004 | Choy et al. | |
| 6,760,796 B1 | 7/2004 | Rossmann et al. | |
| 6,761,085 B1 | 7/2004 | Tan | |
| 6,765,222 B2 | 7/2004 | Bacchi et al. | |
| 6,767,170 B2 | 7/2004 | Kostler et al. | |
| 6,779,962 B2 | 8/2004 | Poole | |
| 6,784,418 B2 | 8/2004 | Bacchi et al. | |
| 6,796,400 B2 | 9/2004 | Ito et al. | |
| 6,802,934 B2 | 10/2004 | Saeki et al. | |
| 6,813,543 B2 | 11/2004 | Aalund et al. | |
| 6,815,661 B2 | 11/2004 | Bacchi et al. | |
| 6,822,413 B2 | 11/2004 | Simondet | |
| 6,827,788 B2 | 12/2004 | Takahashi | |
| 6,837,663 B2 | 1/2005 | Mages et al. | |
| 6,840,732 B2 | 1/2005 | Minami | |
| 6,841,006 B2 | 1/2005 | Barnes et al. | |
| 6,841,485 B1 | 1/2005 | Inoue et al. | |
| 6,852,194 B2 | 2/2005 | Matsushita et al. | |
| 6,853,920 B2 | 2/2005 | Hsiung et al. | |
| 6,856,858 B2 | 2/2005 | Kurita | |
| 6,863,485 B2 | 3/2005 | Mizokawa et al. | |
| 6,869,263 B2 | 3/2005 | Gilchrist | |
| 6,877,946 B2 | 4/2005 | Kinnard et al. | |
| 6,889,447 B2 | 5/2005 | Lee et al. | |
| 6,898,487 B2 | 5/2005 | Bacchi et al. | |
| 6,900,459 B2 | 5/2005 | Farnworth et al. | |
| 6,900,877 B2 | 5/2005 | Raaijmakers | |
| 6,918,731 B2 | 7/2005 | Talmer | |
| 6,932,558 B2 | 8/2005 | Wu | |
| 6,934,606 B1 | 8/2005 | Genetti et al. | |

(56) References Cited

U.S. PATENT DOCUMENTS

| | | |
|---|---|---|
| 6,941,199 B1 | 9/2005 | Bottomley et al. |
| 6,944,584 B1 | 9/2005 | Tenney et al. |
| 6,949,143 B1 | 9/2005 | Kurita et al. |
| 6,949,844 B2 | 9/2005 | Cahill et al. |
| 6,950,716 B2 | 9/2005 | Ward et al. |
| 6,960,057 B1 | 11/2005 | Hofmeister |
| 6,962,644 B2 | 11/2005 | Paterson et al. |
| 6,969,227 B2 | 11/2005 | Kinnard et al. |
| 6,979,165 B2 | 12/2005 | Larson et al. |
| 6,979,168 B2 | 12/2005 | Uchimaki et al. |
| 6,990,430 B2 | 1/2006 | Hosek |
| 6,996,456 B2 | 2/2006 | Cordell et al. |
| 7,025,554 B2 | 4/2006 | Ozawa et al. |
| 7,032,614 B2 | 4/2006 | Lappen et al. |
| 7,047,099 B2 | 5/2006 | Shanmugasundram et al. |
| 7,102,124 B2 | 9/2006 | Bacchi et al. |
| 7,198,448 B2 | 4/2007 | Ozawa et al. |
| 7,207,766 B2 | 4/2007 | Kurita et al. |
| 7,210,246 B2 | 5/2007 | Meulen |
| 7,230,441 B2 | 6/2007 | Carlson-Stevermer |
| 7,245,989 B2 | 7/2007 | Hosek et al. |
| 7,293,950 B2 | 11/2007 | Bonora et al. |
| 7,299,104 B2 | 11/2007 | Tezuka et al. |
| 7,331,751 B2 | 2/2008 | Tamura |
| 7,419,346 B2 | 9/2008 | Danna et al. |
| 7,422,406 B2 | 9/2008 | Meulen |
| 7,458,763 B2 | 12/2008 | van der Meulen |
| 7,467,916 B2 | 12/2008 | Yamagishi et al. |
| 7,575,406 B2 | 8/2009 | Hofmeister et al. |
| 7,622,006 B2 * | 11/2009 | Ishizawa et al. ............. 118/719 |
| 7,665,951 B2 | 2/2010 | Kurita et al. |
| 7,748,944 B2 | 7/2010 | Price et al. |
| 7,769,482 B2 | 8/2010 | Pannese et al. |
| 7,815,739 B2 | 10/2010 | Matsuura |
| 7,841,820 B2 * | 11/2010 | Bonora et al. ................ 414/939 |
| 7,874,781 B2 | 1/2011 | Nozawa et al. |
| 7,905,960 B2 * | 3/2011 | Choi et al. .................... 118/719 |
| 8,231,322 B2 * | 7/2012 | Talmer .......................... 414/217 |
| 8,398,355 B2 | 3/2013 | Holtkamp et al. |
| 2001/0002358 A1 * | 5/2001 | Hempel et al. ................. 451/66 |
| 2001/0020199 A1 | 9/2001 | Bacchi et al. |
| 2001/0038783 A1 | 11/2001 | Nakashima et al. |
| 2001/0041120 A1 | 11/2001 | Hofmeister |
| 2001/0048867 A1 | 12/2001 | Lebar et al. |
| 2001/0053324 A1 | 12/2001 | Saeki et al. |
| 2002/0002422 A1 | 1/2002 | Kondo |
| 2002/0005168 A1 | 1/2002 | Kraus et al. |
| 2002/0006323 A1 | 1/2002 | Yoshida et al. |
| 2002/0021959 A1 | 2/2002 | Schauer et al. |
| 2002/0043274 A1 | 4/2002 | Mayes |
| 2002/0048506 A1 | 4/2002 | Babbs et al. |
| 2002/0068992 A1 | 6/2002 | Hine et al. |
| 2002/0094265 A1 | 7/2002 | Momoki |
| 2002/0103571 A1 | 8/2002 | Yoo et al. |
| 2002/0111811 A1 | 8/2002 | Bares et al. |
| 2002/0138175 A1 | 9/2002 | Fujita et al. |
| 2002/0147534 A1 | 10/2002 | Delcheccolo et al. |
| 2002/0192056 A1 | 12/2002 | Reimer et al. |
| 2002/0192059 A1 | 12/2002 | Foster et al. |
| 2003/0012624 A1 | 1/2003 | Kinnard et al. |
| 2003/0035705 A1 | 2/2003 | Johnson |
| 2003/0053893 A1 | 3/2003 | Matsunaga et al. |
| 2003/0060922 A1 | 3/2003 | Schauer et al. |
| 2003/0063965 A1 | 4/2003 | Langan et al. |
| 2003/0077150 A1 | 4/2003 | Matsuda et al. |
| 2003/0082466 A1 | 5/2003 | del Puerto et al. |
| 2003/0083776 A1 | 5/2003 | Schauer et al. |
| 2003/0129045 A1 | 7/2003 | Bonora et al. |
| 2003/0130761 A1 | 7/2003 | Schauer |
| 2003/0131458 A1 | 7/2003 | Wang et al. |
| 2003/0167102 A1 | 9/2003 | Johnson et al. |
| 2003/0168173 A1 | 9/2003 | Tamura |
| 2003/0171972 A1 | 9/2003 | Heskin |
| 2003/0173512 A1 | 9/2003 | Bacchi et al. |
| 2003/0176940 A1 | 9/2003 | Rangachari et al. |
| 2004/0013497 A1 | 1/2004 | Shirai |
| 2004/0052632 A1 | 3/2004 | Kinnard et al. |
| 2004/0055537 A1 | 3/2004 | Kurita et al. |
| 2004/0062627 A1 | 4/2004 | Aggarwal et al. |
| 2004/0067127 A1 | 4/2004 | Hofmeister et al. |
| 2004/0069225 A1 | 4/2004 | Fairbairn et al. |
| 2004/0076505 A1 | 4/2004 | Kinnard et al. |
| 2004/0091343 A1 | 5/2004 | Astegno et al. |
| 2004/0151562 A1 | 8/2004 | Hofmeister et al. |
| 2004/0151574 A1 | 8/2004 | Lu |
| 2004/0175946 A1 | 9/2004 | Mayes |
| 2004/0179933 A1 | 9/2004 | Huang et al. |
| 2004/0221871 A1 | 11/2004 | Fletcher et al. |
| 2004/0240971 A1 | 12/2004 | Tezuka et al. |
| 2004/0261944 A1 | 12/2004 | Wakabayashi et al. |
| 2005/0095087 A1 | 5/2005 | Sullivan et al. |
| 2005/0105991 A1 * | 5/2005 | Hofmeister et al. .......... 414/217 |
| 2005/0111938 A1 | 5/2005 | van der Meulen |
| 2005/0113964 A1 | 5/2005 | van der Meulen |
| 2005/0118000 A1 * | 6/2005 | Kasai et al. .................... 414/217 |
| 2005/0118009 A1 | 6/2005 | van der Meulen |
| 2005/0120578 A1 | 6/2005 | van der Meulen |
| 2005/0194096 A1 | 9/2005 | Price et al. |
| 2005/0203664 A1 | 9/2005 | Schauer et al. |
| 2005/0223837 A1 | 10/2005 | Van Der Meulen |
| 2006/0016720 A1 | 1/2006 | Naito |
| 2006/0073430 A1 | 4/2006 | Chiles et al. |
| 2006/0099063 A1 | 5/2006 | Pietrantonio et al. |
| 2006/0177288 A1 | 8/2006 | Parker et al. |
| 2006/0241813 A1 | 10/2006 | Babu et al. |
| 2006/0246683 A1 | 11/2006 | Pan et al. |
| 2006/0250401 A1 | 11/2006 | Pannese et al. |
| 2006/0263177 A1 | 11/2006 | Meulen |
| 2006/0279573 A1 | 12/2006 | Pannese et al. |
| 2006/0279574 A1 | 12/2006 | Pannese et al. |
| 2006/0279575 A1 | 12/2006 | Pannese et al. |
| 2006/0279576 A1 | 12/2006 | Pannese et al. |
| 2007/0135932 A1 | 6/2007 | Pannese |
| 2007/0147979 A1 | 6/2007 | Rice et al. |
| 2007/0160447 A1 | 7/2007 | Amikura et al. |
| 2007/0264106 A1 | 11/2007 | van der Meulen |
| 2007/0282480 A1 | 12/2007 | Pannese et al. |
| 2007/0285673 A1 | 12/2007 | Kiley et al. |
| 2007/0286710 A1 | 12/2007 | van der Meulen et al. |
| 2008/0014055 A1 | 1/2008 | van der Meulen |
| 2008/0085173 A1 | 4/2008 | van der Meulen |
| 2008/0124193 A1 | 5/2008 | van der Meulen et al. |
| 2008/0124194 A1 | 5/2008 | van der Meulen et al. |
| 2008/0124195 A1 | 5/2008 | van der Meulen et al. |
| 2008/0124196 A1 | 5/2008 | van der Meulen et al. |
| 2008/0124197 A1 | 5/2008 | van der Meulen et al. |
| 2008/0131237 A1 | 6/2008 | van der Meulen |
| 2008/0131238 A1 | 6/2008 | van der Meulen |
| 2008/0134075 A1 | 6/2008 | Pannese et al. |
| 2008/0134076 A1 | 6/2008 | Pannese et al. |
| 2008/0135788 A1 | 6/2008 | Fogel |
| 2008/0138175 A1 | 6/2008 | Mitchell et al. |
| 2008/0138178 A1 | 6/2008 | Ferrara et al. |
| 2008/0145192 A1 | 6/2008 | van der Meulen et al. |
| 2008/0145194 A1 | 6/2008 | Kiley et al. |
| 2008/0147333 A1 | 6/2008 | van der Meulen et al. |
| 2008/0147580 A1 | 6/2008 | Pannese |
| 2008/0155442 A1 | 6/2008 | Pannese et al. |
| 2008/0155443 A1 | 6/2008 | Pannese et al. |
| 2008/0155444 A1 | 6/2008 | Pannese et al. |
| 2008/0155445 A1 | 6/2008 | Pannese et al. |
| 2008/0155446 A1 | 6/2008 | Pannese et al. |
| 2008/0155447 A1 | 6/2008 | Pannese et al. |
| 2008/0155448 A1 | 6/2008 | Pannese et al. |
| 2008/0155449 A1 | 6/2008 | Pannese et al. |
| 2008/0155450 A1 | 6/2008 | Pannese et al. |
| 2008/0163094 A1 | 7/2008 | Pannese et al. |
| 2008/0163095 A1 | 7/2008 | Pannese et al. |
| 2008/0163096 A1 | 7/2008 | Pannese et al. |
| 2008/0167890 A1 | 7/2008 | Pannese et al. |
| 2008/0175694 A1 | 7/2008 | Park et al. |
| 2008/0187417 A1 | 8/2008 | van der Meulen et al. |
| 2008/0187418 A1 | 8/2008 | van der Meulen et al. |
| 2008/0208372 A1 | 8/2008 | Pannese |

(56) References Cited

U.S. PATENT DOCUMENTS

| | | |
|---|---|---|
| 2008/0219806 A1 | 9/2008 | van der Meulen |
| 2008/0219807 A1 | 9/2008 | van der Meulen |
| 2008/0219808 A1 | 9/2008 | van der Meulen |
| 2008/0219809 A1 | 9/2008 | van der Meulen |
| 2008/0219810 A1 | 9/2008 | van der Meulen |
| 2008/0219811 A1 | 9/2008 | van der Meulen |
| 2008/0219812 A1 | 9/2008 | van der Meulen |
| 2008/0226429 A1 | 9/2008 | van der Meulen |
| 2008/0231866 A1 | 9/2008 | Fogel |
| 2008/0232933 A1 | 9/2008 | Kiley |
| 2008/0232947 A1 | 9/2008 | van der Meulen |
| 2008/0232948 A1 | 9/2008 | van der Meulen |
| 2008/0255798 A1 | 10/2008 | Buzan |

FOREIGN PATENT DOCUMENTS

| | | | |
|---|---|---|---|
| JP | 06-338555 | | 12/1994 |
| JP | 7-172578 A | * | 7/1995 |
| JP | 07-099224 | | 11/1995 |
| JP | 2000-177842 | | 6/2000 |
| JP | 2002271672 | | 9/2002 |
| JP | 200593807 | | 4/2005 |
| WO | 2004114739 | | 12/2004 |
| WO | 2006121931 A2 | | 11/2006 |
| WO | 2007070812 A2 | | 6/2007 |
| WO | 2007101228 A2 | | 9/2007 |
| WO | 2007103870 A2 | | 9/2007 |
| WO | 2007103887 A2 | | 9/2007 |
| WO | 2007103896 A2 | | 9/2007 |
| WO | 2008030637 A2 | | 3/2008 |

OTHER PUBLICATIONS

Final Office Action of U.S. Appl. No. 12/025,541 mailed Jun. 2, 2011.
Office Action of U.S. Appl. No. 12/025,582 mailed Dec. 24, 2008.
PCT Notification of Transmittal of the International Search Report or the Declaration, PCT/US04/37672, International Searching Authority, (Dec. 19, 2005).
U.S. Appl. No. 11/876,910, Non-Final Office Action mailed Jul. 3, 2008.
U.S. Appl. No. 10/985,846, Non-Final Office Action mailed Apr. 30, 2008.
Walsh, et al., "An Automated System for Loading Atomoscan Process Tubes Using Intrabay Material Handling Technologies", IEEE, (1992).
Gardner, "Semiconductor factory automation: Designing for phased automation", IEEE, (1996), 207-213.
U.S. Appl. No. 11/876,904, Non-Final Office Action mailed Jul. 28, 2008.
International Search Report, PCTUS0437672, (Dec. 19, 2005).
International Search Report, EP0481897, (Apr. 4, 2011).
USPTO Office Action, U.S. Appl. No. 11/382,491, (Dec. 1, 2009).
USPTO Office Action, U.S. Appl. No. 11/382,491, (Jun. 10, 2010).
USPTO Office Action, U.S. Appl. No. 11/382,491, (Apr. 19, 2011).
USPTO Office Action, U.S. Appl. No. 11/846,290, (Dec. 16, 2009).
USPTO Office Action, U.S. Appl. No. 11/846,290, (Aug. 25, 2010).
USPTO Office Action, U.S. Appl. No. 10/985,834 (Jan. 31, 2007).
USPTO Office Action, U.S. Appl. No. 10/985,834 (Aug. 2, 2007).
USPTO Office Action, U.S. Appl. No. 10/985,839 (Aug. 6, 2007).
USPTO Office Action, U.S. Appl. No. 10/985,839 (Apr. 30, 2008).
USPTO Office Action, U.S. Appl. No. 12/206,382 (Apr. 5, 2010).
USPTO Office Action, U.S. Appl. No. 12/206,382 (Dec. 17, 2010).
Kumar, "A Neutral Net Complier System for Hierarchical Organization," ACM SIGPLAN Notices Vo. 36 (2), (Feb. 2001), pp. 26-36.
Harper et al. "Flexible Material Handling Automation in Wafer Fabrication," Solid State Technology, Veeco intergrated Automation, Inc., Dallas, Texas, (Jul. 1994), pp. 89-94.
Weiss, "The Automated Semiconductor Fabricator Circa 2020," Automation, PRI Automation, Inc., Billerica, MA.
ITRS 2001 Factory Integration Chapter Material Handling Backup Section, International Technology Roadmap for Semiconductors—ITRS Factory Integration TWG, (Oct. 20, 2005).
International Search Report, PCT/US2006/061960 (Jul. 11, 2008).
USPTO Office Action, U.S. Appl. No. 11/427,723 (Aug. 28, 2007).
USPTO Office Action, U.S. Appl. No. 11/123,966 (Aug. 23, 2007).
USPTO Office Action, U.S. Appl. No. 11/428,136 (Aug. 23, 2007).
International Search Report, PCT/US/06117543, (Sep. 25, 2007).
Microsoft Computer Dictionary, (2003), p. 360.
Baglivo et al., "An integrated Hardware/Software Platform for Both Simulation and Real-Time Autonomous Guided Vehicle Navigation," ECMS 2005, 19th European Conference on Modeling and Simulation, (Jun. 2005), pp. 1-6.
Gholkar et al., "Hardware-in-Loop Simulator for Mini Aerial Vehicle," Center for Aerospace Systems Design and Engineering, (2004), pp. 1-6.
Hong et al., "A PC-Based Open Robot Control System: PC-ORC," Science Direct, (Jun. 2001), pp. 1901-1906.
Samaka "Robot Task-Level Programming Language and Simulation," PWASET vol. 6, (Nov. 2005), pp. 99-103.
Morandin et al., "A Real-Time Hardware-in-the-Loop Simulator for Robotics applications," Multibody Dynamics 2005, ECCOMAS Thematic Conference (Jun. 2005), pp. 1-11.
USPTO Office Action, U.S. Appl. No. 11/123,966 (Jul. 10, 2008).
USPTO Office Action, U.S. Appl. No. 12/032,463 (Aug. 6, 2008).
USPTO Office Action, U.S. Appl. No. 12/032,405 (Aug. 18, 2008).
USPTO Office Action, U.S. Appl. No. 10/985,730 (Sep. 3, 2008).
USPTO Office Action, U.S. Appl. No. 10/985,844 (Sep. 9, 2008).
USPTO Office Action, U.S. Appl. No. 11/876,854 (Sep. 18, 2008).
USPTO Office Action, U.S. Appl. No. 11/876,865 (Sep. 18, 2008).
USPTO Office Action, U.S. Appl. No. 11/876,886 (Sep. 19, 2008).
USPTO Office Action, U.S. Appl. No. 11/876,887 (Sep. 19, 2008).

* cited by examiner

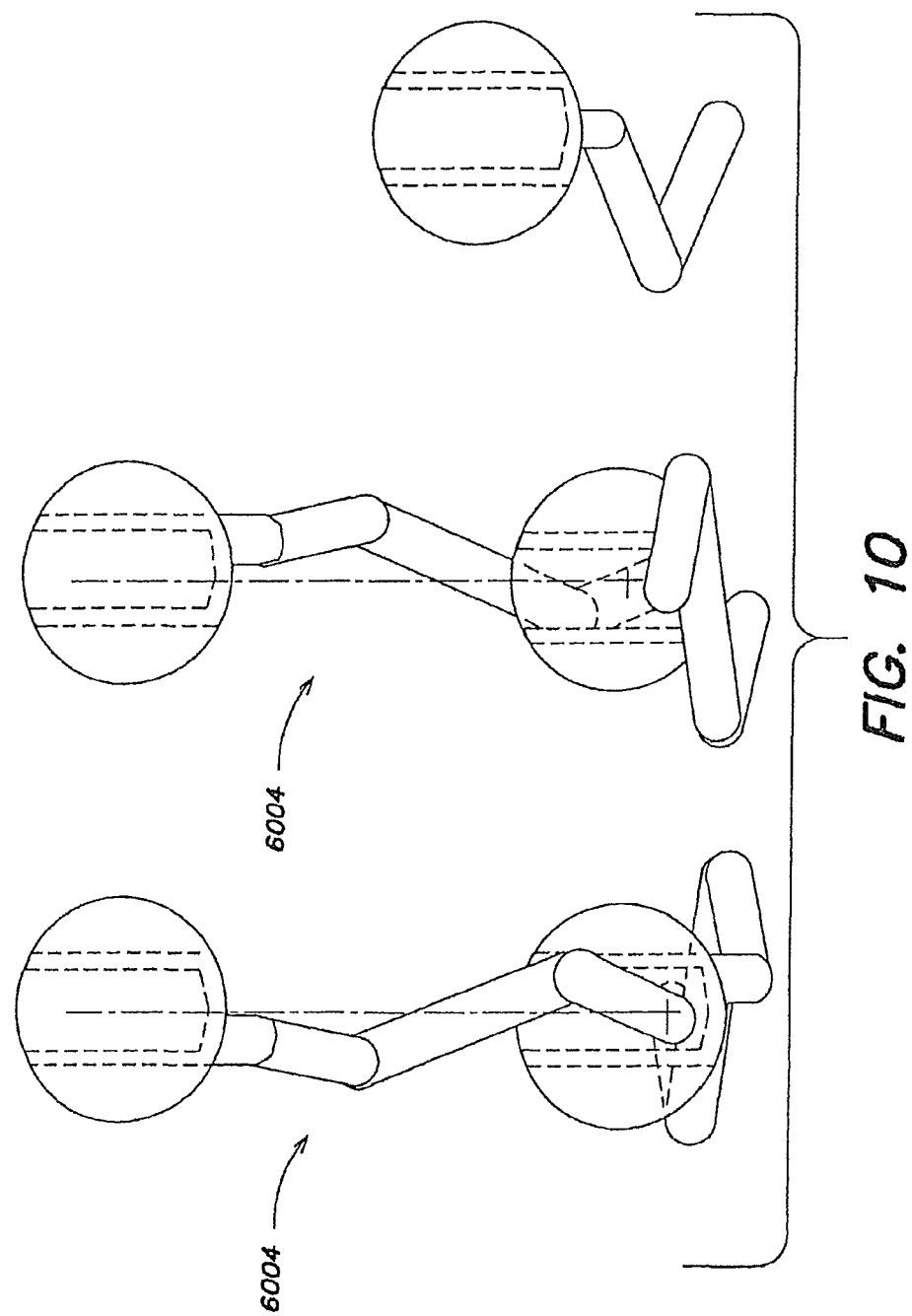

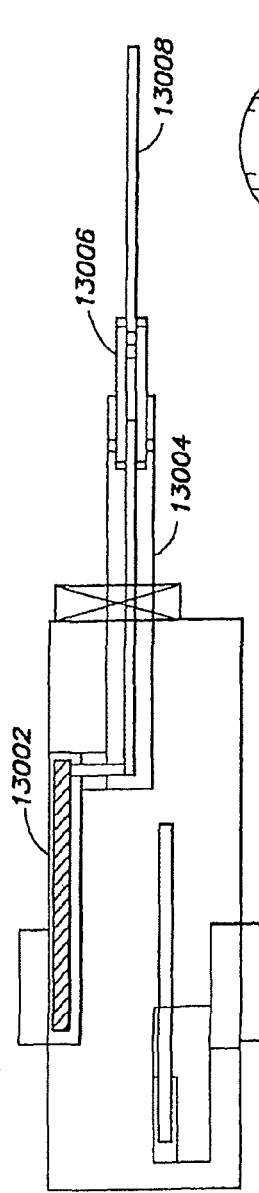
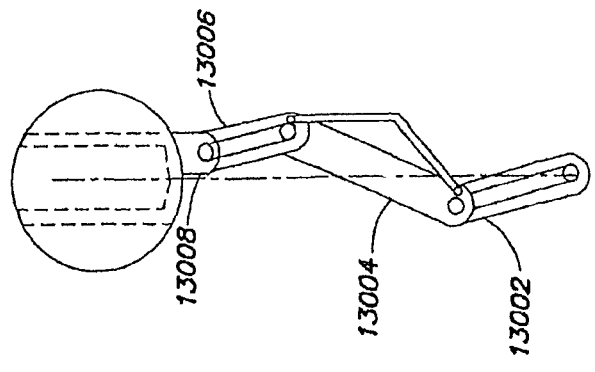
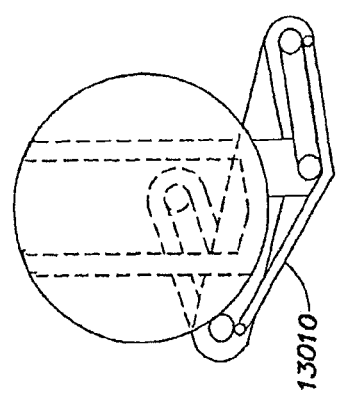
FIG. 13A
FIG. 13C
FIG. 13B

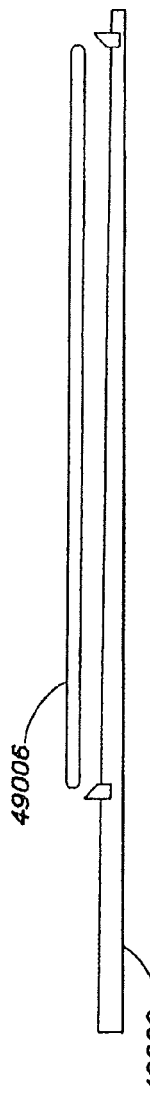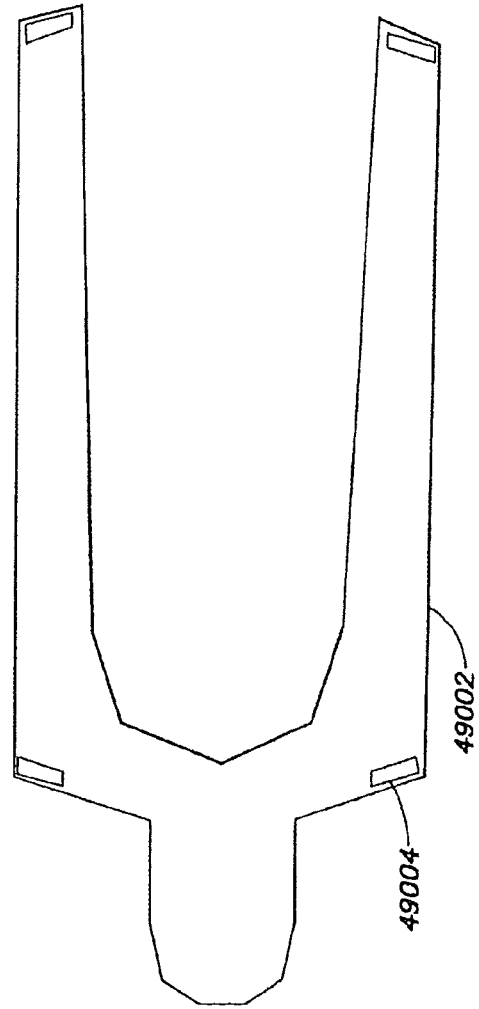
FIG. 49A
FIG. 49B

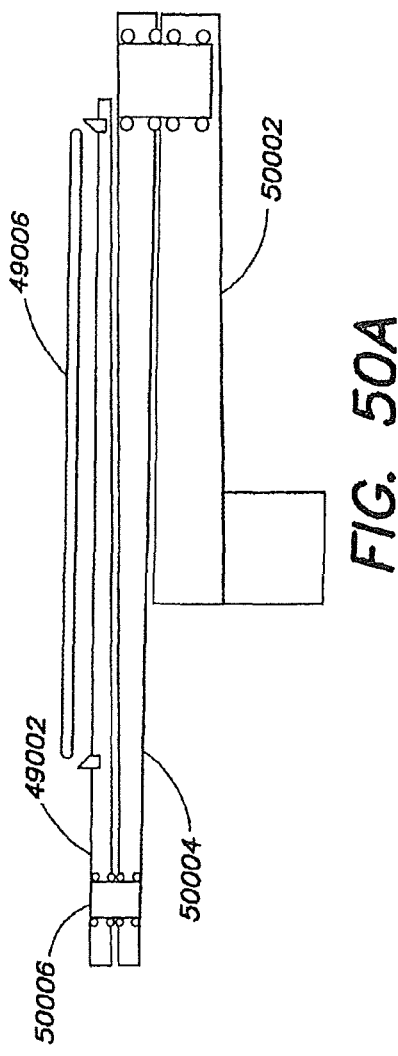
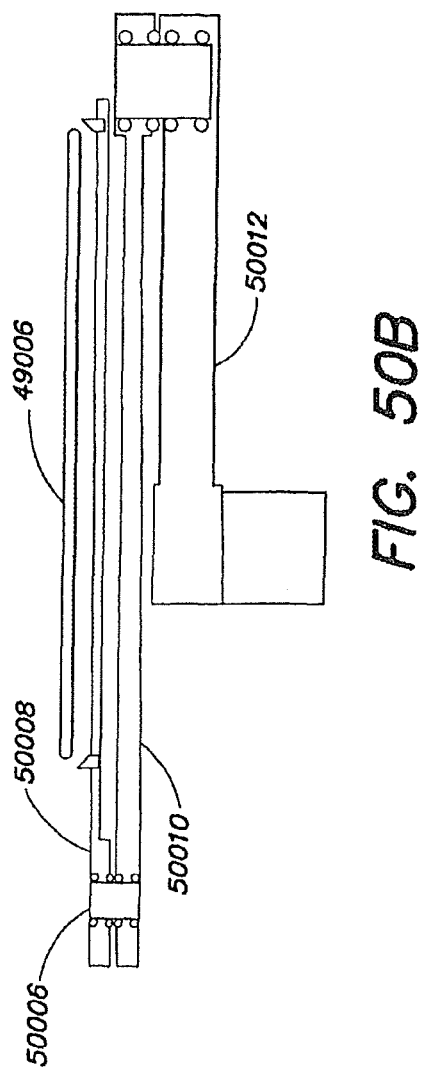

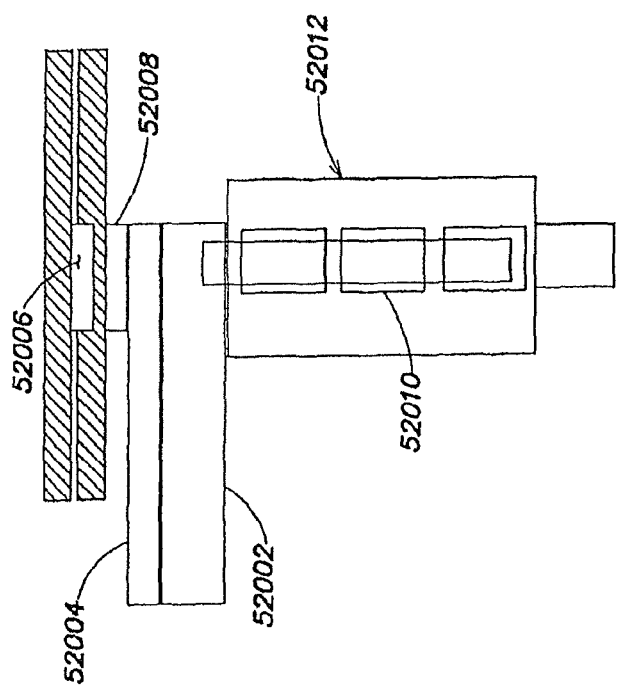
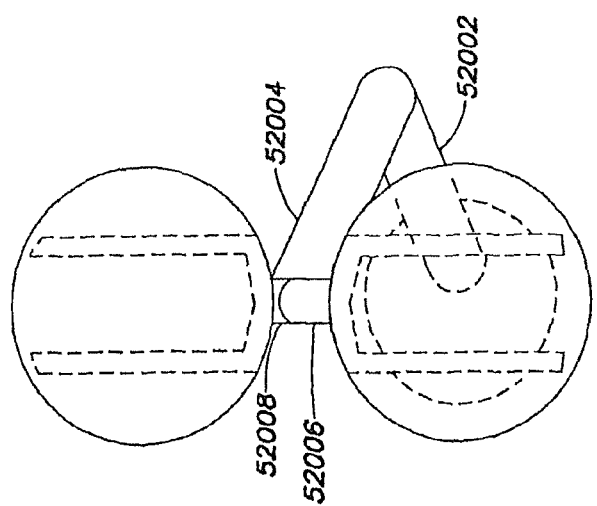
FIG. 52B
FIG. 52A

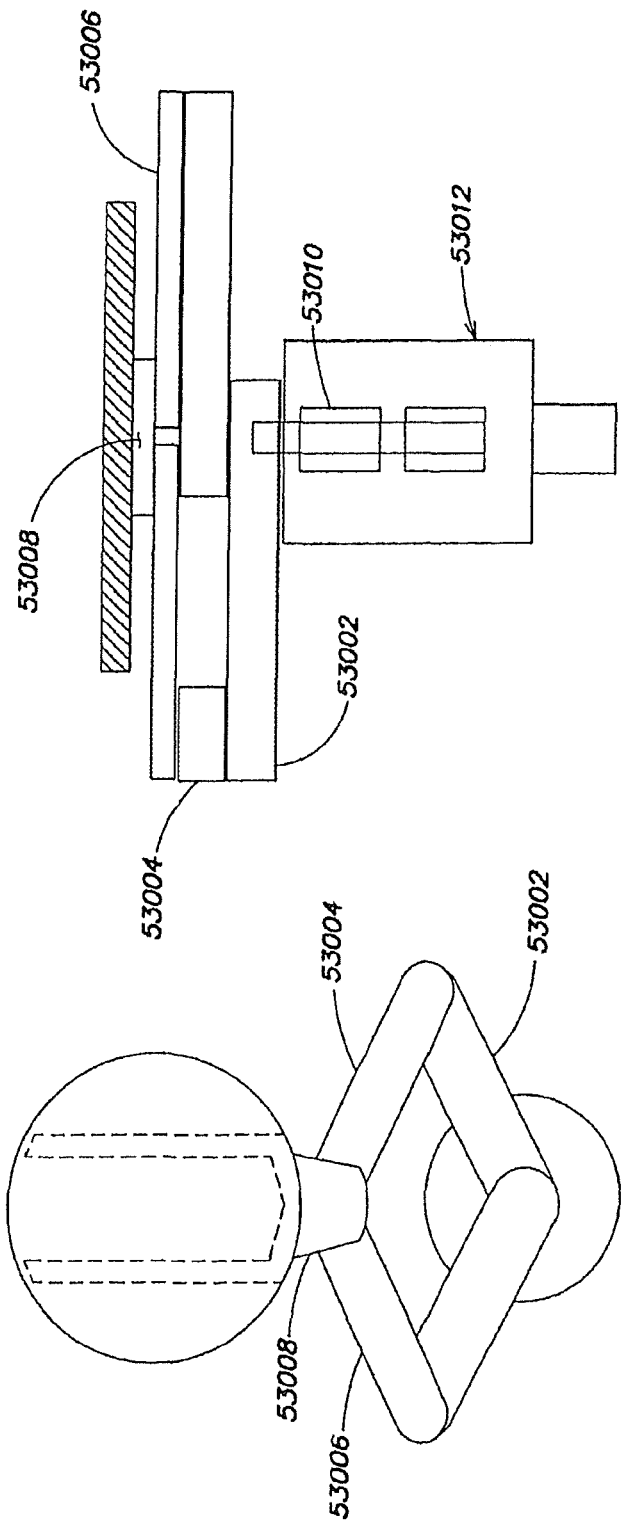

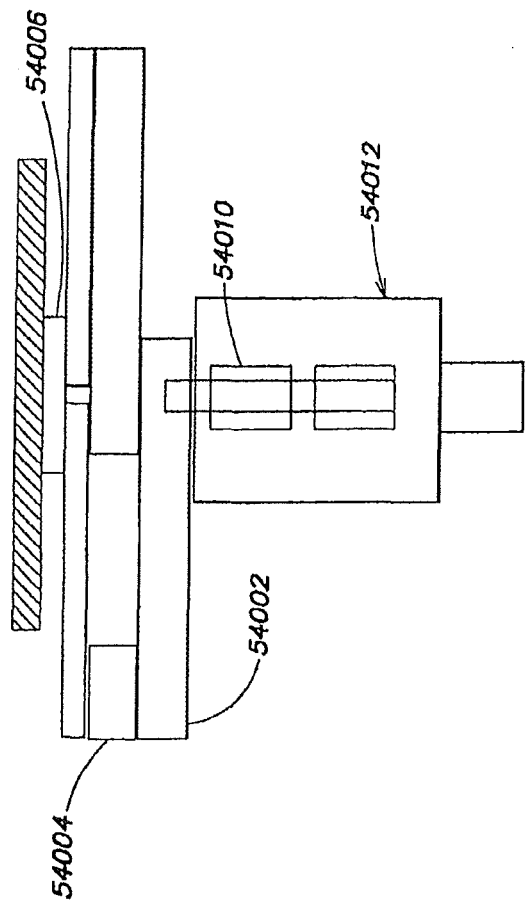
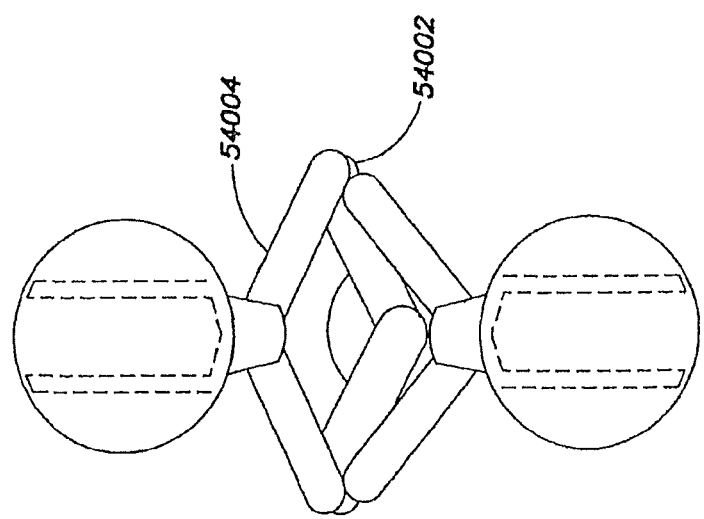
FIG. 54B
FIG. 54A

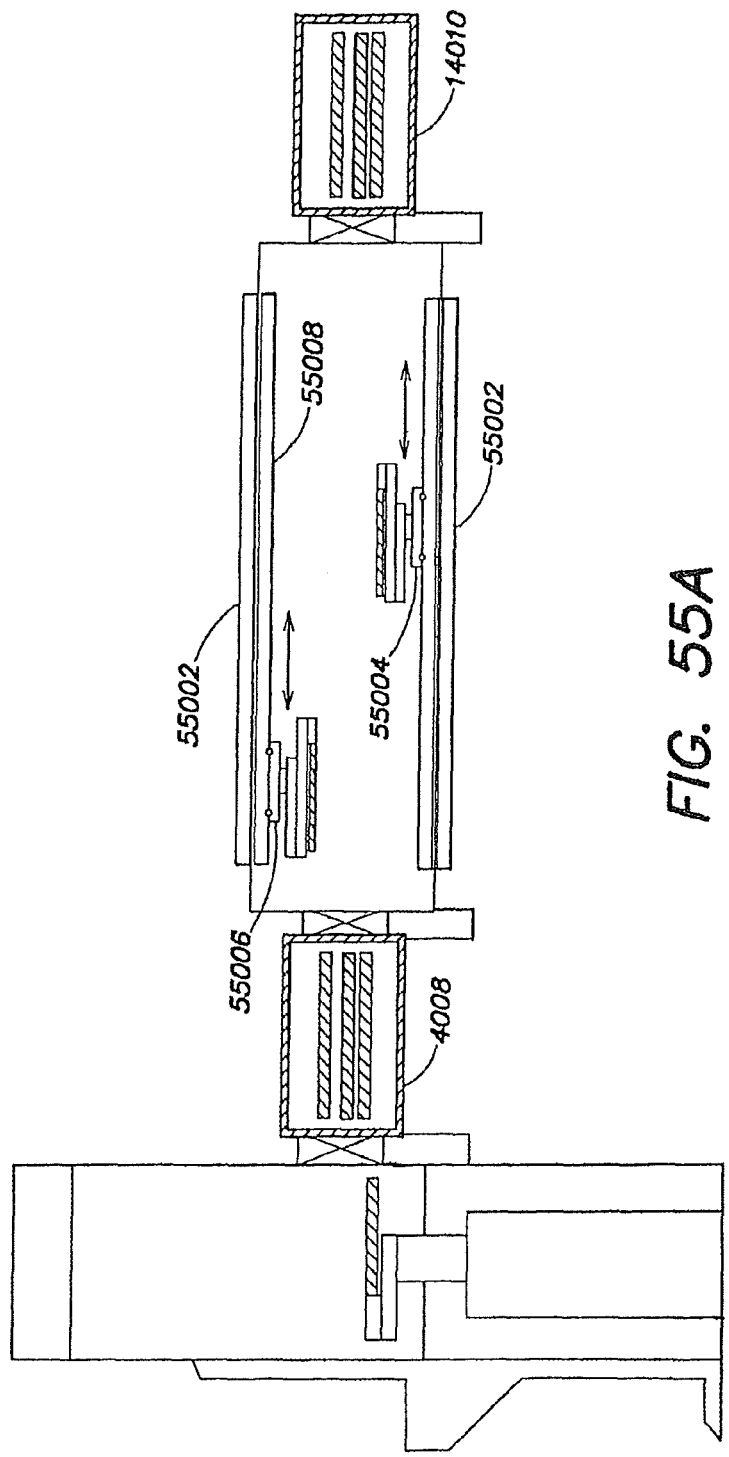

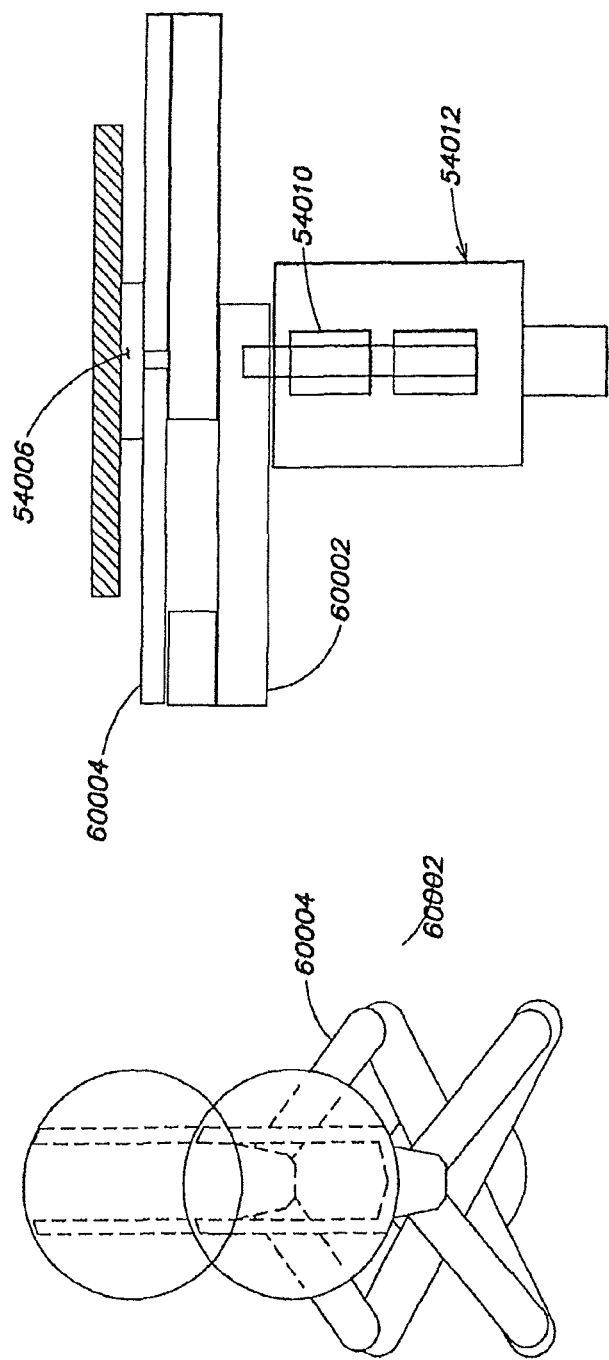

Metrology Approach

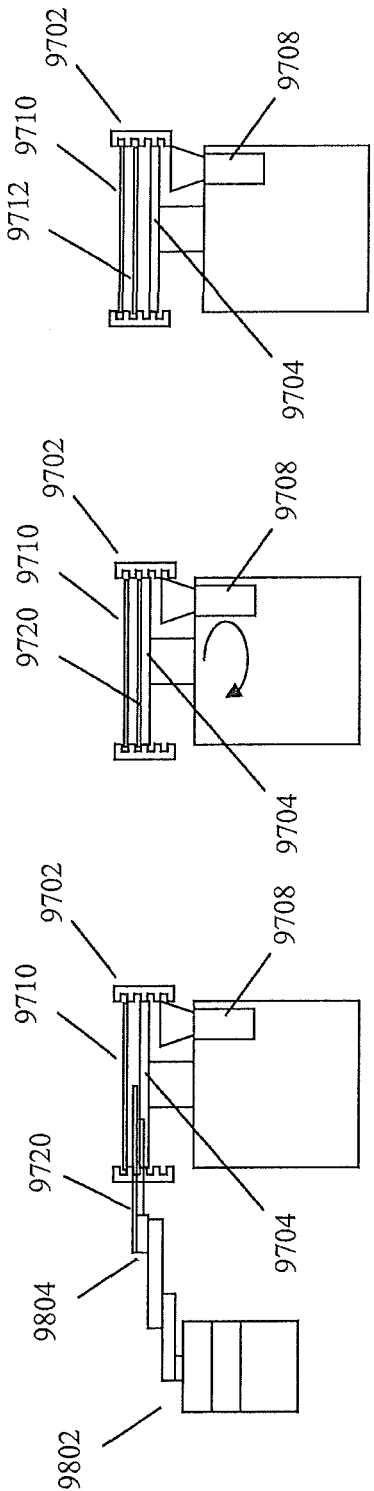

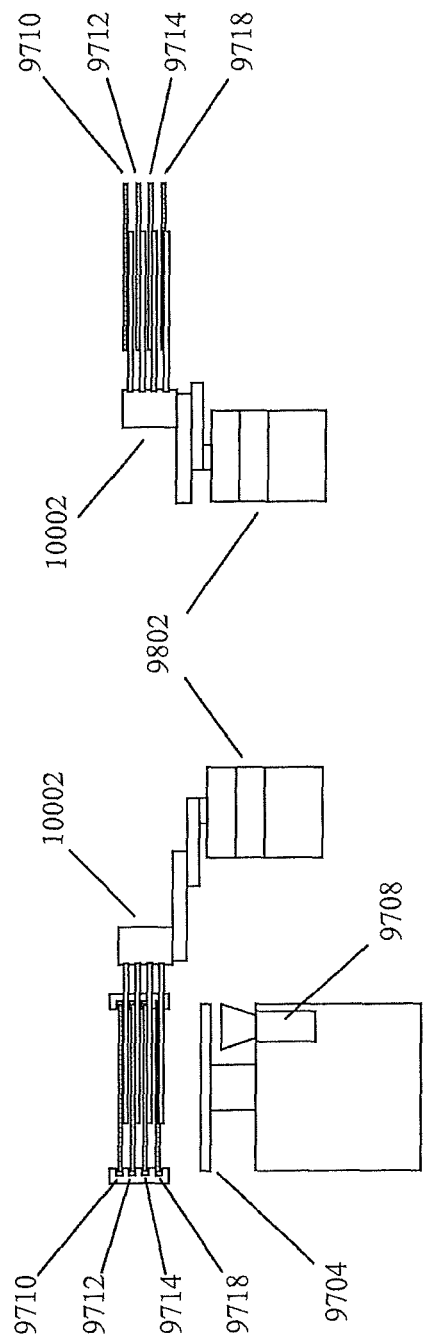

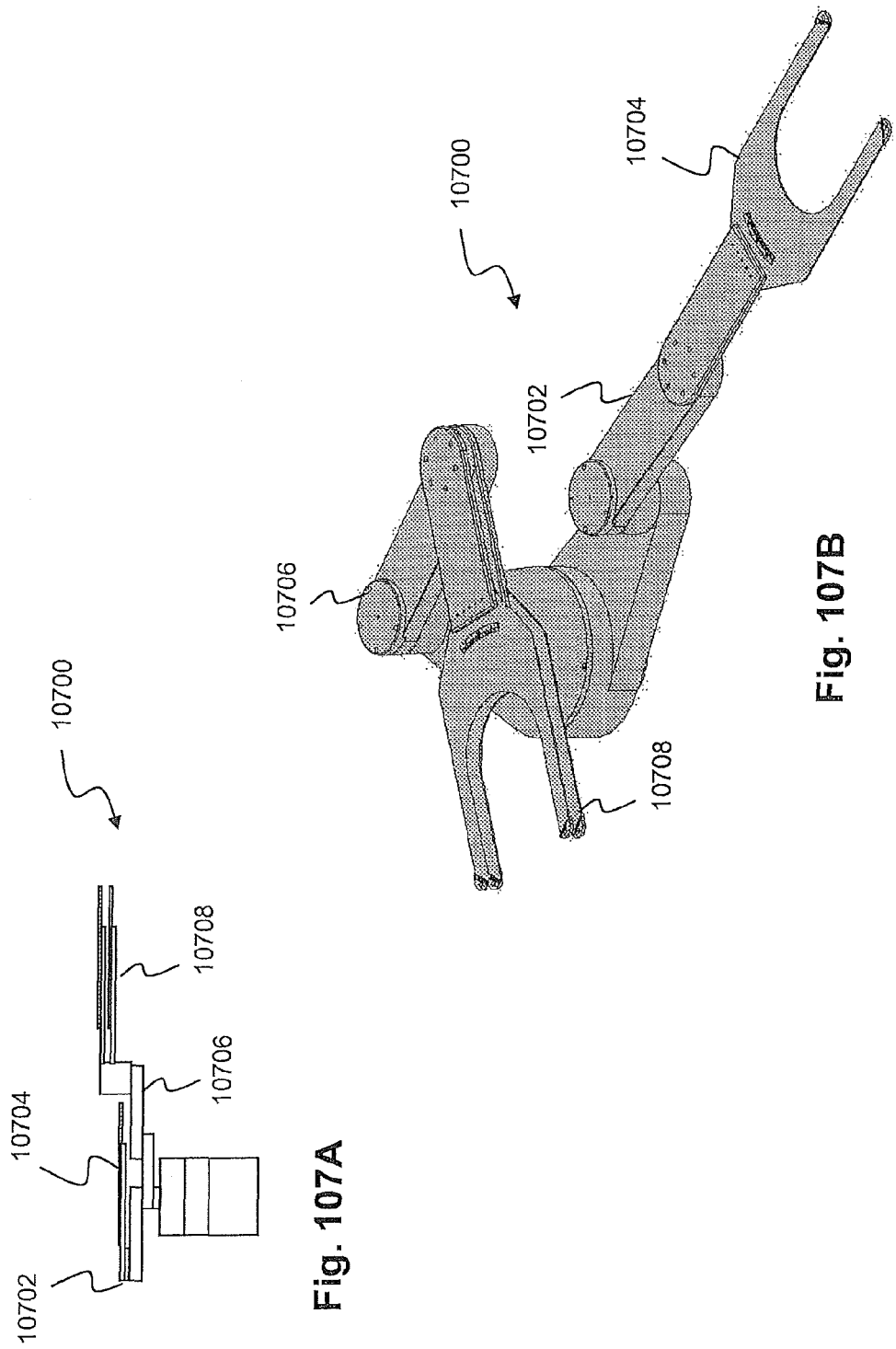

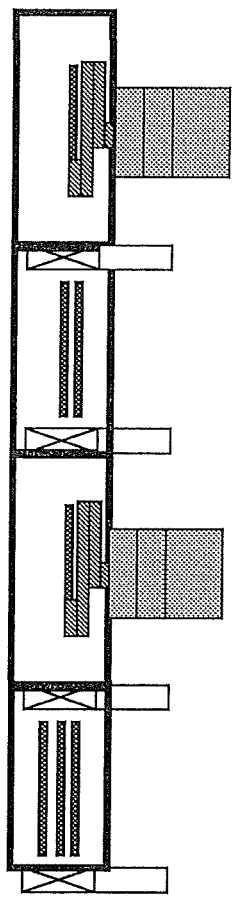
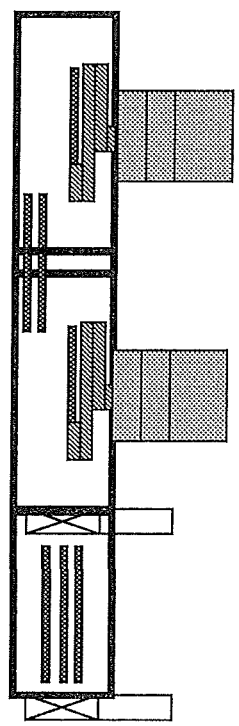
Fig. 108A
Fig. 108B
Fig. 108C

SEMICONDUCTOR WAFER HANDLING AND TRANSPORT

RELATED APPLICATIONS

This application is a continuation of U.S. application Ser. No. 11/679,829 filed Feb. 27, 2007 (now abandoned) which claims the benefit of U.S Prov. App. No. 60/777,443 filed on Feb. 27, 2006 (now expired); U.S. Prov. App. No. 60/779,684 filed on Mar. 5, 2006 (now expired); U.S. Prov. App. No. 60/779,707 filed on Mar. 5, 2006 (now expired); U.S. Prov. App. No. 60/779,478 filed on Mar. 5, 2006 (now expired); U.S. Prov. App. No. 60/779,463 filed on Mar. 5, 2006 (now expired); U.S. Prov. App. No. 60/779,609 filed on Mar. 5, 2006 (now expired); U.S. Prov. App. No. 60/784,832 filed on Mar. 21, 2006 (now expired); U.S. Prov. App. No. 60/746,163 filed on May 1, 2006 (now expired); U.S. Prov. App. No. 60/807,189 filed on Jul. 12, 2006 (now expired); and U.S. Prov. App. No. 60/823,454 filed on Aug. 24, 2006 (now expired)and is a continuation-in-part of U.S. application Ser. No. 10/985,834 filed on Nov. 10, 2004 (now U.S. Pat. No. 7,458,763) which claims the benefit of U.S. Prov. App. No. 60/518,823 filed on Nov. 10, 2003 (now expired) and U.S. Prov. App. No. 60/607,649 filed on Sep. 7, 2004 (now expired).

The entire contents of each of the foregoing applications is incorporated herein by reference.

BACKGROUND

1. Field of the Invention

The invention herein disclosed generally relates to semiconductor processing systems, and specifically relates to vacuum semiconductor processing work piece handling and transportation.

2. Description of the Related Art

Current semiconductor manufacturing equipment takes several different forms, each of which has significant drawbacks. Cluster tools, machines that arrange a group of semiconductor processing modules in a radius about a central robotic arm, take up a large amount of space, are relatively slow, and, by virtue of their architecture, are limited to a small number of semiconductor process modules, typically a maximum of about five or six. Linear tools, while offering much greater flexibility and the potential for greater speed than cluster tools, do not fit well with the current infrastructure of most current semiconductor fabrication facilities. Moreover, linear motion of equipment components within the typical vacuum environment of semiconductor manufacturing leads to problems in current linear systems, such as unacceptable levels of particles that are generated by friction among components. Several hybrid architectures exist that use a combination of a radial process module arrangement and a linear arrangement.

As semiconductor manufacturing has grown in complexity, it becomes increasingly necessary to transfer wafers among a number of different process modules or clusters of process modules, and sometimes between tools and modules that are separated by significant distances. This poses numerous difficulties, particularly when wafers are transferred between separate vacuum processing facilities. Transfers between vacuum environments, or between a vacuum and other processing environments often results in increased risk of particle contamination (due to the pumping and venting of wafers in load locks) as well as higher thermal budgets where wafers are either heated or cooled during transfers.

There remains a need for improved wafer transport and handling system for use in semiconductor manufacturing environments.

SUMMARY

Provided herein are methods and systems used for improved semiconductor manufacturing handling, and transport. Modular wafer transport and handling facilities are combined in a variety of ways deliver greater levels of flexibility, utility, efficiency, and functionality in a vacuum semiconductor processing system. Various processing and other modules may be interconnected with tunnel-and-cart transportation systems to extend the distance and versatility of the vacuum environment. Other improvements such as bypass thermal adjusters, buffering aligners, batch processing, multifunction modules, low particle vents, cluster processing cells, and the like are incorporated to expand functionality and improve processing efficiency.

As used herein, "robot" shall include any kind of known robot or similar device or facility that includes a mechanical capability and a control capability, which may include a combination of a controller, processor, computer, or similar facility, a set of motors or similar facilities, one or more resolvers, encoders or similar facilities, one or more mechanical or operational facilities, such as arms, wheels, legs, links, claws, extenders, grips, nozzles, sprayers, end effectors, actuators, and the like, as well as any combination of any of the above. One embodiment is a robotic arm.

As used herein "drive" shall include any form of drive mechanism or facility for inducing motion. In embodiments it includes the motor/encoder section of a robot.

As used herein, "axis" shall include a motor or drive connected mechanically through linkages, belts or similar facilities, to a mechanical member, such as an arm member. An "N-axis drive" shall include a drive containing N axes; for example a "2-axis drive" is a drive containing two axes.

As used herein, "arm" shall include a passive or active (meaning containing motors/encoders) linkage that may include one or more arm or leg members, bearings, and one or more end effectors for holding or gripping material to be handled.

As used herein, "SCARA arm" shall mean a Selectively Compliant Assembly Robot Arm (SCARA) robotic arm in one or more forms known to those of skill in the art, including an arm consisting of one or more upper links connected to a drive, one or more lower links connected through a belt or mechanism to a motor that is part of the drive, and one or more end units, such as an end effector or actuator.

As used herein, "turn radius" shall mean the radius that an arm fits in when it is fully retracted.

As used herein, "reach" shall include, with respect to a robotic arm, the maximum reach that is obtained when an arm is fully extended. Usually the mechanical limit is a little further out than the actual effective reach, because it is easier to control an arm that is not completely fully extended (in embodiments there is a left/right singularity at full extension that can be hard to control).

As used herein, "containment" shall mean situations when the arm is optimally retracted such that an imaginary circle can be drawn around the arm/end effector/material that is of minimum radius.

As used herein, the "reach-to-containment ratio" shall mean, with respect to a robotic arm, the ratio of maximum reach to minimum containment.

As used herein, "robot-to-robot" distance shall include the horizontal distance between the mechanical central axis of rotation of two different robot drives.

As used herein, "slot valve" shall include a rectangular shaped valve that opens and closes to allow a robot arm to pass through (as opposed to a vacuum (isolation) valve, which controls the pump down of a vacuum chamber). For example, the SEMI E21.1-1296 standard (a published standard for semiconductor manufacturing) the slot valve for 300 mm wafers in certain semiconductor manufacturing process modules has an opening width of 336 mm, a opening height of 50 mm and a total valve thickness of 60 mm with the standard also specifying the mounting bolts and alignment pins.

As used herein, "transfer plane" shall include the plane (elevation) at which material is passed from a robot chamber to a process module chamber through a slot valve. Per the SEMI E21.1-1296 standard for semiconductor manufacturing equipment the transfer plane is 14 mm above the slot valve centerline and 1100 mm above the plane of the factory floor.

As used herein, "section" shall include a vacuum chamber that has one or more robotic drives in it. This is the smallest repeatable element in a linear system.

As used herein, "link" shall include a mechanical member of a robot arm, connected on both ends to another link, an end effector, or the robot drive.

As used herein, "L1," "L2", "L3" or the like shall include the numbering of the arm links starting from the drive to the end effector.

As used herein, "end effector" shall include an element at an active end of a robotic arm distal from the robotic drive and proximal to an item on which the robotic arm will act. The end effector may be a hand of the robot that passively or actively holds the material to be transported in a semiconductor process or some other actuator disposed on the end of the robotic arm.

As used herein, the term "SCARA arm" refers to a robotic arm that includes one or more links and may include an end effector, where the arm, under control, can move linearly, such as to engage an object. A SCARA arm may have various numbers of links, such as 3, 4, or more. As used herein, "3-link SCARA arm" shall include a SCARA robotic arm that has three members: link one (L1), link two (L2) and an end effector. A drive for a 3-link SCARA arm usually has 3 motors: one connected to L1, one to the belt system, which in turn connects to the end effector through pulleys and a Z (lift) motor. One can connect a fourth motor to the end effector, which allows for some unusual moves not possible with only three motors.

As used herein, "dual SCARA arm" shall include a combination of two SCARA arms (such as two 3 or 4-link SCARA arms (typically designated A and B)) optionally connected to a common drive. In embodiments the two SCARA arms are either completely independent or share a common link member L1. A drive for a dual independent SCARA arm usually has either five motors: one connected to L1-A, one connected to L1-B, one connected to the belt system of arm A, one connected to the belt system of arm B, and a common Z (lift) motor. A drive for a dual dependent SCARA arm usually has a common share L1 link for both arms A and B and contains typically four motors: one connected to the common link L1, one connected to the belt system for arm A, one connected to the belt system for arm B, and a common Z (lift) motor.

As used herein, "4-link SCARA arm" shall include an arm that has four members: L1, L2, L3 and an end effector. A drive for a 4-link SCARA arm can have four motors: one connected to L1, one to the belt systems connected to L2 and L3, one to the end effector and a Z motor. In embodiments only 3 motors are needed: one connected to L1, one connected to the belt system that connects to L2, L3 and the end effector, and a Z motor.

As used herein, "Frog-leg style arm" shall include an arm that has five members: L1A, L1B, L2A, L3B and an end effector. A drive for a frog-leg arm can have three motors, one connected to L1A—which is mechanically by means of gearing or the like connected to L1B—, one connected to a turret that rotates the entire arm assembly, and a Z motor. In embodiments the drive contains three motors, one connected to L1A, one connected to L1B and a Z motor and achieves the desired motion through coordination between the motors.

As used herein, "Dual Frog-leg style arm" shall include an arm that has eight members L1A, L1B, L2A-1, L2A-2, L2B-1, L2B-2 and two end effectors. The second link members L2A-1 and L2B-1 form a single Frog-leg style arm, whereas the second link members L2A-2 and L2B-2 also form a single Frog-leg style arm, however facing in an opposite direction. A drive for a dual frog arm may be the same as for a single frog arm.

As used herein, "Leap Frog-leg style arm" shall include an arm that has eight members L1A, L1B, L2A-1, L2A-2, L2B-1, L2B-2 and two end effectors. The first link members L1A and L1B are each connected to one of the motors substantially by their centers, rather than by their distal ends. The second link members L2A-1 and L2B-1 form a single Frog-leg style arm, whereas the second link members L2A-2 and L2B-2 also form a single Frog-leg style arm, however facing in the same direction. A drive for a dual frog arm may be the same as for a single frog arm.

Disclosed herein are methods and systems for combining a linkable, flexible robotic system with a vacuum tunnel system using moveable carts for carrying one or more wafers in vacuum between process modules. The vacuum tunnel cart may be employed to transfer wafers between process modules or clusters, while a linkable robotic system is employed within each module or cluster for local wafer handling. The carts may employ any transportation medium suitable for a vacuum environment, such as magnetic levitation/propulsion.

Disclosed herein are also various configurations of vacuum transport systems in which heterogeneous handling systems are combined in a modular fashion to allow for more diverse functionality within a single process environment. In general, robots may be provided for wafer handling inside and between process modules that are in proximity to each other, while allowing for rapid, convenient transport of wafers between process cells that are relatively distant. Such heterogeneous handling systems may include, for example, systems in which robotic arms, such as SCARA arms, are used to handle wafers within process modules or clusters, while carts or similar facilities are used to transport wafers between process modules or clusters. A cart or similar facility may include a levitated cart, a cart on a rail, a tube system, or any of a wide variety of cart or railway systems, including various embodiments disclosed herein.

The methods and systems disclosed herein also include various configurations of robot handling systems in combination with cart systems, including ones in which cart systems form "U" and "T" shapes, circuits, lines, dual linear configurations (including side-by-side and above and below configurations) and the like.

Disclosed herein are methods and systems for supporting vacuum processing and handling modules in vacuum semiconductor processing systems. The pedestal support systems herein disclosed may precisely position vacuum modules to facilitate proper vacuum sealing between adjacent modules. In embodiments, the pedestal's cylindrical shape affords opportunity for convenient manufacturing methods while providing stability to the supported vacuum module with a small footprint.

In embodiments, the pedestal support system further may incorporate a robot motor mechanism for a robot operating within the vacuum module, further reducing the overall size and cost of the vacuum processing system.

A pedestal support system with a rolling base may also provide needed flexibility in reconfiguring processing and handling modules quickly and cost effectively.

These and other systems, methods, objects, features, and advantages of the present invention will be apparent to those skilled in the art from the following detailed description of the preferred embodiment and the drawings. All documents mentioned herein are hereby incorporated in their entirety by reference.

BRIEF DESCRIPTION OF THE FIGURES

The foregoing and other objects and advantages of the invention will be appreciated more fully from the following further description thereof, with reference to the accompanying drawings, wherein:

FIG. 10 shows reach and containment capabilities of a 4-link SCARA arm.

FIGS. 13A, 13B, and 13C show a dual-arm set of 4-link SCARA arms using a spline link as the transmission mechanism.

FIGS. 49A and 49B show an end effector tapered in two dimensions, which reduces active vibration modes in the end effector.

FIGS. 50A and 50B show how vertical tapering of robotic arm elements for a robot planar arm can be used to reduce vibration in the arm set, without significantly affecting vertical stacking height.

FIGS. 52A and 52B illustrate a dual dependent SCARA robotic arm.

FIGS. 53A and 53B illustrate a frog-leg style robotic arm.

FIGS. 54A and 54B illustrate a dual Frog-leg style robotic arm.

FIG. 55A illustrates a 4-Link SCARA arm mounted on a moveable cart, as well as a 4-Link SCARA arm mounted on an inverted moveable cart.

FIGS. 60A and 60B illustrate a dual Frog-Leg style robotic manipulator with substrates on the same side of the system.

FIG. 99 depicts an alignment of a second work piece in the aligner of FIG. 97.

FIG. 100 depicts a batch of aligned work pieces being transferred from the aligner of FIG. 97.

FIG. 107 shows a robotic arm for use in a batch processing system.

FIG. 108 shows a multi-shelf buffer for use in a batch processing system.

DETAILED DESCRIPTION

Figure 1:
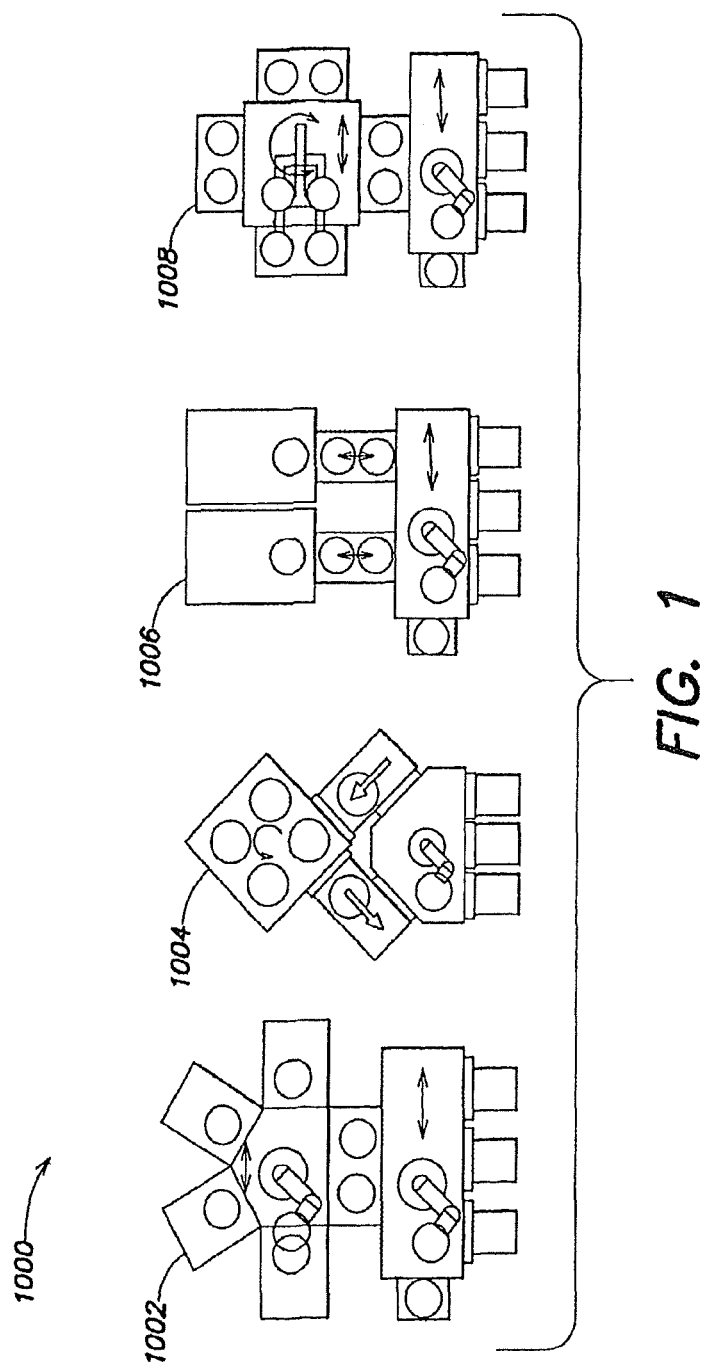
FIG. 1 shows equipment architectures for a variety of manufacturing equipment types.

FIG. 1 shows equipment architectures 1000 for a variety of manufacturing equipment types. Each type of manufacturing equipment handles items, such as semiconductor wafers, between various processes, such as chemical vapor deposition processes, etching processes, and the like. As semiconductor manufacturing processes are typically extremely sensitive to contaminants, such as particulates and volatile organic compounds, the processes typically take place in a vacuum environment, in one or more process modules that are devoted to specific processes. Semiconductor wafers are moved by a handling system among the various processes to produce the end product, such as a chip. Various configurations 1000 exist for handling systems. A prevalent system is a cluster tool 1002, where process modules are positioned radially around a central handling system, such as a robotic arm. In other embodiments, a handling system can rotate items horizontally, such as in the embodiment 1004. An important aspect of each type of tool is the "footprint," or the area that the equipment takes up in the semiconductor manufacturing facility. The larger the footprint, the more space required to accommodate multiple machines in a fabrication facility. Also, larger footprints typically are associated with a need for larger vacuum systems, which increase greatly in cost as they increase in size. The architecture 1004 rotates items in a "lazy susan" facility. The architecture in 1006 moves items in and out of a process module where the process modules are arranged next to each other. The architecture 1008 positions process modules in a cluster similar to 1002, with the difference that the central robot handles two wafers side by side. Each of these systems shares many of the challenges of cluster tools, including significant swap time delays as one wafer is moved in and another out of a given process module, as well as considerable difficulty maintaining the cleanliness of the vacuum environment of a given process module, as more and more wafers are moved through the system.

Figure 2:
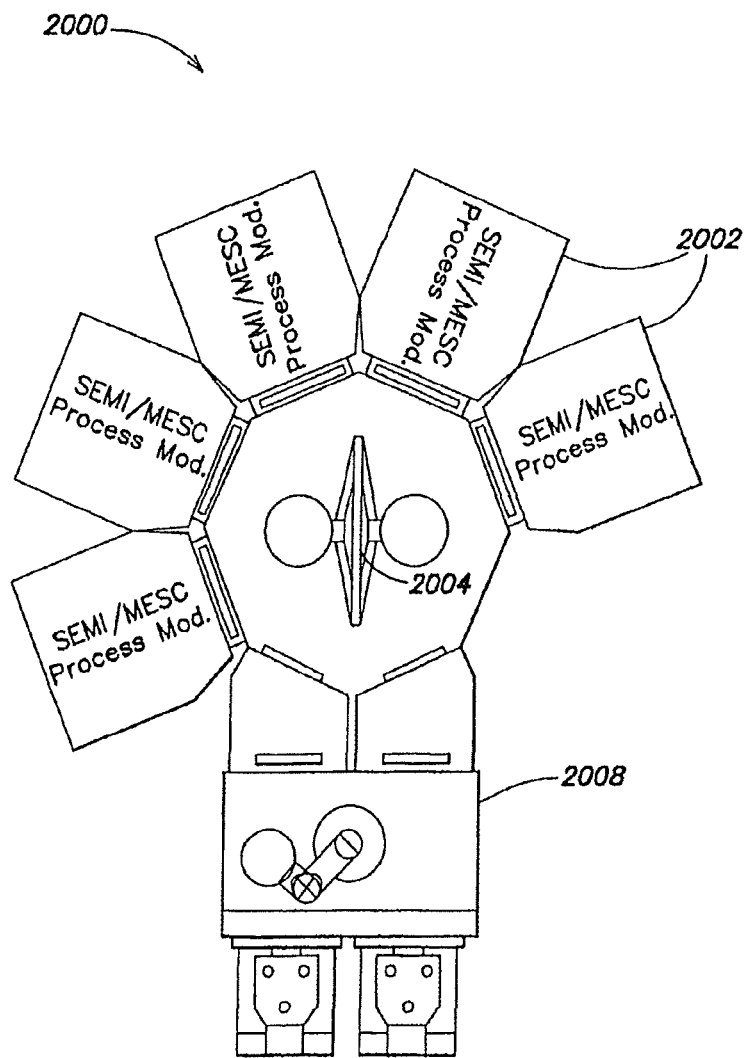
FIG. 2 shows a conventional, cluster-type architecture for handling items in a semiconductor manufacturing process.

FIG. 2 shows a conventional cluster-type architecture 2000 for handling items in a semiconductor manufacturing process. A robotic arm 2004 moves items, such as wafers, among various process modules 2002 that are positioned in a cluster around the robotic arm 2004. An atmospheric substrate handling mini-environment chamber 2008 receives materials for handling by the equipment and holds materials once processing is complete. Note how difficult it would be to add more process modules 2002. While one more module 2002 would potentially fit, the practical configuration is limited to five process modules 2002. Adding a sixth module may significantly impact the serviceability of the equipment, in particular the robotic arm 2004.

Figure 3A:
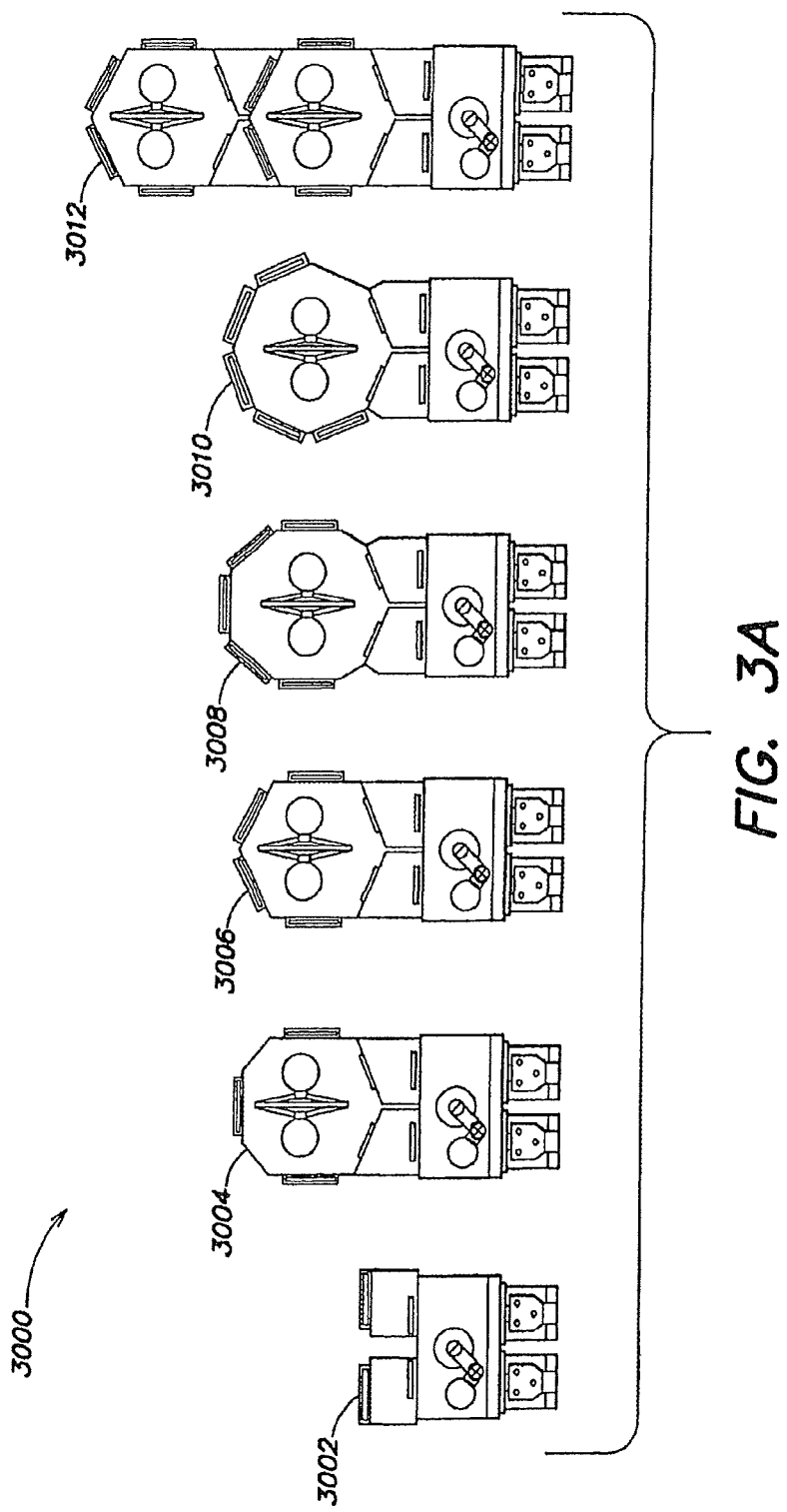
FIGS. 3A and 3B show a series of cluster-type systems for accommodating between two and six process modules.
Figure 3B:
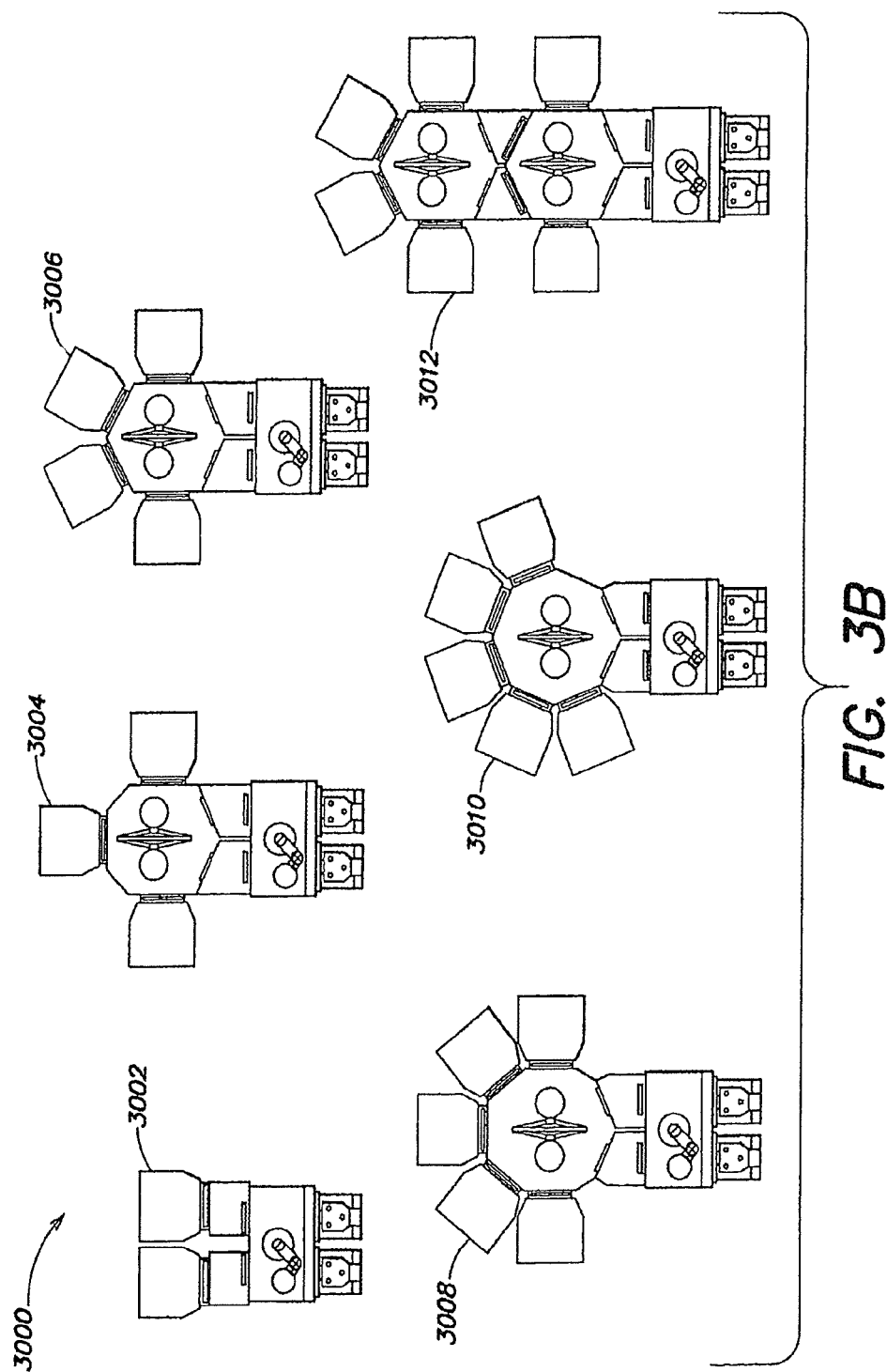

FIGS. 3A and 3B show cluster tool modules, atmospheric mini-environment handling chambers, vacuum handling chambers and other components 3000 from a flexible architecture system for a vacuum based manufacturing process. Different modules can be assembled together to facilitate manufacturing of a desired process technology. For example, a given chip may require chemical vapor deposition of different chemical constituents (e.g., Titanium Nitride, Tungsten, etc.) in different process modules, as well as etching in other process modules. The sequence of the processes in the different process modules produces a unique end product. Given the increasing complexity of semiconductor components, it is often desirable to have a flexible architecture that allows the manufacturer to add more process modules. However, the cluster tools described above are space-limited; therefore, it may be impossible to add more process modules, meaning that in order to complete a more complex semiconductor wafer it may be necessary to move manufacturing to a second cluster tool. As seen in FIG. 3A and FIG. 3B, cluster tools can include configurations with two 3002, three 3004, four 3006, five 3008, 3010 or six 3012 process modules with staged vacuum isolation. Other components can be supplied in connection with the equipment.

Figure 4:
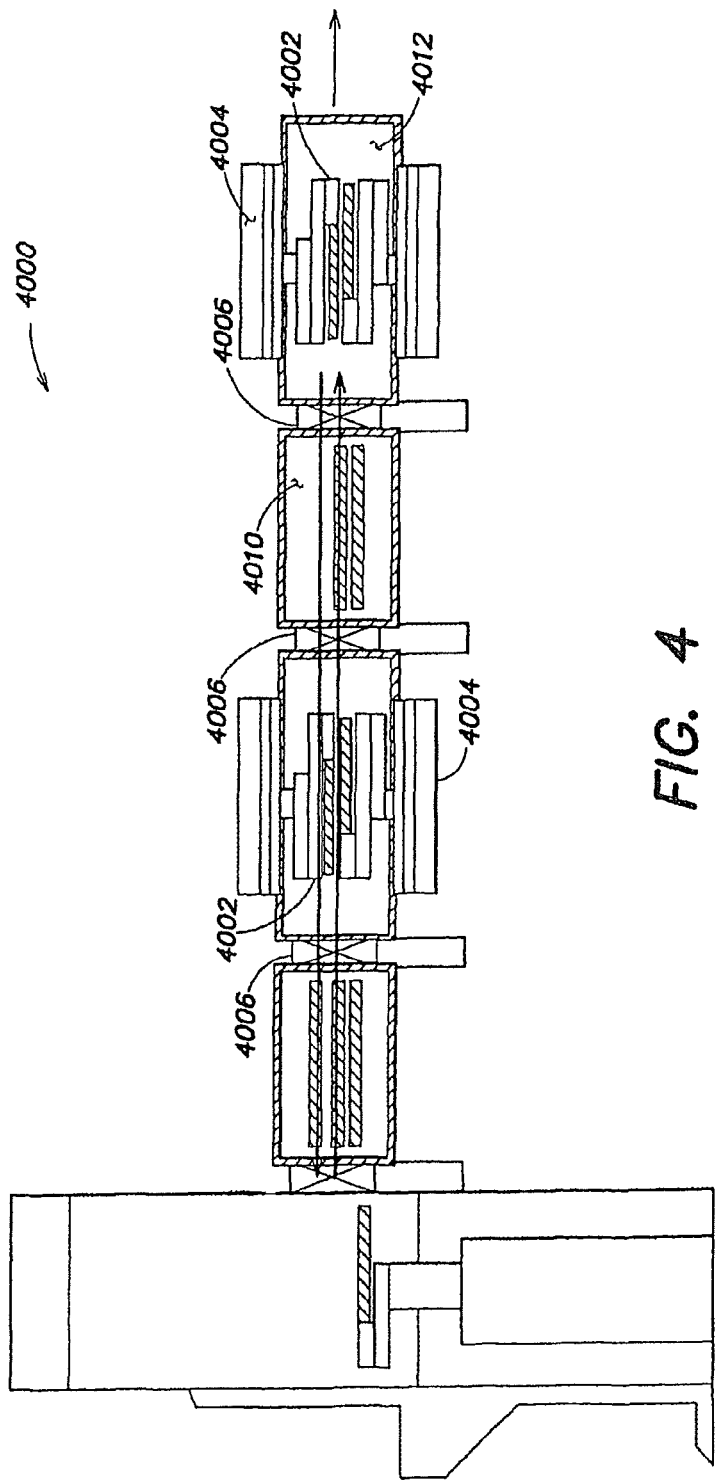
FIG. 4 shows high-level components of a linear processing architecture for handling items in a manufacturing process.

FIG. 4 shows high-level components of a linear processing architecture 4000 for handling items in a manufacturing process. The architecture uses two or more stationary robots 4002 arranged in a linear fashion. The robots 4002 can be either mounted in the bottom of the system or hang down from the chamber lid or both at the same time. The linear system uses a vacuum chamber 4012 around the robot. The system could be comprised of multiple connected vacuum chambers 4012, each with a vacuum chamber 4012 containing its own robot arranged in a linear fashion. In embodiments, a single controller could be set up to handle one or more sections of the architecture. In embodiments vacuum chambers 4012 sections are extensible; that is, a manufacturer can easily add additional sections/chambers 4012 and thus add process capacity, much more easily than with cluster architectures. Because each section uses independent robot drives 4004 and arms 4002, the throughput may stay high when additional sections and thus robots are added. By contrast, in cluster tools, when the manufacturer adds process chambers 2002, the system increases the load for the single robot, even if that robot is equipped with a dual arm, eventually the speed of the robot can become the limiting factor. In embodiments, systems address this problem by adding additional robot arms 4002 into a single drive. Other manufacturers have used a 4-axis robot with two completely independent arms such as a dual SCARA or dual Frog-leg robots. The linear system disclosed herein may not be limited by robot capacity, since each section 4012 contains a robot, so each section 4012 is able to transport a much larger volume of material than with cluster tools.

In embodiments the components of the system can be controlled by a software controller, which in embodiments may be a central controller that controls each of the components. In embodiments the components form a linkable handling system under control of the software, where the software controls each robot to hand off a material to another robot, or into a buffer for picking up by the next robot. In embodiments the software control system may recognize the addition of a new component, such as a process module or robot, when that component is plugged into the system, such as recognizing the component over a network, such as a USB, Ethernet, firewire, Bluetooth, 802.11a, 802.11b, 802.11g or other network. In such embodiments, as soon as the next robot, process module, or other component is plugged in a software scheduler for the flow of a material to be handled, such as a wafer, can be reconfigured automatically so that the materials can be routed over the new link in the system. In embodiments the software scheduler is based on a neural net, or it can be a rule-based scheduler. In embodiments process modules can make themselves known over such a network, so that the software controller knows what new process modules, robots, or other components have been connected. When a new process module is plugged into an empty facet, the system can recognize it and allow it to be scheduled into the flow of material handling.

In embodiments the software system may include an interface that permits the user to run a simulation of the system. The interface may allow a user to view the linking and configuration of various links, robotic arms and other components, to optimize configuration (such as by moving the flow of materials through various components, moving process modules, moving robots, or the like), and to determine what configuration to purchase from a supplier. In embodiments the interface may be a web interface.

The methods and system disclosed herein can use optional buffer stations 4010 between robot drives. Robots could hand off to each other directly, but that is technically more difficult to optimize, and would occupy two robots, because they would both have to be available at the same time to do a handoff, which is more restrictive than if they can deposit to a dummy location 4010 in-between them where the other robot can pick up when it is ready. The buffer 4010 also allows higher throughput, because the system does not have to wait for both robots to become available. Furthermore, the buffers 4010 may also offer a good opportunity to perform some small processing steps on the wafer such as heating, cooling, aligning, inspection, metrology, testing or cleaning.

In embodiments, the methods and systems disclosed herein use optional vacuum isolation valves 4006 between robot areas/segments 4012. Each segment 4012 can be fully isolated from any other segment 4012. If a robot handles ultra clean and sensitive materials (e.g., wafers) in its segment 4012, then isolating that segment 4012 from the rest of the system may prevent cross-contamination from the dirtier segment 4012 to the clean segment 4012. Also the manufacturer can now operate segments 4012 at different pressures. The manufacturer can have stepped vacuum levels where the vacuum gets better and better further into the machine. The big advantage of using vacuum isolation valves 4006 between segments 4012 may be that handling of atomically clean wafers (created after cleaning steps and needing to be transported between process modules without contamination from the environment) can be done without out-gassing from materials or wafers in other parts of the system entering the isolated chamber segment 4012.

In embodiments, vacuum isolation between robots is possible, as is material buffering between robots, such as using a buffer module 4010, a mini-process module or an inspection module 4010.

Figure 5:
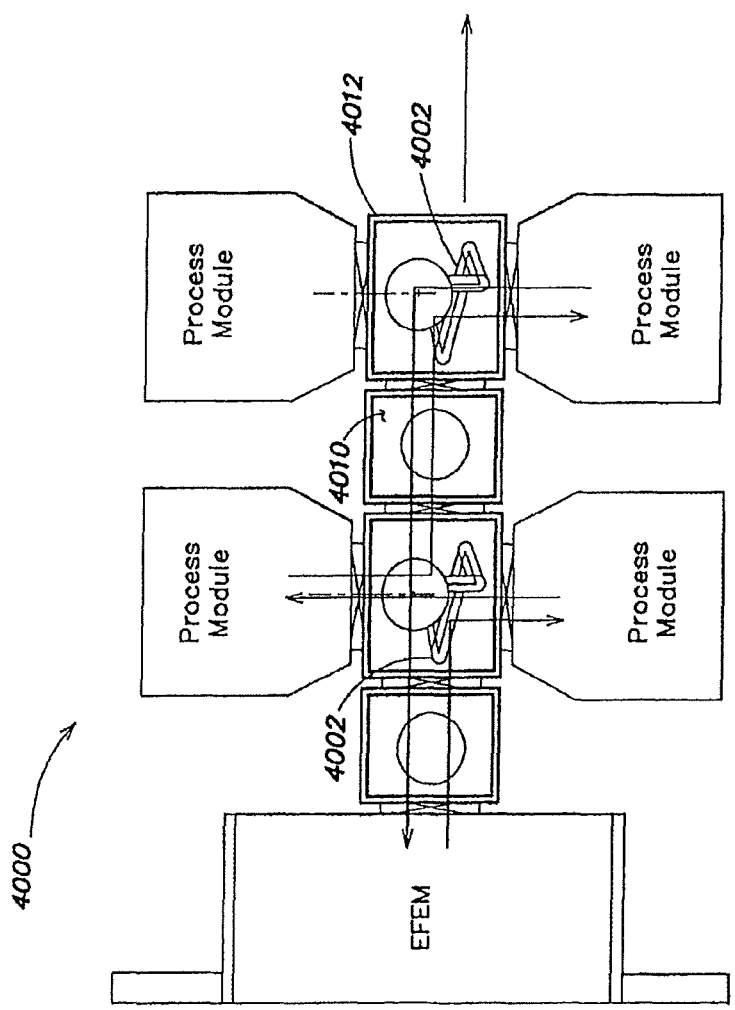
FIG. 5 shows a top view of a linear processing system, such as one with an architecture similar to that of FIG. 4.

FIG. 5 shows a top view of a linear processing system 4000, such as one with a linear architecture similar to that of FIG. 4.

Different forms of robots can be used in semiconductor manufacturing equipment, whether a cluster tool or a linear processing machine such as disclosed in connection with FIGS. 4 and 5.

Figure 6:
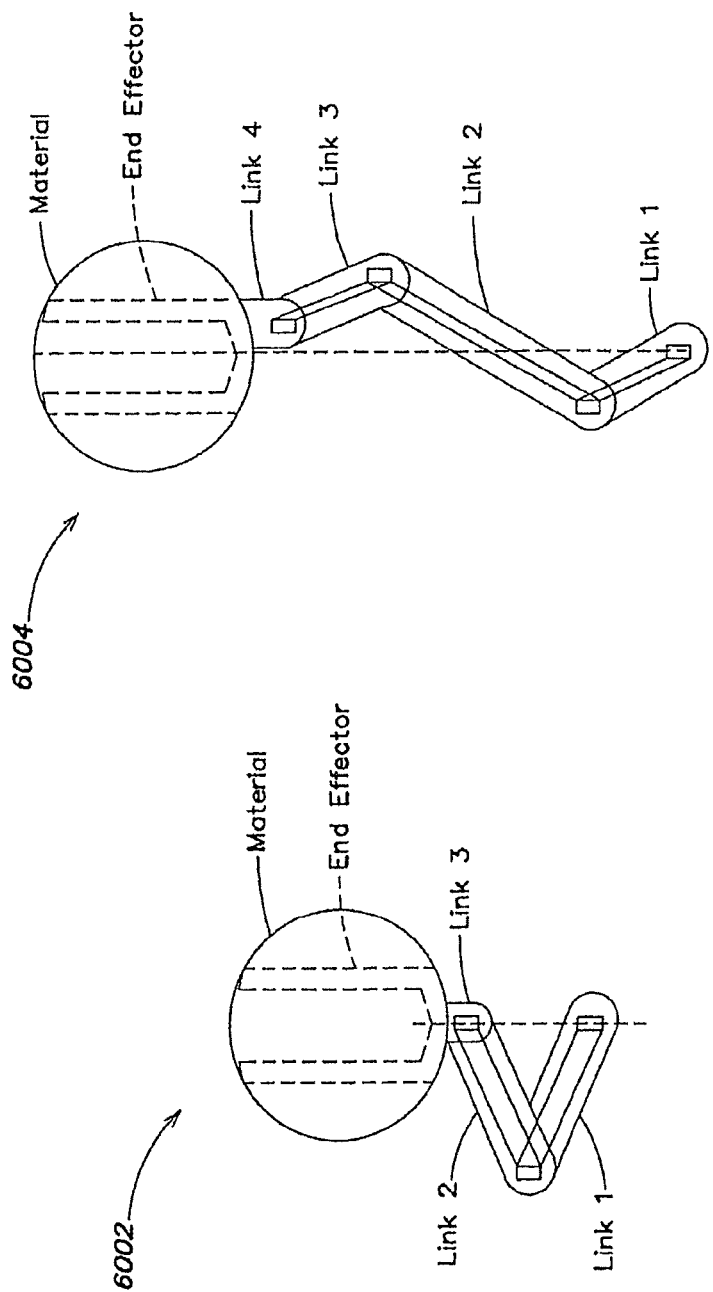
FIGS. 6A and 6B show a 3-link SCARA arm and a 4-link SCARA arm.

FIGS. 6A and 6B show a 3-link SCARA arm 6002 and a 4-link SCARA arm 6004. The 3-link or 4-link arms 6002, 6004 are driven by a robot drive. The 3-link arm 6002 is commonly used in industry. When the 3-link SCARA arm 6002 is used, the system is not optimized in that the reach-to-containment ratio is not very good. Thus, the vacuum chambers need to be bigger, and since costs rise dramatically with the size of the vacuum chamber, having a 3-link SCARA arm 6002 can increase the cost of the system. Also the overall footprint of the system becomes bigger with the 3-link SCARA arm 6002. Moreover, the reach of a 3-link SCARA arm 6002 is less than that of a 4-link arm 6004. In some cases a manufacturer may wish to achieve a large, deep handoff into a process module, and the 4-link arm 6004 reaches much farther beyond its containment ratio. This has advantages in some non-SEMI-standard process modules. It also has advantages when a manufacturer wants to cover large distances between segments.

The 4-link arm 6004 is advantageous in that it folds in a much smaller containment ratio than a 3-link SCARA arm 6002, but it reaches a lot further than a conventional 3-link SCARA 6002 for the same containment diameter. In combination with the ability to have a second drive and second 4-link arm 6004 mounted on the top of the system, it may allow for a fast material swap in the process module. The 4-link SCARA arm 6004 may be mounted, for example, on top of a stationary drive as illustrated, or on top of a moving cart that provides the transmission of the rotary motion to actuate the arms and belts. In either case, the 4-link arm 6004, optionally together with a second 4-link arm 6004, may provide a compact, long-reach arm that can go through a small opening, without colliding with the edges of the opening.

Figure 7:
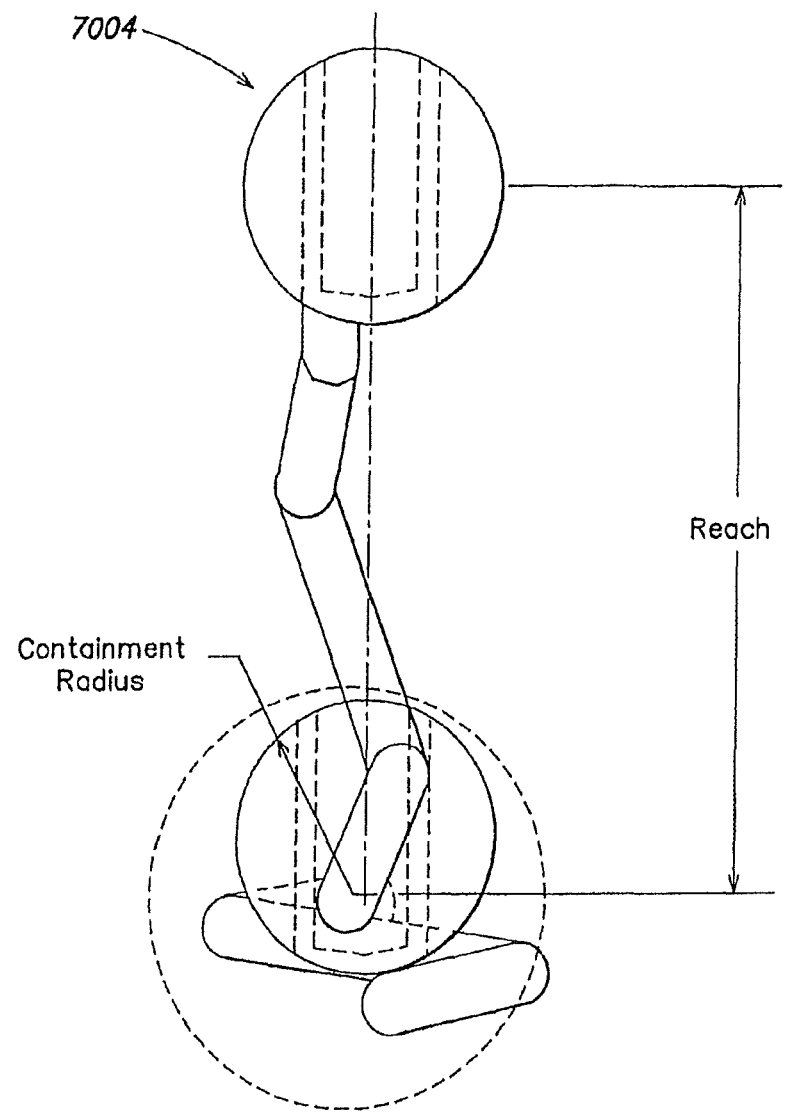
FIG. 7 shows reach and containment characteristics of a SCARA arm.

FIG. 7 shows reach and containment characteristics of a 4-link SCARA arm 7004. In embodiments, the 4-link SCARA arm 7004 link lengths are not constrained by the optimization of reach to containment ratio as in some other systems. Optimization of the reach to containment ratio may lead to a second arm member that is too long. When the arm reaches through a slot valve that is placed as close as practical to the minimum containment diameter, this second arm member may collide with the inside edges of the slot valve. Thus the second (and third) links may be dimensioned based on collision avoidance with a slot valve that the arm is designed to reach through. This results in very different ratios between L1, L2 and L3. The length of L2 may constrain the length of L3. An equation for optimum arm length may be a 4th power equation amenable to iterative solutions.

Figure 8:
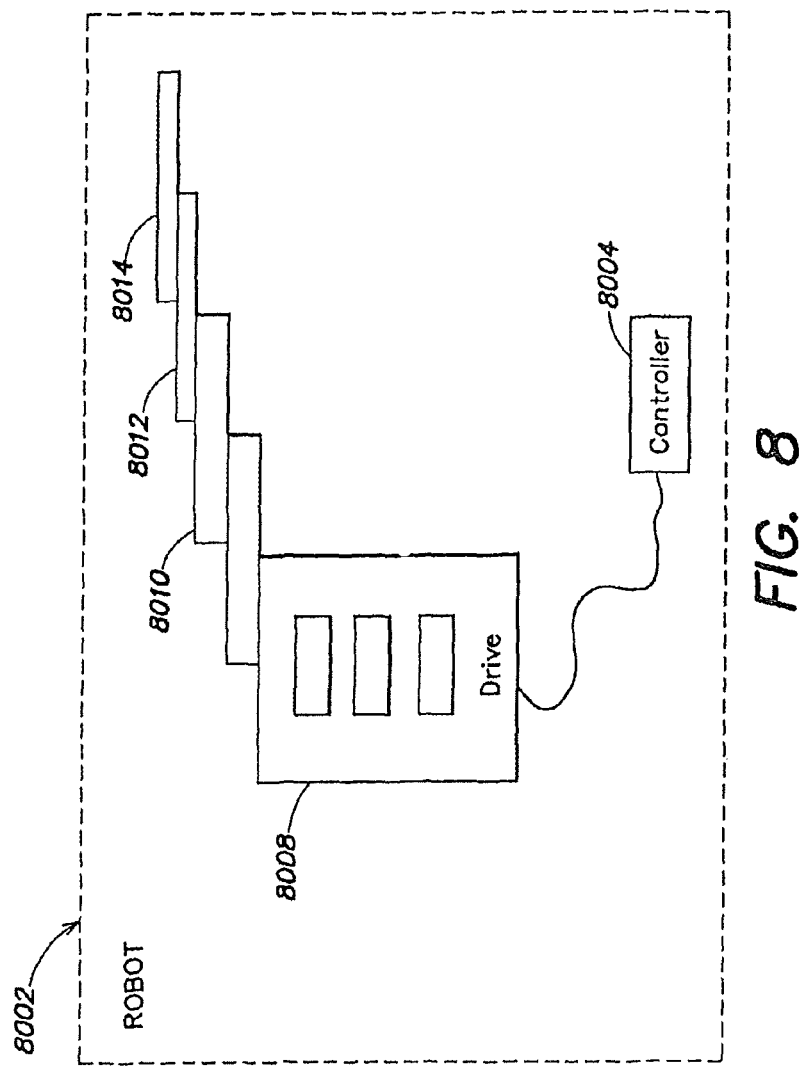
FIG. 8 shows high-level components for a robot system.

FIG. 8 shows high-level components for a robot system 8002, including a controller 8004, a drive/motor 8008, an arm 8010, an end effector 8012, and a material to be handled 8014.

Figure 9:
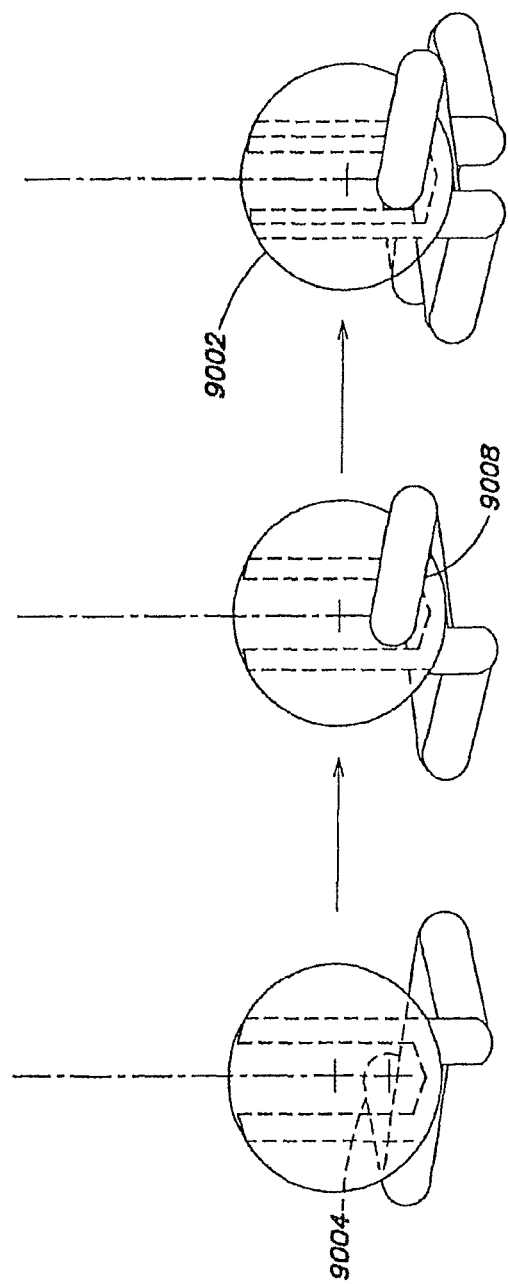
FIG. 9 shows components of a dual-arm architecture for a robotic arm system for use in a handling system.

FIG. 9 shows components of a dual-arm 9002 architecture for a robotic arm system for use in a handling system. One arm is mounted from the bottom 9004 and the other from the top 9008. In embodiments both are 4-link SCARA arms. Mounting the second arm on the top is advantageous. In some other systems arms have been connected to a drive that is mounted through the top of the chamber, but the lower and upper drives are conventionally mechanically coupled. In embodiments, there is no mechanical connection between the two drives in the linear system disclosed in connection with FIG. 4 and FIG. 5; instead, the coordination of the two arms (to prevent collisions) may be done in a software system or controller. The second (top) arm 9008 may optionally be included only if necessary for throughput reasons.

Another feature is that only two motors, just like a conventional SCARA arm, may be needed to drive the 4-link arm. Belts in the arm may maintain parallelism. Parallelism or other coordinated movements may also be achieved, for example, using parallel bars instead of belts. Generally, the use of only two motors may provide a substantial cost advantage. At the same time, three motors may provide a functional advantage in that the last (L4) link may be independently steered, however the additional belts, bearings, connections, shafts and motor may render the system much more expensive. In addition the extra belts may add significant thickness to the arm mechanism, making it difficult to pass the arm through a (SEMI standard) slot valve. Also, the use of fewer motors generally simplifies related control software.

Another feature of the 4-link SCARA arm disclosed herein is that the wrist may be offset from centerline. Since the ideal system has a top-mount 9008 as well as a bottom 9004 mount 4-link arm, the vertical arrangement of the arm members may be difficult to adhere to if the manufacturer also must comply with the SEMI standards. In a nutshell, these standards specify the size and reach requirements through a slot valve 4006 into a process module. They also specify the level above centerline on which a wafer has to be carried. Many existing process modules are compliant with this standard. In systems that are non-compliant, the slot valves 4006 are of very similar shape although the opening size might be slightly different as well as the definition of the transfer plane. The SEMI standard dimensional restrictions require a very compact packaging of the arms. Using an offset wrist allows the top 9008 and bottom 9004 arms to get closer together, making it easier for them to pass through the slot valve 4006. If the wrist is not offset, then the arms need to stay further apart vertically and wafer exchanges may take more time, because the drives need to move more in the vertical direction. The proposed design of the top arm does not require that there is a wrist offset, but a wrist offset may advantageously reduce the turn radius of the system, and allows for a better mechanical arm layout, so no interferences occur.

FIG. 10 shows reach and containment capabilities of a 4-link SCARA arm 6004.

Figure 11B:
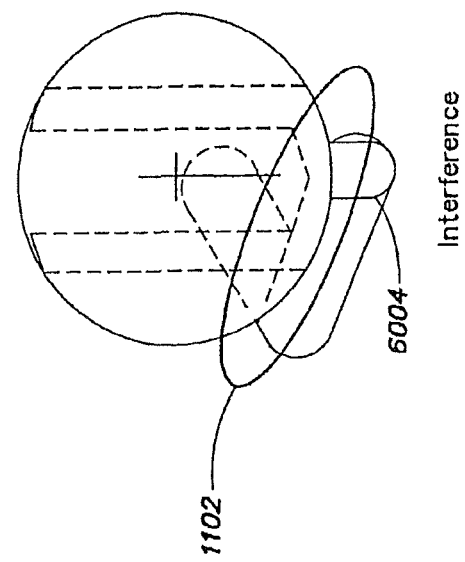
FIGS. 11A and 11B show interference characteristics of a 4-link SCARA arm.
Figure 11A:
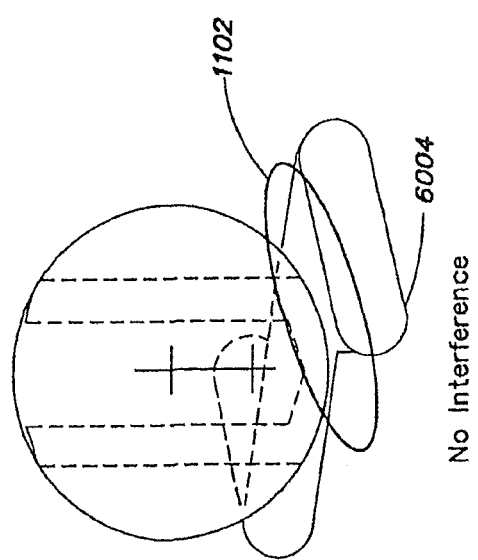

FIG. 11 shows interference characteristics 1102 of a 4-link SCARA arm 6004. The wrist offset may help to fold the arm in a smaller space than would otherwise be possible.

Figure 12:
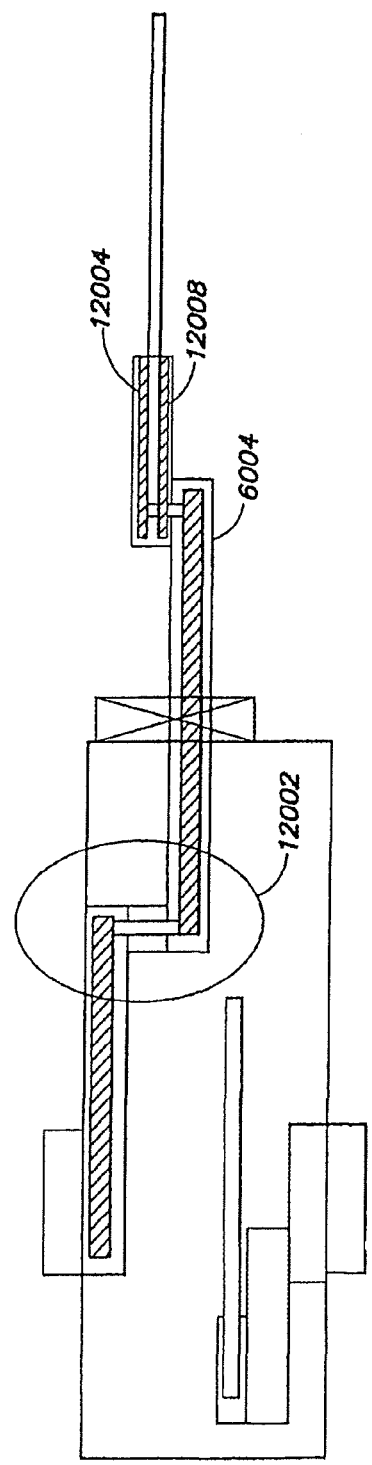
FIG. 12 shows a side view of a dual-arm set of 4-link SCARA arms using belts as the transmission mechanism.

FIG. 12 shows a side view of a dual-arm set of 4-link SCARA arms 6004. Because of the packaging constraints of particularly the top arm, it may be necessary to construct an arm that has some unique features. In embodiments, one link upon retracting partially enters a cutout in another arm link. Belts can be set in duplicate, rather than a single belt, so that one belt is above 12004 and one below 12008 the cutout. One solution, which is independent of the fact that this is a 4-link arm, is to make L2 significantly lower 12002, with a vertical gap to L1, so that L3 and L4 can fold inside. Lowering L2 12002 may allow L3 and L4 to reach the correct transfer plane and may allow a better containment ratio. Because of the transfer plane definition, the lowering of L2 12002 may be required.

FIG. 13 shows an embodiment in which a combination of belts and linkages is used. The transmission of motion through L1 13002 and L3 13006 may be accomplished by either a single belt or a dual belt arrangement. In contrast, the motion transmission in L2 13004 may be accomplished by a mechanical linkage (spline) 13010. The advantage of such an arrangement may be that enclosed joints can be used which reduces the vertical dimension of the arm assembly that may allow an arm to more easily pass through a SEMI standard slot valve.

Figure 14:
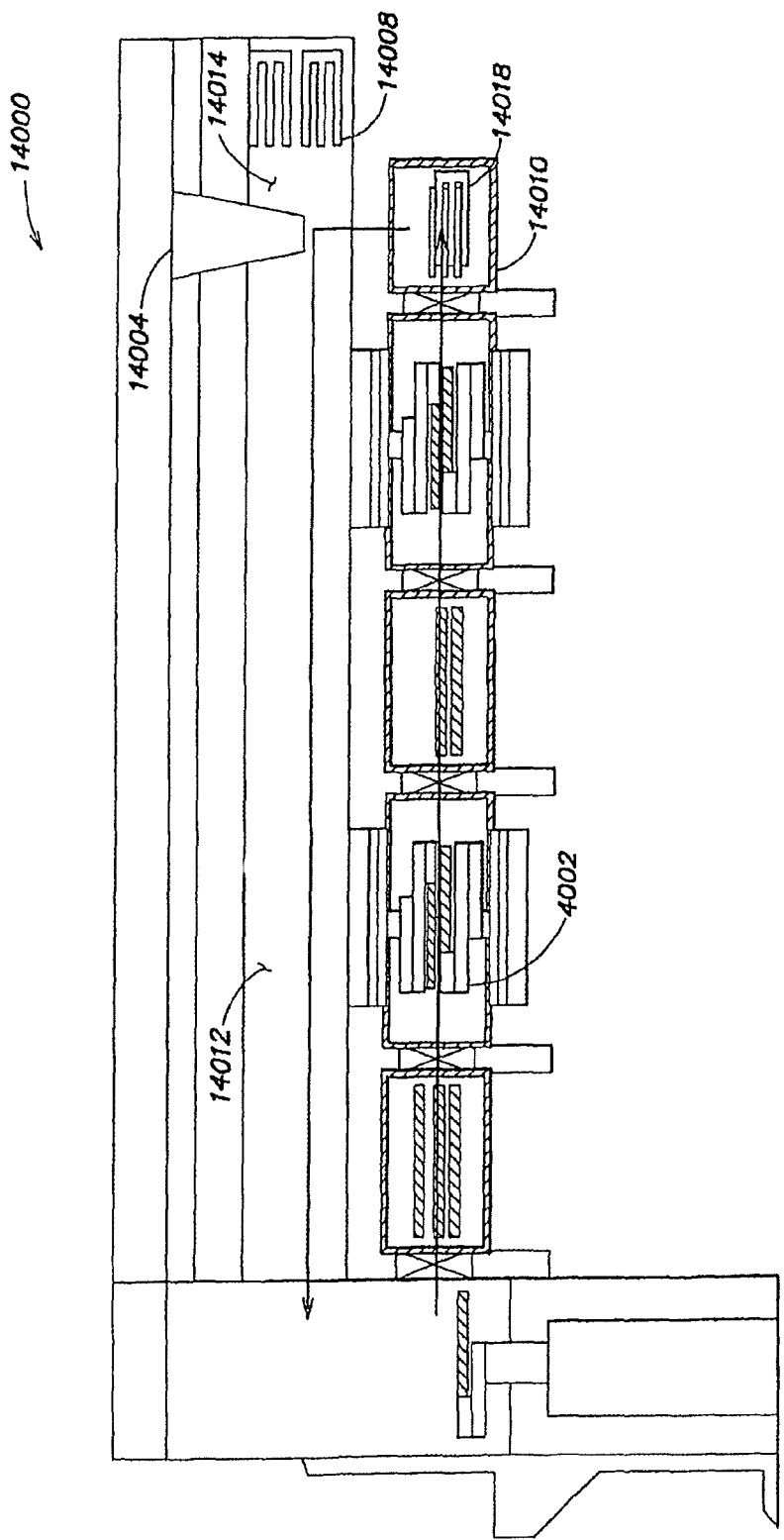
FIG. 14 shows an external return system for a handling system having a linear architecture.
Figure 14A:
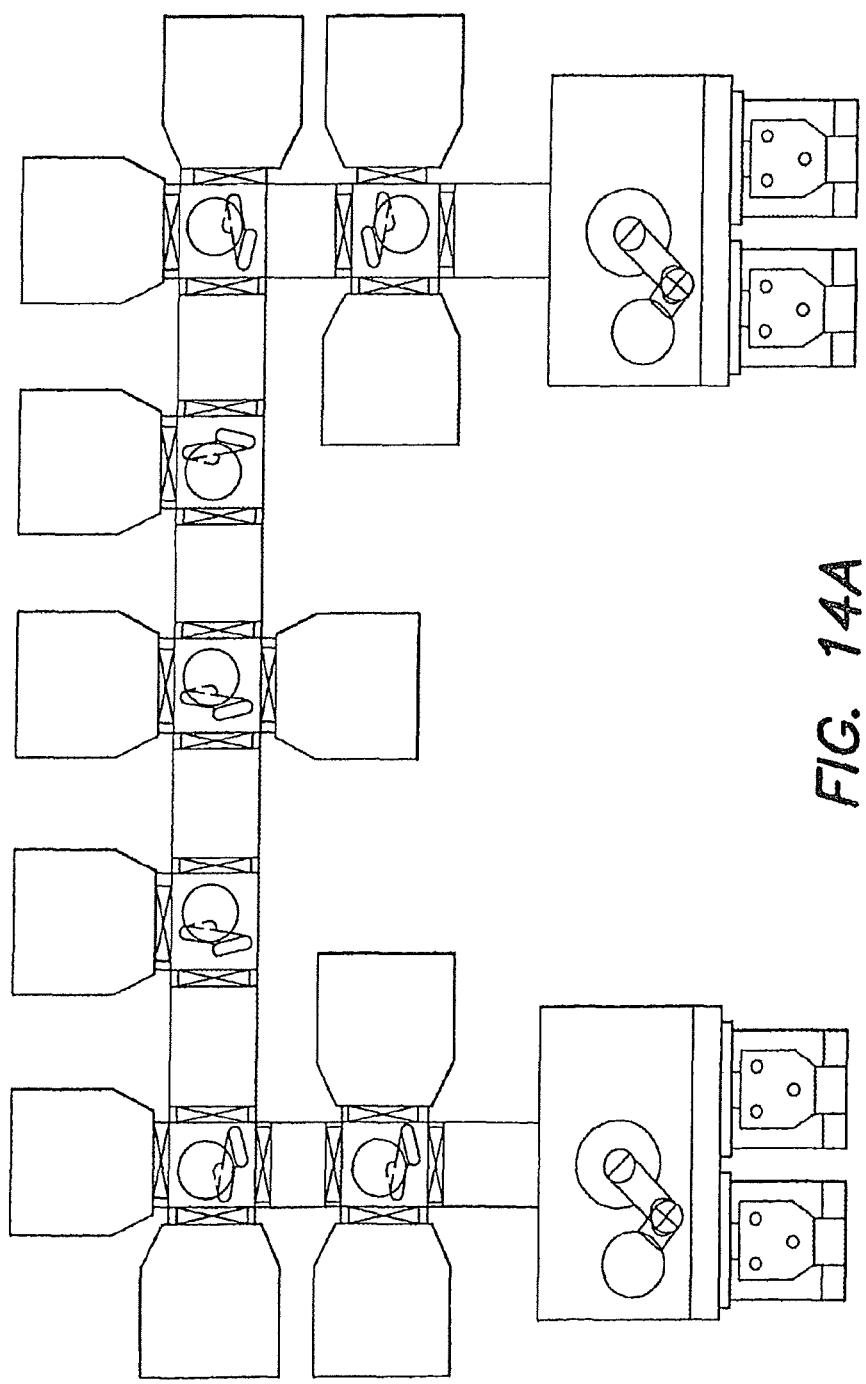
FIG. 14a shows a U-shaped configuration for a linear handling system.

FIG. 14 shows an external return system for a handling system having a linear architecture 14000. The return mechanism is optionally on the top of the linear vacuum chamber. On conventional vacuum handling systems, the return path is often through the same area as the entry path. This opens up the possibility of cross contamination, which occurs when clean wafers that are moving between process steps get contaminated by residuals entering the system from dirty wafers that are not yet cleaned. It also makes it necessary for the robot 4002 to handle materials going in as well as materials going out, and it makes it harder to control the vacuum environment. By exiting the vacuum system at the rear and moving the wafers on the top back to the front in an air tunnel 14012, there are some significant advantages: the air return may relatively cheap to implement; the air return may free up the vacuum robots 4002 because they do not have to handle materials going out; and the air return may keep clean finished materials out of the incoming areas, thereby lowering cross-contamination risks. Employing a small load lock 14010 in the rear may add some costs, and so may the air tunnel 14012, so in systems that are short and where vacuum levels and cross contamination are not so important, an air return may have less value, but in long systems with many integrated process steps the above-system air return could have significant benefits. The return system could also be a vacuum return, but that would be more expensive and more complicated to implement. It should be understood that while in some embodiments a load lock 14010 may be positioned at the end of a linear system, as depicted in FIG. 14, the load lock 14010 could be positioned elsewhere, such as in the middle of the system. In such an embodiment, a manufacturing item could enter or exit the system at such another point in the system, such as to exit the system into the air return. The advantage of a mid-system exit point may be that in case of a partial system failure, materials or wafers can be recovered. The advantage of a mid-system entry point may be that wafers can be inserted in multiple places in the system, allowing for a significantly more flexible process flow. In effect, a mid system entry or exit position behaves like two machines connected together by the mid-system position, effectively eliminating an EFEM position. It should also be understood that while the embodiment of FIG. 14 and subsequent figures is a straight line system, the linear system could be curvilinear; that is, the system could have curves, a U- or V-shape, an S-shape, or a combination of those or any other curvilinear path, in whatever format the manufacturer desires, such as to fit the configuration of a fabrication facility. In each case the system optionally includes an entry point and an exit point that is down the line (although optionally not a straight line) from the entry point. Optionally the air return returns the item from the exit point to the entry point. Optionally the system can include more than one exit point. In each case the robotic arms described herein can assist in efficiently moving items down the line, without the problems of other linear systems. FIG. 14A shows an example of a U-shaped linear system.

Referring still to FIG. 14, an embodiment of the system uses a dual carrier mechanism 14008 so that wafers that are finished can quickly be returned to the front of the system, but also so that an empty carrier 14008 can be placed where a full one was just removed. In embodiments the air return will feature a carrier 14008 containing N wafers. N can be optimized depending on the throughput and cost requirements. In embodiments the air return mechanism may contain empty carriers 14008 so that when a full carrier 14018 is removed from the vacuum load lock 14010, a new empty carrier 14008 can immediately be placed and load lock 14010 can evacuated to receive more materials. In embodiments the air return mechanism may be able to move wafers to the front of the system. At the drop-off point a vertical lift 14004 may be employed to lower the carrier to a level where the EFEM (Equipment Front End Module) robot can reach. At the load lock point(s) the vertical lift 14004 can lower to pick an empty carrier 14008 from the load lock.

In embodiments the air return mechanism may feature a storage area 14014 for empty carriers 14008, probably located at the very end and behind the location of the load lock

14010. The reason for this is that when the load lock 14010 releases a carrier 14018, the gripper 14004 can grip the carrier 14018 and move it forward slightly. The gripper 14004 can then release the full carrier 14018, move all the way back and retrieve an empty carrier 14008, place it on the load lock 14010. At this point the load lock 14010 can evacuate. The gripper 14004 can now go back to the full carrier 14018 and move it all the way to the front of the system. Once the carrier 14018 has been emptied by the EFEM, it can be returned to the very back where it waits for the next cycle.

It is also possible to put the lift in the load lock rather than using the vertical motion in the gripper, but that would be more costly. It would also be slightly less flexible. A manufacturer may want a vertical movement of the carrier 14018 in a few places, and putting it in the gripper 14004 would be more economical because the manufacturer then only needs one vertical mechanism.

Figure 15:
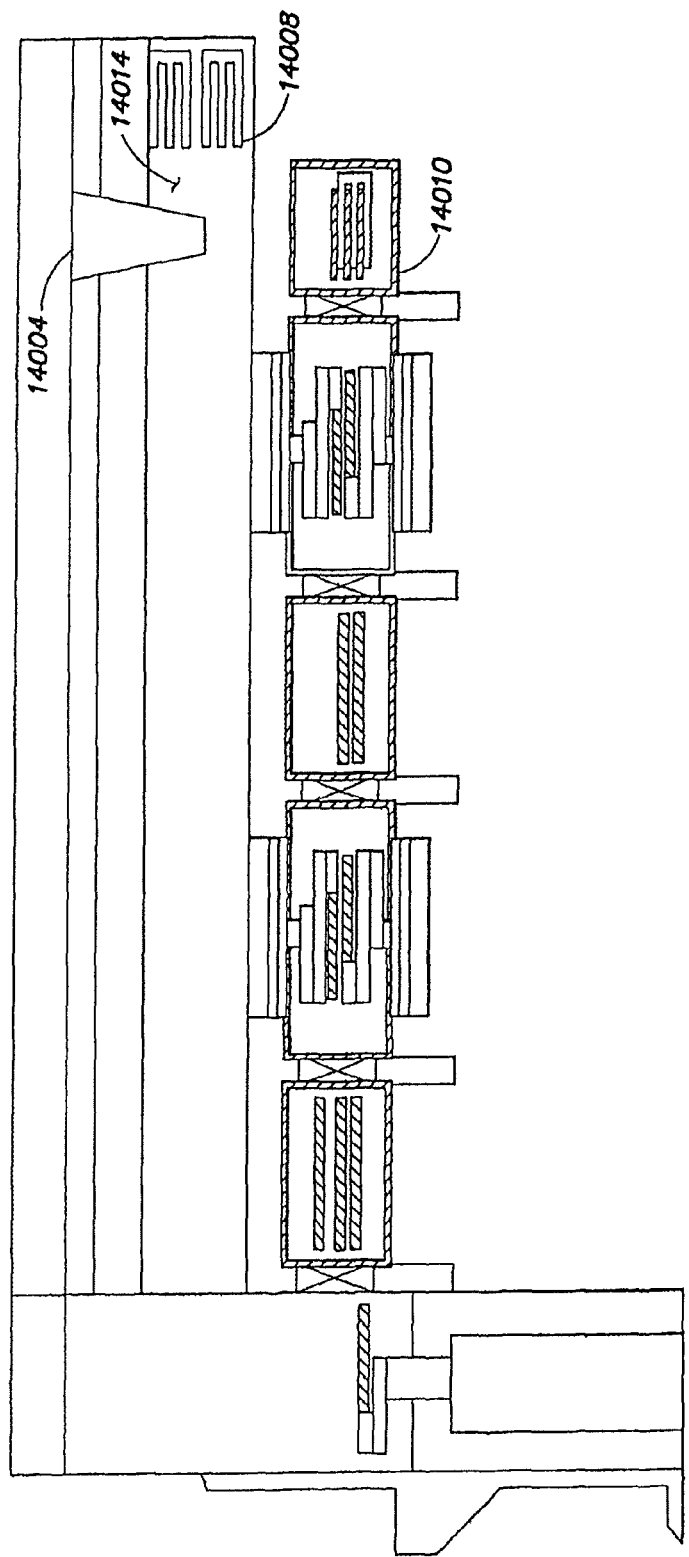
FIG. 15 shows certain details of an external return system for a handling system of FIG. 14.

FIG. 15 shows certain additional details of an external return system for a handling system of FIG. 14.

Figure 16:
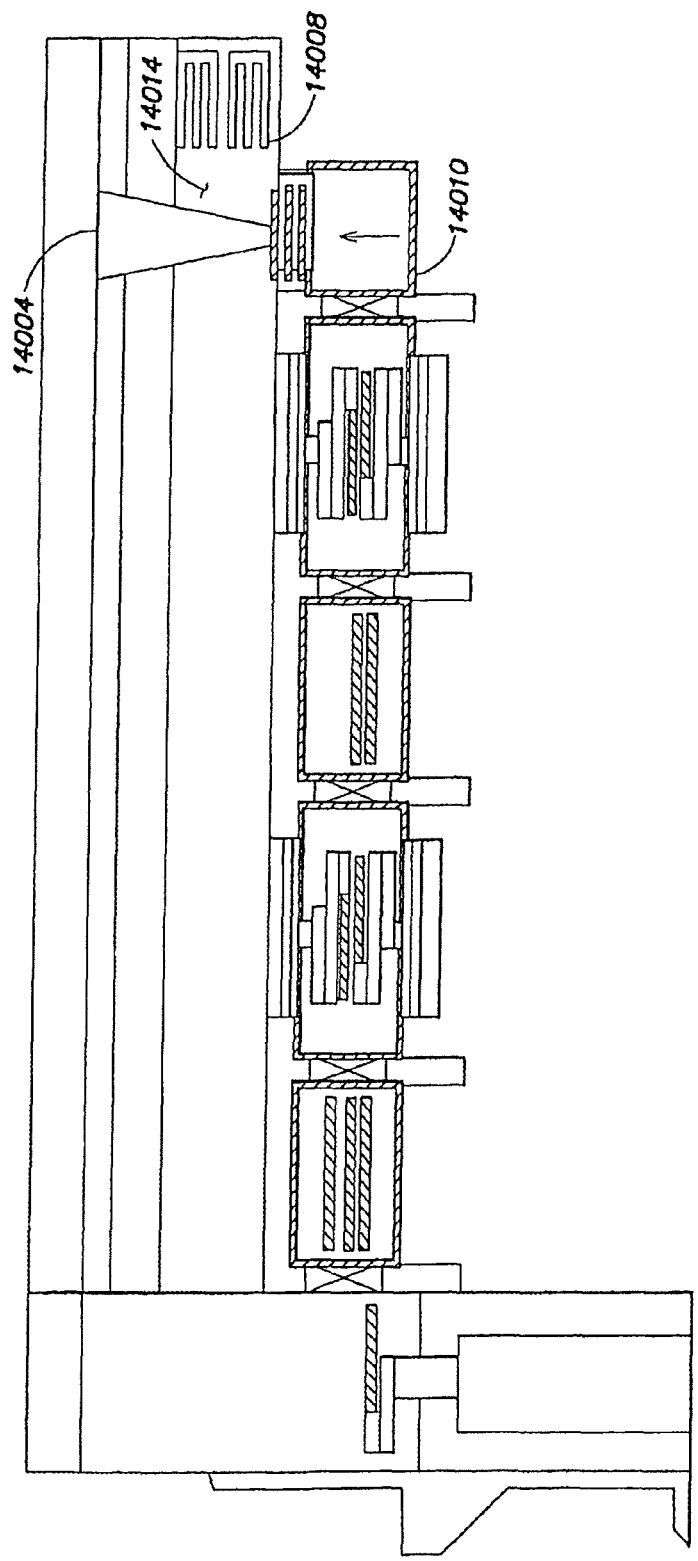
FIG. 16 shows additional details of an external return system for a handling system of FIG. 14.

FIG. 16 shows additional details of an external return system for a handling system of FIG. 14.

Figure 17:
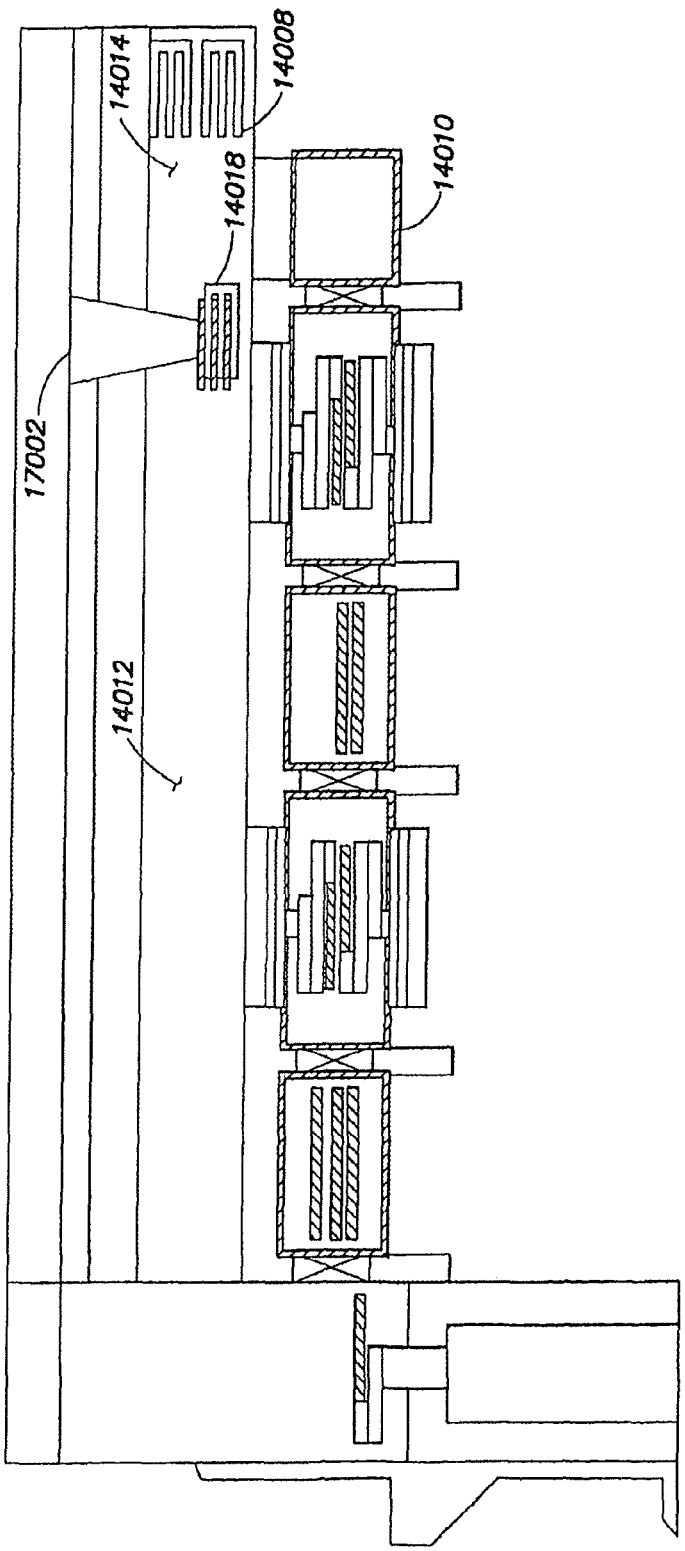
FIG. 17 shows movement of the output carrier in the return system of FIG. 14.

FIG. 17 shows movement of the output carrier 14018 in the return tunnel 14012 of FIG. 14.

Figure 18:
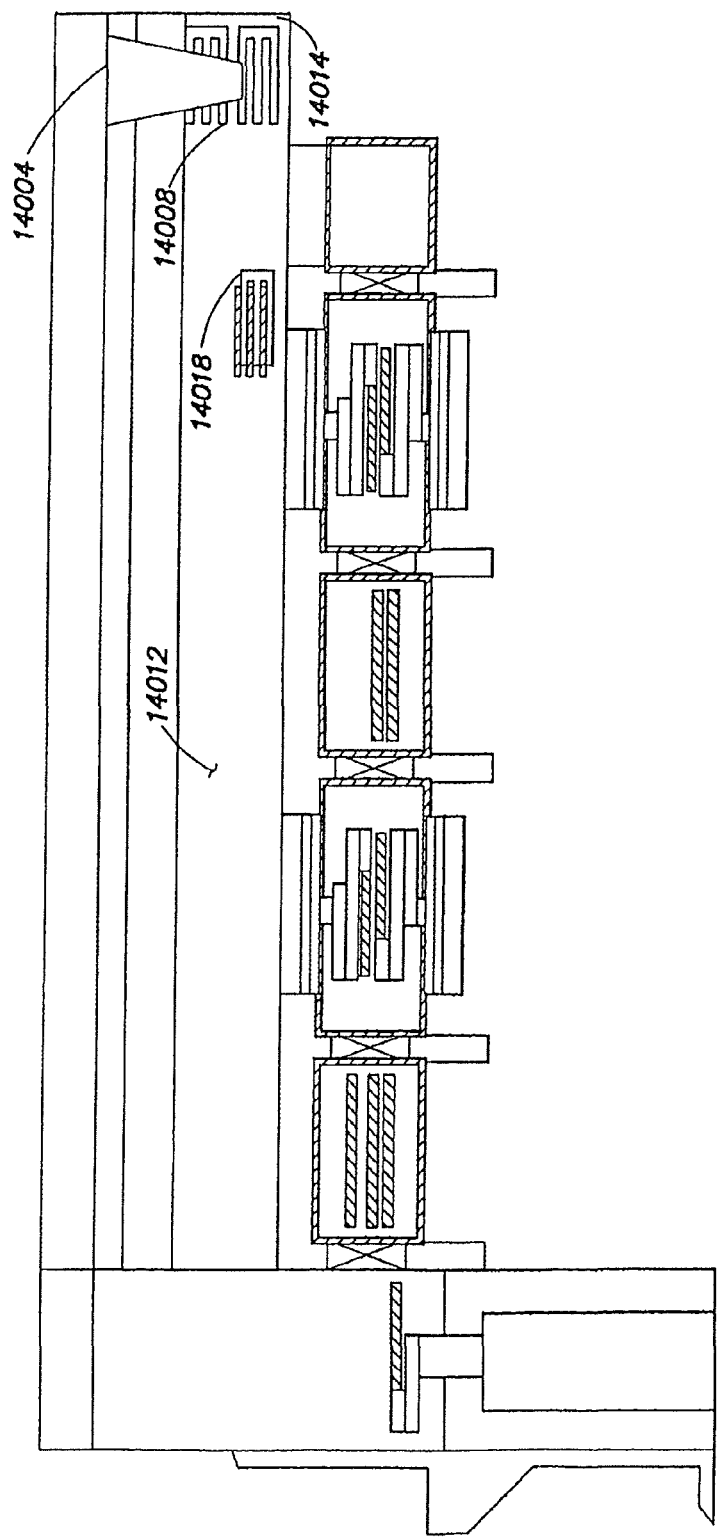
FIG. 18 shows handling of an empty carrier in the return system of FIG. 14.

FIG. 18 shows handling of an empty carrier 14008 in the return system 14012 of FIG. 14.

Figure 19:
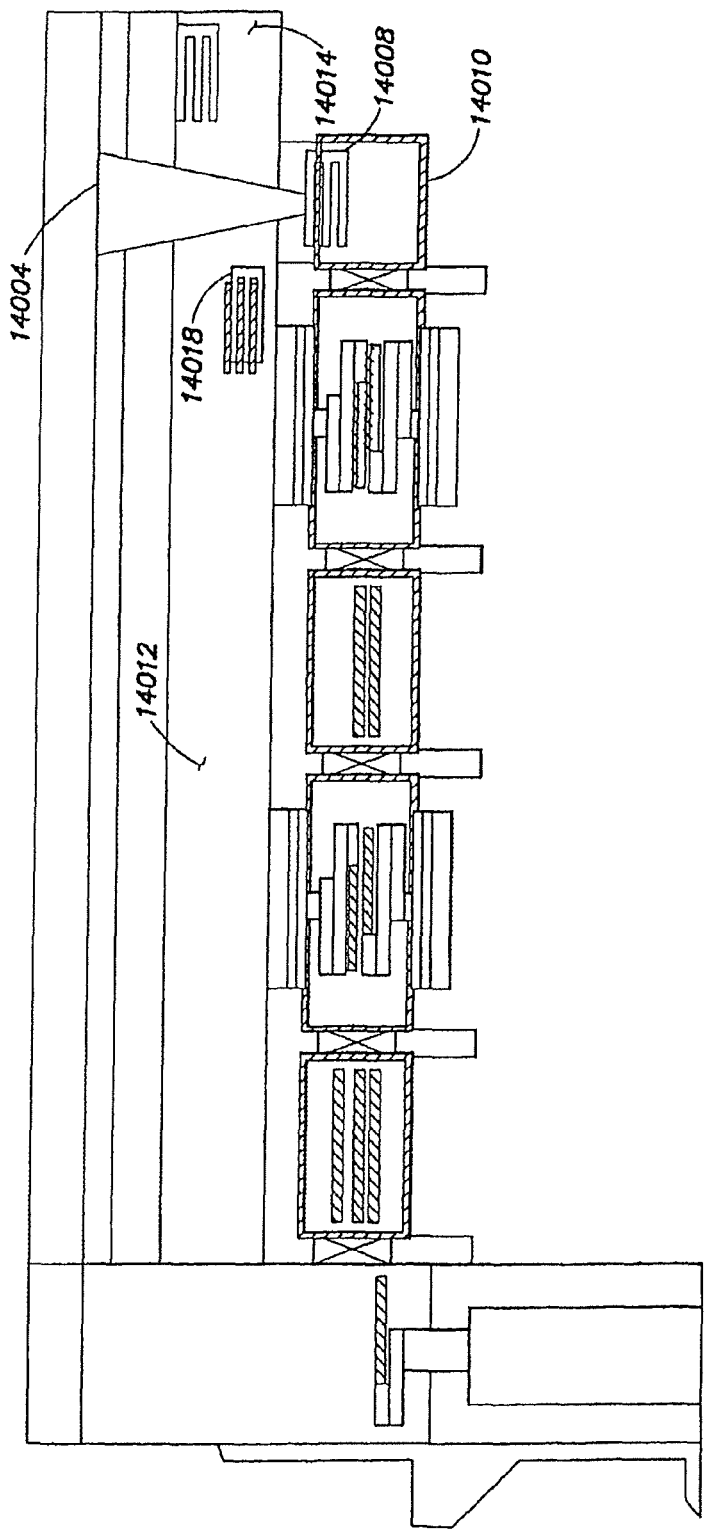
FIG. 19 shows movement of the empty carrier in the return system of FIG. 14 into a load lock position.

FIG. 19 shows movement of the empty carrier 14008 in the return tunnel 14012 of FIG. 14 into a load lock 14010 position.

Figure 20:
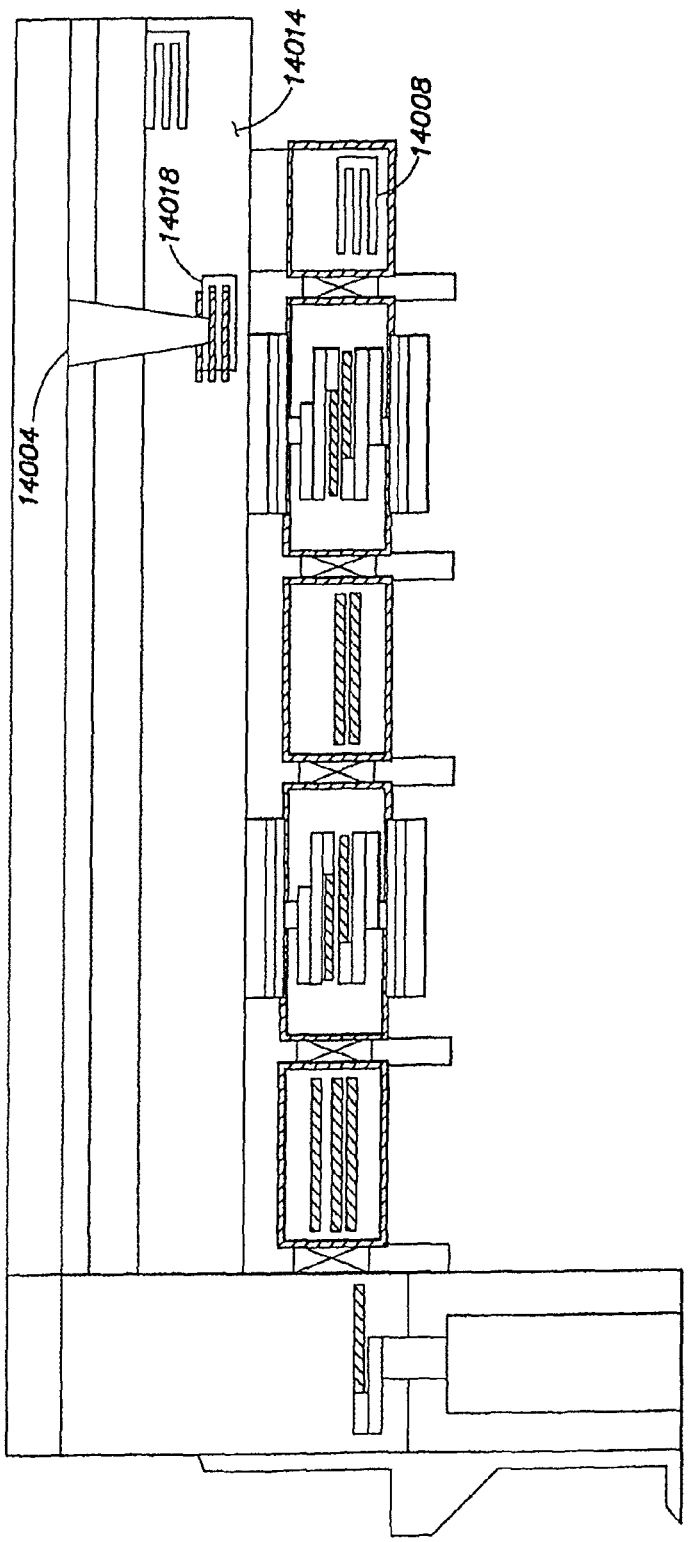
FIG. 20 shows the empty carrier lowered and evacuated and movement of the gripper in the return system of FIG. 14.

FIG. 20 shows the empty carrier 14008 lowered and evacuated and movement of the gripper 14004 in the return system of FIG. 14.

Figure 21:
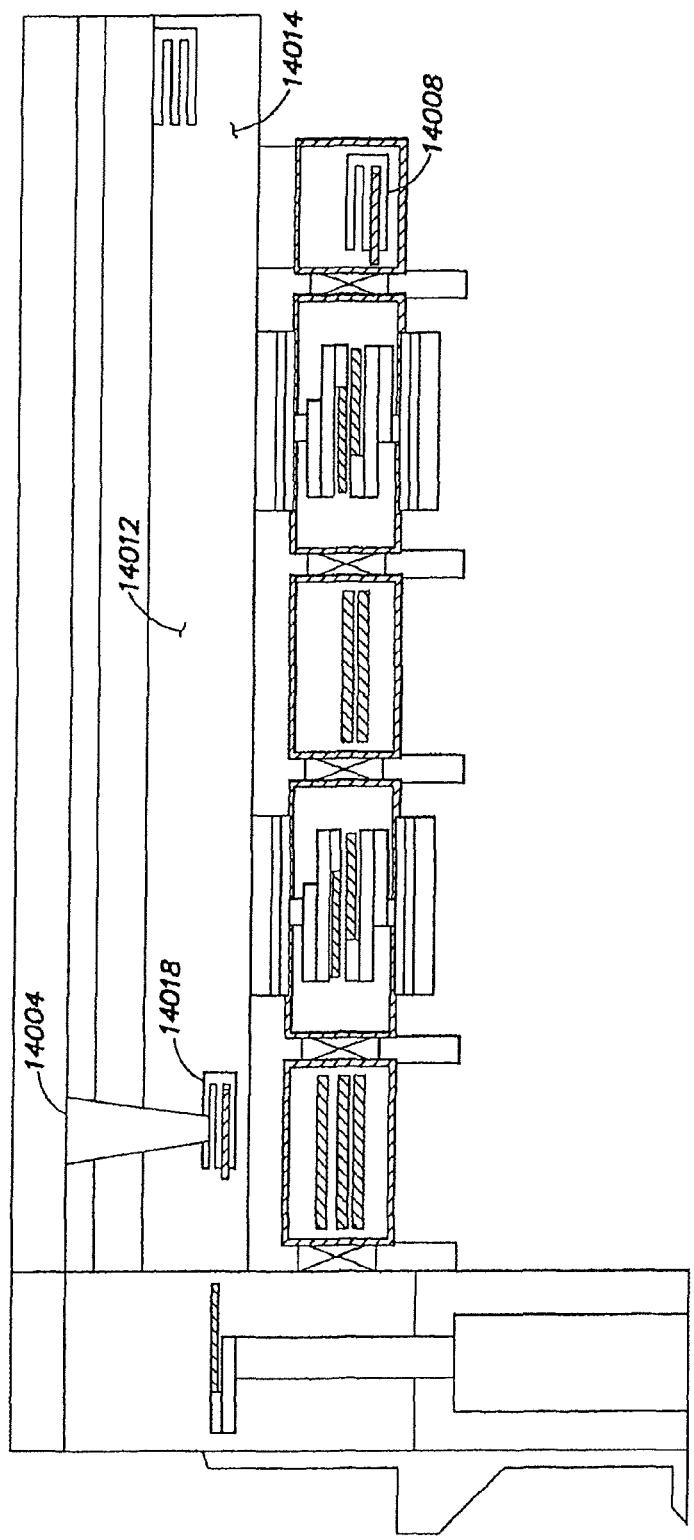
FIG. 21 shows an empty carrier receiving material as a full carrier is being emptied in the return system of FIG. 14.

FIG. 21 shows an empty carrier 14008 receiving material as a full carrier 14018 is being emptied in the return tunnel 14012 of FIG. 14.

Figure 22:
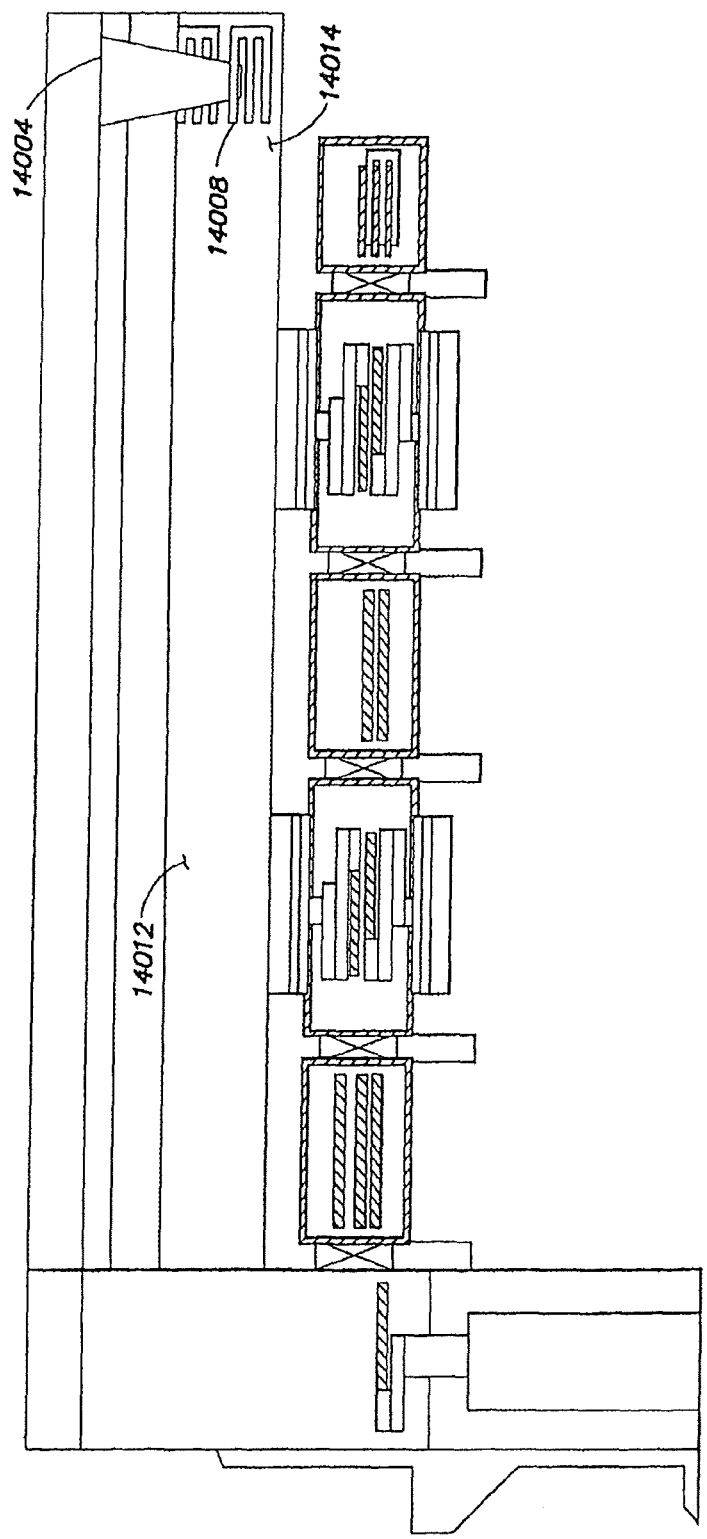
FIG. 22 shows an empty carrier brought to a holding position, starting a new return cycle in the return system of FIG. 14.

FIG. 22 shows an empty carrier 14008 brought to a holding position, starting a new return cycle in the return tunnel 14012 of FIG. 14.

Figure 23:
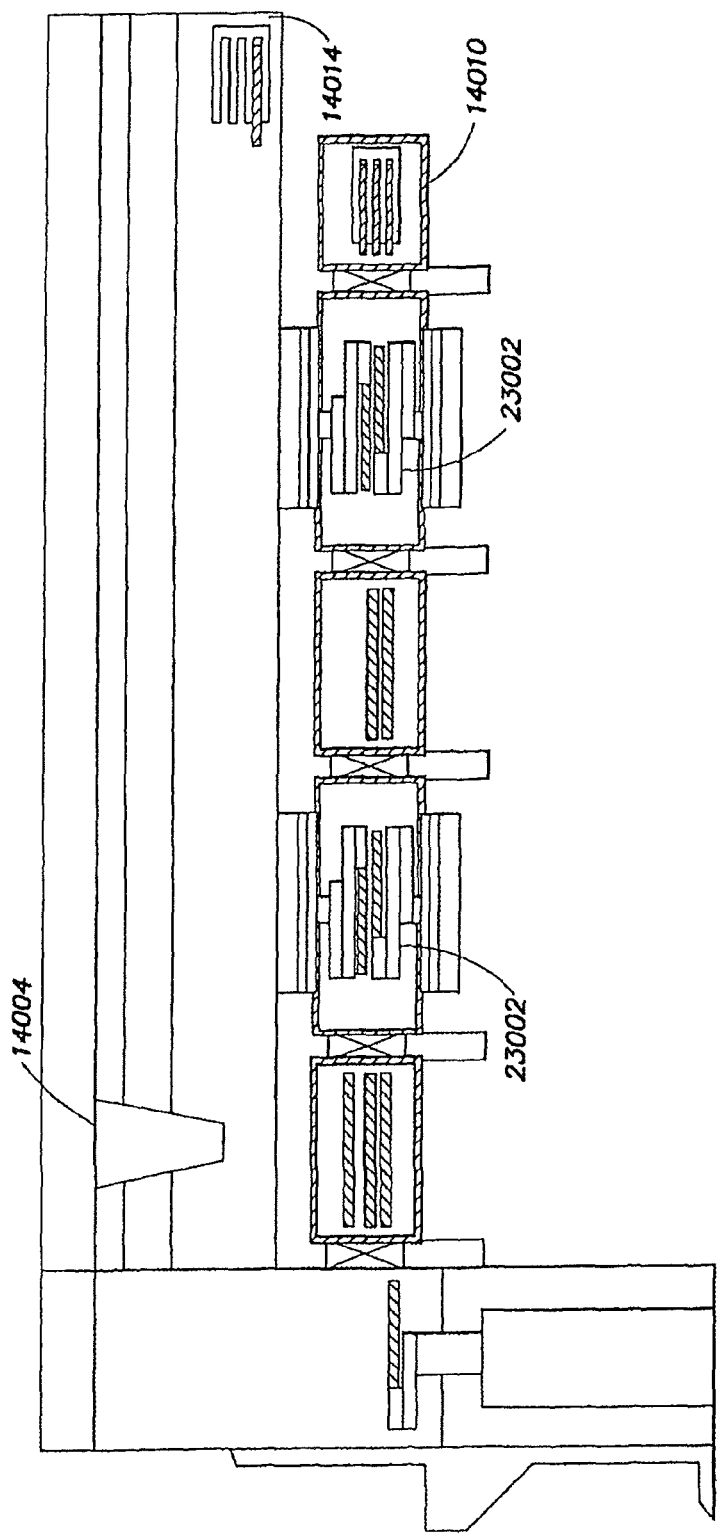
FIG. 23 shows an architecture for a handling facility for a manufacturing process, with a dual-arm robotic arm system and a return system in a linear architecture.

FIG. 23 shows an architecture for a handling facility for a manufacturing process, with a dual-arm robotic arm system 23002 and a return system in a linear architecture.

Figure 24:
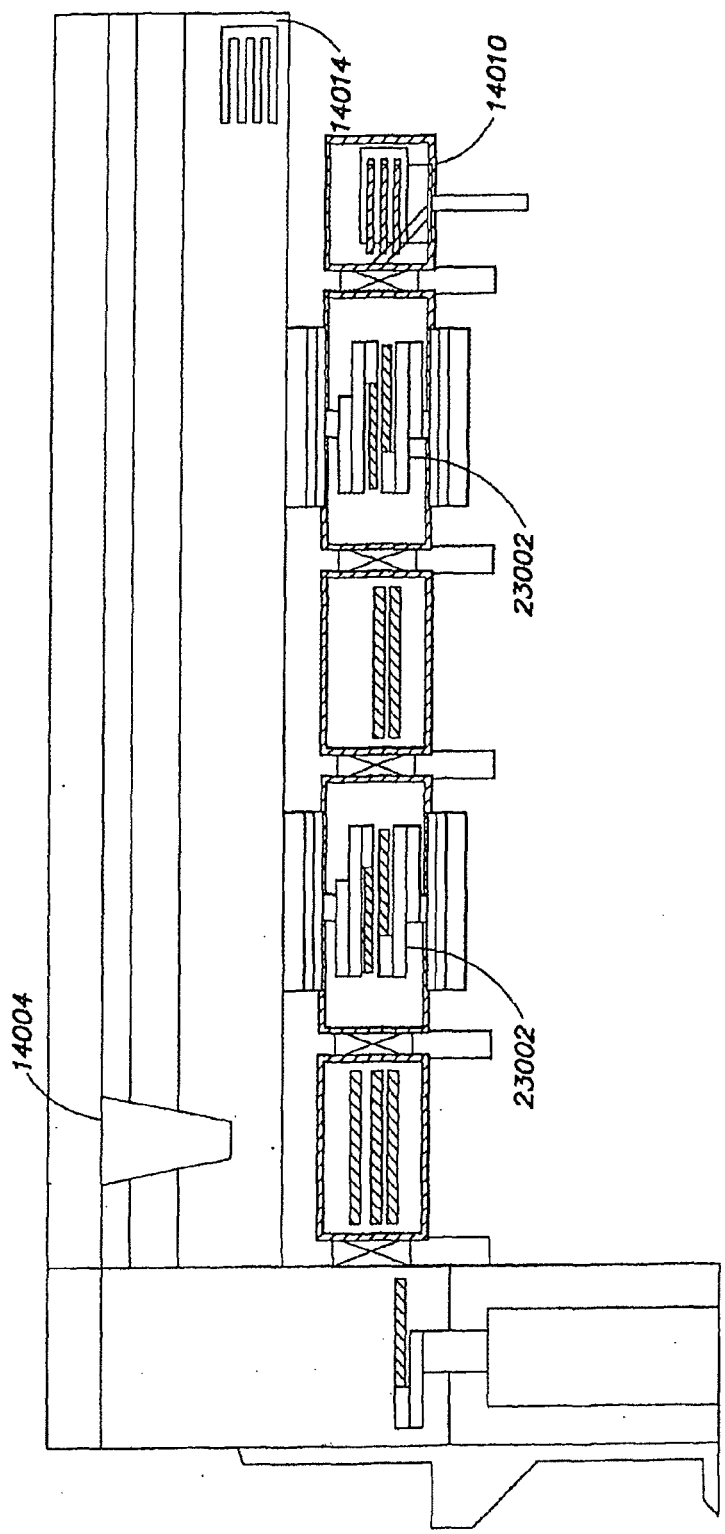
FIG. 24 shows an alternative embodiment of an overall system architecture for a handling method and system of the present invention.

FIG. 24 shows an alternative embodiment of an overall system architecture for a handling method and system of the present invention.

Figure 25B:
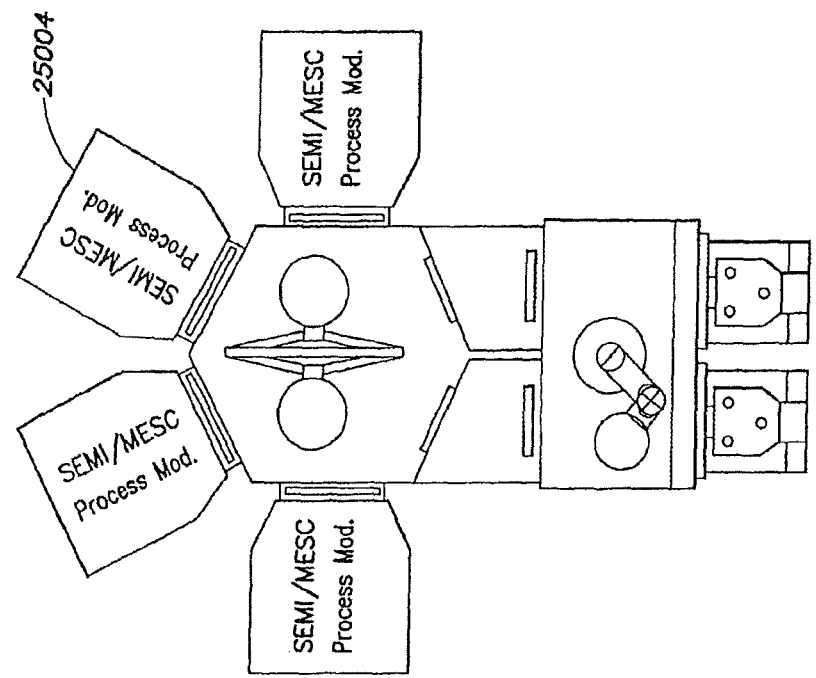
FIGS. 25A and 25B show a comparison of the footprint of a linear system as compared to a conventional cluster system.
Figure 25A:
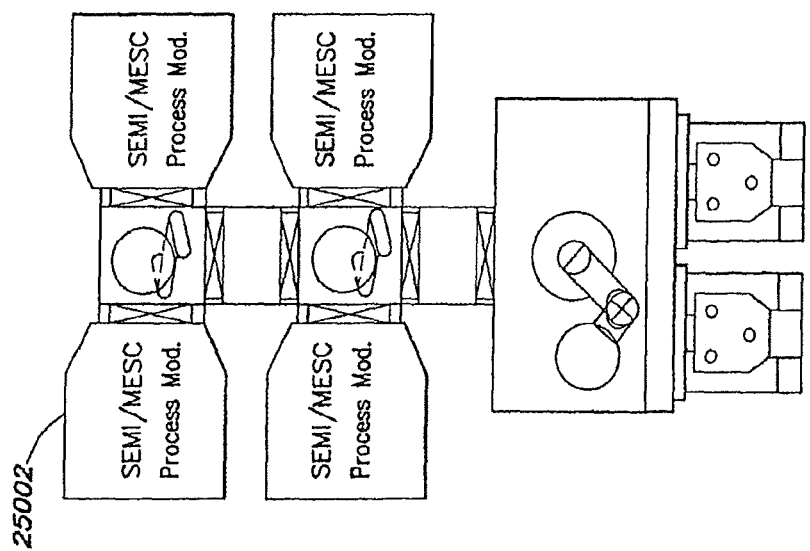

FIG. 25 shows a comparison of the footprint of a linear system 25002 as compared to a conventional cluster system 25004. Note that with the linear system 25002 the manufacturer can easily extend the machine with additional modules without affecting system throughput. For example, as shown in FIG. 25A, for the vacuum section only, W=2*750+2*60+440=2060. Similarly, D=350*2+440*1.5+3*60+745/2=1913, and A=3.94 m². With respect to FIG. 25B, for the vacuum section only, W=2*750+2*60+1000=2620. Similarly, D=920+cos(30)*(500+60+750)+sin(30)*745/2=2174; accordingly, A=6.9 m², which is 45% bigger.

Figure 26:
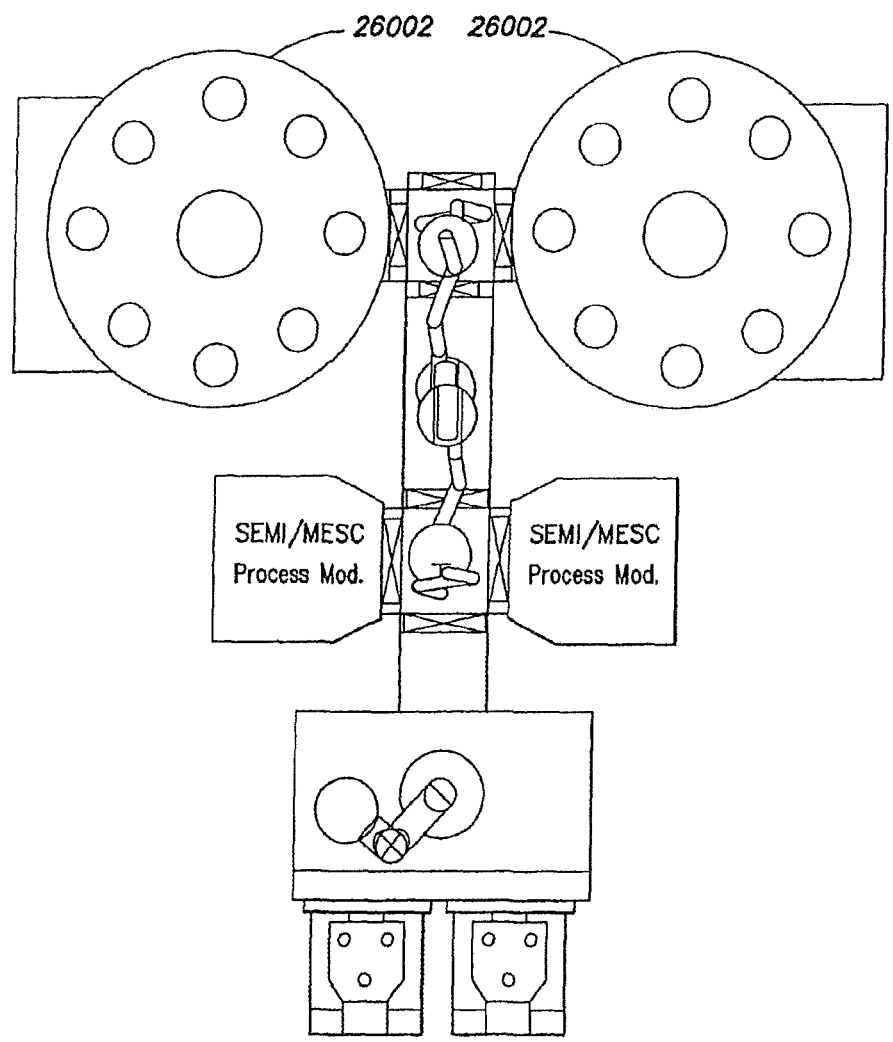
FIG. 26 shows a linear architecture deployed with oversized process modules in a handling system in accordance with embodiments of the invention.

FIG. 26 shows a linear architecture deployed with oversized process modules 26002 in a handling system in accordance with embodiments of the invention.

Figure 27:
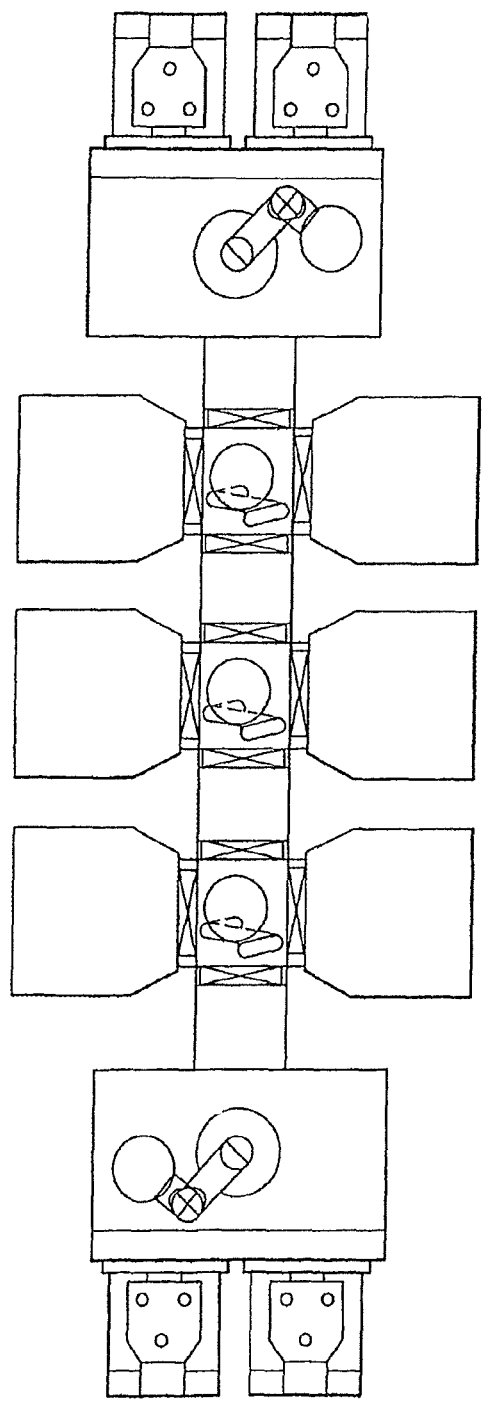
FIG. 27 shows a rear-exit architecture for a handling system in accordance with embodiments of the invention.

FIG. 27 shows a rear-exit architecture for a handling system in accordance with embodiments of the invention.

Figure 28:
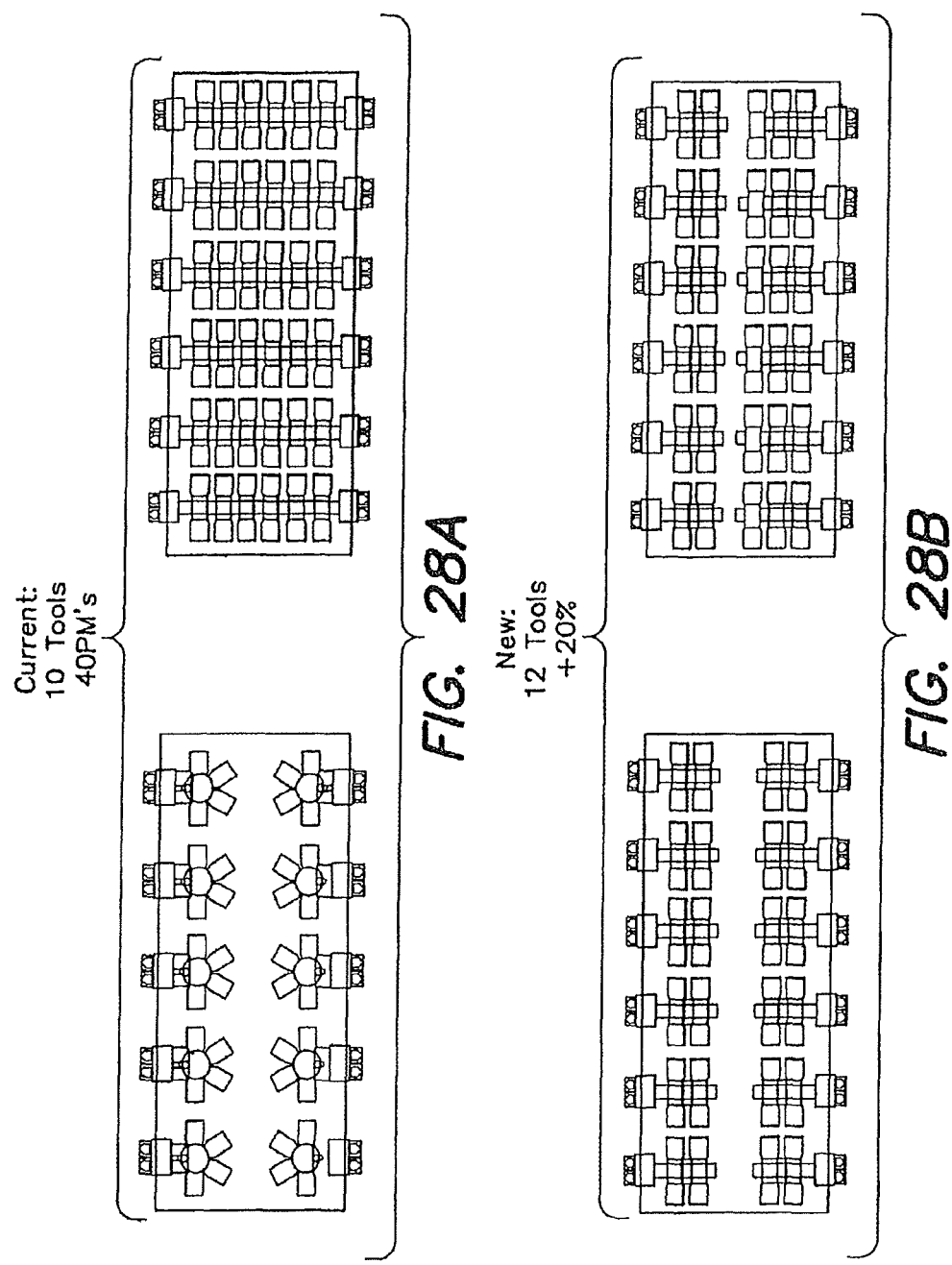
FIGS. 28A and 28B show a variety of layout possibilities for a fabrication facility employing linear handling systems in accordance with various embodiments of the invention.

FIG. 28 shows a variety of layout possibilities for a fabrication facility employing linear handling systems in accordance with various embodiments of the invention.

Figure 29:
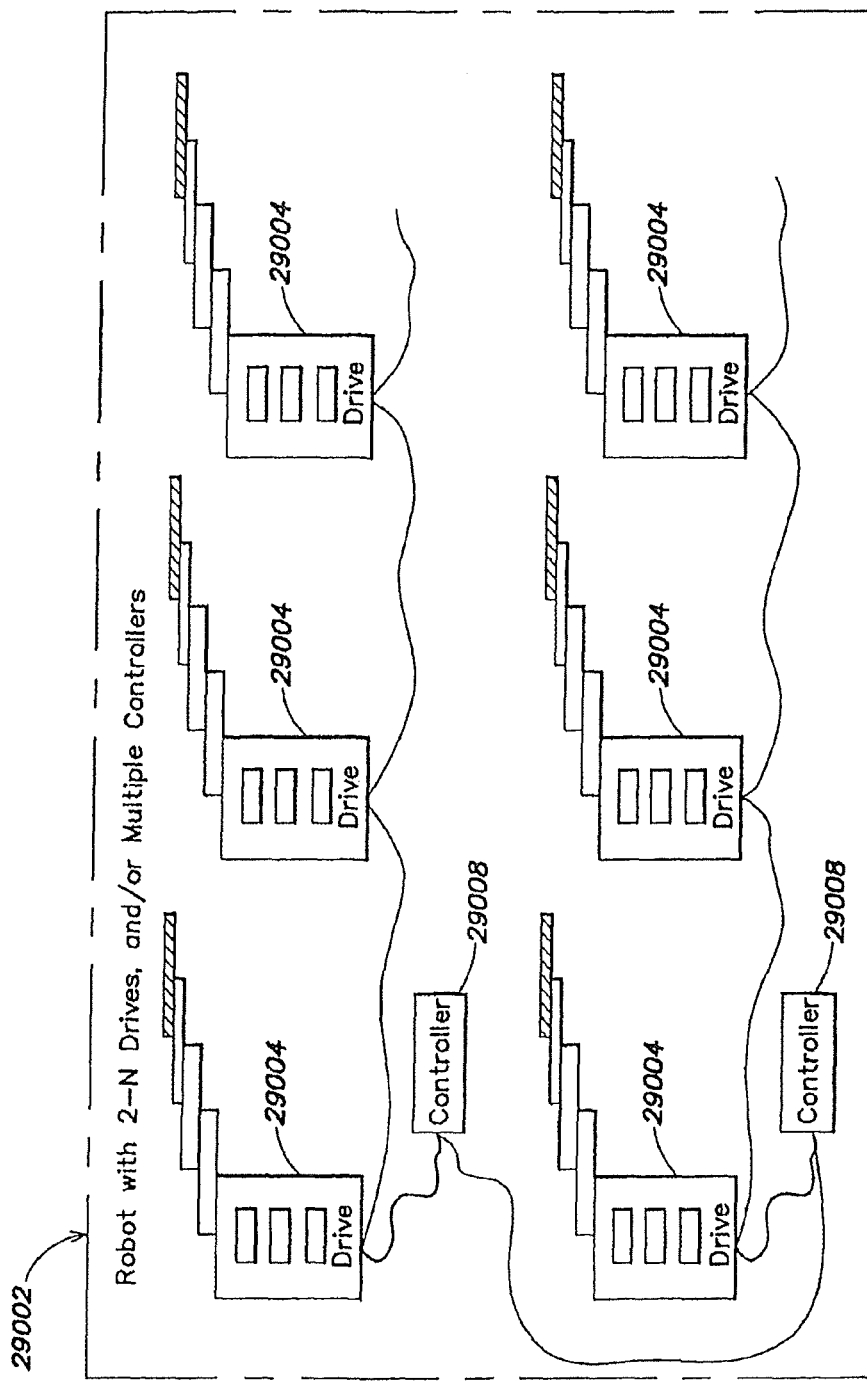
FIG. 29 shows an embodiment of the invention wherein a robot may include multiple drives and/or multiple controllers.

FIG. 29 shows an embodiment of the invention wherein a robot 29002 may include multiple drives 29004 and/or multiple controllers 29008. In embodiments a controller 29008 may control multiple drives 29004 as well as other peripheral devices such as slot valves, vacuum gauges, thus a robot 29002 may be a controller 29008 with multiple drives 29004 or multiple controllers 29008 with multiple drives 29004.

Figure 30:
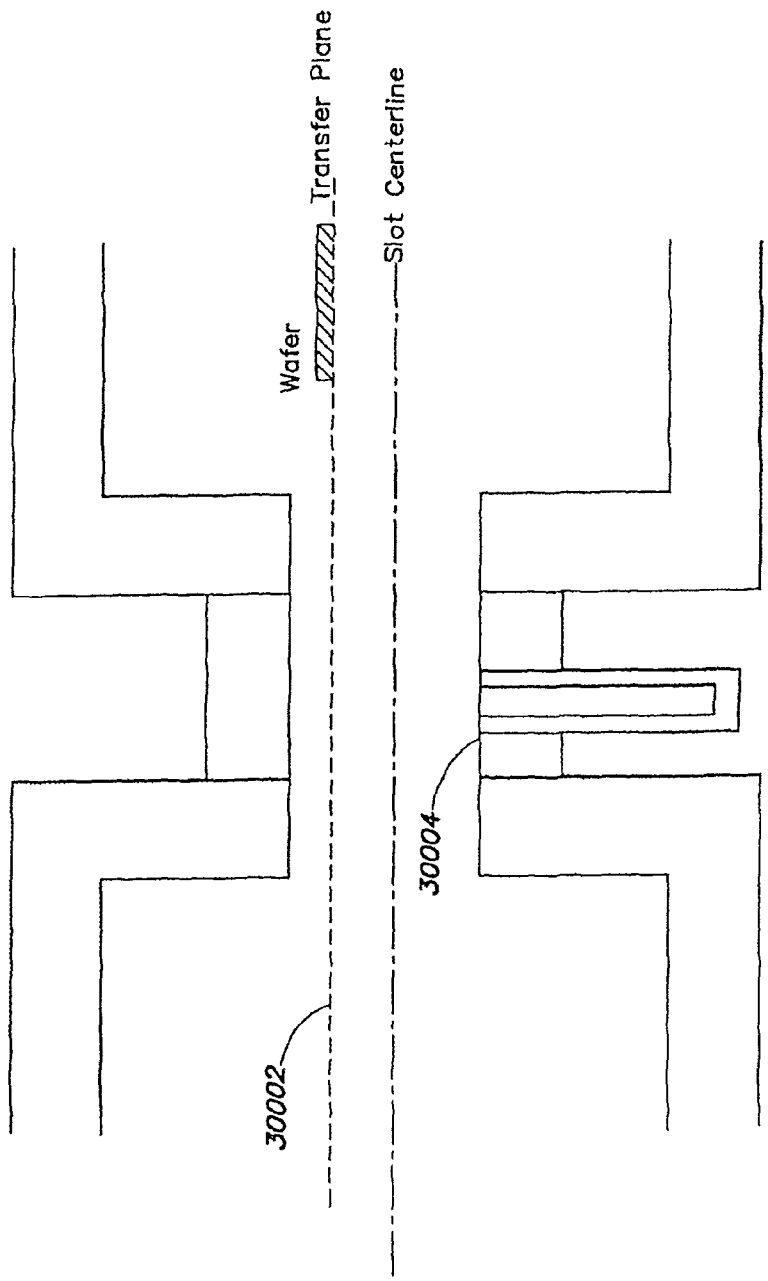
FIG. 30 shows transfer plane and slot valve characteristics relevant to embodiments of the invention.

FIG. 30 shows transfer plane 30002 and slot valve 30004 characteristics relevant to embodiments of the invention.

Figure 31:
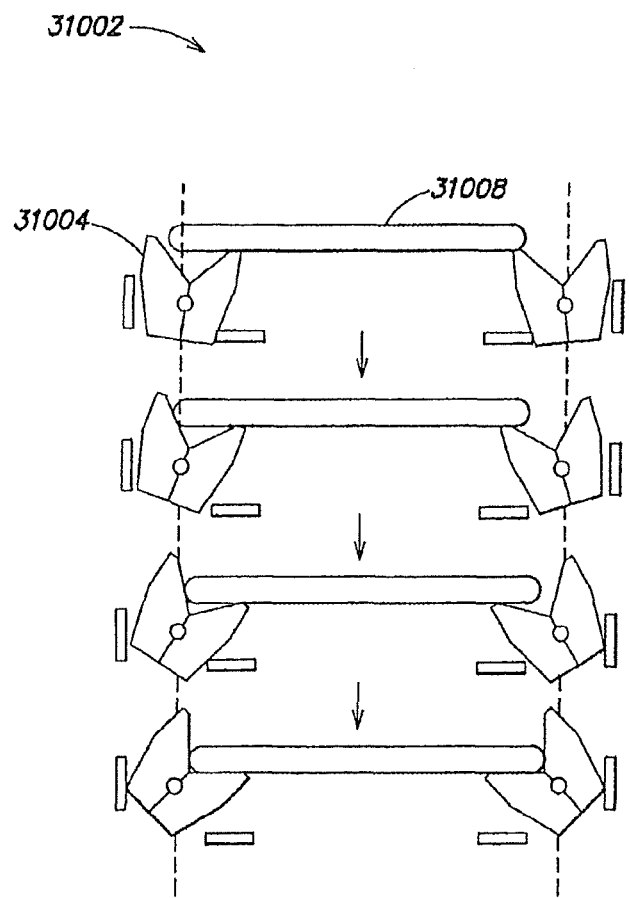
FIG. 31 shows a tumble gripper for centering wafers.
Figure 32:
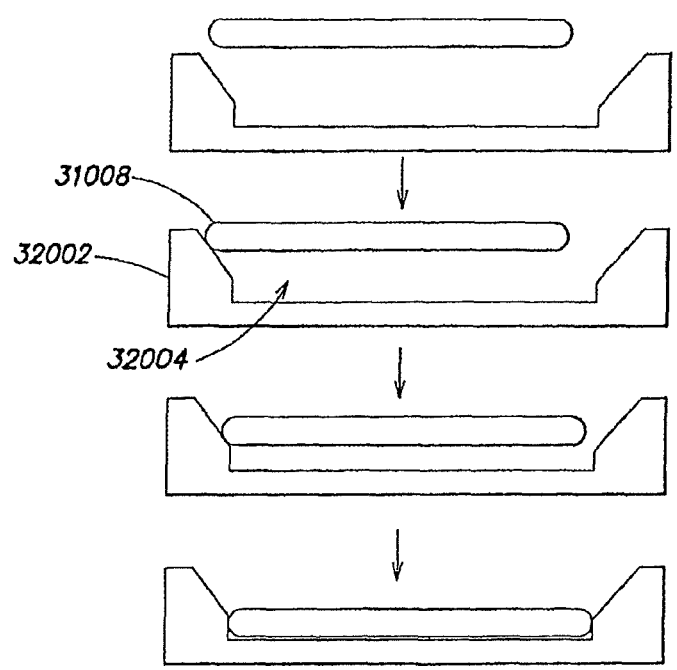
FIG. 32 shows a passive sliding ramp for centering wafers.

FIG. 31 shows a tumble gripper 31002 for centering wafers. The advantage of the tumble gripper 31002 over the passive centering gripper 32002 in FIG. 32 is that there is less relative motion between the tumblers 31004 and the backside of the wafer 31008. The tumblers 31004 may gently nudge the wafer 31008 to be centered on the end effector, supporting it on both sides as it moves down. In certain manufacturing processes it may be desirable to center wafers 31008, such as in a vacuum environment. The tumble gripper 31004 may allow the handling of very fragile wafers 31008, such as when employing an end effector at the end of a robotic arm, because it supports both ends of the wafer during handling.

FIG. 32 shows a passively centering end effector 32002 for holding wafers 31008. The wafer 31008 is typically slightly off-center when the end effector lifts (or the wafer 31008 is lowered). This results in the wafer 31008 sliding down the ramp and dropping into the cutout 32004. This can result in the wafer 31008 abruptly falling or moving, which in turn can create particles.

The methods and systems disclosed herein offer many advantages in the handling of materials or items during manufacturing processes. Among other things, vacuum isolation between robots may be possible, as well as material buffering between robots. A manufacturer can return finished wafers over the top of the system without going through vacuum, which can be a very substantial advantage, requiring only half the necessary handling steps, eliminating cross contamination between finished and unfinished materials and remaining compatible with existing clean room designs. When a manufacturer has relatively dirty wafers entering the system, the manufacturer may want to isolate them from the rest of the machine while they are being cleaned, which is usually the first step in the process. It may be advantageous to keep finished or partially finished materials away from the cleaning portion of the machine.

Other advantages may be provided by the methods and systems disclosed herein. The dual arms (top mounted and bottom mounted) may work in coordinated fashion, allowing very fast material exchanges. Regardless of the exact arm design (3-link, 4-link or other), mounting an arm in the lid that is not mechanically connected to the arm in the bottom can be advantageous. The link lengths of the 4-link SCARA arm provided herein can be quite advantageous, as unlike conventional arms they are determined by the mechanical limits of slot valves and chamber radius. The 4-link SCARA arms disclosed herein are also advantageous in that they can use two motors for the links, along with a Z motor, rather than three motors plus the Z motor.

A linear vacuum system where materials exit in the rear may offer substantial benefits. Another implementation may be to have both the entry system and exit system installed through two opposing walls.

The 4-link SCARA arm disclosed herein may also allow link L3 to swing into and over link L2 for the top robot drive. This may not be easily done with the 3-link SCARA, nor with existing versions of 4-link SCARA arms, because they have the wrong link lengths.

The gripper for carriers and the multiple carrier locations in the linear system may also offer substantial benefits in materials handling in a linear manufacturing architecture. Including vertical movement in the gripper and/or in the rear load lock may offer benefits as well.

While the invention has been described in connection with certain preferred embodiments, one of ordinary skill in the art will recognize other embodiments that are encompassed herein.

Figure 33:
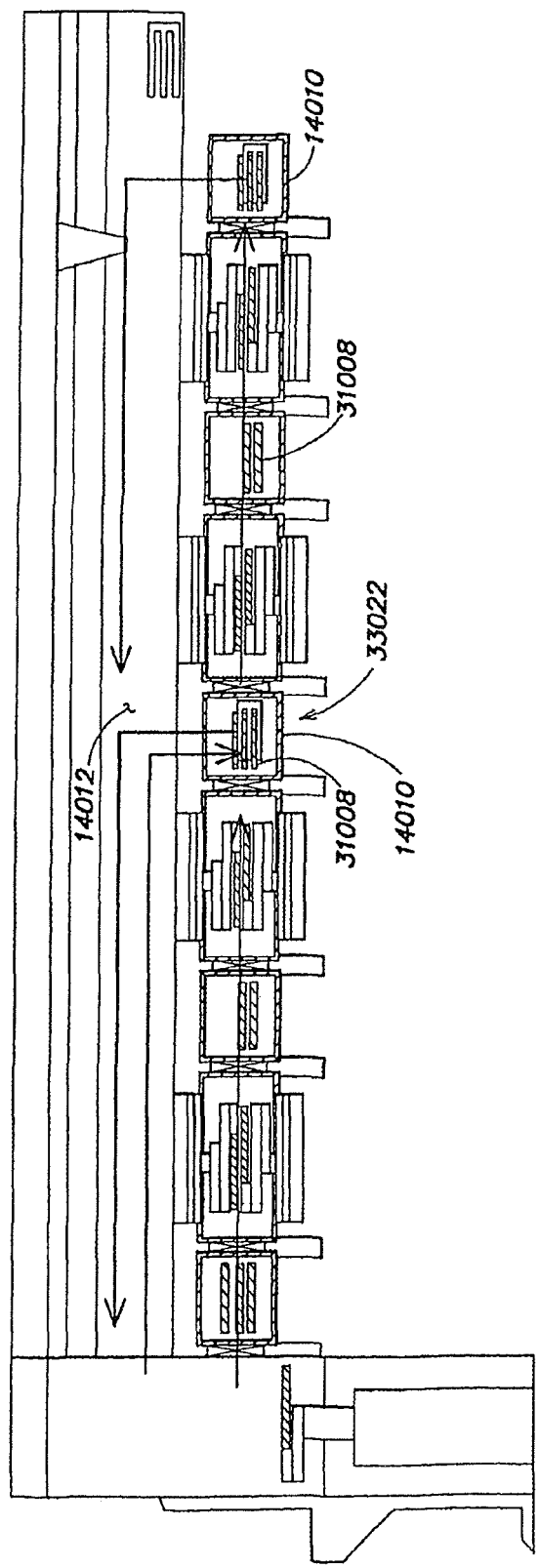
FIG. 33 illustrates a fabrication facility including a mid-entry facility.

FIG. 33 illustrates a fabrication facility including a mid-entry point 33022. In an embodiment, the fabrication facility may include a load lock 14010 mid-stream 33002 where wafers 31008 can be taken out or entered. There can be significant advantages to such a system, including providing a processing facility that provides dual processing capabilities (e.g. connecting two machines behind each other, but only need to use one EFEM). In an embodiment, the air return system 14012 can also take new wafers 31008 to the midpoint 33022 and enter wafers 31008 there.

Figure 34A:
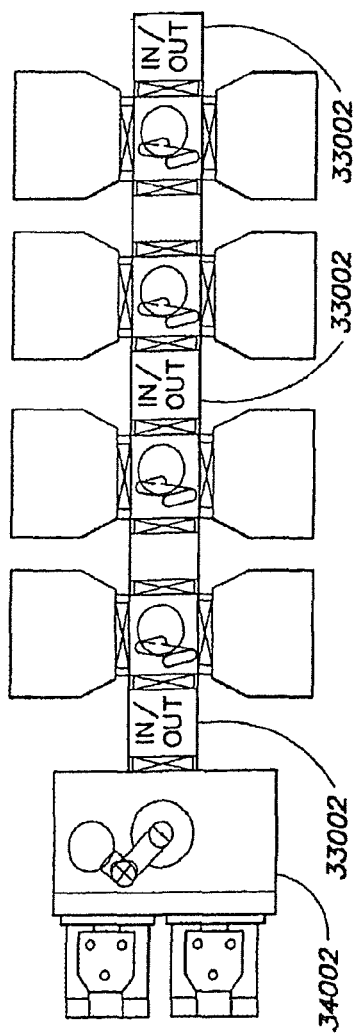
FIGS. 34A, 34B and 34C illustrate a fabrication facility including a mid-entry facility from a top view.
Figure 34C:
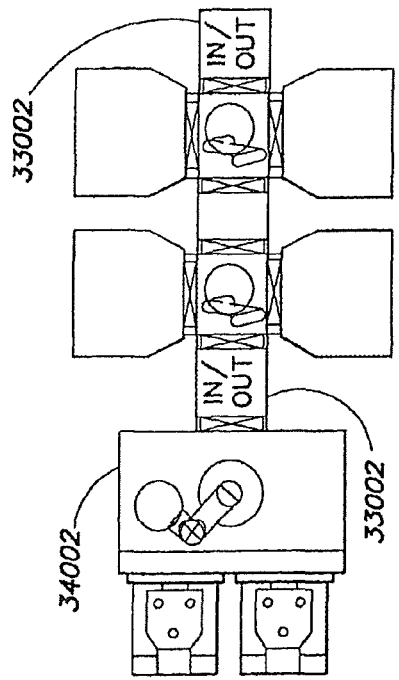
Figure 34B:
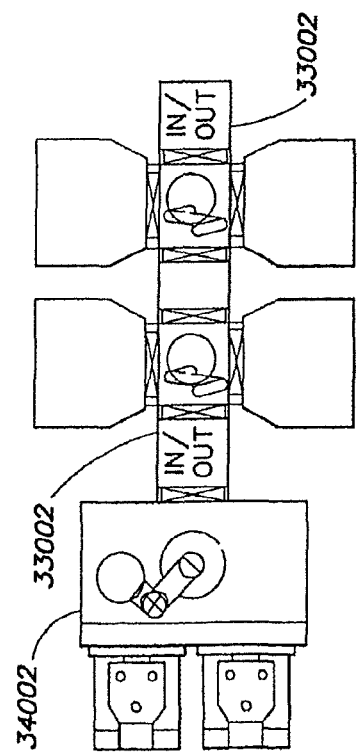

FIG. 34 illustrates several top views of a fabrication facility with mid-entry points 33002. The figure also illustrates how the combination of a mid-entry point effectively functions to eliminate one of the EFEMs 34002.

Figure 35:
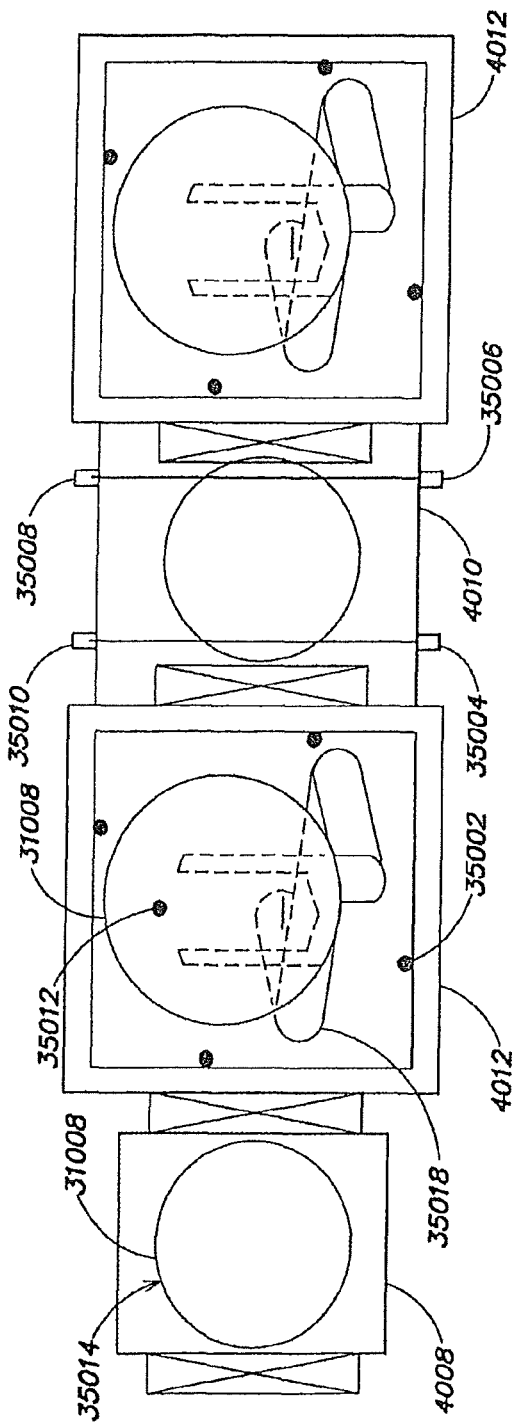
FIG. 35 illustrates a fabrication facility including the placement of optical sensors for detection of robotic arm position and materials in accordance with embodiments of the invention.

FIG. 35 illustrates a fabrication facility including a series of sensors 35002. In many fabrication facilities such sensors 35002 are commonly used to detect whether a material 35014 is still present on a robotic arm 35018. Such sensors 35002 may be commonly placed at each vacuum chamber 4012 entry and exit point. Such sensors 35002 may consist of a vertical optical beam, either employing an emitter and detector, or employing a combination emitter/detector and a reflector. In a vacuum handling facility, the training of robotic stations is commonly accomplished by a skilled operator who views the position of the robot arm and materials and adjusts the robot position to ensure that the material 35014 is deposited in the correct location. However, frequently these positions are very difficult to observe, and parallax and other optical problems present significant obstacles in properly training a robotic system. Hence a training procedure can consume many hours of equipment downtime.

Several automated training applications have been developed, but they may involve running the robotic arm into a physical obstacle such as a wall or edge. This approach has significant downsides to it: physically touching the robot to an obstacle risks damage to either the robot or the obstacle, for example many robot end effectors are constructed using ceramic materials that are brittle, but that are able to withstand very high wafer temperatures. Similarly, inside many process modules there objects that are very fragile and easily damaged. Furthermore, it may not be possible to employ these auto-training procedures with certain materials, such as a wafer 31008 present on the robot end effector. Moreover, the determination of vertical position is more difficult because upward or downward force on the arm caused by running into an obstacle is much more difficult to detect.

In the systems described herein, a series of sensors 35002-35010 may include horizontal sensors 35004-35010 and vertical sensors 35002. This combination of sensors 35002-35010 may allow detection, for example through optical beam breaking, of either a robotic end effector, arm, or a handled object. The vertical sensor 35002 may be placed slightly outside the area of the wafer 31008 when the robotic arm 35018 is in a retracted position. The vertical sensor 35002 may also, or instead, be placed in a location such as a point 35012 within the wafer that is centered in front of the entrance opening and covered by the wafer when the robot is fully retracted. In this position the sensor may be able to tell the robotic controller that it has successfully picked up a wafer 31008 from a peripheral module.

Horizontal sensors 35004-35010 may also be advantageously employed. In vacuum cluster tools, horizontal sensors 35004-35010 are sometimes impractical due to the large diameter of the vacuum chamber, which may make alignment of the horizontal sensors 35004-35010 more complicated. In the systems described above, the chamber size may be reduced significantly, thus may make it practical to include one or more horizontal sensors 35004-35010.

Figure 36:
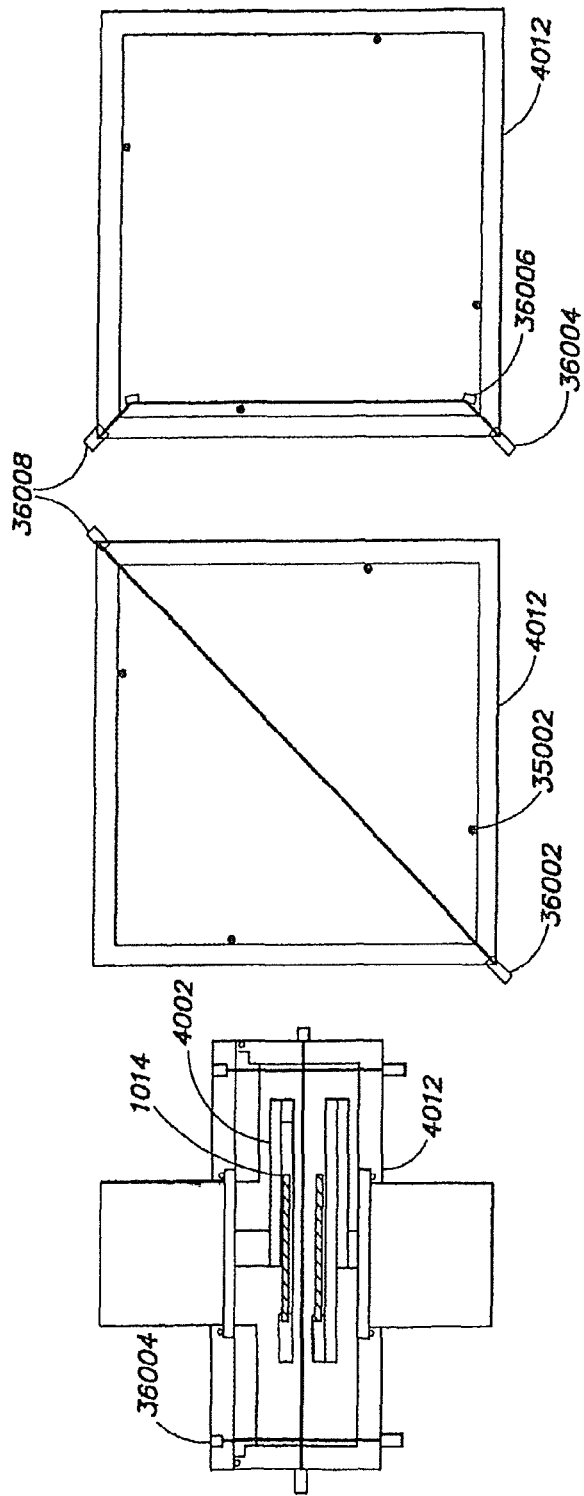
FIGS. 36A, 36B and 36C illustrate a fabrication facility in a cross-sectional side view showing optical beam paths and alternatives beam paths.

FIG. 36 illustrates other possible locations of the horizontal sensors 35004-35010 and vertical sensors 35002, such as straight across the chamber (36002 and 36008) and/or through mirrors 36006 placed inside the vacuum system.

Figure 37:
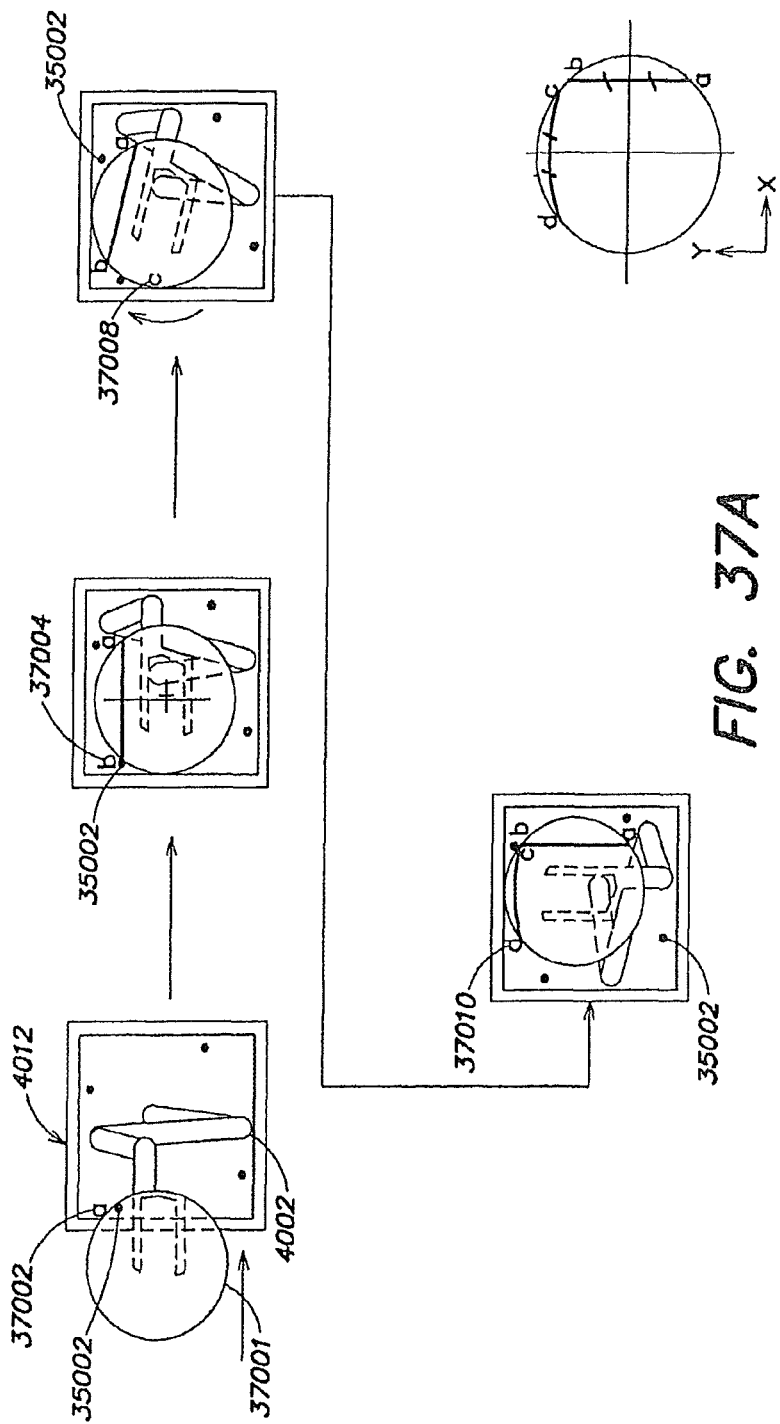
FIGS. 37A and 37B illustrate how optical sensors can be used to determine the center of the material handled by a robotic arm.

FIG. 37 illustrates a possible advantage of placing the sensor 35002 slightly outside the wafer 37001 radius when the robot arm is fully retracted. During a retract motion the sensor 35002 detects the leading edge of the wafer 37001 at point "a" 37002 and the trailing edge at point "b" 37004. These results may indicate that the wafer 37001 was successfully retrieved, but by tying the sensor 35002 signal to the encoders, resolvers or other position elements present in the robotic drive, one can also calculate if the wafer 37001 is centered with respect to the end effector. The midpoint of the line segment "a-b" 37002 37004 should correspond to the center of the end effector because of the circular geometry of a wafer 37001. If the wafer 37001 slips on the end effector, inconsistent length measurements may reveal the slippage.

Additionally, during a subsequent rotation and movement, a second line segment "c-d" 37008 37010 may be detected when the wafer 37001 edges pass through the sensor. Again, the midpoint between "c" 37008 and "d" 37010 should coincide with the center of the end effector, and may permit a measurement or confirmation of wafer centering.

The above method may allow the robot to detect the wafer 37001 as well as determine if the wafer 37001 is off-set from the expected location on the end effector.

The combination of horizontal and vertical sensors 35002-35010 may allow the system to be taught very rapidly using non-contact methods: the robotic arm and end effectors may be detected optically without the need for mechanical contact. Furthermore, the optical beams can be used during real-time wafer 37001 handling to verify that wafers 37001 are in the correct position during every wafer 37001 handling move.

Figure 38:
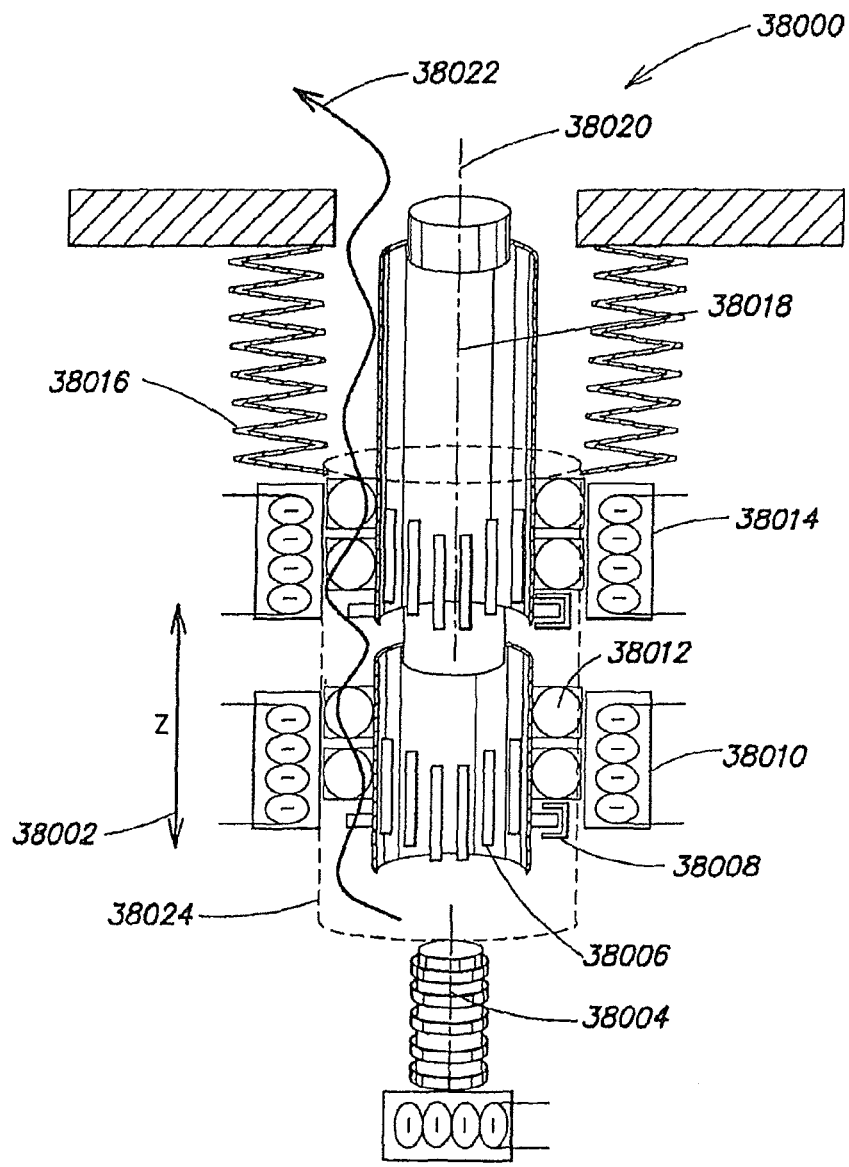
FIG. 38 shows a conventional 3-axis robotic vacuum drive architecture

FIG. 38 illustrates a conventional vacuum drive 38000 with two rotary axes 38020 and 38018 and a vertical (Z) axis 38004. A bellows 38016 may allow for the vertical Z-axis 38002 motion. A thin metal cylinder 38024 affixed to the bottom of the bellows 18016 may provide a vacuum barrier between the rotor and the stator of the motors 38010 and 38014. This arrangement may require in-vacuum placement of many components: electrical wires and feedthroughs, encoders, signal LEDs and pick-ups 38008, bearings 38012, and magnets 38006. Magnets 38006, bearings 38012, wires and connectors, and encoders can be susceptible to residual processing gasses present in the vacuum environment. Furthermore, it may be difficult to remove gasses trapped in the bottom of the cylinder 38024, as the gasses may have to follow a convoluted path 38022 when evacuated.

Figure 39:
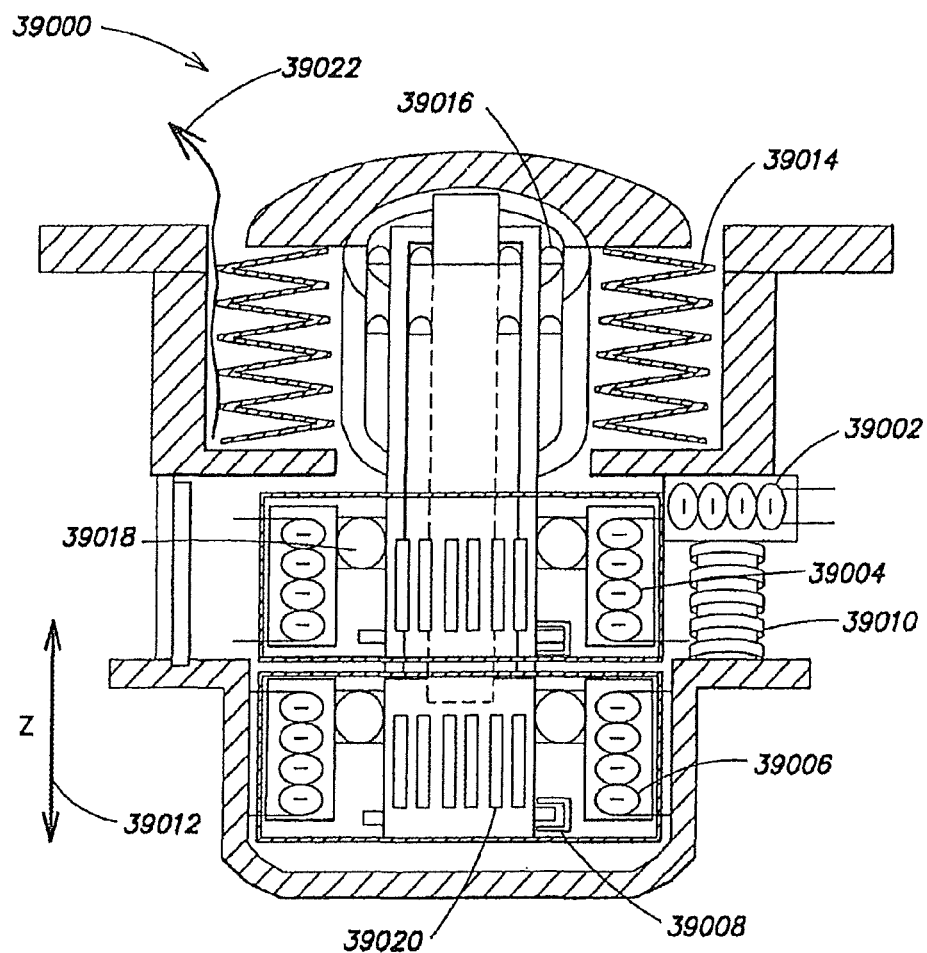
FIG. 39 shows a 3-axis robotic vacuum drive architecture in accordance with embodiments of the invention.

FIG. 39 illustrates a vacuum robot drive 39000 that may be used with the systems described herein. The rotary drive forces may be provided by two motor cartridges 39004 and 39006. Each cartridge may have an integral encoder 39008, bearings 39018 and magnets 39020. Some or all of these components may be positioned outside the vacuum envelope. A concentric dual-shaft rotary seal unit 39016 may provide vacuum isolation for the rotary motion using, for example, lip-seals or ferrofluidic seals. This approach may reduce the number of components inside the vacuum system. It may also permit servicing of the motors 39004, 39006 and encoders 39008 without breaking vacuum, thereby increasing serviceability of the drive unit.

Figure 40A:
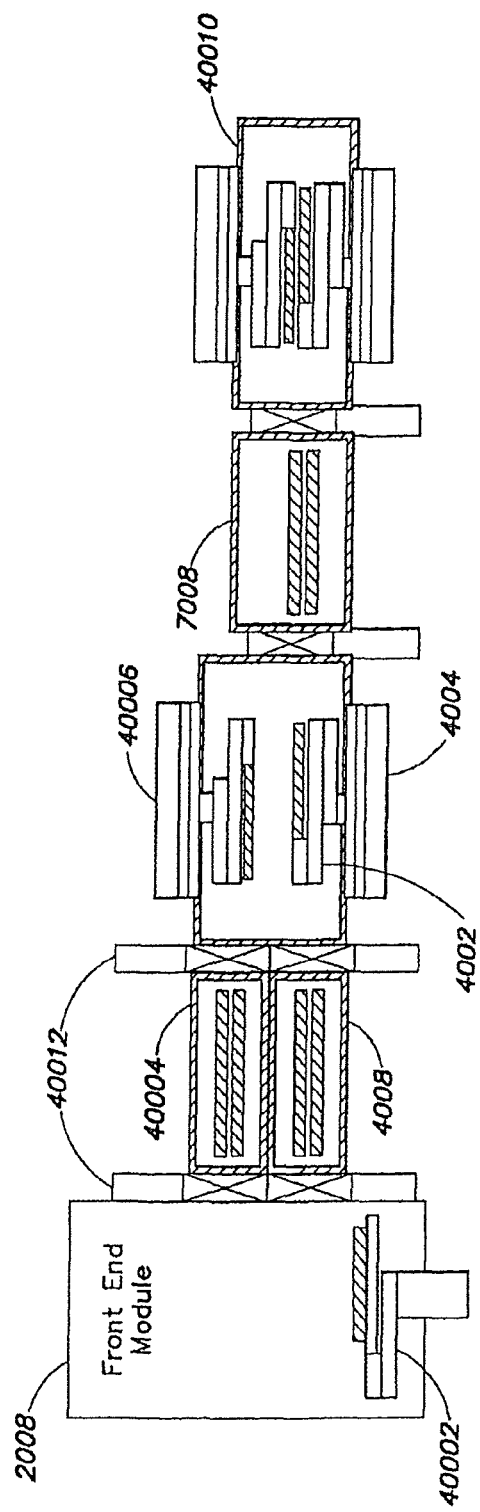
FIG. 40 illustrates a vertically arranged load lock assembly in accordance with embodiments of the invention.
FIG. 40B illustrates a vertically arranged load lock assembly at both sides of a wafer fabrication facility in accordance with embodiments of the invention.

FIG. 40 shows a stacked vacuum load lock 4008, 40004 for entering materials into a vacuum environment. One limiting factor on bringing wafers 31008 into a vacuum system is the speed with which the load lock can be evacuated to high vacuum. If the load lock is pumped too fast, condensation may occur in the air in the load lock chamber, resulting in precipitation of nuclei on the wafer 31008 surfaces, which can result in particles and can cause defects or poor device performance. Cluster tools may employ two load locks side by side, each of which is alternately evacuated. The pumping speed of each load lock can thus be slower, resulting in improved performance of the system. With two load locks 4008 40004 in a vertical stack, the equipment footprint stays very small, but retains the benefit of slower pumping speed. In embodiments, the load lock 40004 can be added as an option. In embodiments the robotic arms 4004 and 40006 can each access either one of the two load locks 4008 40004. In embodiments the remaining handoff module 7008 could be a single level handoff module.

Figure 40B:
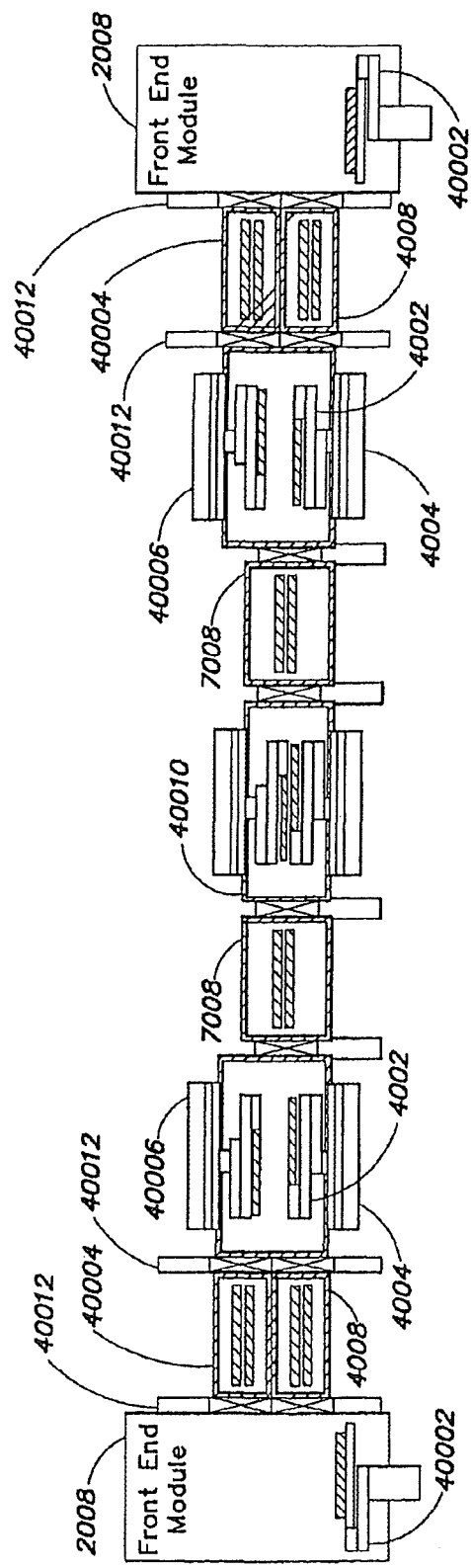

FIG. 40B shows another load lock layout. In this figure wafers 31008 can be entered and can exit at two levels on either side of the system, but follow a shared level in the rest of the system.

Figure 41:
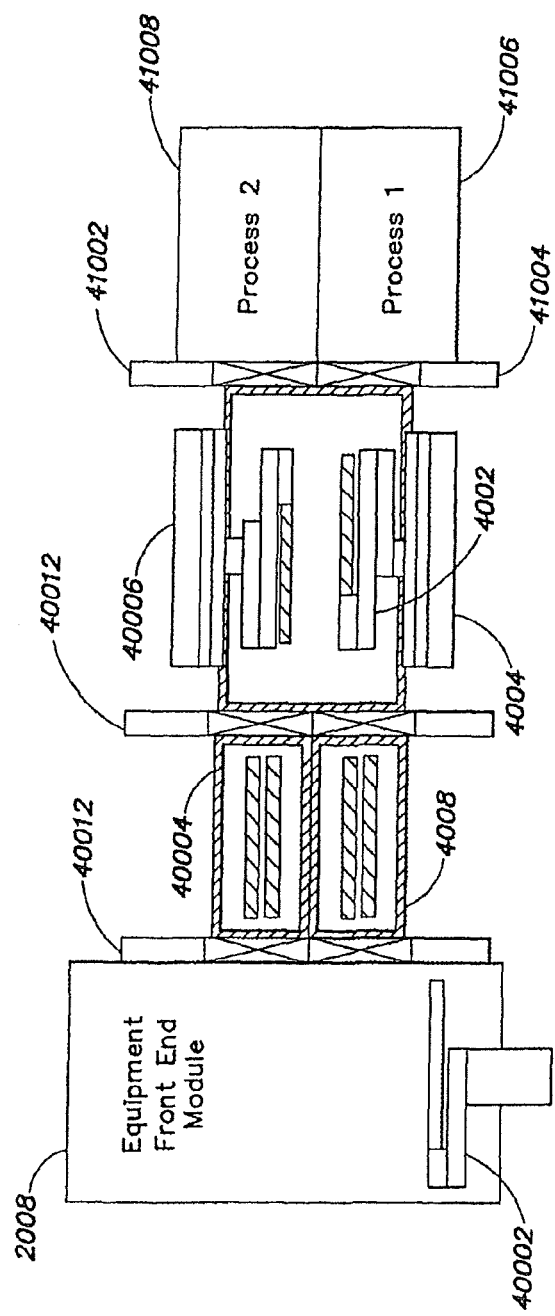
FIG. 41 shows a vertically arranged load lock and vertically stacked process modules in accordance with embodiments of the invention.

FIG. 41 details how the previous concept of stacked load locks 4008 40004 can be also implemented throughout a process by stacking two process modules 41006, 41008. Although such modules would not be compliant with the SEMI standard, such an architecture may offer significant benefits in equipment footprint and throughput.

Figure 42:
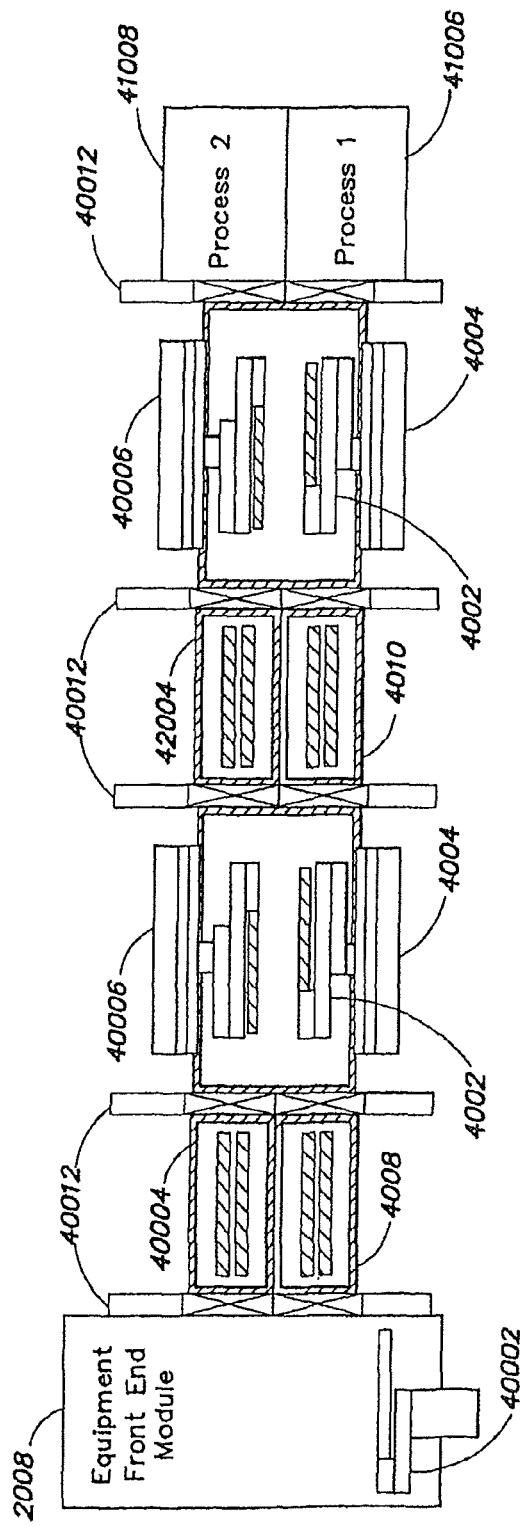
FIG. 42 shows a linearly arranged, two-level handling architecture with vertically stacked process modules in a cross-sectional side view in accordance with embodiments of the invention.

FIG. 42 shows a system with two handling levels 4008, 40004, 4010, 42004: wafers may be independently transported between modules using either the top link 40006 or the bottom link 4004. Optionally, each handling level may have two load locks to provide the advantage of reduced evacuation speed noted above. Thus a system with four input load locks, two handling levels, and optionally four output load locks, is also contemplated by description provided herein, as are systems with additional load lock and handling levels.

Figure 43:
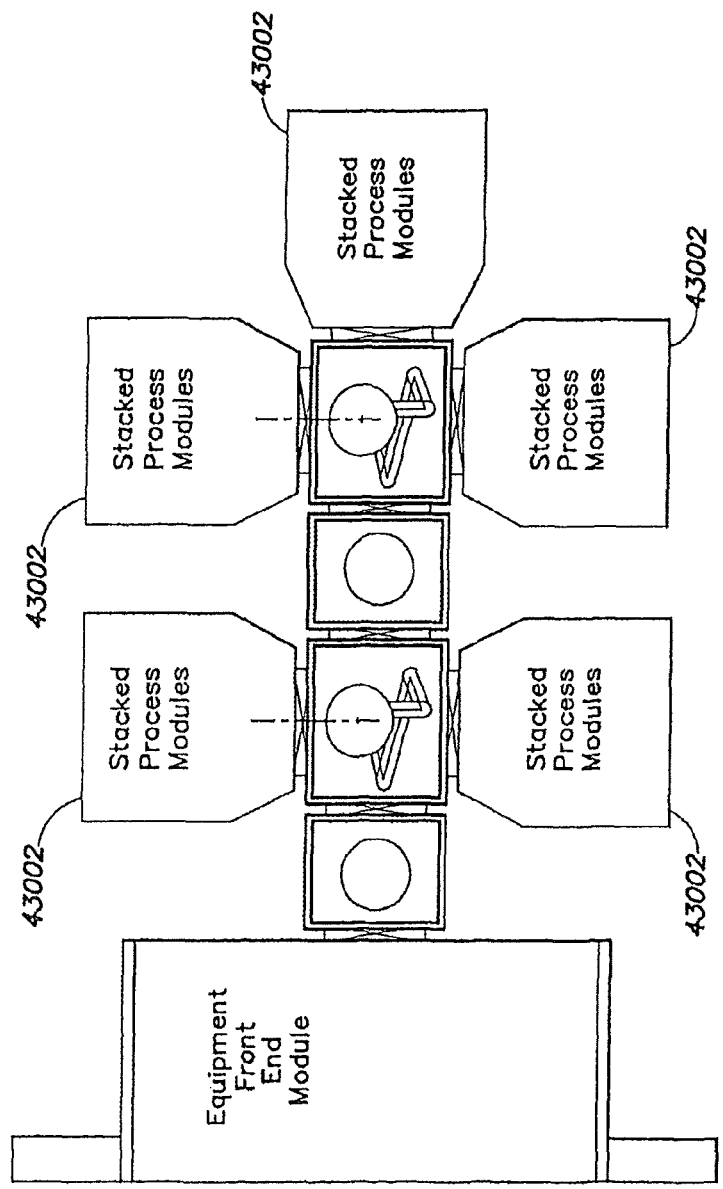
FIG. 43 shows the handling layout of FIG. 42 in a top view.

FIG. 43 shows a top view of the system of FIG. 42.

Figure 44:
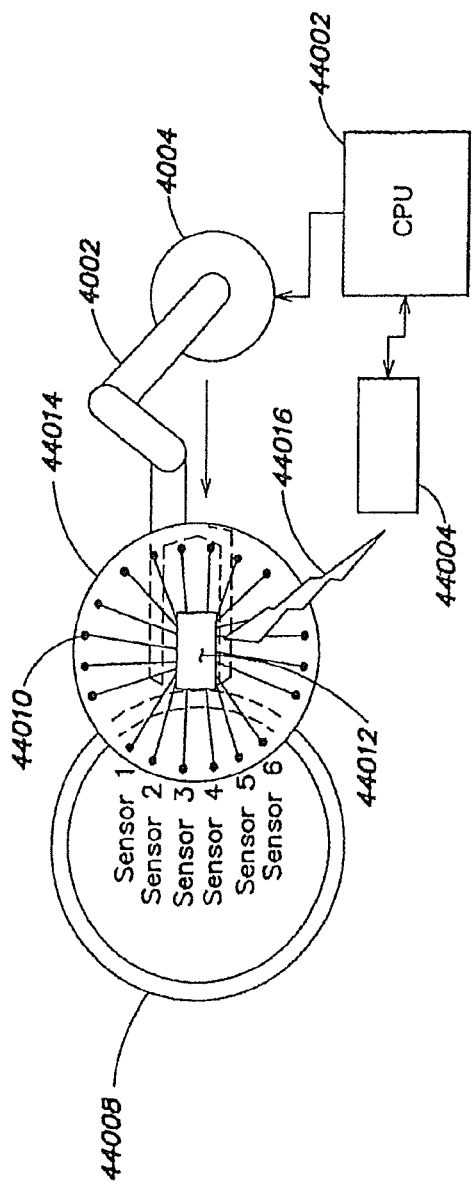
FIG. 44 shows an instrumented object on a robotic arm with sensors to detect proximity of the object to a target, in accordance with embodiments of the invention.

FIG. 44 depicts a special instrumented object 44014, such as a wafer. One or more sensors 44010 may be integrated into the object 44014, and may be able to detect environmental factors around the object 44014. The sensors 44010 may include proximity sensors such as capacitive, optical or magnetic proximity sensors. The sensors 44010 may be connected to an amplifier/transmitter 44012, which may use battery power to transmit radio frequency or other sensor signals, such as signals conforming to the 802.11b standard, to a receiver 44004.

In many instances it may be difficult or impossible to put instrumentation on an object 44014 used to train a robot, because the wires that are needed to power and communicate to the instruments and sensors interfere with proper robotic motion or with the environment that the robot moves through. By employing a wireless connection to the object, the problem of attached wires to the object may be resolved.

The object 44014 can be equipped with numerous sensors of different types and in different geometrically advantageous patterns. In the present example, the sensors 1 through 6 (44010) are laid out in a radius equal to the radius of the target object 44008. In embodiments these sensors are proximity sensors. By comparing the transient signals from the sensors 44010, for example sensor 1 and sensor 6, it can be determined if the object 44014 is approaching a target 44008 at the correct orientation. If the target 44008 is not approached correctly, one of the two sensors 44010 may show a premature trigger. By monitoring multiple sensors 44010, the system may determine if the object 44010 is properly centered above the target 44008 before affecting a handoff. The sensors 44010 can be arranged in any pattern according to, for example, efficiency of signal analysis or any other constraints. Radio frequency signals also advantageously operate in a vacuum environment.

Figure 45:
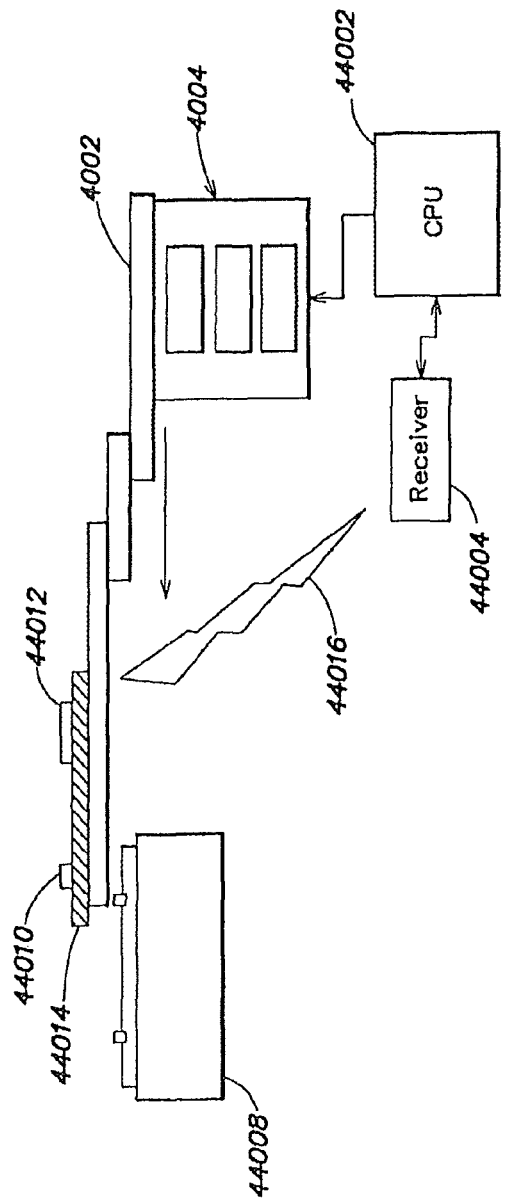
FIG. 45 illustrates how the movement of sensors over a target can allow the robotic arm to detect its position relative to the obstacle.

FIG. 45 shows the system of FIG. 44 in a side orientation illustrating the non-contact nature of orienting the instrumented object 44014 to a target 44008. The sensors 44010 may include other sensors for measuring properties of the target 44008, such as temperature.

Figure 46:
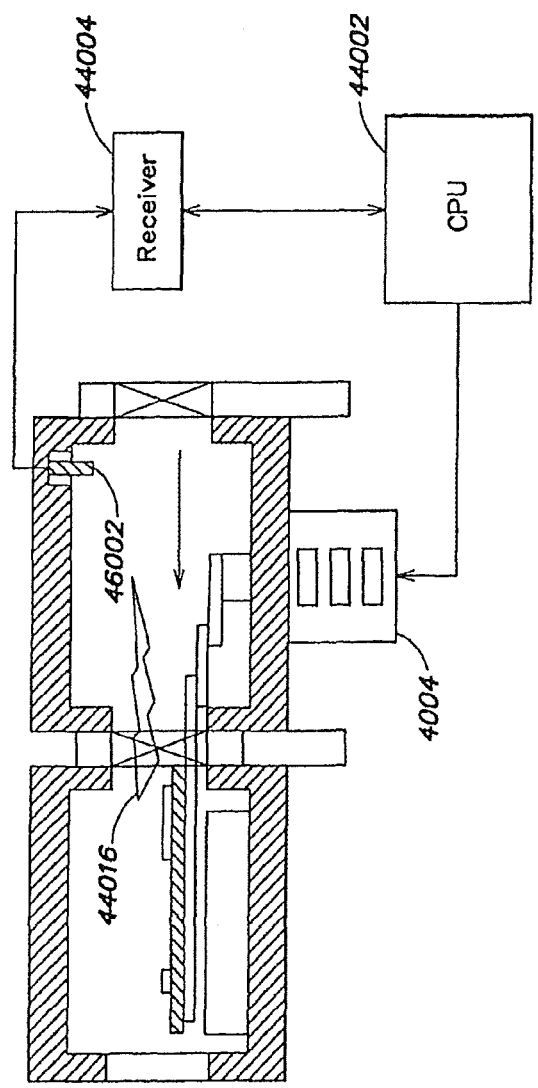
FIG. 46 shows how an instrumented object can use radio frequency communications in a vacuum environment to communicate position to a central controller.

FIG. 46 depicts radio frequency communication with one or more sensors. A radio frequency sensor signal 44016 may be transmitted to an antenna 46002 within a vacuum. Appropriate selection of wavelengths may improve signal propagation with a fully metallic vacuum enclosure. The use of sensors in wireless communication with an external receiver and controller may provide significant advantages. For example, this technique may reduce the time required for operations such as finding the center of a target, and information from the sensor(s) may be employed to provide visual feedback to an operator, or to automate certain operations using a robotic arm. Furthermore, the use of one or more sensors may permit measurements within the chamber that would otherwise require release of the vacuum to open to atmosphere and physically inspect the chamber. This may avoid costly or time consuming steps in conditioning the interior of the chamber, such as depressurization and baking (to drive out moisture or water vapor).

Figure 47:
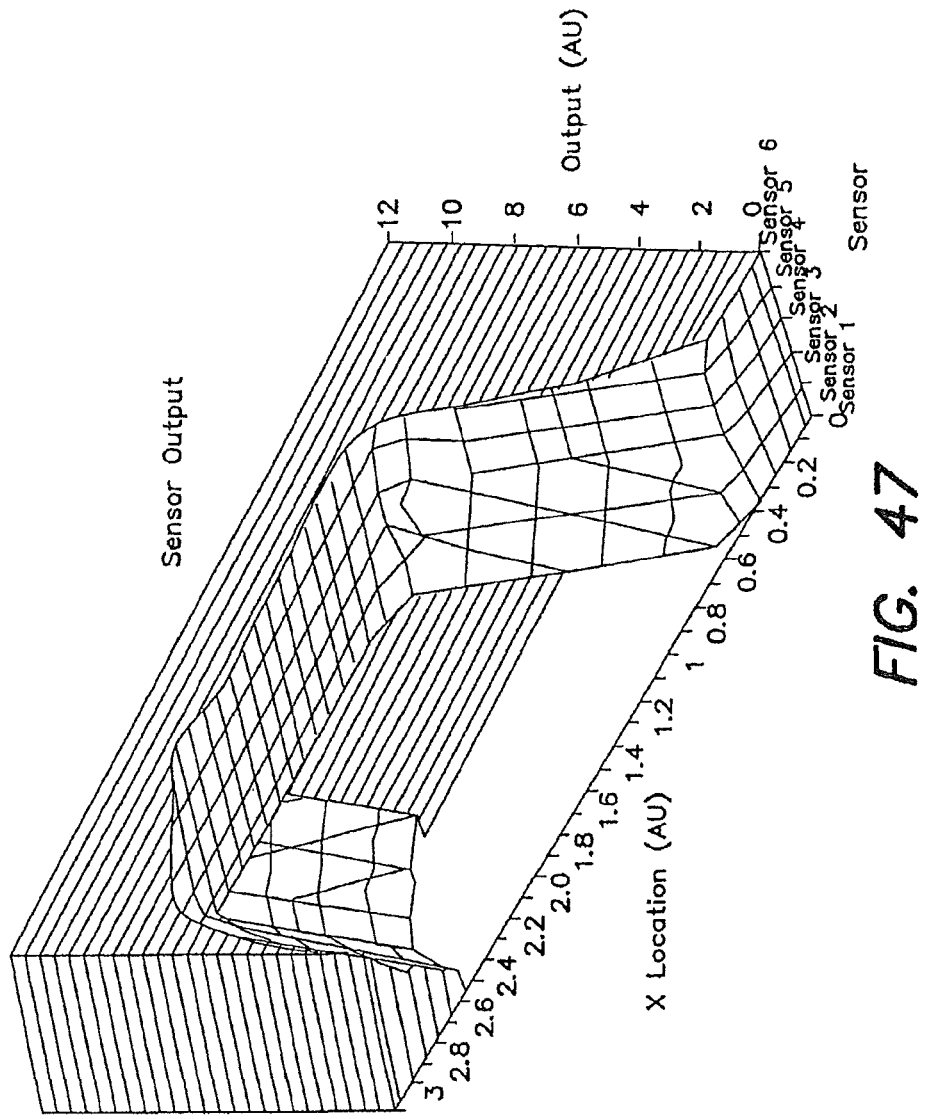
FIG. 47 illustrates the output of a series of sensors as a function of position.

FIG. 47 illustrates the output from multiple sensors 44010 as a function of the robot movement. When the robot moves over the target 44008 the motion may result in the sensors providing information about, for example, distance to the target 44008 if the sensors are proximity sensors. The signals can be individually or collectively analyzed to determine a location for the target 44008 relative to the sensors. Location or shape may be resolved in difference directions by moving the sensor(s) in two different directions and monitoring sensor signals, without physically contacting the target 44008.

Figure 48:
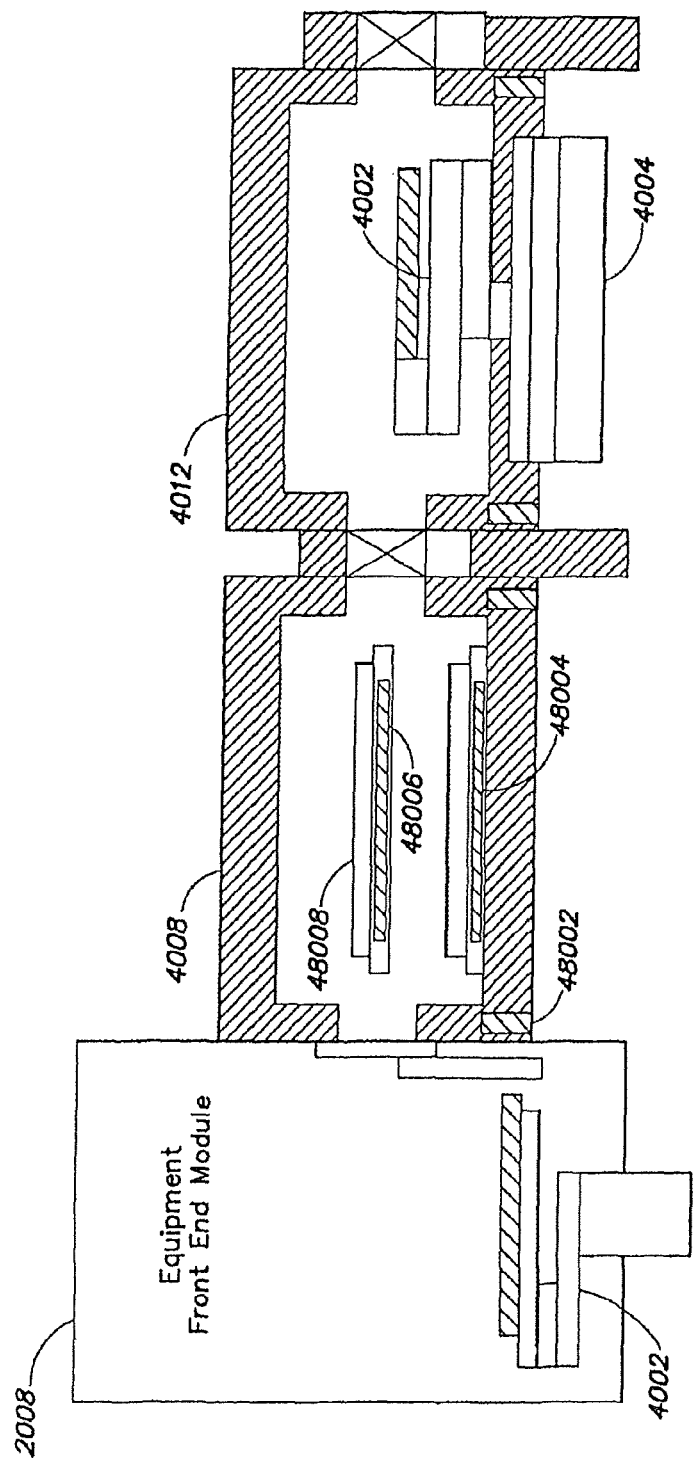
FIG. 48 illustrates how heating elements can be placed in a load lock for thermal treatment of objects in accordance with embodiments of the invention.

FIG. 48 depicts a technique for inserting and removing wafers 48008 from a vacuum system. One or more heating elements, such as a set of heating elements 48002, 48004, and 48006 may be employed, individually or in combination, to heat a chamber 4008 and a substrate material 48008 to an elevated temperature of 50° C. to 400° C. or more. This increase in starting temperature may mitigate condensation that would otherwise occur as pressure decreases in the chamber, and may allow for a more rapid pump down sequence to create a vacuum. When heated wafers 48008 are moved to the load lock 4008 by the robotic arm 4002, they may be significantly warmer than heating units 48004, 48006, such that the heating units 48004, 48006 may cool the wafers on contact. A heating power supply may regulate heat provided to the heating units 48004 48006 to maintain a desired temperature for the heating units and/or wafers. A suitable material selection for the heating units 48004, 48006 may result in the system reacting quickly to heating power changes, resulting in the possibility of different temperature settings for different conditions, for example a higher temperature setting during pump-down of the chamber 4008 and a lower setting during venting of chamber 4008.

Preheating the wafers 48008 may reduce condensation and particles while reducing process time. At the same time, the wafers 48008 may be too hot when exiting the system, such that they present a safety hazard, or melt handling and support materials such as plastic. Internal temperatures of about 80 to 100° C. degrees, and external temperatures of about 50° C. degrees or less may, for example, meet these general concerns.

FIG. 49 illustrates a robotic end effector 49002. The robotic end effector 49002 may be tapered so that it has a non-uniform thickness through one or more axes. For example, the robotic end effector 49002 may have a taper when viewed from the side or from the top. The taper may mitigate resonant vibrations along the effector 49002. At the same time, a relatively narrow cross-sectional profile (when viewed from the side) may permit easier maneuvering between wafers 49006. The side-view taper may be achieved by grinding or machining, or by a casting process of the effector 49002 with a taper. Materials such as Aluminum Silicon Carbide (AlSiC 9) may be advantageously cast into this shape to avoid subsequent machining or other finishing steps. A casting process offers the additional advantage that the wafer support materials 49004 can be cast into the mold during the casting process, thereby reducing the number of components that require physical assembly.

As shown in FIG. 50, similar techniques may be applied to robotic arm segments 50002 and 50004. The same dampening effect may be achieved to attenuate resonant vibrations in the arm segments 50002 50004 as described above. The tapered shape may be achieved using a variety of known processes, and may allow more rapid movement and more precise control over a resulting robotic arm segment.

Figure 51B:
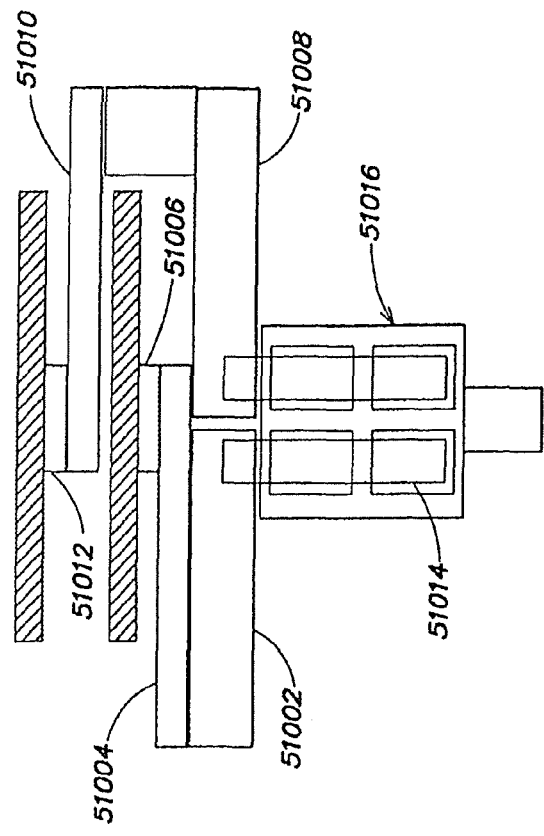
FIGS. 51A and 51B illustrate a dual independent SCARA robotic arm.
Figure 51A:
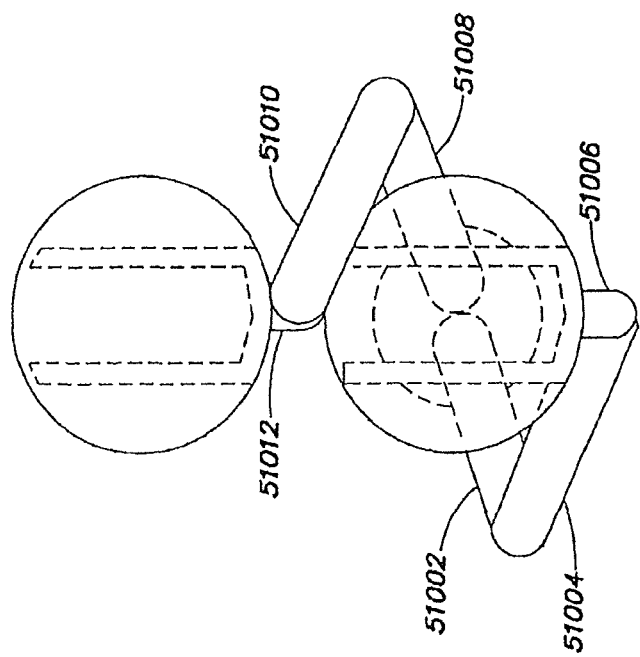

FIG. 51 shows a dual independent SCARA arm employing five motors 51014. Each lower arm 51002 and 51008 can be independently actuated by the motors 51014. The arms are connected at the distal end to upper arms 51004 and 51010. The configuration gives a relatively small retract radius, but a somewhat limited extension.

FIG. 52 shows a dual dependent SCARA arm employing 4 motors 52010. The links 52002 and 52004 may be common to the end effectors 52006 and 52008. The motors 52010 may control the end effectors 52006 and 52008 in such a way that during an extension motion of the lower arm 52002, the desired end effector, (say 52008) may be extended into the processing modules, whereas the inactive end effector (say 52006) may be pointed away from the processing module.

FIG. 53 shows a frog-leg style robotic arm. The arm can be used in connection with various embodiments described herein, such as to enable passing of work pieces, such as semiconductor wafers, from arm-to-arm in a series of such arms, such as to move work pieces among semiconductor process modules.

FIG. 54 shows a dual frog-leg arm that can be employed in a planar robotic system, such as one of the linear, arm-to-arm systems described in this disclosure.

FIG. 55A illustrates a 4-Link SCARA arm as described in this disclosure mounted to a cart 55004. Such a cart may move in a linear fashion by a guide rail or magnetic levitation track 55008 and driven by a motor 55002 internal or external to the system. The 4-Link SCARA arm has the advantage that it fold into a smaller retract radius than a 3-Link SCARA arm, while achieving a larger extension into a peripheral module such as a process module all the while avoiding a collision with the opening that the arm has to reach through. An inverted cart 55006 could be used to pass substrates over the cart 55004.

Figure 55B:
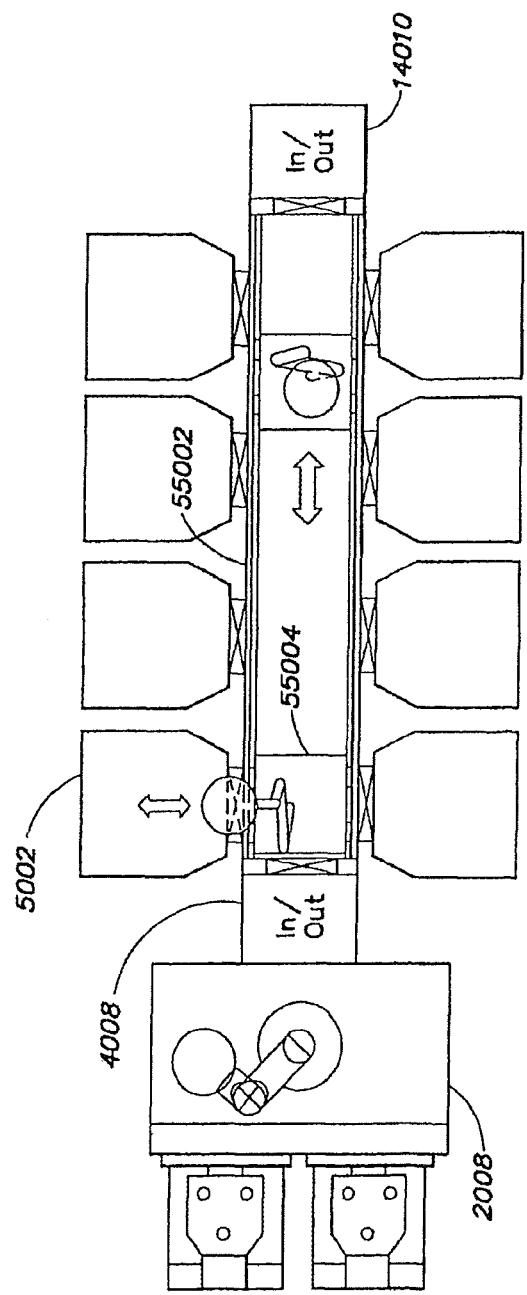
FIG. 55B illustrates a top view of FIG. 55A.

FIG. 55B shows a top view of the system described in FIG. 55A.

Figure 56:
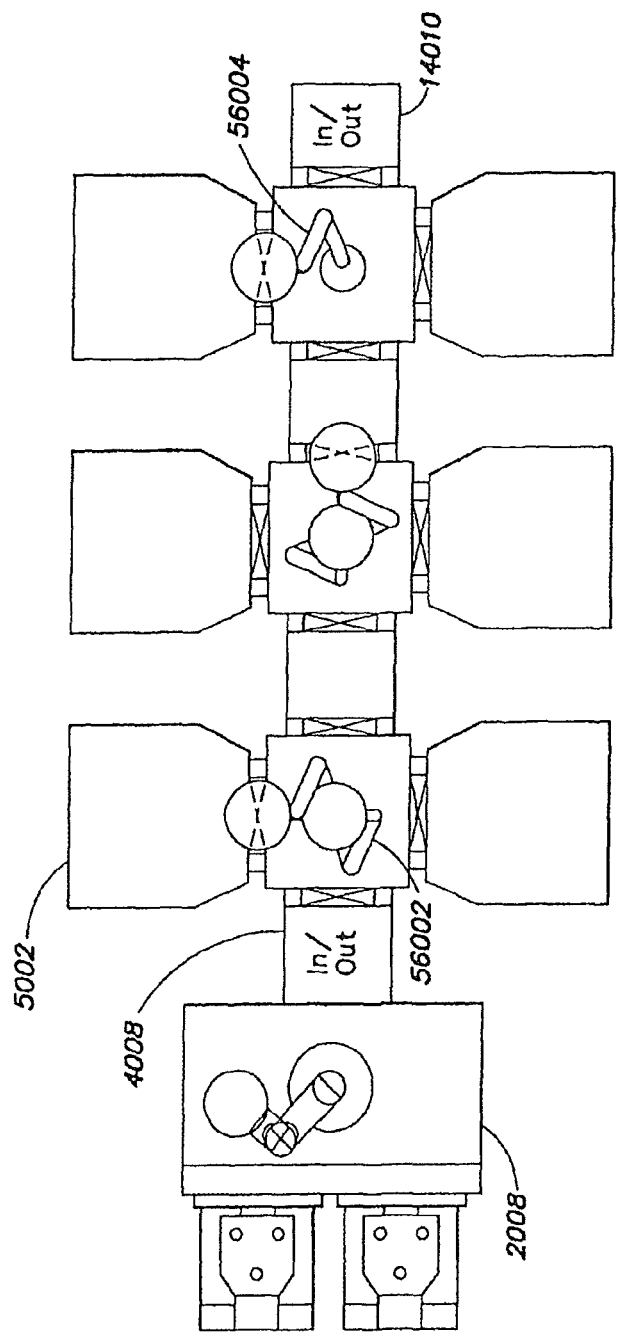
FIG. 56 illustrates using a 3-Link single or dual SCARA arm robotic system to pass wafers along a substantially a linear axis.

FIG. 56 illustrates a linear system described in this disclosure using a combination of dual independent and single SCARA robotic arms. Such a system may not be as compact as a system employing a 4-Link SCARA arm robotic system.

Figure 57:
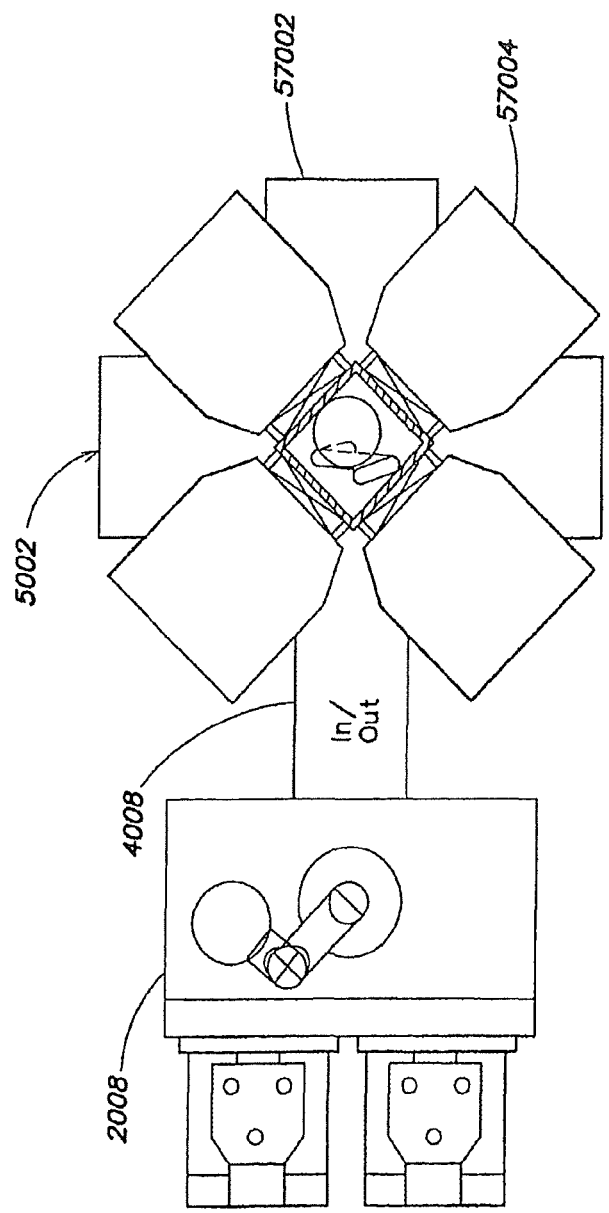
FIG. 57 illustrates a 2-level vacuum handling robotic system where the top and bottom process modules are accessible by means of a vertical axis in the robotic arms.

FIG. 57 demonstrates a vertically stacked handling system employing a 4-Link SCARA robotic arm, where the arm can reach any and all of the peripheral process modules 5002. By rotating the process modules in the top level 57004 by approximately 45 degrees and mounting the top level components to the bottom level chambers 57002, the top and bottom of each of the process modules may remain exposed for service access as well as for mounting components such as pumps, electrodes, gas lines and the like. The proposed layout may allow for the combination of seven process modules 5002 in a very compact space.

Figure 58A:
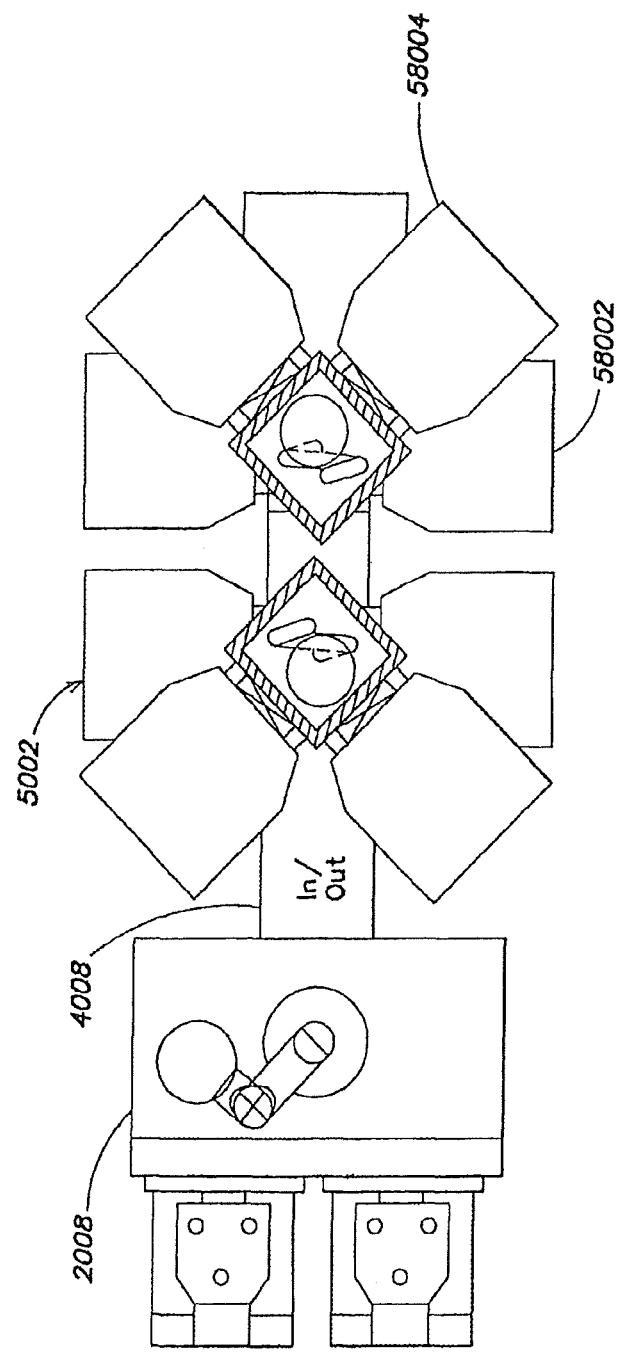
FIG. 58A shows a two level processing facility where substrates are passed along a substantially linear axis on one of the two levels.

FIG. 58A illustrates a variation of FIG. 57, where the bottom level 58002 of the system consists of a plurality of robotic systems as described in this disclosure and the top level system 58004 employs process modules 5002 oriented at a 45 degree angle to the main system axis. The proposed layout allows for the combination of nine process modules 5002 in a very compact space.

Figure 58B:
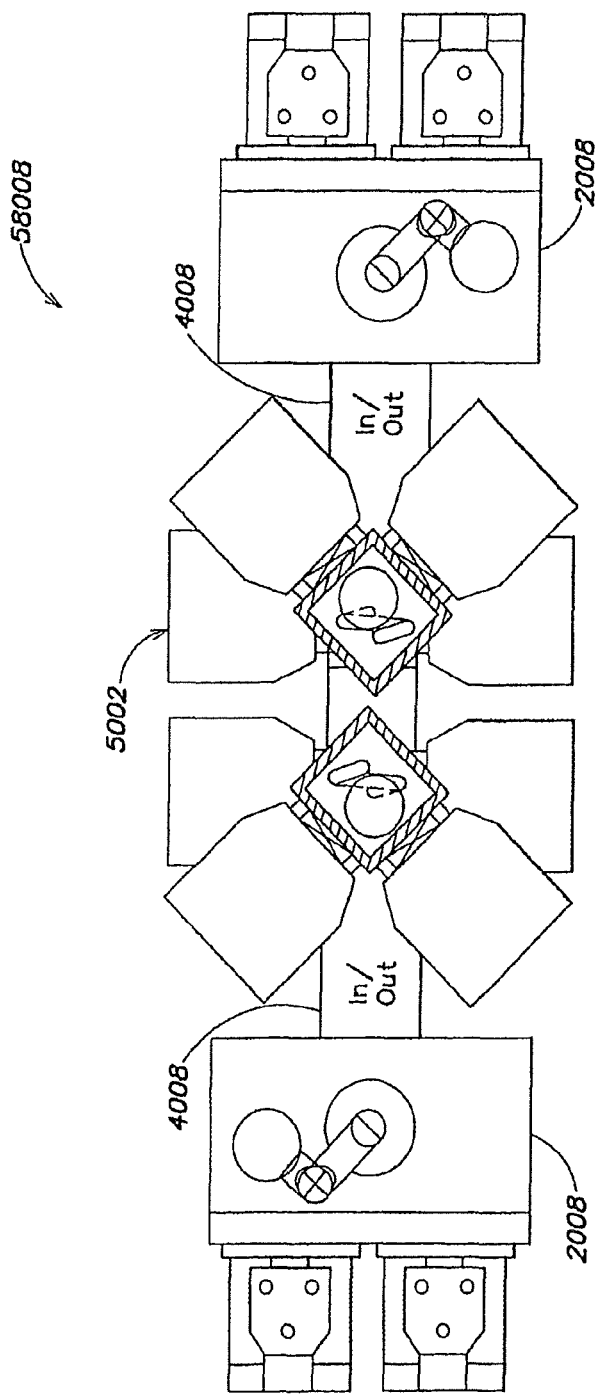
FIG. 58B illustrates a variation of FIG. 58a where substrates are removed from the rear of the system.

FIG. 58B illustrates a variation of FIG. 58A with the use of a rear-exit load lock facility to remove substrates such as semiconductor wafers from the system.

Figure 59A:
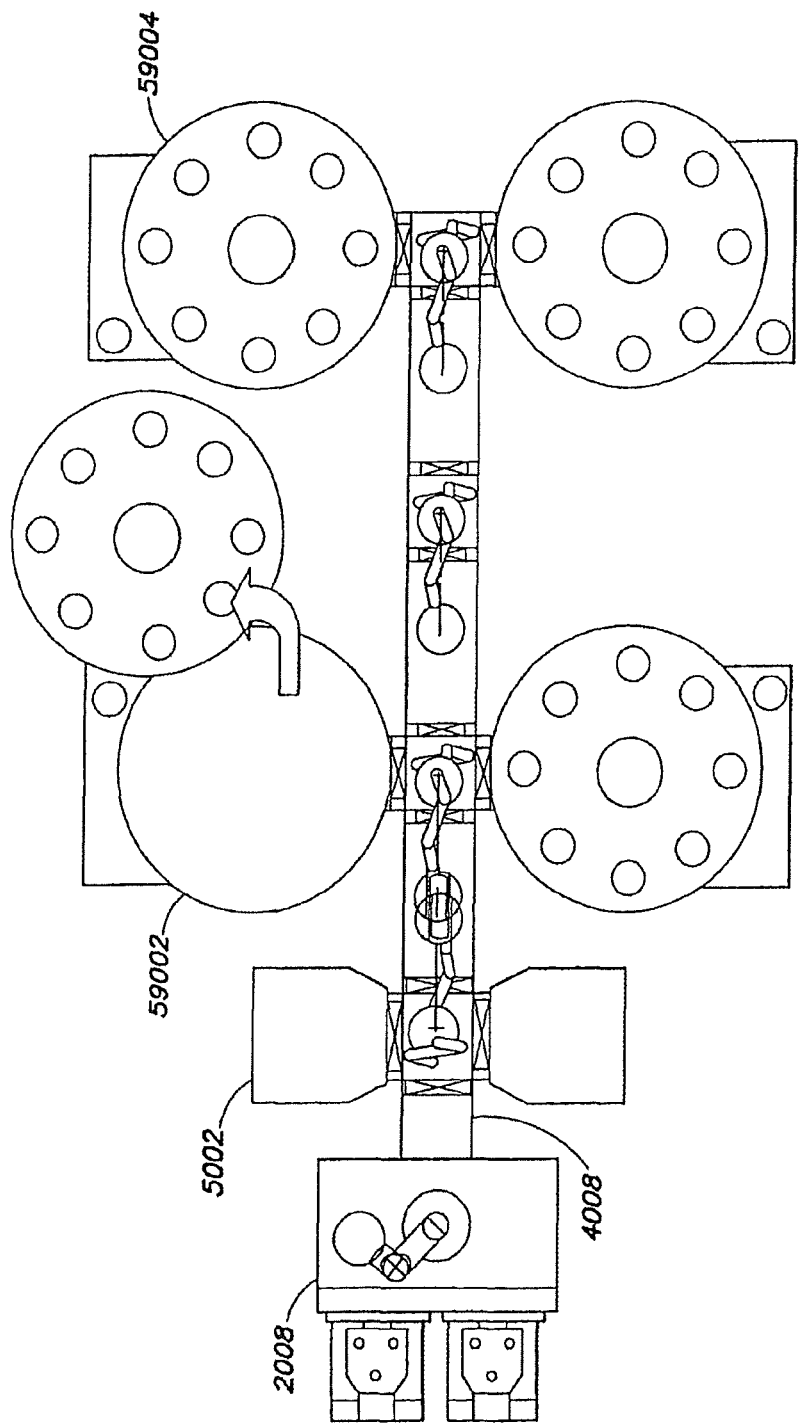
FIG. 59A shows a manufacturing facility which accommodates very large processing modules in a substantially linear axis. Service space is made available to allow for access to the interior of the process modules.

FIG. 59A shows a linear handling system accommodating large substrate processing modules 59004 while still allowing for service access 59002, and simultaneously still providing locations for two standard sized process module 5002.

Figure 59B:
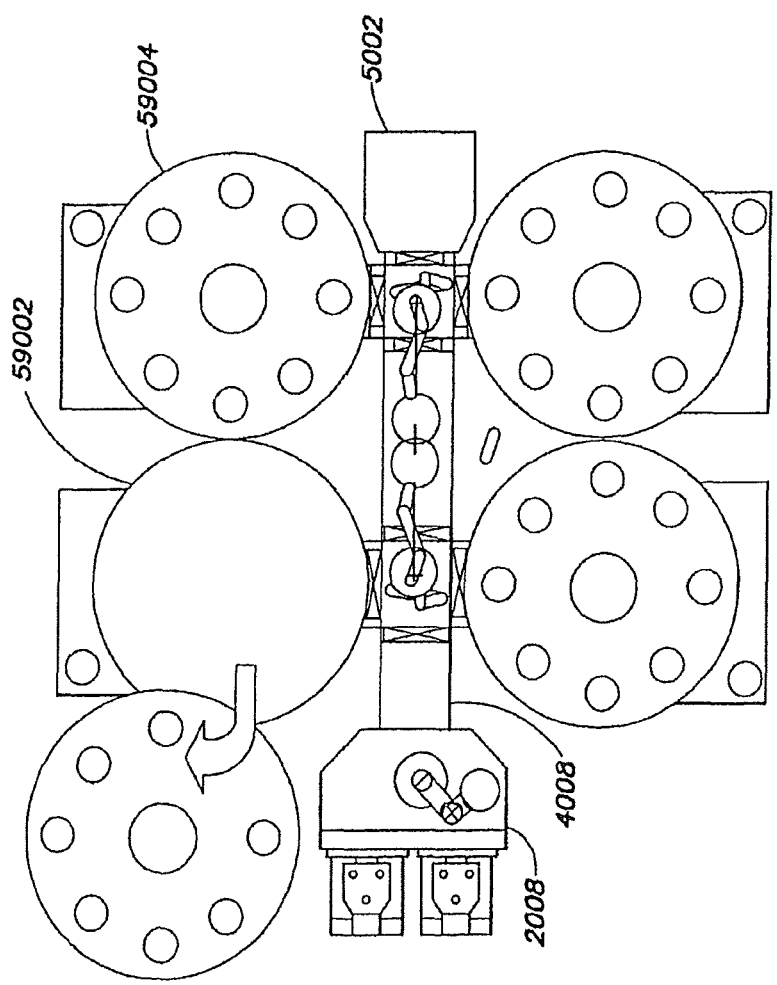
FIG. 59B illustrates a more compact layout for 4 large process modules and one small process module.

FIG. 59B demonstrates a system layout accommodating four large process modules 59004 and a standard sized process module 5002 while still allowing service access 59002 to the interior of the process modules 5002.

FIG. 60A shows a top view of a dual frog robot with arms substantially on the same side of the robotic drive component. The lower arms 60002 support two sets of upper arms 60004. FIG. 60B shows a side view of the lower arms 60002 mechanically coupled to a motor set 54010.

A variety of techniques may be used to handle and transport wafers within semiconductor manufacturing facilities such as those described above. It will be understood that, while certain processing modules, robotic components, and related systems are described above, other semiconductor processing hardware and software may be suitably employed in combination with the transport and handling systems described below. All such variations and modifications that would be clear to one of ordinary skill in the art are intended to fall within the scope of this disclosure.

Figure 61:
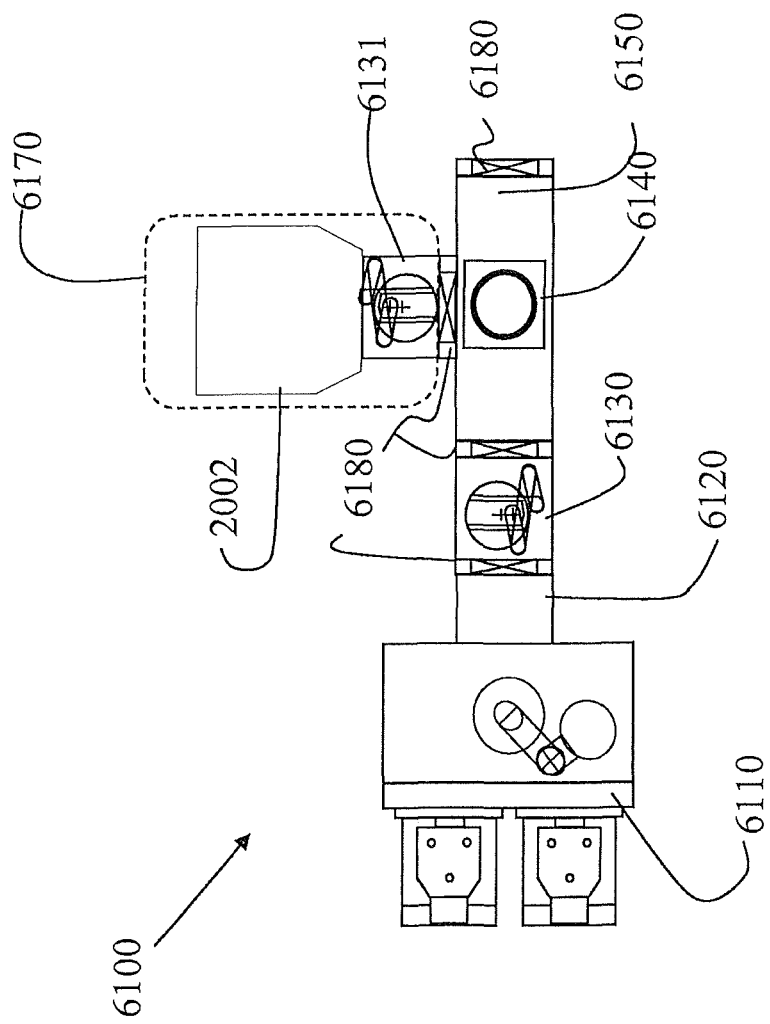
FIG. 61 is a plan view of a preferred embodiment wherein a vacuum tunnel cart is configured with a process module through a transfer robot.

Referring to FIG. 61, in a vacuum processing system, a process group 6100 may include a handling interface 6110 such as an equipment front end module connected to an exchange zone 6120, and may be further connected to a work piece handling vacuum module 6130 that transfers work pieces from the exchange zone 6120 to a transport cart 6140 inside a transport tunnel 6150.

In order to facilitate discussion of various transport/handling schemes, the combination of the transfer robot 6131 with one or more process modules 2002 is referred to herein as a process cell 6170. It should be understood that process cells may have many configurations including conventional or unconventional process modules and/or cluster tools that perform a wide range of processes, along with associated or additional robotics for transferring wafers. This may include commercially available process modules, custom process modules, and so forth, as well as buffers, heaters, metrology stations, or any other hardware or combination of hardware that might receive wafers from or provide wafers to a wafer transportation system. Process modules 2002 and/or process cells 6170 may be disposed in various configurations, such as in clusters, aligned along the sides of a line or curve, in square or rectangular configurations, stacked vertically, or the like.

Similarly, one or more robots 6131 that service process cells 6170 can be configured many ways, to accommodate different configurations of process modules, including in vertically stacked or opposing positions, in line with each other, or the like.

The process group 6100 may further include one or more isolation valves 6180 such as slot valves or the like that selectively isolate vacuum zones within the group 6100 and facilitate work piece interchange between vacuum zones. The isolation valves 6180 may provide control to maintain a proper vacuum environment for each work piece during one or more processing steps, while permitting intermittent movement of work pieces between vacuum zones.

In the embodiment of FIG. 61, the work piece handling vacuum modules 6130 and 6131 transfer work pieces between other components of the group 6100, and more particularly transfer work pieces between the transport cart 6140 and various destinations. The transport cart 6140 is responsible for moving a work piece from destination to destination, such as among the work piece handling vacuum modules 6130 and 6131. In various layouts for fabrication facilities, process modules and the like may be too far separated for direct or convenient work piece transfer using robots, such as the robots 6130, 6131 shown in FIG. 61. This may arise for a number of reasons, such as the size or shape of processing modules, the positions of entry and exit points for process modules, the number of process modules in a particular fabrication layout, and so forth. As a significant advantage, the use of one or more transport carts 6140 as an intermediate transportation system permits flexible interconnection of a wide variety of modules and other equipment into complex, multi-purpose processing facilities.

The transport cart 6140 may transport a work piece, such as a semiconductor wafer, to a position accessible by the work piece handling vacuum module 6130, and may selectively transport items such as wafers or other workpieces to a process module 2002 for processing. The transport cart 6140 can be realized in many embodiments, including a magnetically levitated and/or driven cart, a cart on a railway, a cart with an arm or extending member, a cart on wheels, a cart propelled by a telescoping member, a cart propelled by an electric motor, a cart that is capable of tipping or tilting, a cart that may traverse a sloping tunnel to move a work piece or work pieces from one height to another, an inverted cart suspended from a transport track, a cart that performs processing or one of several functions on a work piece during transport, or the like.

The cart 6140 may be on gimbals, or suspended as a gondola, to accommodate variations in horizontal alignment of the path of the cart 6140. Similarly, the cart may include a wafer holder (e.g., supports, shelves, grippers, or the like) that is on gimbals, or that is suspended from a wire or the like, such that the wafer holder maintains a substantially level orientation while the cart traverses an incline. Thus, in certain embodiments, the cart may traverse inclines, declines, or direct vertical paths while maintaining a wafer or other workpiece in substantially uniform, level horizontal alignment. Such a cart may have a selectively fixed horizontal alignment so that movements such as acceleration or deceleration in a horizontal plane do not cause tipping of the workpiece. In other embodiments, the cart may be permitted to tip during acceleration or deceleration in order to stabilize a position of the work piece on the cart 6140.

The cart 6140 may be made of materials suitable for use in vacuum, such as materials that mitigate generation of undesirable particles or materials that have low outgassing characteristics. In an embodiment, the cart 6140 is a simple cart, without a robotic arm. As a significant advantage, using an armless cart mechanically simplifies the cart, thus saving on maintenance, repairs, and physical contamination of vacuum environments. In such embodiments, each entrance/egress from the cart path preferably includes a robot or similar device to place and retrieve workpieces on the cart.

In order to distinguish between various possible implementations, the following description employs the term "passive cart" to denote a cart without a robotic arm or other mechanism for loading and unloading wafers. As noted above, this configuration provides a number of advantages in terms of simplicity of design and in-vacuum implementation, and provides the additional advantage of mitigating the creation of contaminants from mechanical activity. The term "active cart" is employed herein to denote a cart that includes a robotic arm. Active carts present different advantages, in particular the improved versatility of having a robotic arm available arm at all times with the cart and a relaxation of the corresponding requirement for wafer handling hardware at each port 6180 of the tunnel 6150. It will be understood that, while providing a useful vocabulary for distinguishing between carts with and without robots, a so-called "passive cart" may nonetheless have other mechanical or active components such as wheels, sensors, and so forth.

The cart 6140 may include space for a single wafer or the like. In some embodiments, the cart 6140 may include a plurality of shelves so that multiple wafers can be transported by the cart. The shelves may have a controllable height or the like in order to accommodate access to different ones of the wafers by a fixed-height robot, or the shelves may have a fixed height for use with robotic handlers having z-axis control. In still other embodiments, the cart 6104 may include a single surface having room for multiple wafers. While multi-wafer variations require an additional degree of processing control (to account for multiple possible positions of a wafer on each cart), they also provide increased flexibility and capacity to the systems described herein. In other embodiments, the cart 6140 may be adapted to carry a multi-wafer carrier or for concurrent handling and/or processing of multiple wafers.

The cart 6140 may provide supplemental functionality. For example, the cart 6140 may include a wafer cooling or heating system that controls wafer temperature during transport. The cart 6104 may also, or instead, include wafer center finding sensors, wafer metrology sensors, and the like. It will be appreciated that, while a range of possible supplemental functions may be supported by the cart 6104, those functions that employ solid state sensing and processing may be preferably employed to facilitate preservation of a clean processing environment.

The tunnel 6150 may be of any cross-sectional shape and size suitable for accommodating the transport cart 6140 and any associated payload. In general, the tunnel 6150 will be capable of maintaining an environment similar or identical to various process cells connected thereto, such as a vacuum. The vacuum environment may be achieved, for example by providing slot valves or the like for independent vacuum isolation of each port 6180 (generally indicated in FIG. 61 as coextensive with slot valves 6180, although it will be understood that the slot valve identifies the mechanism by which seals are opened and closed, while the port refers to the opening through which wafers and the like may be passed). While a slot valve or slit valve is one common form of isolation device, many others are known and may be suitable employed with the systems described herein. Thus it will be understood that terms such as slot valve, slit valve isolation valve, isolation mechanism, and the like should be construed broadly to refer to any device or combination of devices suitable for isolating various chambers, process modules, buffers, and so forth within a vacuum environment, unless a narrower meaning is explicitly provided or otherwise clear from the context.

In some embodiments, the tunnel 6150 may maintain an intermediate environment where, for example, different process cells employ different vacuum levels, or include other gasses associated with processing. While depicted as a straight line, the tunnel 6150 may include angles, curves, and other variations in path suitable for accommodating travel of the transport cart 6140. In addition, the tunnel 6150 may include tracks or other surfaces consistent with the propulsion system used to drive the transport cart 6140 from location to location. In some embodiments, the tunnel 6150 may include inclines or other variations that accommodate changes in height among various process cells connected thereto. All such variations that can be used with a cart 6140 to move wafers or other workpieces within a processing environment are intended to fall within the scope of this disclosure.

Figure 62:
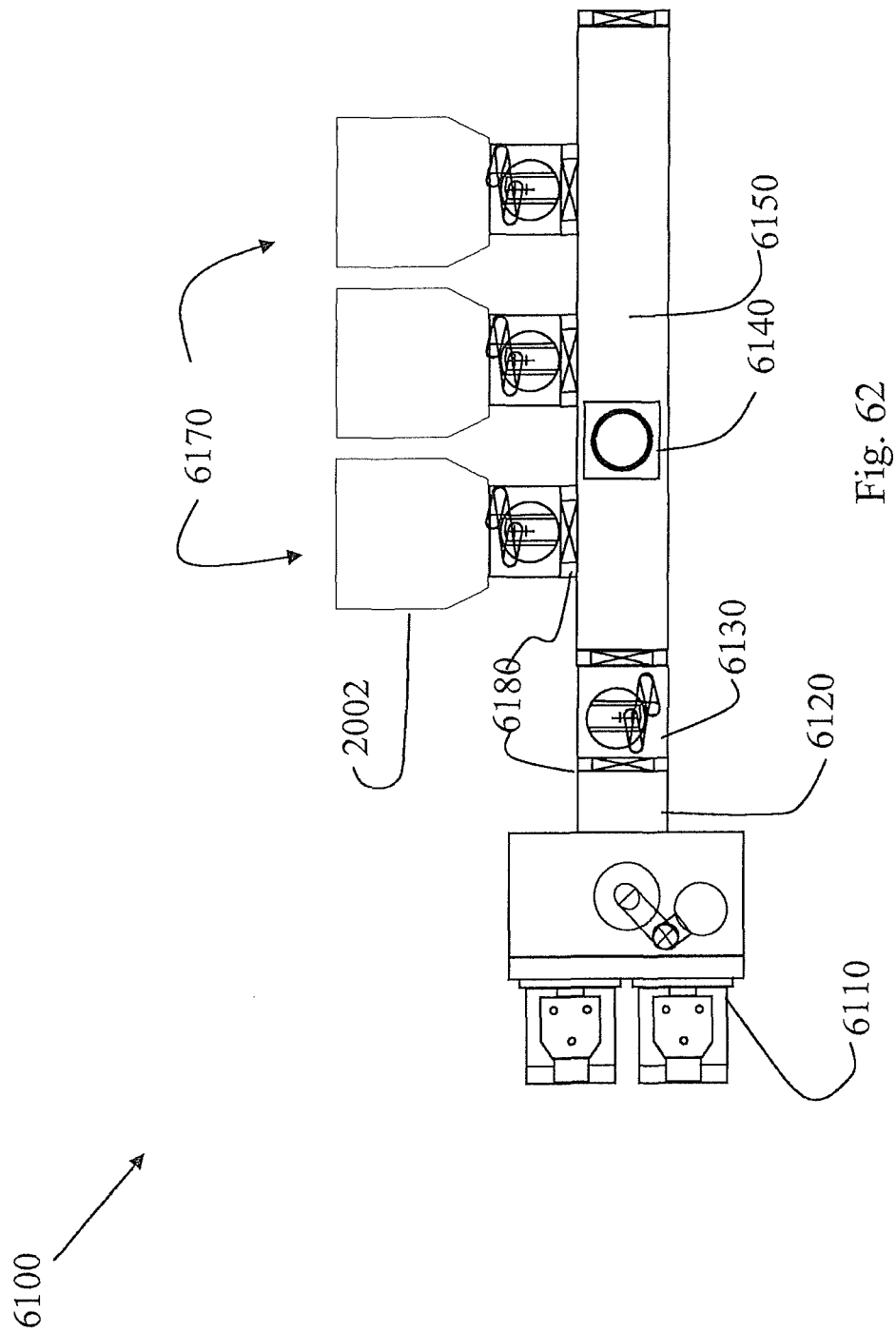
FIG. 62 is a plan view of a preferred embodiment wherein a vacuum tunnel cart is configured with a plurality of process modules through a plurality of transfer robots.

FIG. 62 shows another embodiment of a wafer processing system including a transport system. As shown, the system 6100 may include a plurality of transfer robots and process modules capable of simultaneously handling and/or processing a plurality of wafers. The system 6100 may also include a controller such as computing facility (not shown) interconnected with the transport and processing system members to schedule motion of the cart 6140 according to various processes within the system 6100. Processing of each work piece may be controlled so that transport cart 6140 position and availability is coordinated with start and stop times of the processes within a number of process cells 6170. The process cells 6170 may be identical or different. In various embodiments, the system 6100 may perform serial processing, parallel processing, or combinations of these to process a plurality of work pieces at one time, thereby improving utilization of the processing resources within the process cells 6170.

Figure 63:
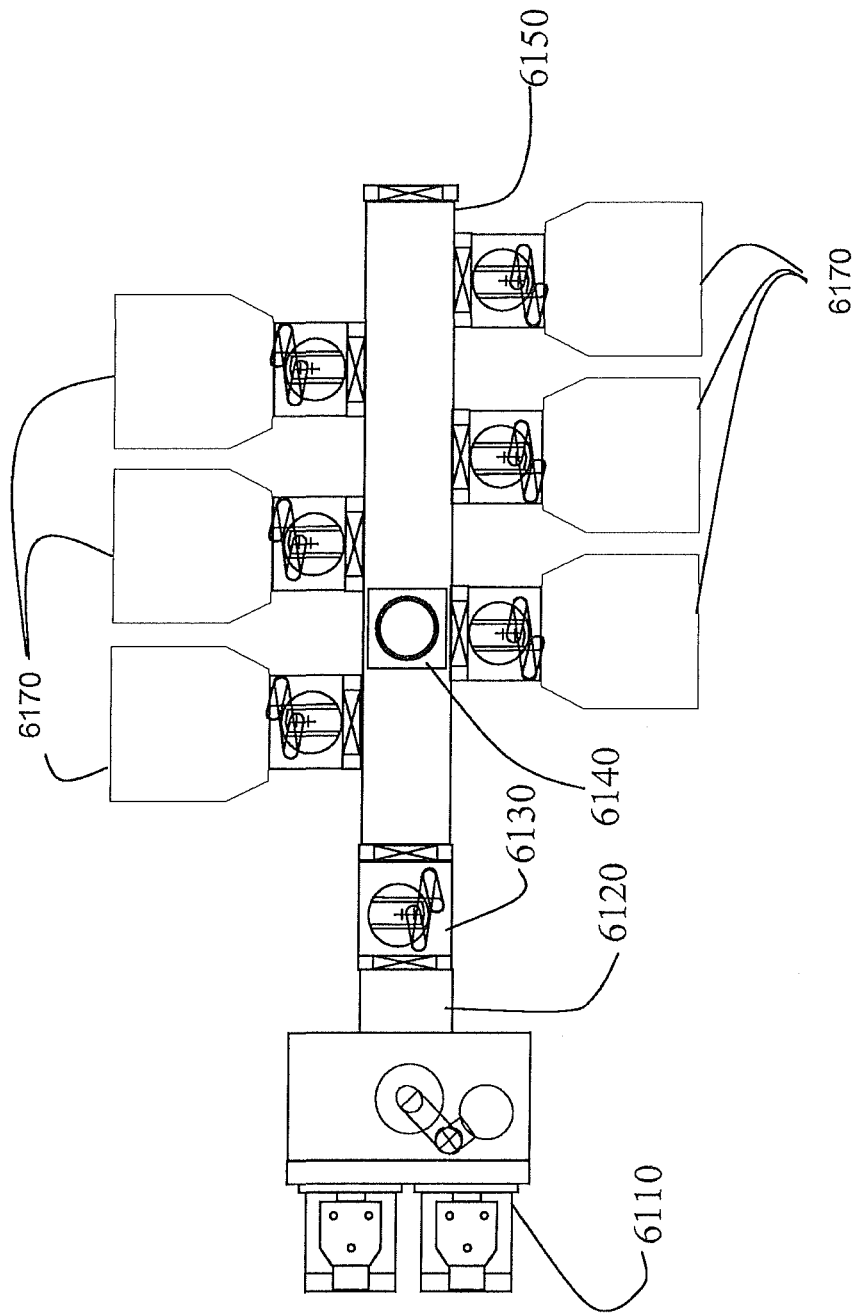
FIG. 63 shows the embodiment of FIG. 62 further including process modules along both sides of the vacuum tunnel.

FIG. 63 shows another embodiment of a semiconductor processing facility including a wafer transport system. As depicted in FIG. 63, process cells 6170 may be connected to both sides of a transport tunnel 6150. Numerous variations in work piece processing, such as those depicted in FIGS. 61-62 above, may be employed in combination with the configuration of FIG. 63. As illustrated by these figures, any number of process cells 6170 in a variety of configurations, may be readily accommodated by a transport cart 6140 interconnecting process cells 6170. This includes greater numbers of processing cells 6170, as well as curved, angled, multi-lane, and other cart paths. For example, cells on one side of a cart path may mirror process cells on the right side, to provide dual three-step process groups having a common tunnel 6150, transport cart 6140, transfer robot 6130, exchange zone 6120 and interface module 6110.

Figure 64:
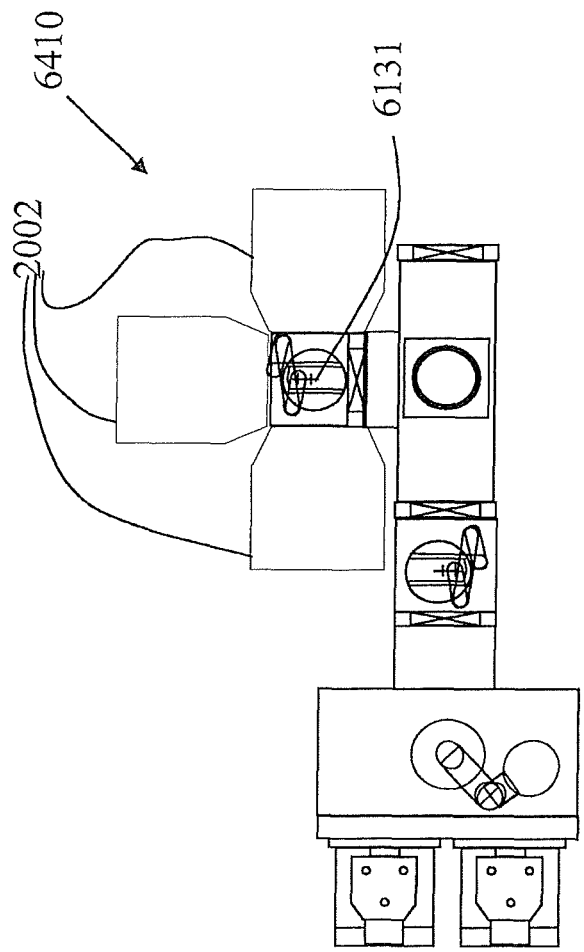
FIG. 64 is a plan view of a preferred embodiment wherein a vacuum tunnel cart is configured with a cluster process cell through a transfer robot.

FIG. 64 illustrates a configuration that uses a work piece handling vacuum module 6131 and a plurality of process modules 2002 arranged as a cluster tool 6410. This layout offers the compact footprint and functionality of a cluster tool, along with a cart-based transport system that can be flexibly interconnected to any number of additional process cells.

Figure 65:
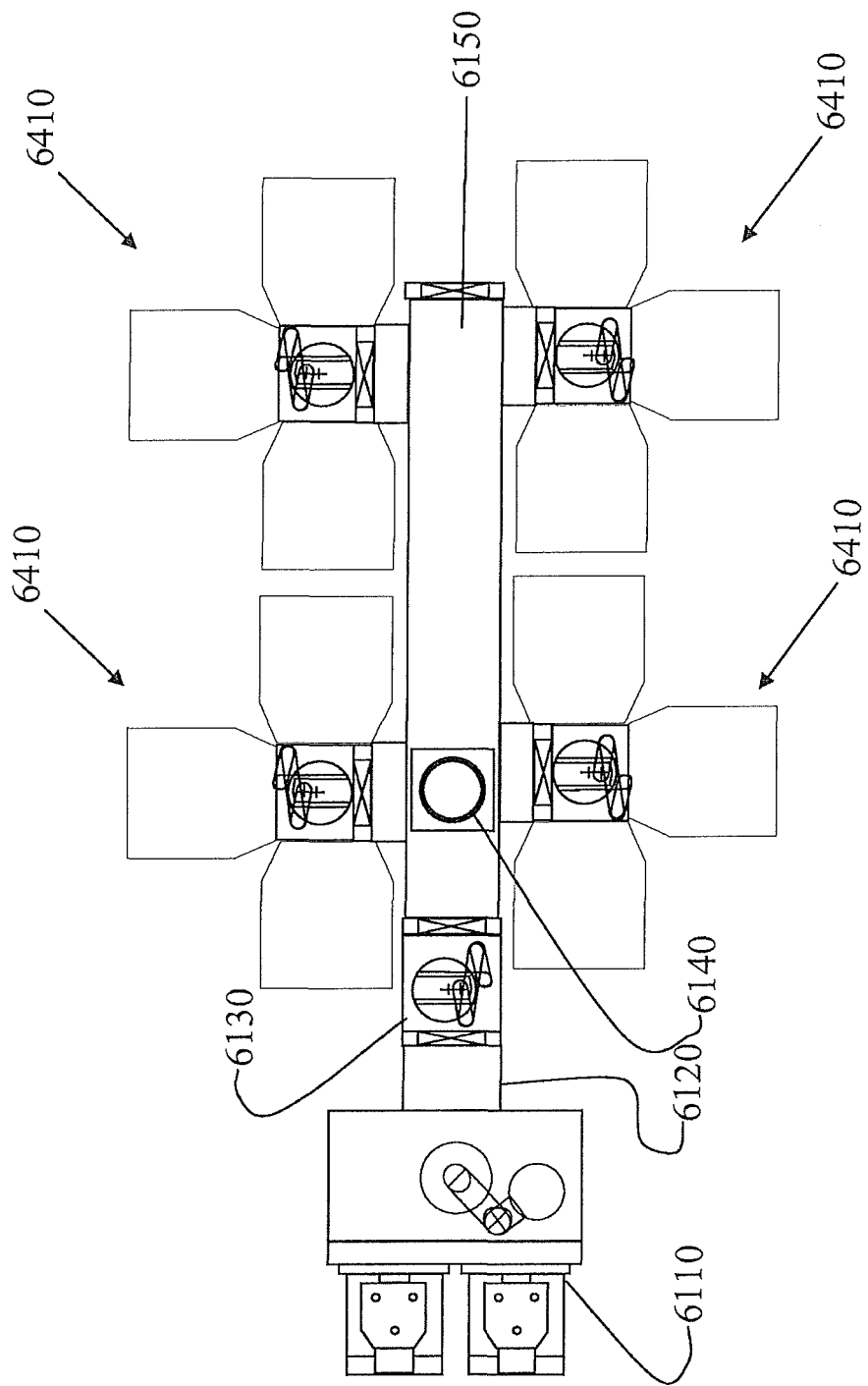
FIG. 65 shows the embodiment of FIG. 64 further including a plurality of cluster process cells and a plurality of transfer robots along both sides of the vacuum tunnel.

FIG. 65 shows another embodiment of a semiconductor processing facility including a transport system. In this system, a number of cluster tools 6410 are interconnected using a transport cart 6140 and tunnel 6150 as described generally above. It will be noted that this arrangement permits interconnection of any number of cluster tools regardless of size. As a significant advantage, this reduces the need for a dense group of cluster tools arranged around a single or multi-robot handling system.

Figure 66:
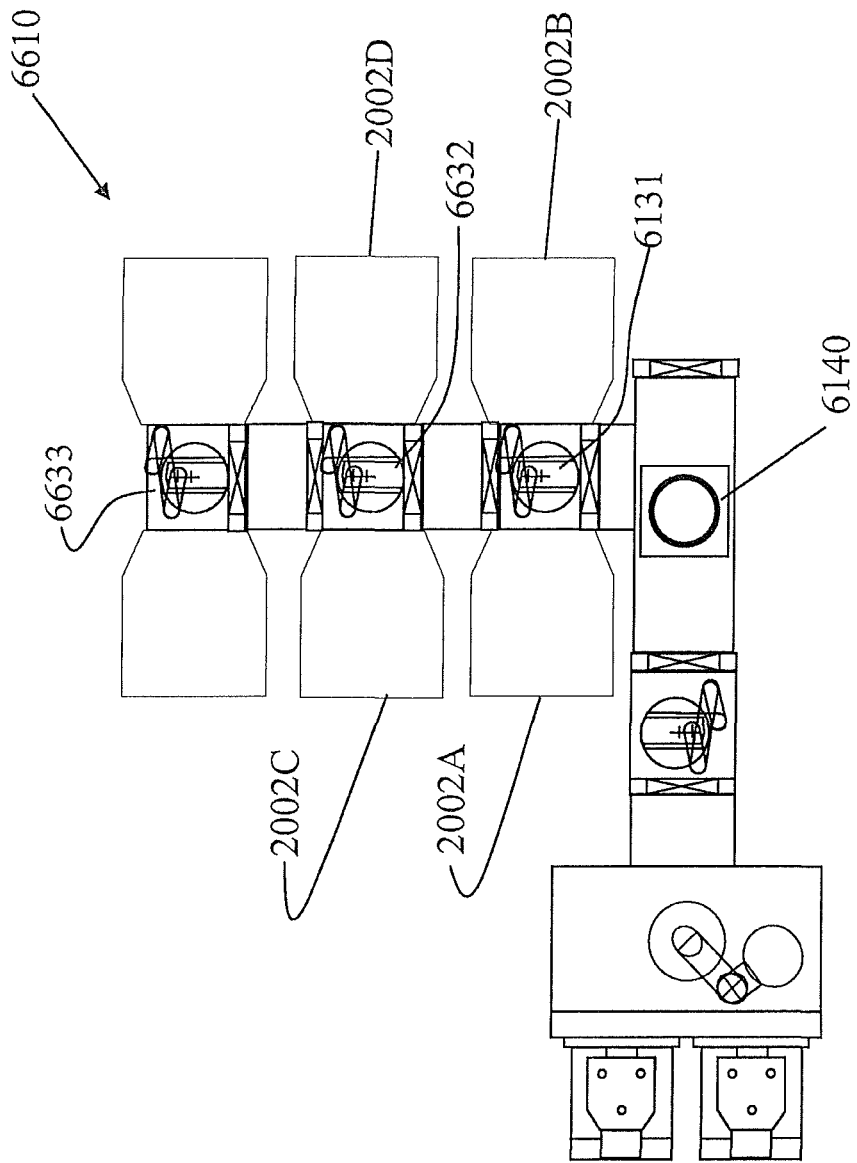
FIG. 66 is a plan view of a preferred embodiment wherein a vacuum tunnel cart is configured with a linear process cell through a transfer robot.

FIG. 66 shows another embodiment of a semiconductor manufacturing facility using a wafer transport system. In this embodiment, a linear processing system 6610 is constructed with a plurality of process modules 2002A-2002D functionally interconnected through a number of robots 6131, 6632, 6633 that employ robot-to-robot handoffs for wafer handling within the linear system 6610. This linear system 6610 may include an interface to a transport cart 6140 which may move wafers to and from the linear system 6610 and any other process cells 6170 connected to the transport system. It will be understood that, while in the depicted embodiment, each transfer robot services two process modules 2002 and handles transfer of work pieces to another transfer robot, other linear layouts may also be employed.

In operation, work pieces may move into the linear process cell by manipulation with the transfer robot 6131 from transport cart 6140. The transfer robot 6131 may either transfer the work piece to transfer robot 6632 or to one of two process modules 2002A or 2002B. The transfer robot 6632 may receive a work piece to be processed from the transfer robot 6631 and either transfers it to the transfer robot 6633 or to one of two process modules 2002C or 2002D. The transfer robot 6633 may receive a work piece to be processed from the transfer robot 6632. Finished work pieces may be transferred to consecutive, adjacent transfer robots until passing through the transfer robot 6131 onto tunnel transport cart 6140. In one embodiment, a load lock may be provided at one end of the linear system 6610 to permit the addition or removal of wafers at an opposing end of the linear system 6610 from the transport cart interface.

Figure 67:
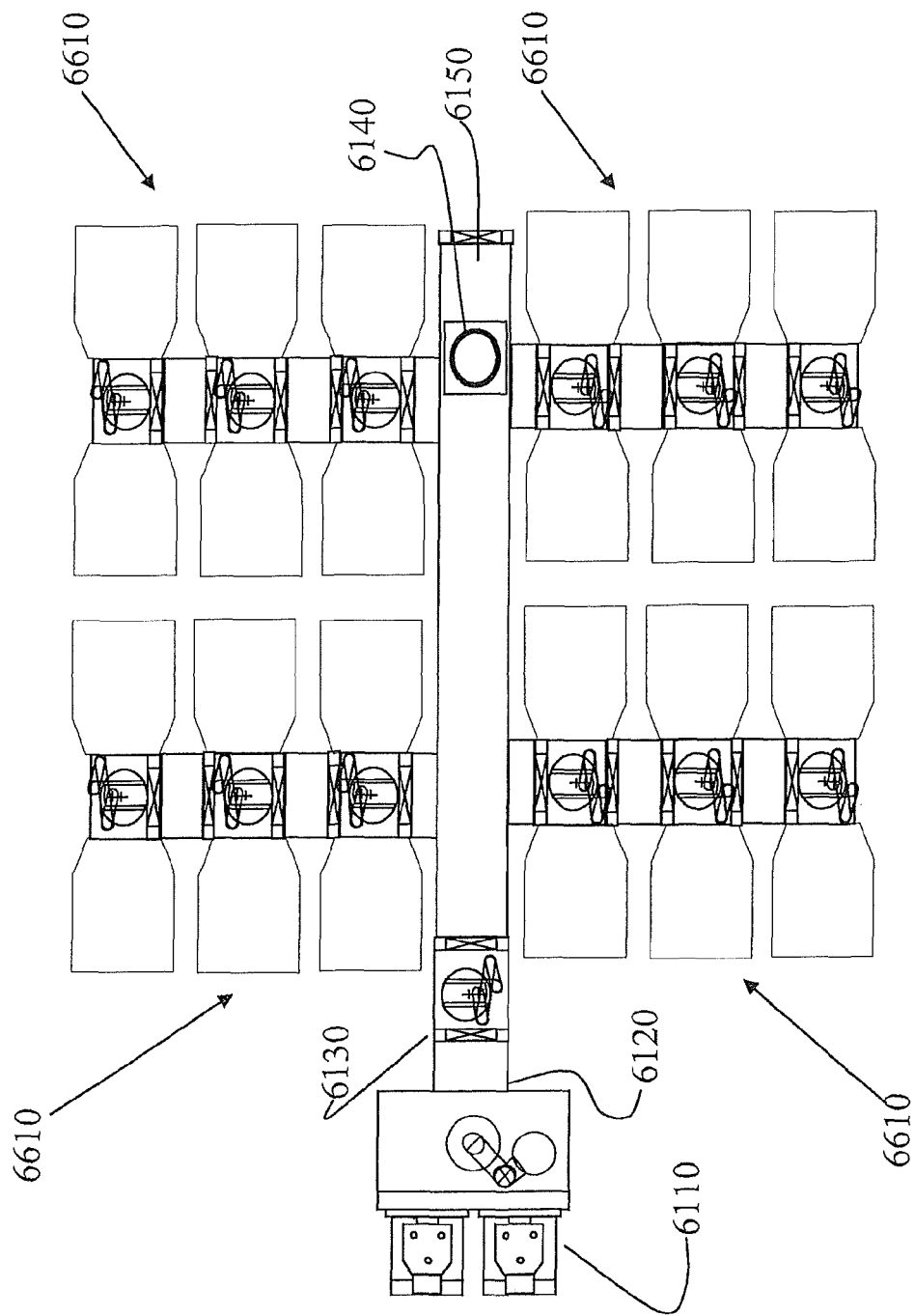
FIG. 67 shows the embodiment of FIG. 66 further including a plurality of linear process cells.

FIG. 67 shows a semiconductor fabrication facility including a transport system. As shown in FIG. 67, a number of linear systems 6610 may be interconnected using a transport cart 6140 and tunnel 6150. As a significant advantage, a single vacuum environment for a number of different linear systems 6610 may be interconnected regardless of the layout and physical dimensions of each linear system 6610. Additionally, longer sequences of processing, or increased throughput of work pieces for individual process cells, can readily be achieved using the cart and tunnel systems described herein.

In one aspect, the selection of process cells connected to the tunnel 6150 may be advantageously made to balance or control system-wide throughput. Thus, for example, process cells with relatively quick process times can be combined with a suitable number of parallel process cells providing a different process with a slower process time. In this manner, a process cell with quick process time can be more fully utilized by servicing multiple downstream or upstream process cells within a single vacuum environment. More generally, using the transport cart 6140 and tunnel 6150, or a number of such carts and tunnels, greater design flexibility is provided for fabrication process layouts to balance load and/or improve utilization among process cells with varying process times and throughput limitations.

Figure 68:
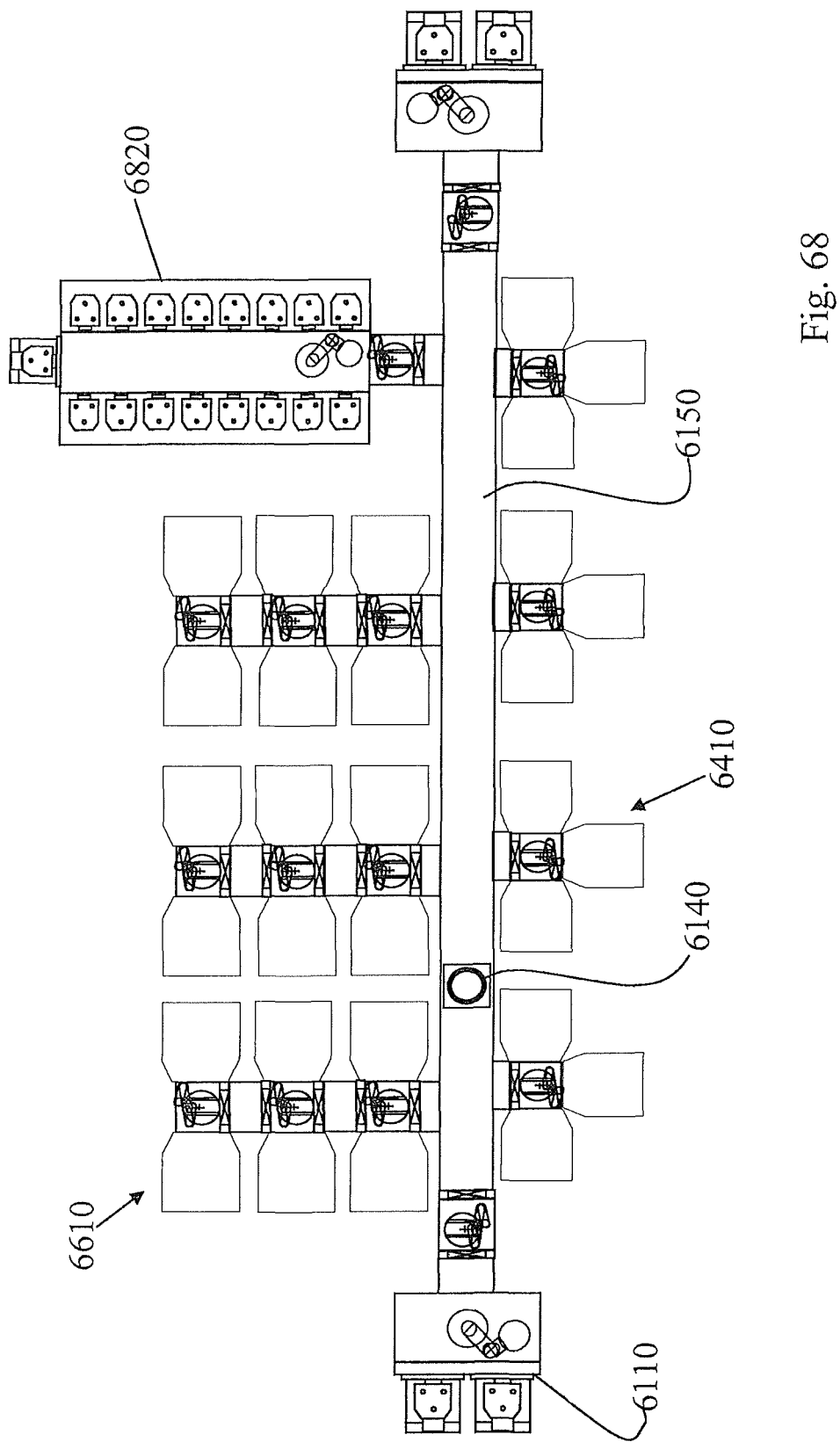
FIG. 68 is a plan view of a preferred embodiment wherein a plurality of cluster process cells and a plurality of linear process cells are configured with a tunnel transfer cart.

FIG. 68 shows a semiconductor fabrication facility with a transport system. As shown, a fabrication facility may include a variety of different tool and module types. For example, the facility may include plurality of cluster process cells 6410 and a plurality of linear process cells 6610, along with a storage cell 6820 that provides a multi-wafer buffer for temporary in-vacuum storage of work pieces. As further depicted, the system may include more than one front end module using, for example, two front end modules on opposing ends of a tunnel 6150. As will be clear from the following description, other shapes are possible, and may include T-junctions, Y-junctions, X-junctions, or any other type of interconnections, any or all of which may end at a front end module or connect to one or more additional tunnels 6150. In this manner, large, complex layouts of interconnected processing modules may be more readily implemented. It will be further understood that individual process cells may be added or removed from such a system in order to adapt a processing facility to different process requirements. Thus, a modular and flexible fabrication layout system may be achieved.

Figure 69:
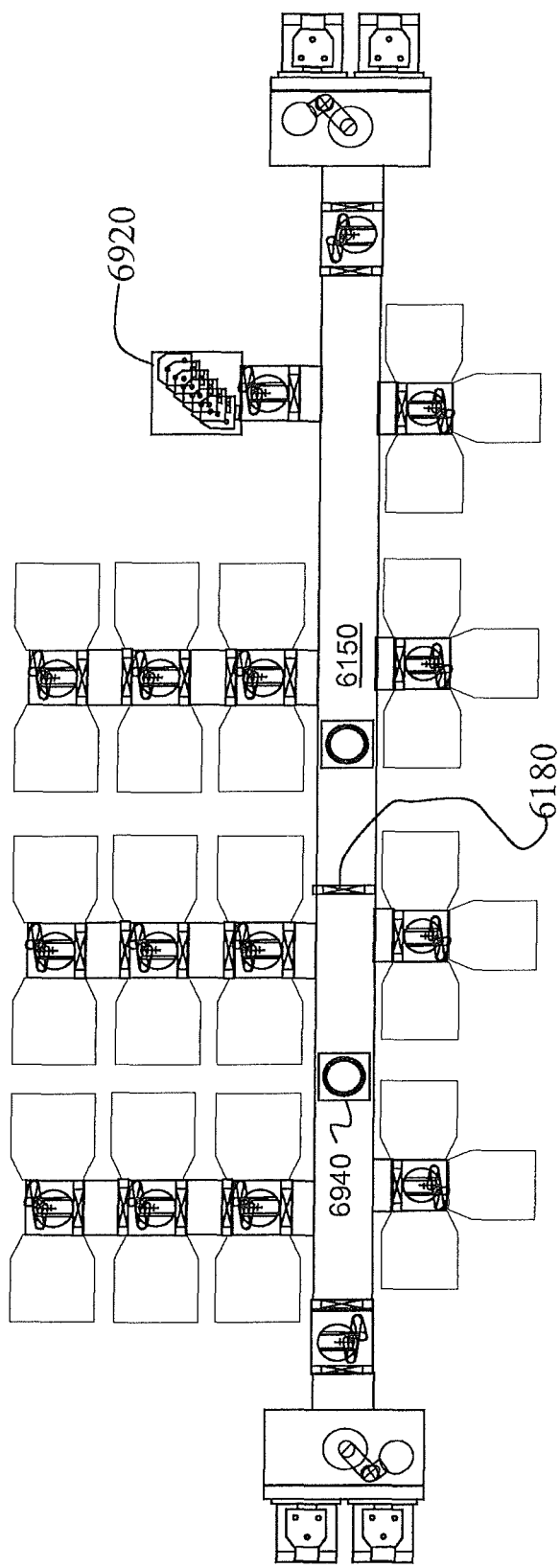
FIG. 69 shows the embodiment of FIG. 68 further including a plurality of transfer carts.

FIG. 69 shows a semiconductor fabrication facility with a transport system. In the embodiment of FIG. 69, an isolation valve 6180 is provided within a straight length of vacuum tunnel 6150. The isolation valve 6180 permits isolation of portions of the tunnel 6150, and more particularly allows processes in which different vacuum environments are appropriate for different groups of process cells. In this embodiment, a second transport cart 6940 is included so that each half of the tunnel 6150 includes an independent transportation vehicle while the isolation valve 6180 is closed. It will be understood that, in certain processes, the isolation valve may remain open and both carts may service both halves of the tunnel 6150. More generally, this illustrates the flexibility of the transportation system to accommodate complex processes using a variety of different processing tools. As depicted in FIG. 69, the system may also include a work piece storage elevator 6920 to provide storage for a plurality of work pieces.

Figure 70:
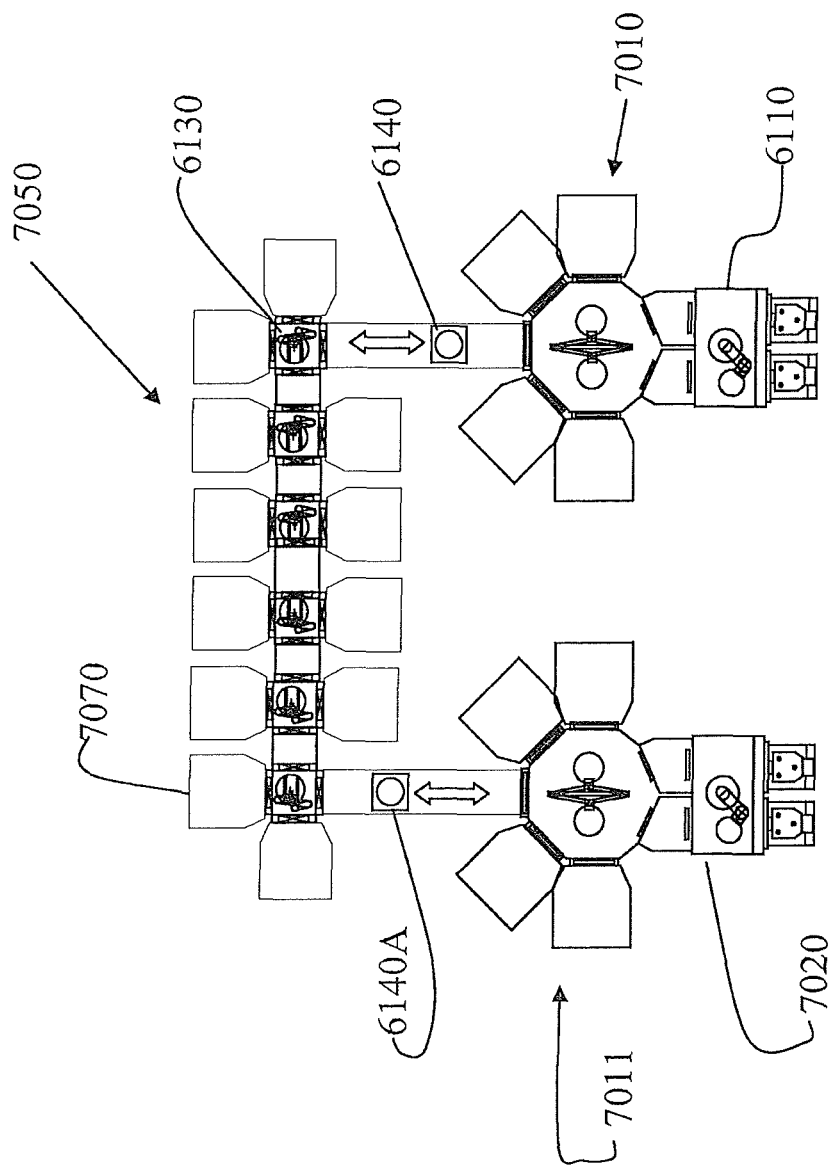
FIG. 70 is a plan view of an alternate embodiment wherein alternate cluster processing cells are combined with both tunnel transport cart systems and a linear processing group.

Referring to FIG. 70, cluster and linear processing groups may be combined with a plurality of tunnel transport cart systems to provide a complex process group. In the embodiment of FIG. 70, two cluster processing cells, a first cluster processing cell 7010 at a first end of the processing group, and a second cluster processing cell 7011 at a second end of the processing group, each interconnect with tunnel transport cart 6140, 6140A for transporting work pieces among the process cells. As depicted, the linear processing cell 7050 may include an access port on each end.

In the embodiment of FIG. 70, an example work piece flow may include receiving the work piece in first cluster processing cell 7010 from input interface module 6110, processing the work piece as necessary in the cluster cell 7010. The first tunnel transport cart 6140 may then transport the work piece to a linear processing group 7050 where it is received by the work piece handling vacuum module 6130 and processed, as required, in one or more process modules 2002. Within the linear processing group 7050 the work piece may be transferred between adjacent transfer robots until all processing within the linear processing group 7050 is complete for the work piece, at which time the work piece is transferred to a second tunnel transport cart 6140A for transport to a second cluster processing cell 7011. Further processing of the work piece, as required, may be performed in the second cluster processing cell 7011 and received into an exit interface module 7020 for automated or manual retrieval.

It will be appreciated that the system may handle multiple wafers at one time. In some embodiments, wafers may flow uniformly from one entrance (e.g., a first front end module 7020) to one exit (e.g., a second front end module 6110). However, the depicted layout can readily accommodate wafers simultaneously traveling in the opposing direction, or wafers entering and exiting through a single one of the front end modules, or combinations of these. As noted above, this permits the deployment of fabrication facilities that significantly improve utilization of particular processing tools, and permits the implementation of numerous, different processes within a single fabrication system.

Figure 71:
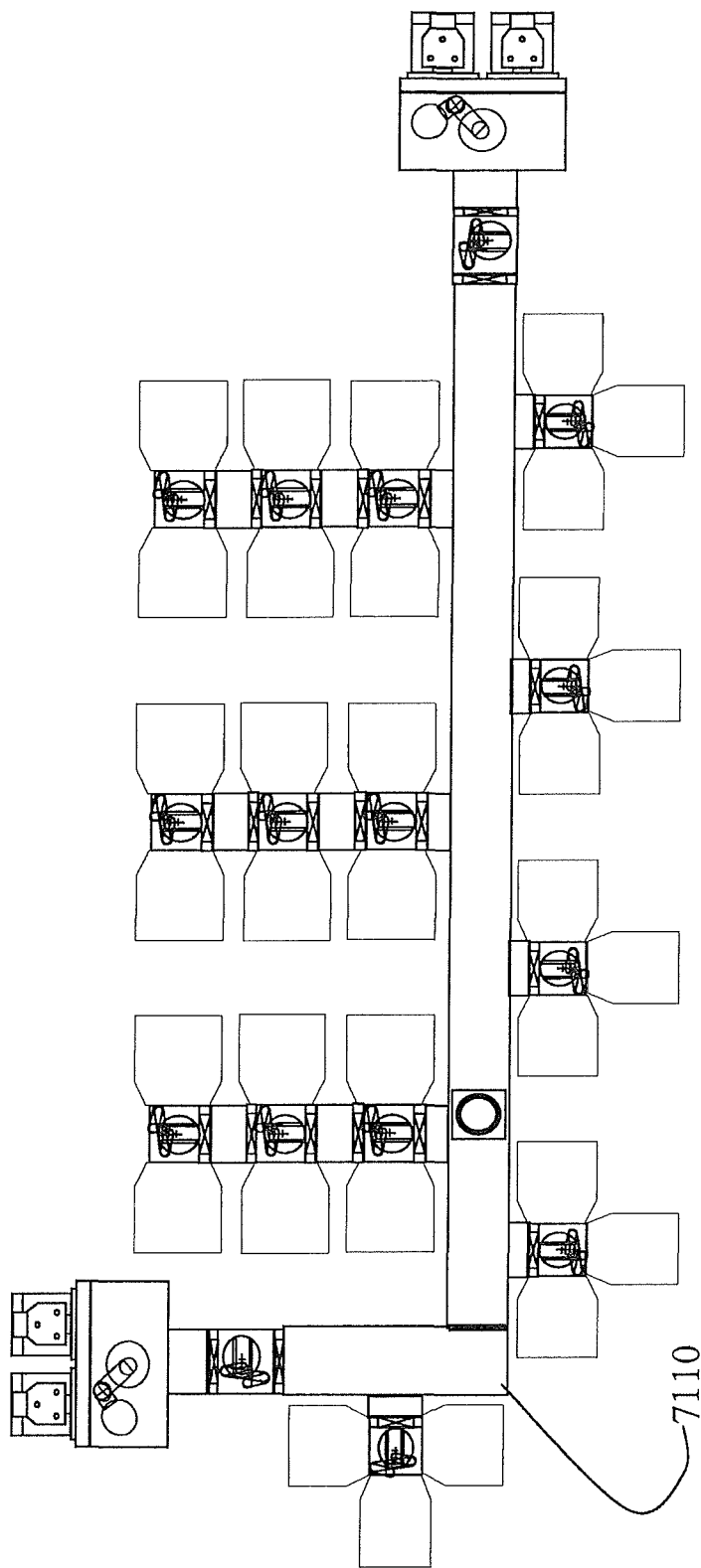
FIG. 71 is a plan view of an alternate embodiment wherein the tunnel forms a shape of an "L".
Figure 72:
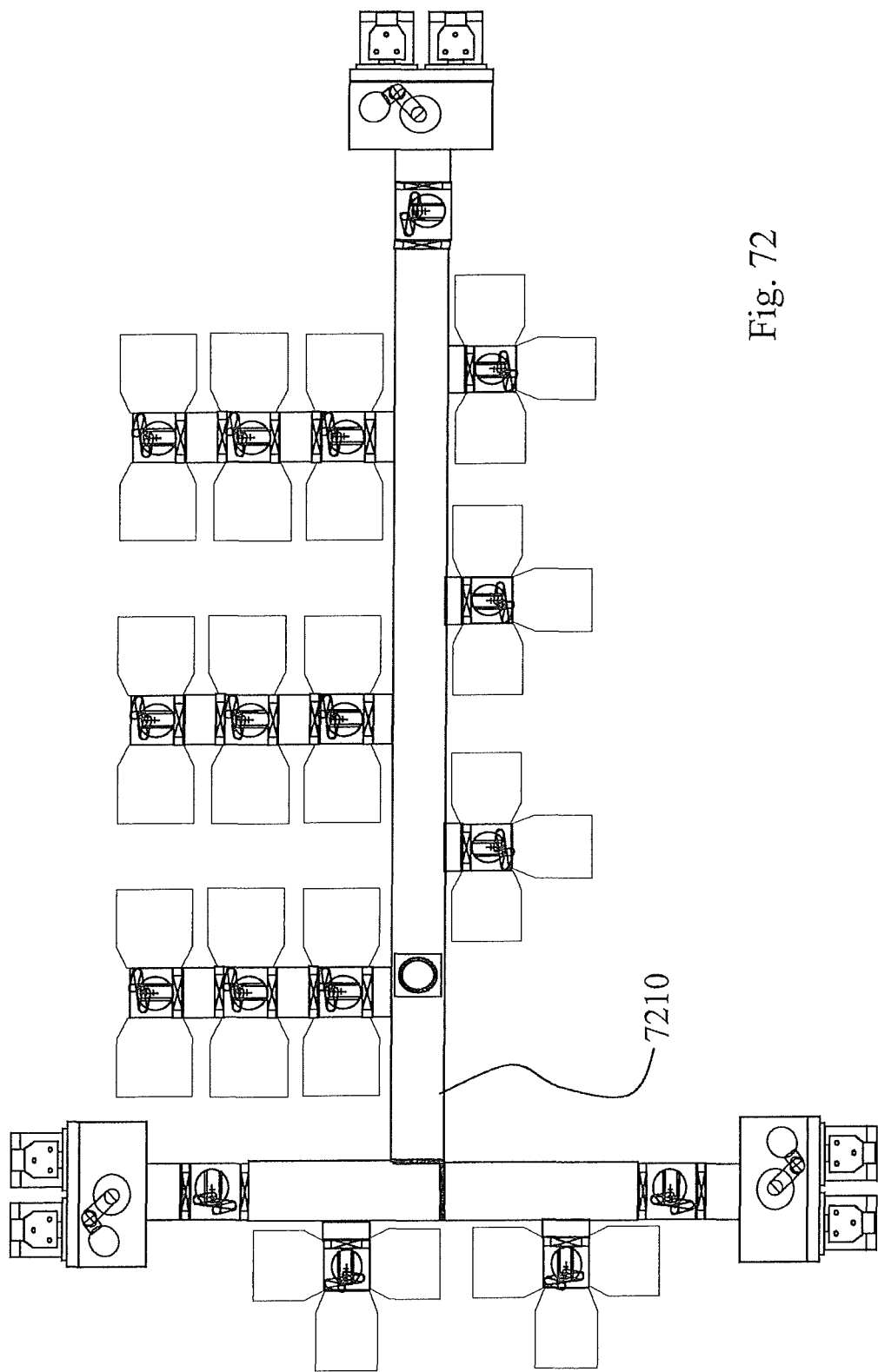
FIG. 72 is a plan view of an alternate embodiment wherein the tunnel forms a shape of a "T".
Figure 73:
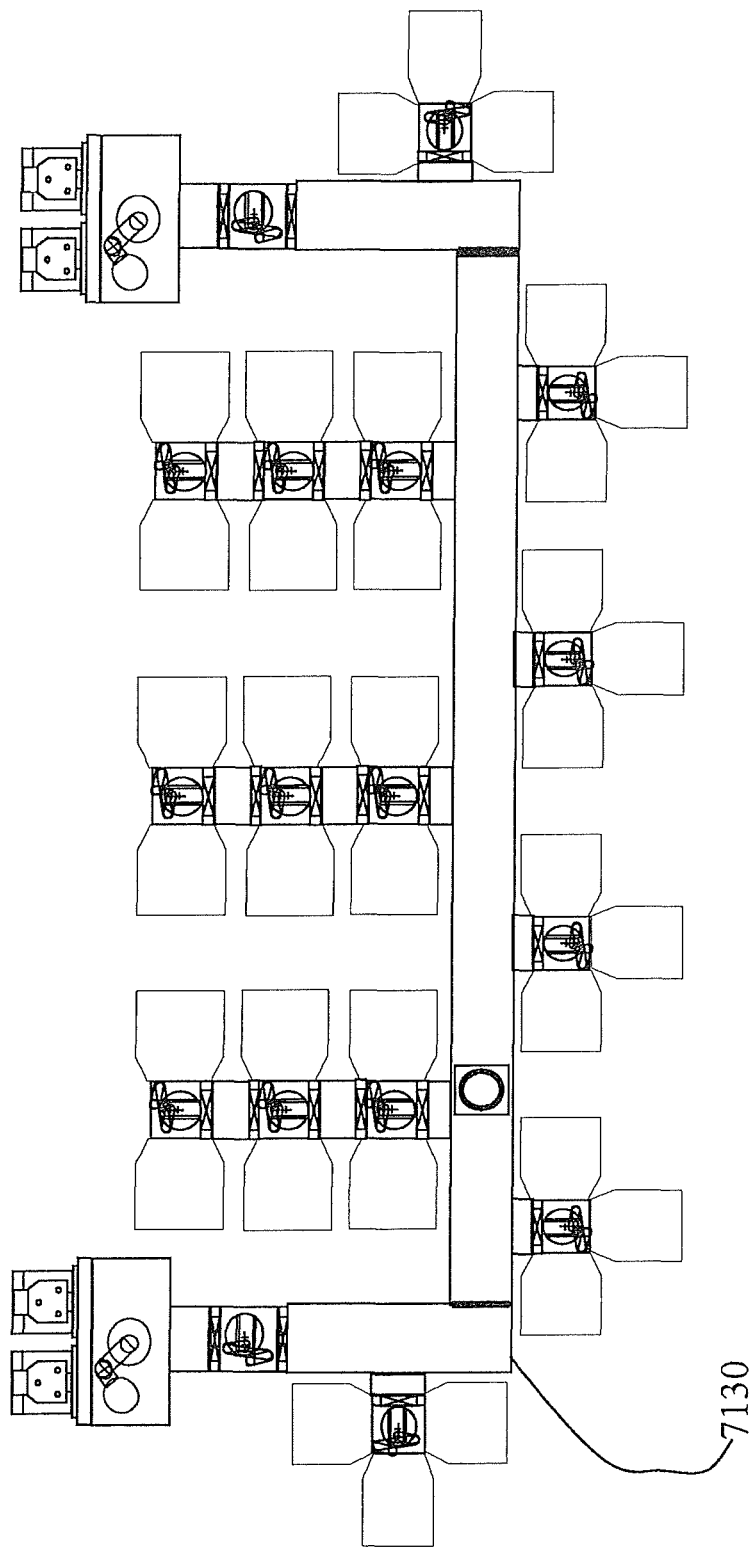
FIG. 73 is a plan view of an alternate embodiment wherein the tunnel forms a shape of a "U".

FIG. 71 shows a two-ended tunnel 7110 having an L-shape. FIG. 72 shows a three-ended tunnel 7210 having a T-shape. FIG. 73 shows a two-ended tunnel 7130 having a U-shape. It will be understood that tunnels may use any of these shapes, as well as other shapes, and combinations thereof in order to accommodate design factors ranging from floor space within a facility to the shape and size of individual pieces of equipment. As depicted by these figures, a variety of different process cell types may be connected to a tunnel as appropriate to a particular process.

Figure 74:
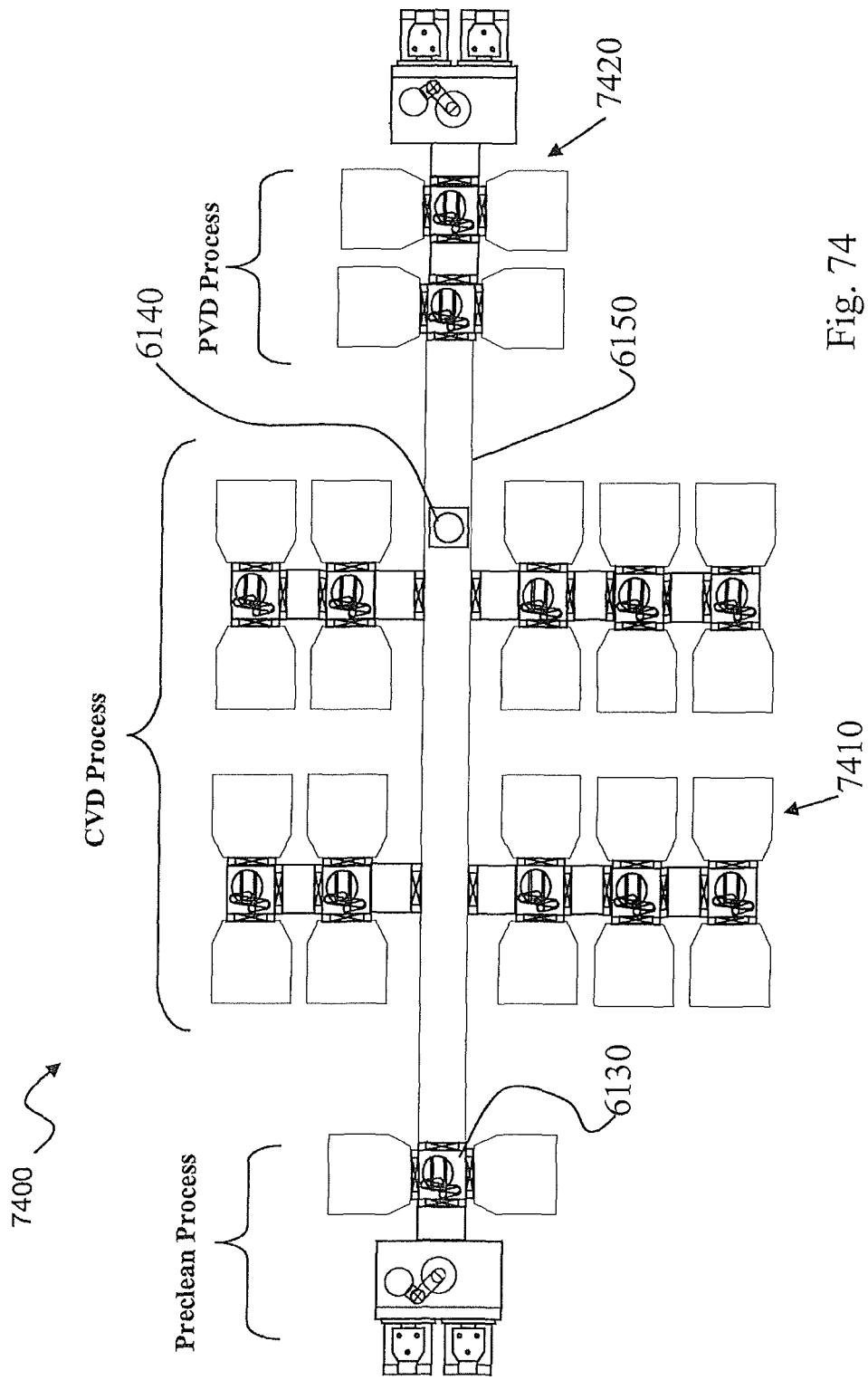
FIG. 74 is a plan view of an alternate embodiment wherein both long duration processes and short processes are required.

Referring to FIG. 74, a transport cart 6140 may interconnect systems having different processing times. For example, the transport cart 6140 may connect a preclean process 6130 to a system 7410 with relatively long process times such as Chemical Vapor Deposition ("CVD") and a system 7420 with relatively short process times such as Physical Vapor Deposition ("PVD").

For configurations that include process steps of substantially different durations, slower processes 7410 may be supported by a relatively large number of associated tools (which may be deployed as clusters or linear groups) in order to balance throughput for the combined processing system 7400. Thus, using the transport systems described herein, conceptual bottlenecks in complex semiconductor manufacturing processes can be addressed by simply expanding capacity around longer processes, thereby improving utilization of tools having relatively shorter processes. By way of example and not of limitation, processes having relative durations of 1 (preclean): 2 (PVD): 10 (CVD) can be supported by a facility having 2 preclean tools, 20 CVD processing tools, and 4 PVD processing tools working together in a single vacuum environment supported by a cart 6140 and tunnel 6150. While preserving this ratio, the total number of each tool type may be expanded or contracted according to further process constraints such as the throughput capacity of front end modules or other separate systems within a fabrication facility.

Figure 75:
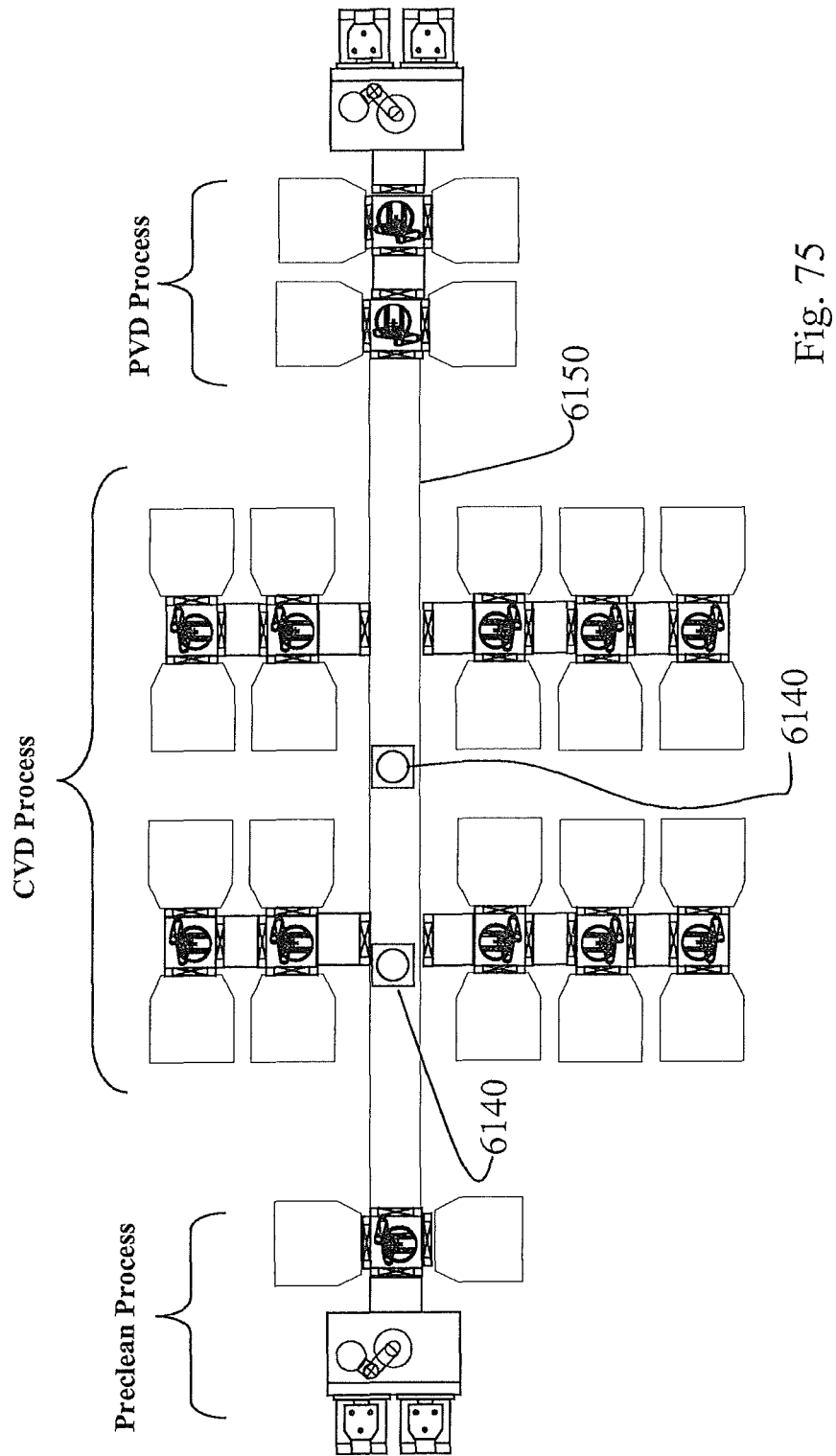
FIG. 75 shows the embodiment of FIG. 74 with a plurality of transport carts in the transport tunnel.

Referring to FIG. 75, the configuration of FIG. 74 alternatively may include a plurality of carts 6140 in one tunnel 6150 wherein each cart transports work pieces over a portion of the tunnel 6150. Coordination of the carts may be employed to avoid collision of adjacent carts at a common side process cell.

An alternate embodiment may include a tunnel configured as a loop to allow transport carts that have reached the end process cell to continue in a loop to an input interface module to accept a new work piece for transport. The loop may be configured either as a horizontal loop or a vertical loop, or a combination of these.

Figure 76:
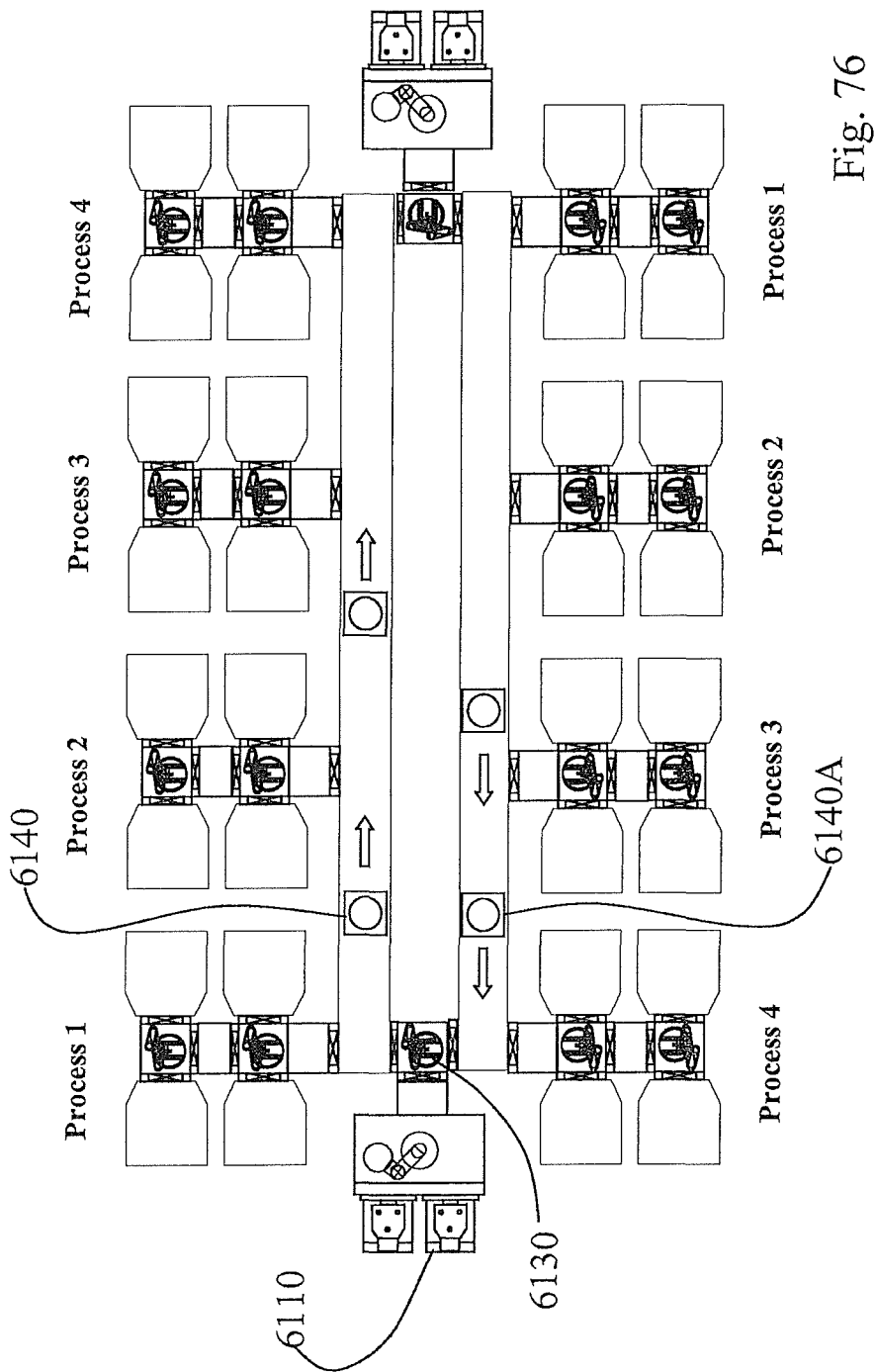
FIG. 76 is an alternate embodiment wherein a plurality tunnel transport cart systems are interconnected by work piece handling vacuum modules.

Referring to FIG. 76, a plurality of tunnel transport carts may be interconnected by work piece handling vacuum modules. In the embodiment of FIG. 76, a transfer robot 6130 may serve as an interface between two separate tunnel transport carts 6140 and 6140A, and may further serve as an interface to a front end module 6110 for purposes of transferring work pieces into and out of the vacuum environment. The embodiment of FIG. 76 may accommodate substantial flexibility of use of the process cells. Each interface module may enable access to both of the tunnel transport carts, facilitating increased capacity if the process cells associated with each tunnel are the same. Alternatively, the embodiment of FIG. 76 may allow redundancy of processes; a common interface module for different processes, or may support additional processing steps by combining the separate tunnel transport cart systems into one process group.

Figure 77:
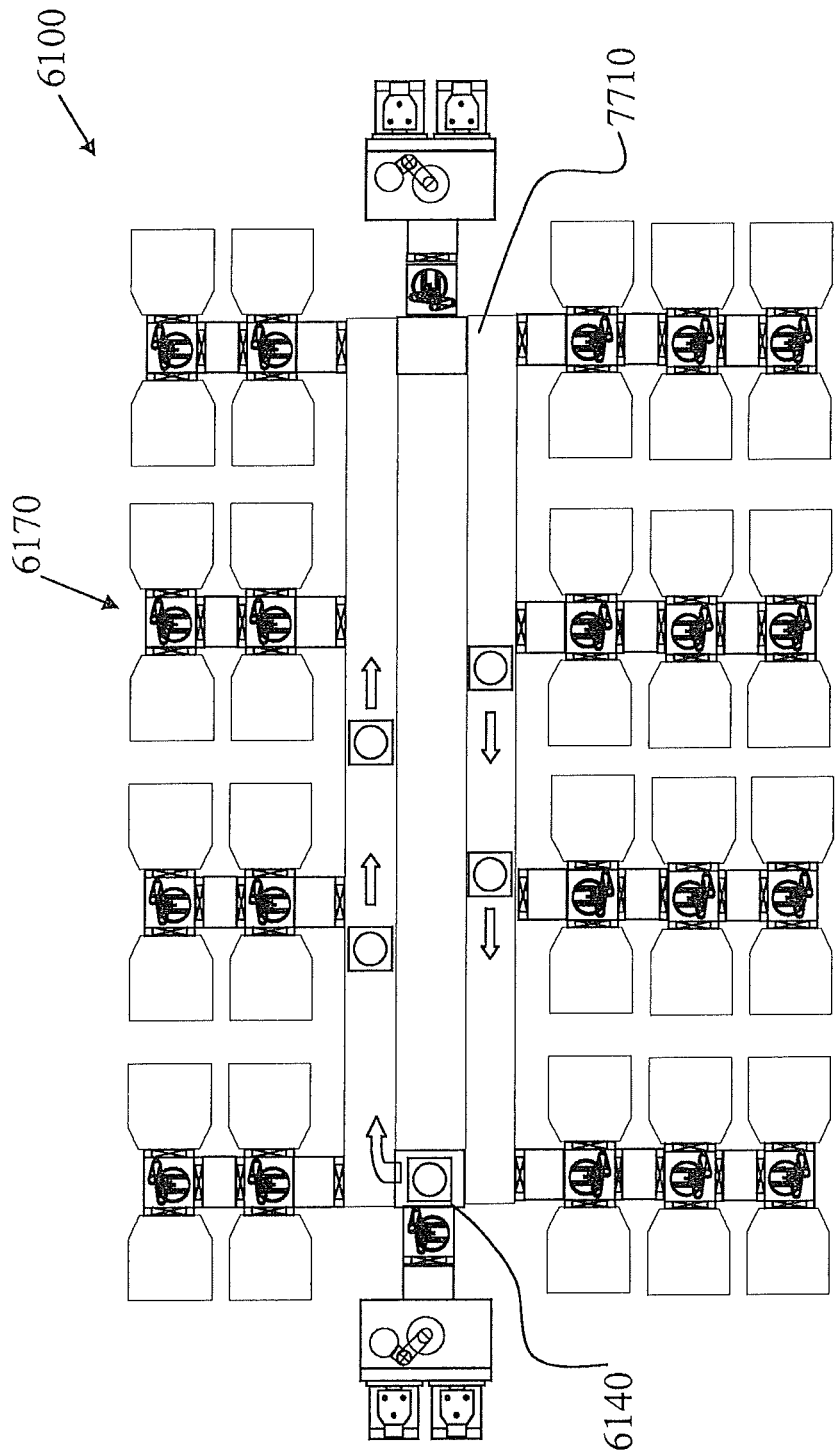
FIG. 77 shows the embodiment of FIG. 76 wherein the tunnel transport cart system forms a complete loop.

FIG. 77 shows a system 6100 wherein the transport system forms a complete loop 7710. In this embodiment, a transport cart 6140 may move continuously in a single direction around the loop, while adding or removing work pieces at appropriate locations within the process. In addition, one or more locations may be serviced by an equipment front end module for transferring work pieces to and from the vacuum environment. As a significant advantage, this layout permits direct transfer between any two process cells connected to the system. It will be understood that any number of transport carts 6140 may share the tunnel, and having more than one transport cart 6140 increases processing options by permitting multiple inter-cell transfers at a single time.

Figure 78:
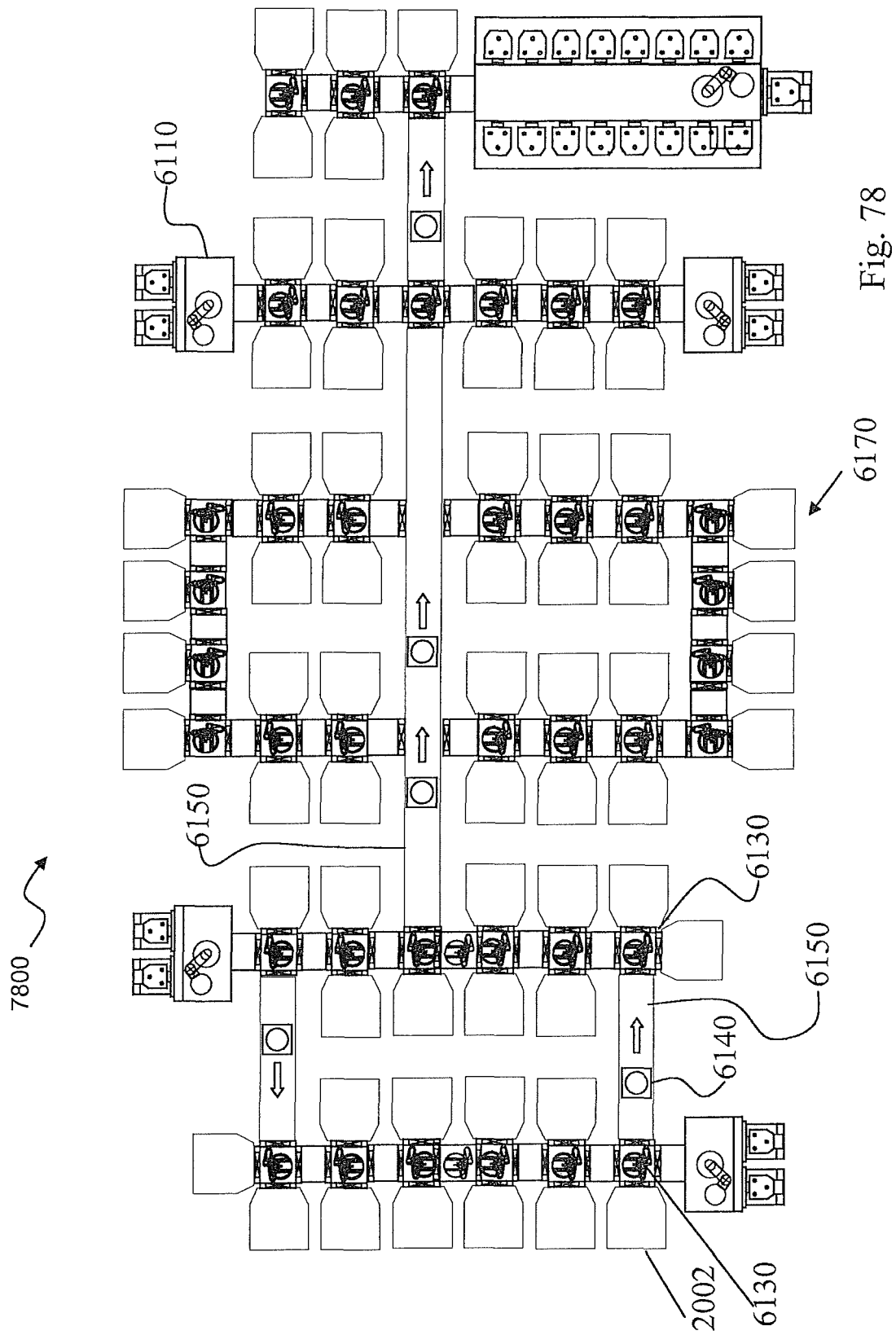
FIG. 78 shows an alternate embodiment depicting a complete process group.

FIG. 78 shows a semiconductor processing system including a transportation system. The system 7800 is a complex system including a variety of cart and processing module configurations. In particular, the system 7800 of FIG. 78 includes four front end modules, one storage module, four independent cart transport systems, and six separate linear processing modules. By way of illustration, it will be noted that one of the linear processing modules 6110 includes two front end modules (one on each end), and intersects two tunnels for interconnection to adjacent processing systems. More generally, and as generally noted above, any arrangement of tools, clusters, and related hardware can be shared using one or more tunnels and carts as described herein. The embodiment of FIG. 78 may allow work pieces to be removed from the vacuum environment at a number of locations (illustrated as front end modules) to undergo atmospheric processes such as inspection, chemical mechanical polishing, or electro-plating. Work pieces may also be returned to the vacuum environment as needed. A wide variation of possibilities emerges from this type of system.

In the configuration of FIG. 78, transfer robots 6130 may be used to transfer work pieces from a transport cart 6140 to a process cell 6170, or an interface module 6110, as well as transferring work pieces between carts 6140 on separate transport vacuum tunnels 6150.

This configuration permits a work piece to be processed on one or more of the processes associated with one or more of the transport vacuum tunnels without the work piece having to be removed from the vacuum environment. Linking transport vacuum tunnels by transfer robots allows for isolation of one or more of the transport vacuum tunnels, thus permitting adjacent use of different vacuum environments and enabling independent operation of the processes associated with each of the transport vacuum tunnels.

Figure 79:
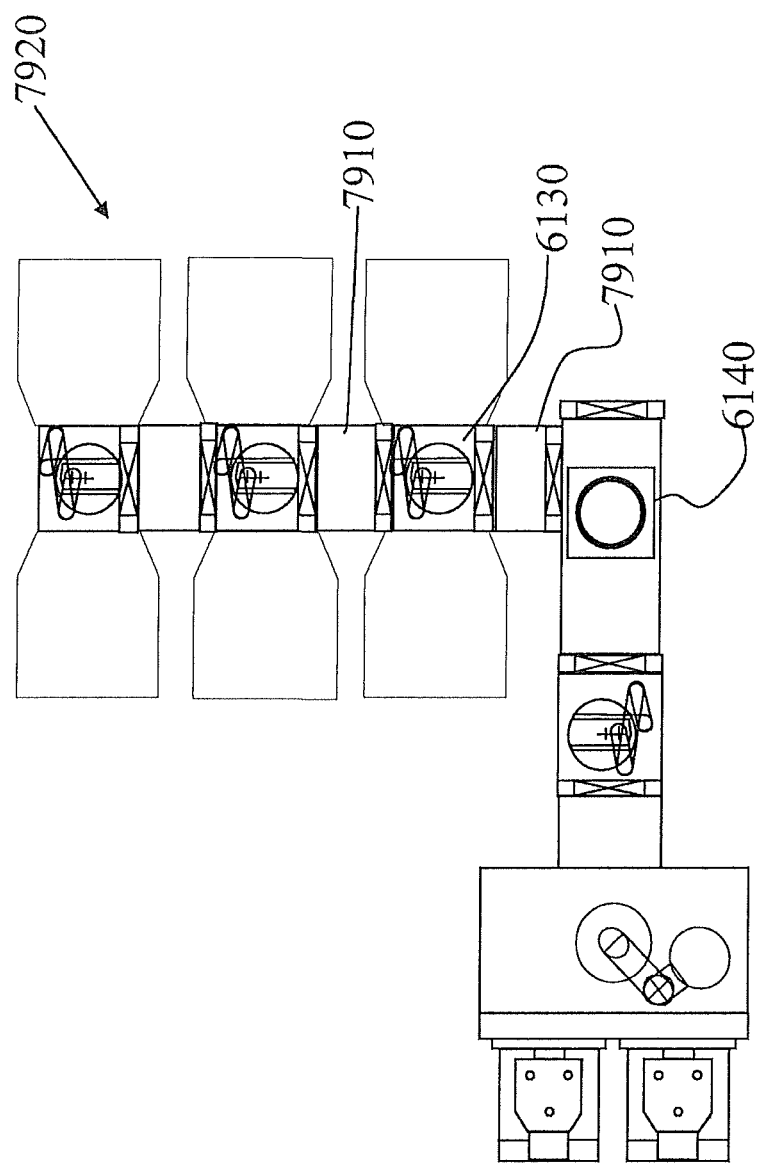
FIG. 79 shows an embodiment of a work piece buffer zone in a vacuum processing system.

FIG. 79 shows an embodiment which includes vacuum tubes 7910 located between processing modules. More generally, these vacuum tubes 7910 may be placed between any adjacent vacuum hardware to extend a vacuum environment across a physical void. The vacuum tubes 7910 may be fashioned of any suitable material including, where interior visibility is desired, glass or the like. These vacuum tubes 7910 can be intended to provide additional functionality such as described in previous paragraphs and below, and have very few design constraints except that they preferably form a vacuum seal where they physically connect to other system components, and they provide sufficient interior space for passage of wafers, workpieces, and any robotic arms or the like associated with handling same. In general, the vacuum tubes 7910 serve as a physical buffer between adjacent hardware, such as processing modules (or, as depicted, pairs of modules serviced by a single robot) in order to permit functional couplings that cannot be achieved directly due to physical dimensions of the hardware.

Figure 80:
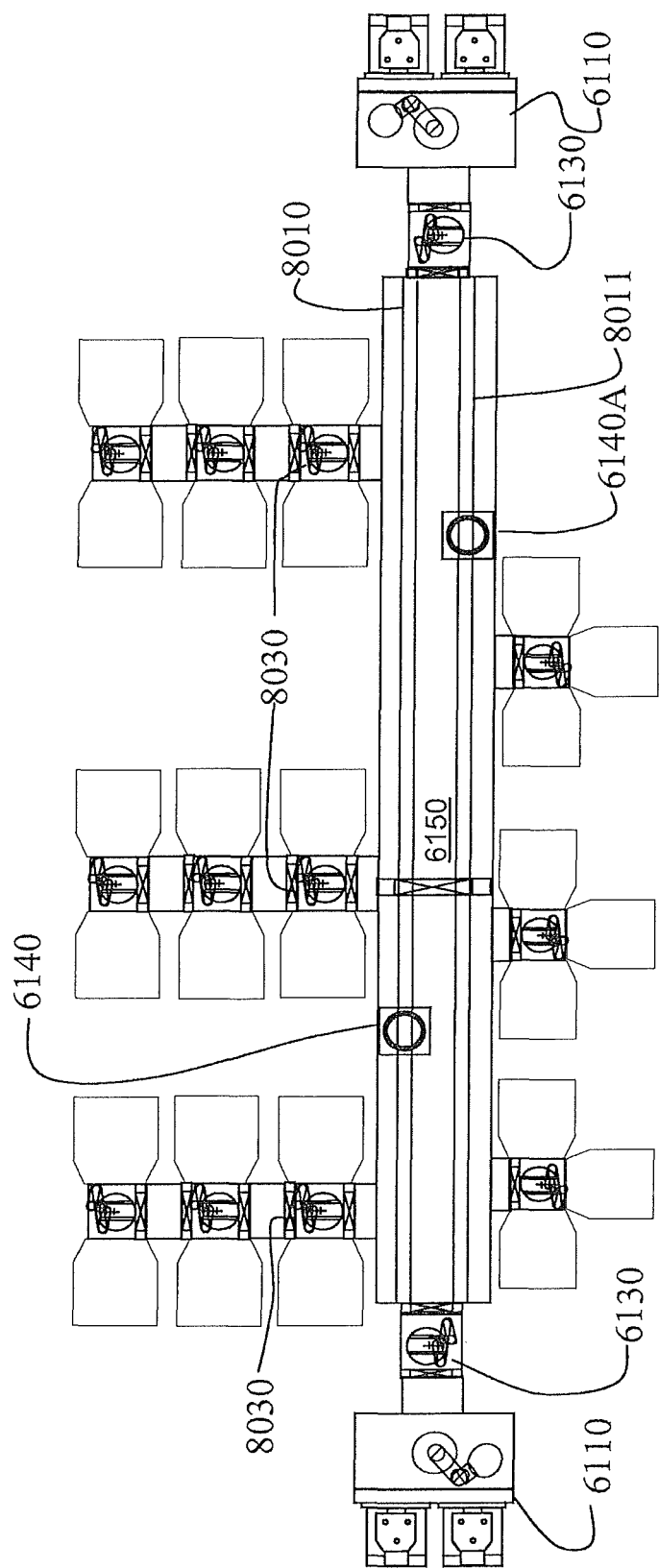
FIG. 80 shows dual side-by-side independent transport carts in a vacuum tunnel.

FIG. 80 shows a semiconductor processing system including a transportation system. The embodiment of FIG. 80 includes dual side-by-side independent transport carts in a single vacuum tunnel. Carts 6140 and 6140A may operate independently on non-interfering paths 8010 and 8011 within the tunnel 6150. Robots 6130 may transfer a work piece among a first cart 6140, a second cart 6140A, and an interface 6110. In one embodiment, the robots 8030 that service one or more of the process cells may be configured to reach across the tunnel 6150 so that workpieces may be picked from or placed to either of the carts 6140A, 6140B. A number of work piece handling vacuum modules may move work pieces between the carts 6140, 6140A and their respective process cells. The embodiment of FIG. 80 allows for faster transfer of work pieces among process cells than would an embodiment with dual coordinated transport carts or a single path. In another aspect, the paths 8010, 8011 may include exchanges or cross-overs to permit each cart 6140, 6140A to switch between the paths 8010, 8011 for increased flexibility in material handling. One or more isolation valves may be provided to isolate various segments of the tunnel 6150.

Figure 81:
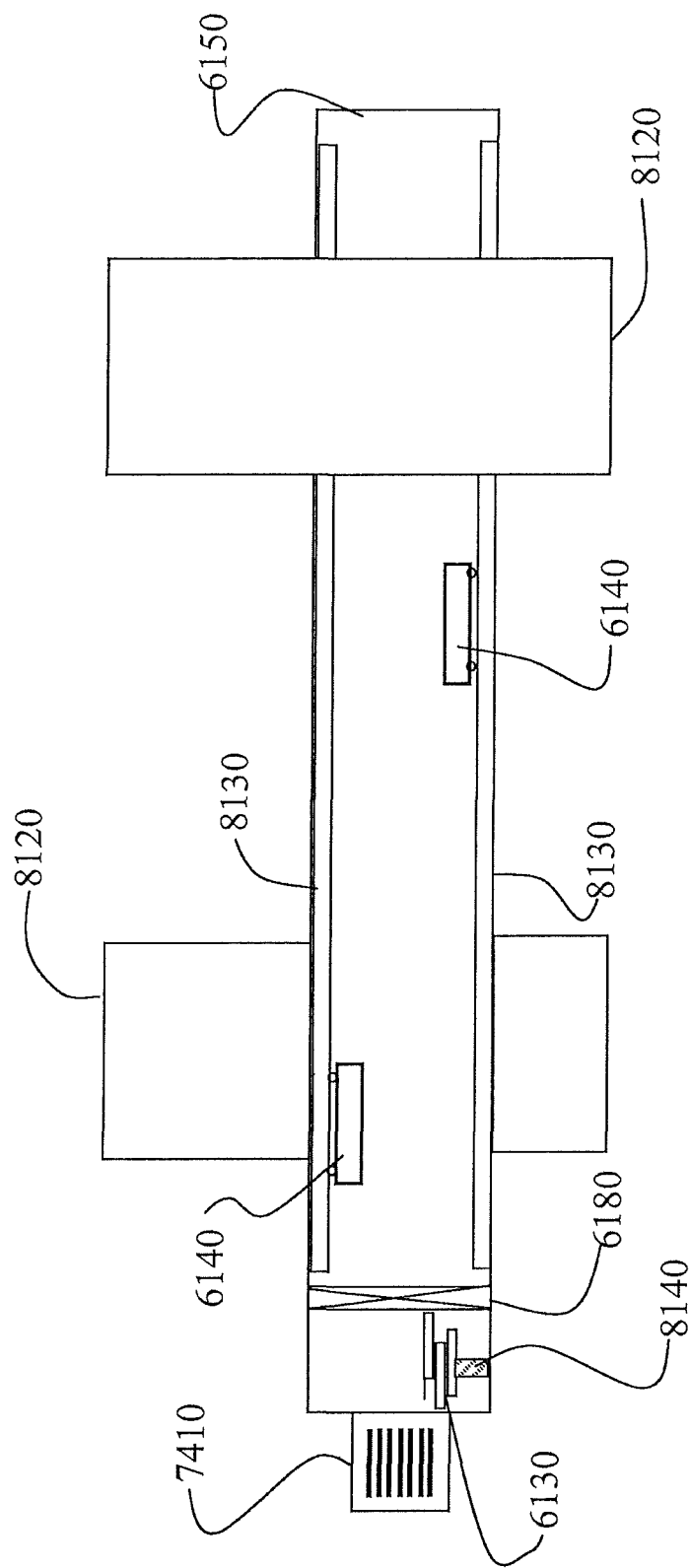
FIG. 81 shows a side view of dual vertically opposed independent transport carts in a vacuum tunnel.

FIG. 81 shows a side view of dual vertically opposed independent transport carts in a vacuum tunnel. In the embodiment of FIG. 81, a tunnel 6150 encloses two transport carts 6140 running on railway or levitation systems 8130. A robot 6130 may access work pieces through an isolation valve 6180 for loading and unloading the work pieces among an interface 7410 (such as load-lock or equipment front end module) and the transport carts 6140. In a similar way, transfer robots (not shown) may transfer work pieces among carts 6140 and process cells 8120. The transfer robot 6130 may be vertically adjustable through use of a robot lift 8140 or other z-axis controller to facilitate transferring a work piece between different cart levels.

Figure 82:
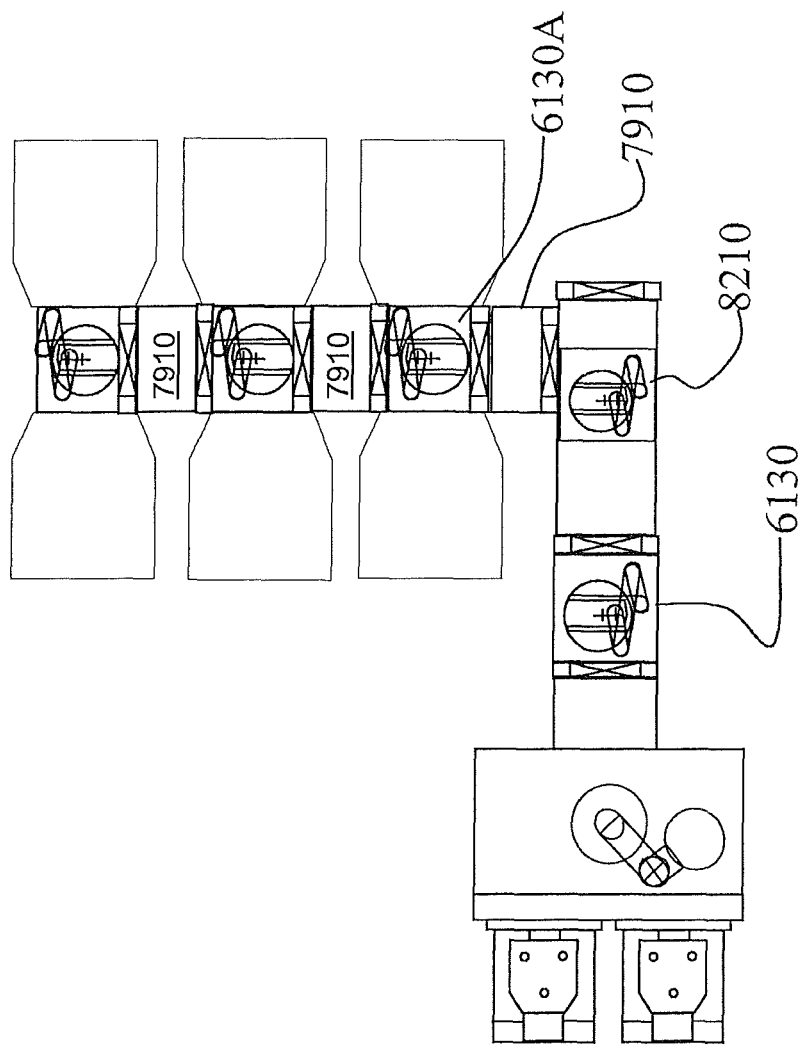
FIG. 82 shows an embodiment of transport cart with a robotic arm in a processing system that also includes transfer robots for work piece handling.

FIG. 82 shows an embodiment of transport cart with a robotic arm in a processing system that also includes transfer robots for work piece handling. Transfer robots 6130 and 6130A may coordinate with a cart robot 8210 to facilitate handling of work pieces. One or more vacuum extensions 7910 may be provided to physically accommodate adjacent process cells.

Figure 83:
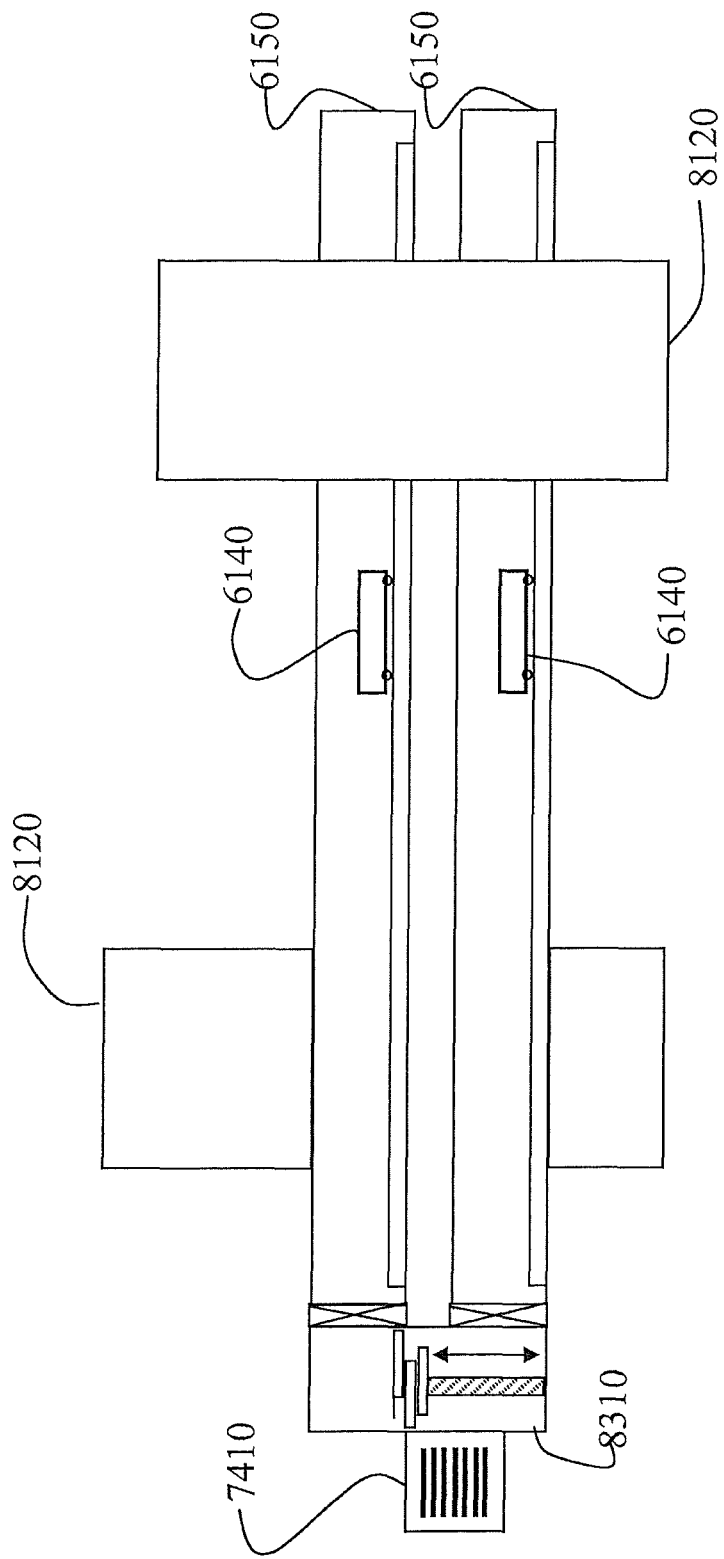
FIG. 83 shows an embodiment of dual independent transport tunnels, each with a transport cart.

FIG. 83 illustrates a semiconductor manufacturing system with dual independent transport tunnels 6150. Each tunnel may include a transport cart 6140. In the embodiment of FIG. 83, a transfer robot 8310 with vertical motion capabilities may transfer work pieces among the transport cart in the lower tunnel, the transport cart in the upper tunnel, and a load-lock 7410. Similarly, transfer robots (not shown) may transfer work pieces among the upper cart 6140, and the lower cart 6140 and the process cells 8120.

Figure 84:
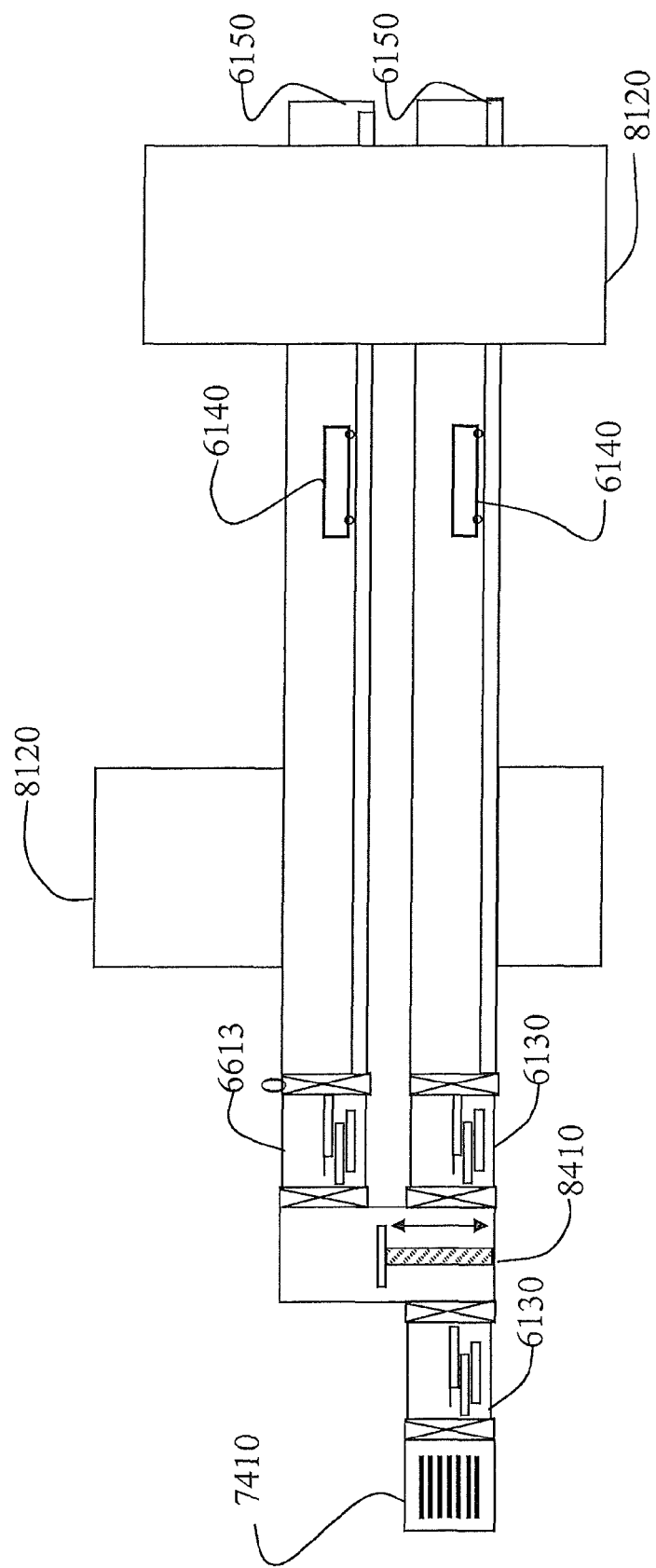
FIG. 84 shows an embodiment of the embodiment depicted in FIG. 83 wherein a work piece elevator is used to move a work piece from the lower tunnel to the upper tunnel.

FIG. 84 is an alternate embodiment of the embodiment depicted in FIG. 83 wherein a work piece elevator 8410 is used to move a work piece from the lower tunnel to the upper tunnel. Additionally, a transfer robot 6130 may be associated with each tunnel 6150 to transfer the work piece between the work piece elevator 8410 and the transport cart 6140. Additionally a transfer robot 6130 may be required between the work piece elevator 8410 and the load-lock 7410 to facilitate transfer of work pieces between the work piece elevator 8410 and the load-lock 7410.

Figure 85:
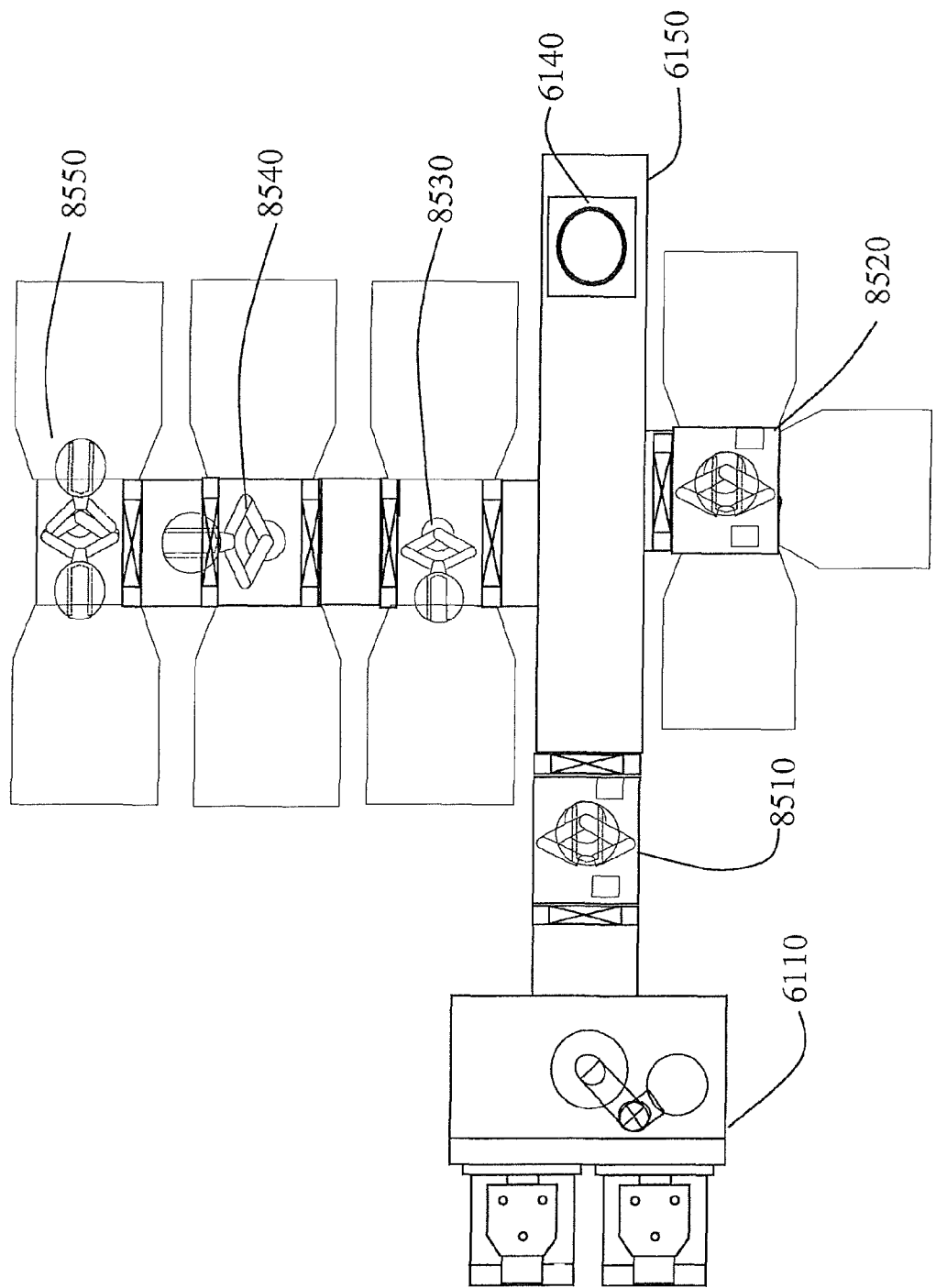
FIG. 85 is an embodiment of a system wherein two types of frog-leg style robots are configured as the main work piece handling transfer robots.

FIG. 85 shows an embodiment of a tunnel system using frog-leg type robots. The frog-leg type robot may be the main work piece handling transfer robot. The transfer robot 8510 may be used to transfer work pieces from the interface 6110 to the cart 6140, and is depicted as a fully retracted frog-leg robot. The transfer robot 8520 may also be retracted and is shown in a cluster cell configuration on the right side of tunnel 6150. Additional robots within the system may be frog-leg robots, as illustrated generally in the linear processing arrangement on the left side of the tunnel 6150. In the linear processing group, the transfer robot 8530 may extend into a process chamber, while transfer the robot 8540 extends toward the transfer robot 8550, which is depicted as a dual frog-leg robot partially extended toward both associated process chambers simultaneously.

Figure 86:
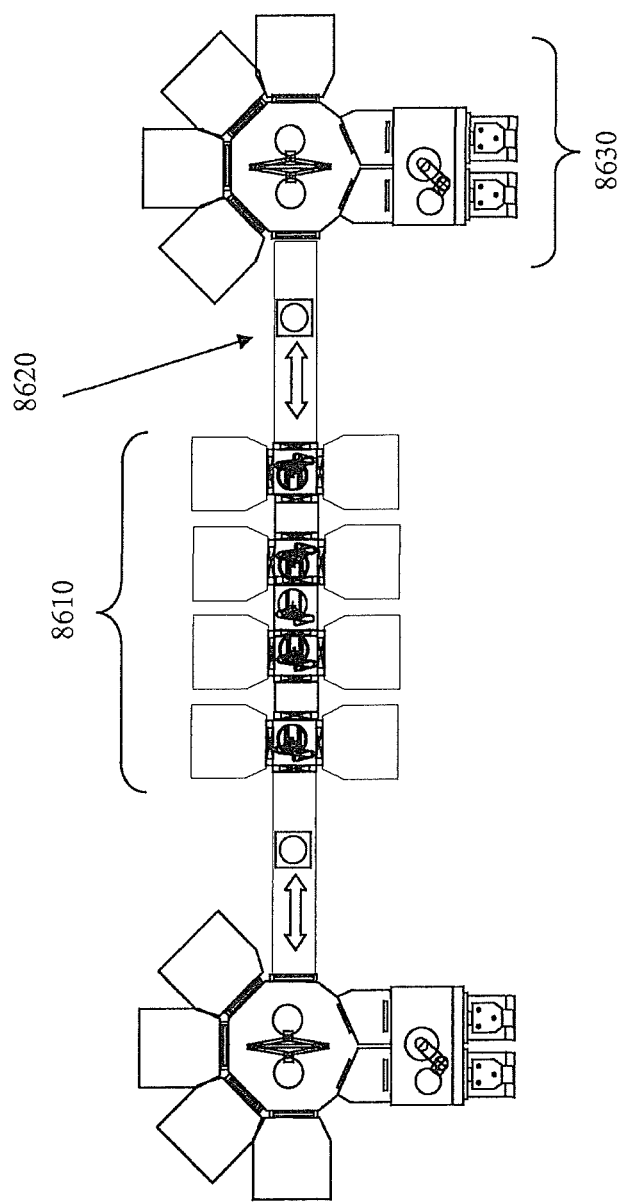
FIG. 86 illustrates another embodiment of the systems described herein.

FIG. 86 illustrates an embodiment of an integration scheme of a "bucket-brigade" 8610 linear group, a wafer transport shuttle system 8620 and traditional cluster tool systems 8630. More generally, any combination of traditional cluster tools 8630, linear "bucket-brigade" systems 8610 and shuttle systems 8620 is possible. In one application, short processes on the cluster tool can be combined with longer processes in the bucket brigade to improve per-tool utilization within the system.

Figure 87:
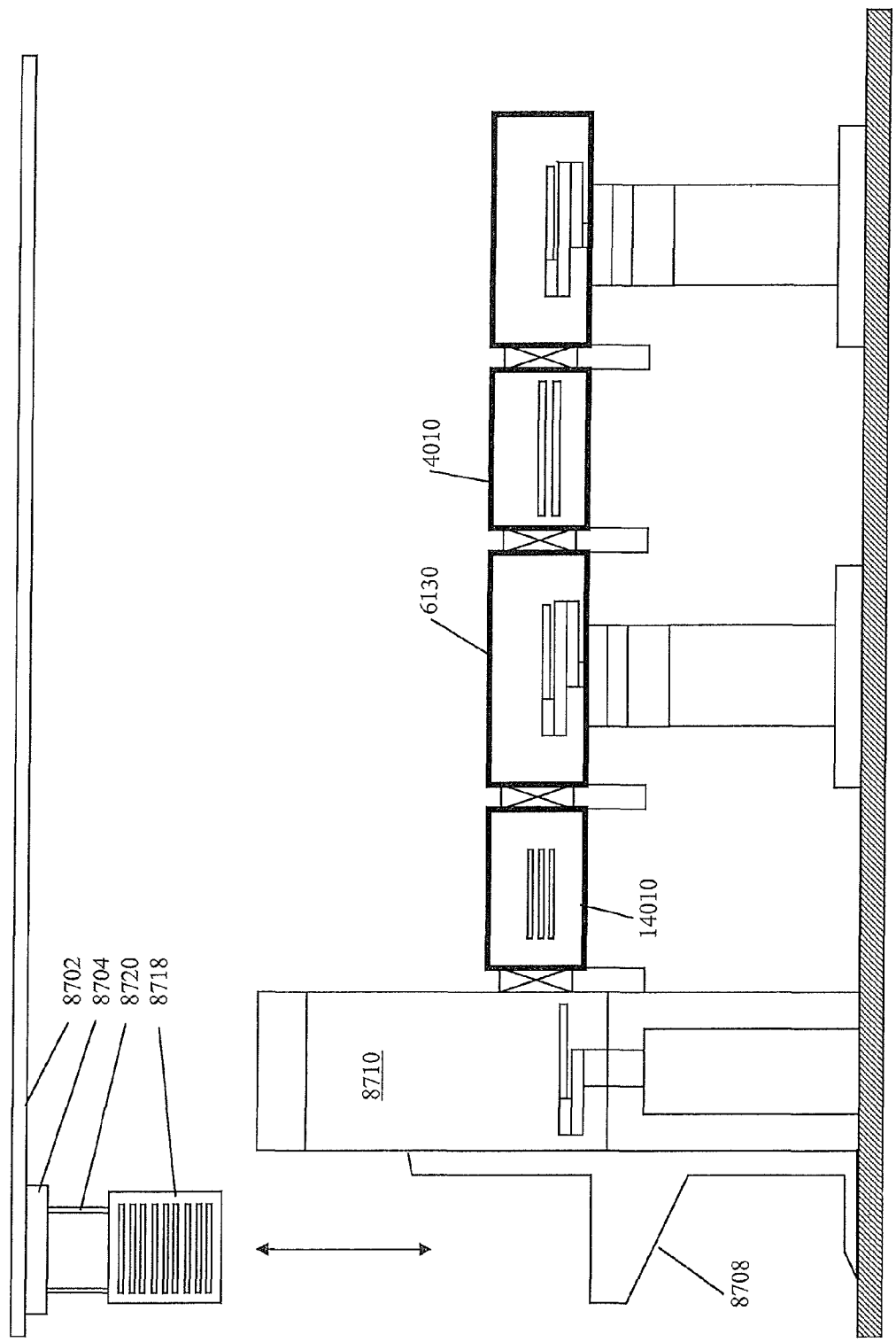
FIGS. 87-91 illustrate additional embodiments using vertical lifters and/or elevators.

While numerous arrangements of semiconductor handling and processing hardware have been described, it will be understood that numerous other variations are possible to reduce floor space usage and shorten the distance between related processing groups. For example, vacuum transport systems may be usefully deployed underneath floors, behind walls, on overhead rails, or in other locations to improve the layout of fabrication facilities, such as by clearing floor space for foot traffic or additional machinery. In general, these embodiments may employ vertical lifts in combination with robotic arms and other handling equipment when loading or transferring wafers or other work pieces among processing modules. FIG. 87 depicts such a system including a vertical lift.

FIG. 87 shows a typical loading/unloading system for use in wafer fabrication. An overhead track 8702 may deliver a cart 8704 with work pieces, to a wafer Front Opening Unified Pod (FOUP) which may include a load point 8708 and an equipment front end module (EFEM) 8710. A load lock 14010 may be employed to transfer wafers from the FOUP 8708 to one or more processing modules using, for example, the work piece handling vacuum module 6130 depicted in FIG. 87. A plurality of work piece handling vacuum modules supported by pedestals 10110 with intervening vacuum modules 4010 may be configured as a semiconductor vacuum processing system. Work pieces may be transferred in a cassette 8718 that the cart 8704 may lower to the FOUP 8708 using an elevator or vertical extension 8720.

Figure 88:
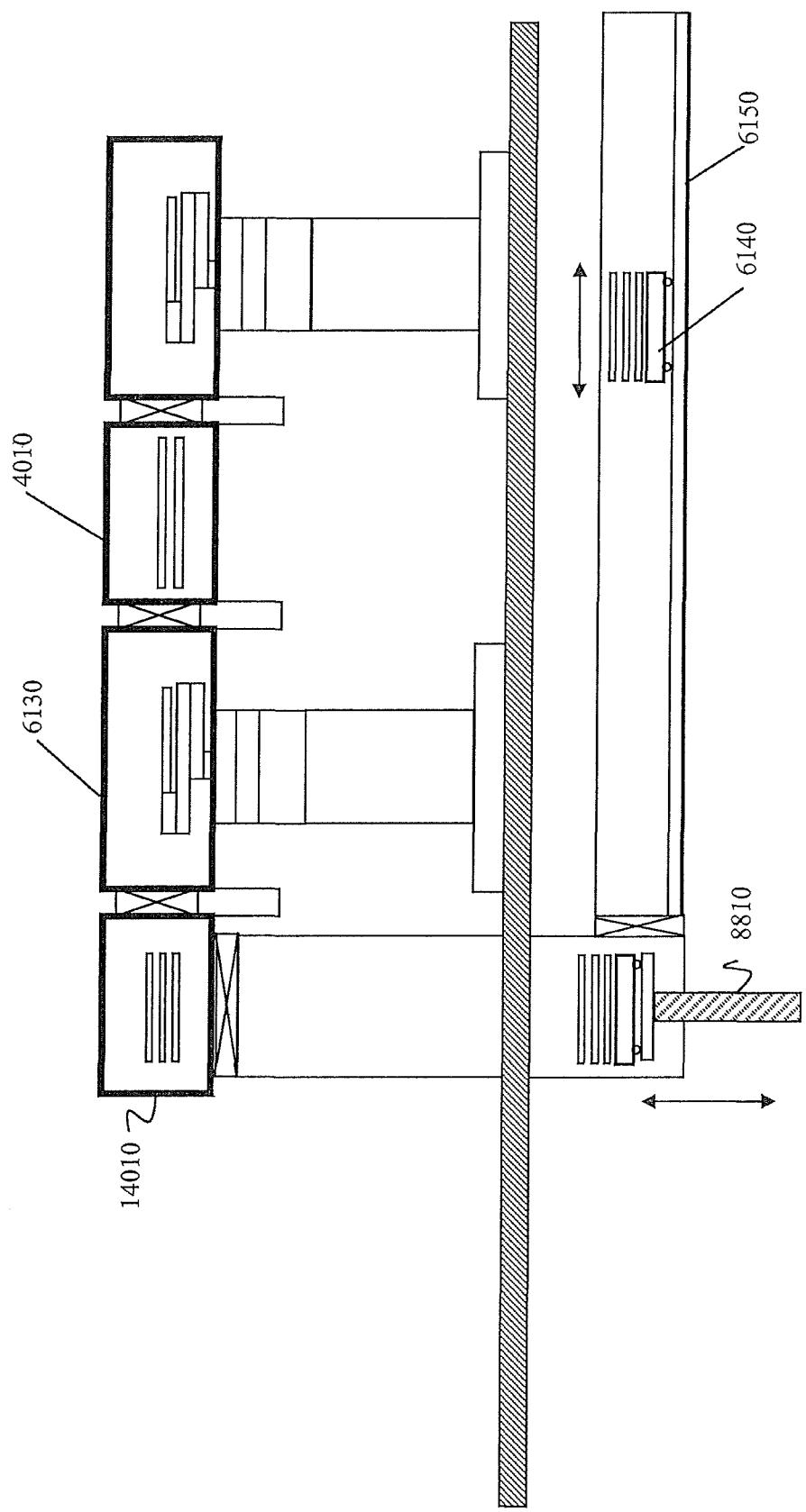

FIG. 88 illustrates an improved wafer handling facility in which a transport cart 6140 in a vacuum tunnel 6150 is installed beneath a factory floor. A vertical lift 8810 may be employed to move wafers, or a cassette carrying one or more wafers to the processing level. It will be understood that, while a single cart 6140 in a single tunnel 6150 is depicted, any number of tunnels 6150 and/or carts 6140 may intersect at a lifter 8810 that transfers wafers to a bottom access load lock 14010.

Figure 89:
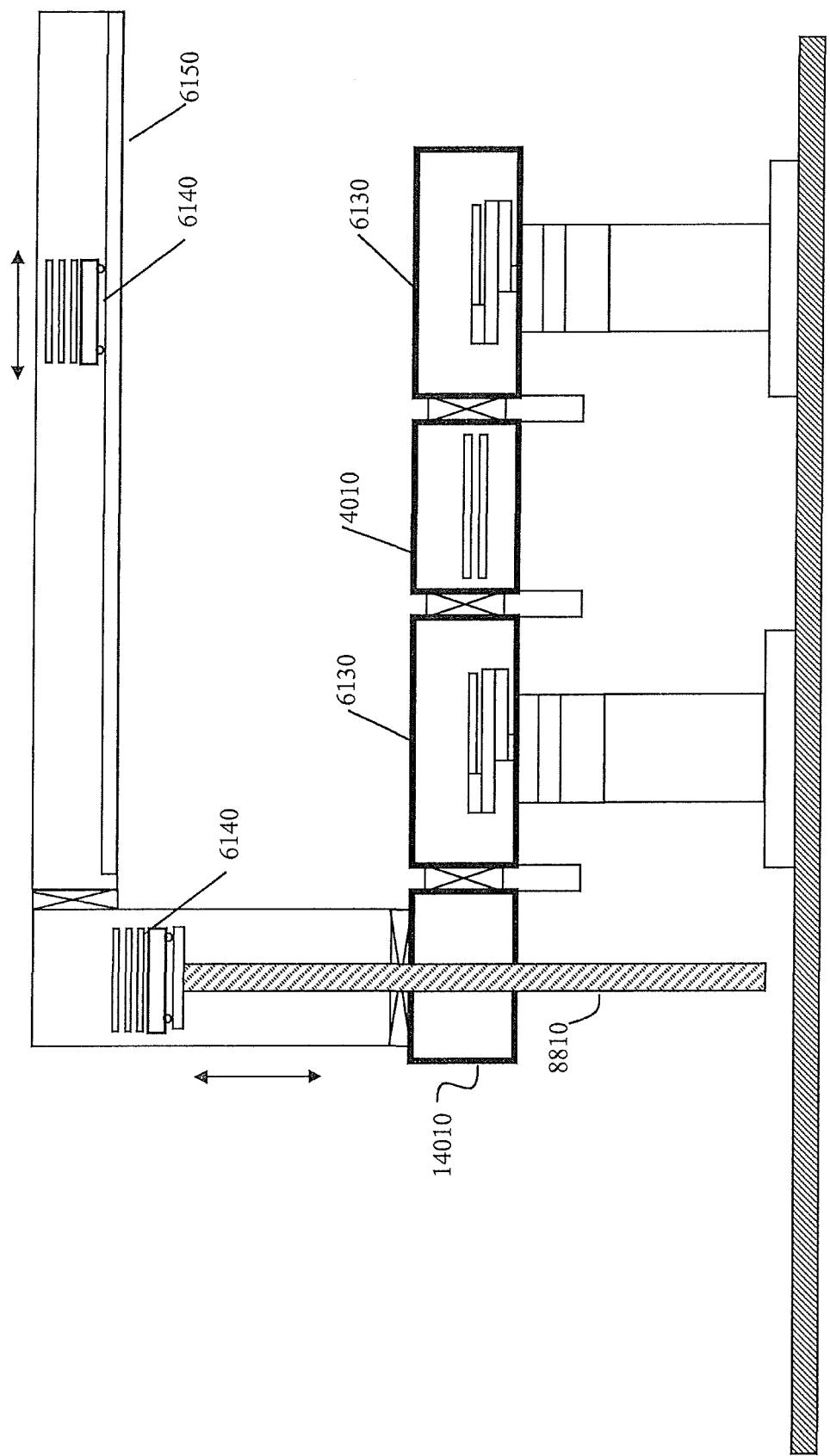

FIG. 89 illustrates an embodiment of an overhead cart 6140 and vacuum tunnel system 6150. This system may be used with any of the layouts described above. The configuration depicted in FIG. 89 facilitates transferring a cart 6140 carrying one or more wafers from a tunnel 6150 to a load lock 14010. However, in general, the lifter 8810 may be employed to move wafers and/or carts from a top access load lock (which is at a processing level) to an overhead vacuum tunnel 6150 where a cart 6140 can transport the work pieces along a transport system, such as a rail system. In one embodiment, drive elements of the lifter (not shown) may be installed below the processing level (e.g. on a floor or beneath a floor), or above the processing level. Deploying the mechanical aspects of the lifter below the processing level may advantageously reduce the number and/or size of particles that may fall on wafers being carried by the lifter.

Figure 90:
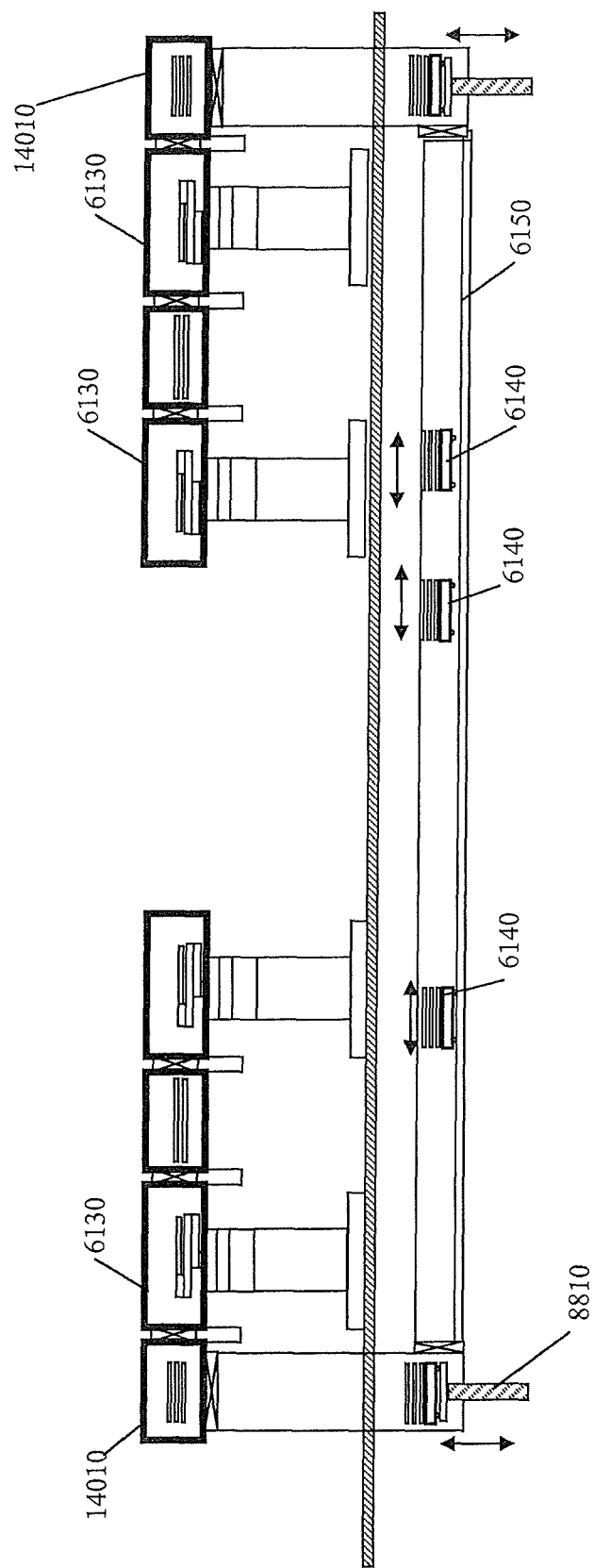
Figure 91:
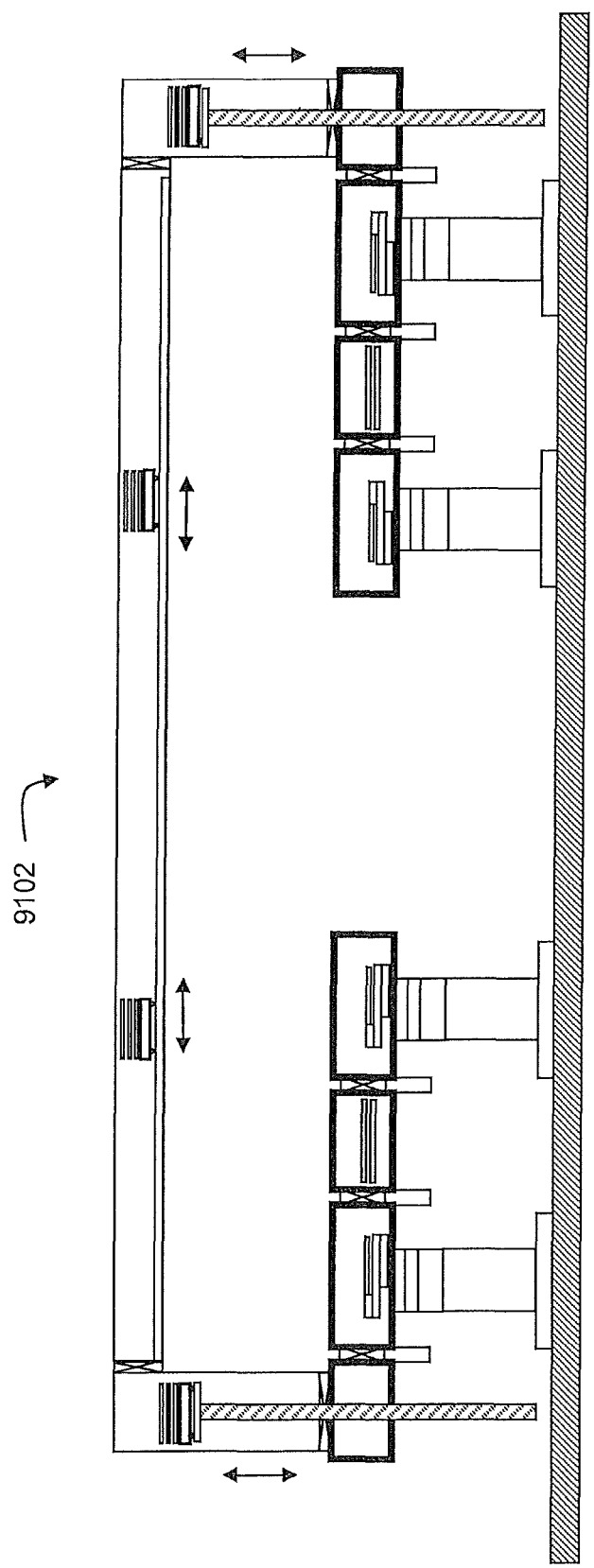

FIG. 90 depicts a semiconductor vacuum processing system including two processing groups, such as a linear processing groups interconnected by a beneath-processing-level tunnel 6150. The tunnel 6150, which may include any of the vacuum tunnel systems described above, may be deployed, for example, beneath a factory floor. The tunnel 6150 may connect groups of processing modules separated by large distances, and may improve the handling capabilities of the interconnected system by providing, e.g., storage areas, switches, sorting systems, and so forth. Processing groups may include process chambers, load locks, work piece handling vacuum modules 6130, vacuum modules 4010, multi-function modules, bypass thermal adjustment modules, lithography, metrology, mid-entry load locks, vacuum tunnels extensions for extending the reach of a vacuum system, and a wide variety of semiconductor processing related functions. Processing groups may also include modules supported by a pedestal. One or more processing groups, including the tunnel 6150 and cart 6140 may be controlled by a controller, such as a computing facility executing a software program FIG. 91 depicts two processing groups interconnected by an overhead tunnel network. The tunnel network 9102, which may include any of the vacuum tunnel systems described above, may be deployed, for example, on a second floor above a factory floor or suspended from a factory ceiling. The tunnel network 9102 may connect groups of processing modules separated by large distances, and may improve the handling capabilities of the interconnected system by providing, e.g., storage areas, switches, sorting systems, and so forth.

Figure 92:
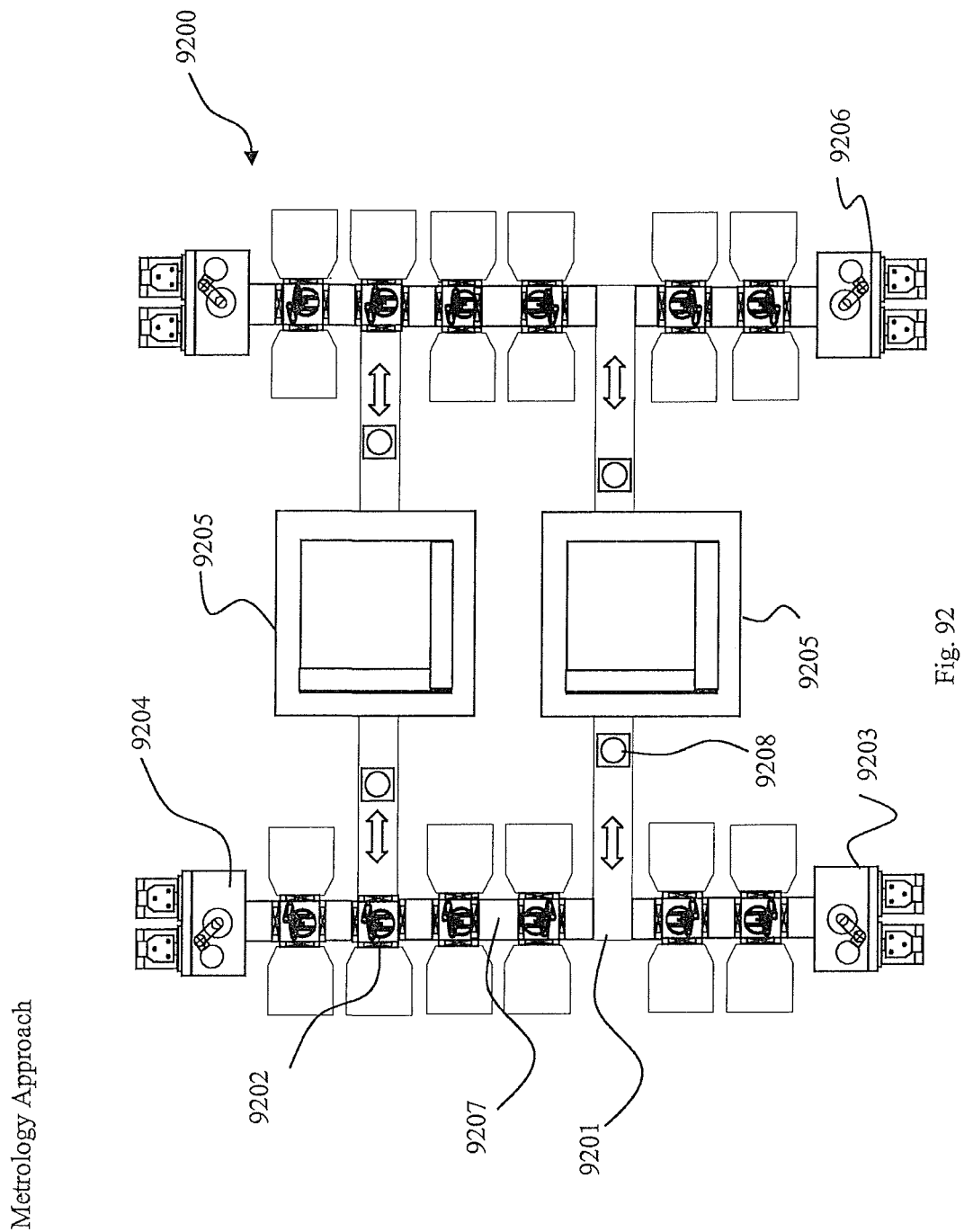
FIG. 92 shows a system for sharing metrology or lithography hardware.

FIG. 92 shows a system for sharing metrology or lithography hardware. As illustrated, the tunnel network and other module interconnection systems described herein may incorporate, e.g., shared metrology or lithography resources 9205 wherein the vacuum based cart system removes and returns a sample wafer from a flow. Generally wafers "flow" from one equipment front end module 9203 or other atmospheric interface entrance station to another equipment front end module 9204. If an in-process inspection is desirable to check for certain process parameters, such an inspection could be performed in a location such as an inter-module buffer 9207. In the present system there are several such interim locations where such an inspection could be performed. However, some measurement systems can be physically quite large and can be difficult to accommodate in module interconnections such as the inter-module buffer 9207 because of their size.

In such a situation it may be desirable to provide a vacuum cart and tunnel system as generally disclosed herein to remove one or more wafers from the flow under vacuum to a standalone metrology or lithography system 9205. A cart 9208 may be positioned in the flow at a location 9201 between process modules to receive a wafer. It will be understood that, while a particular location is identified in FIG. 92 as the location 9201, any number of locations within the system 9200 may be similarly employed according to desired process flows, capabilities, physical space constraints, and so forth. Software or setup logic may determine which wafer to remove from the flow at 9201. In other embodiments, the cart may dock with a module 9202 within the system 9200, where a wafer handling robot may load a wafer on the cart for transport to the metrology or lithography system 9205.

As depicted in FIG. 92, a metrology or lithography system 9205 may be shared by more than one work piece processing system. In an example, a wafer originating from the first loading system 9203 may be assessed in a metrology system 9205 that can also be accessed by wafers originating from a second system 9206. While two linear systems are depicted, it will be understood that other arrangements of processing modules may similarly employ shared resources such as metrology or lithography systems according to the general principles described with reference to FIG. 92. For example, using a variety of rail configurations with, for example, curves, switches, and so forth, the system may be configured to concentrate metrology or lithography systems and/or other shared resources for any number of processing systems in a common location. Such a system could apply metrology or lithography to wafers from multiple locations and multiple systems. As described above with respect to processes having different process times, a single metrology or lithography system may be shared among numerous process cells or system to achieve high utilization of metrology or lithography resources in a semiconductor manufacturing system.

Figure 93:
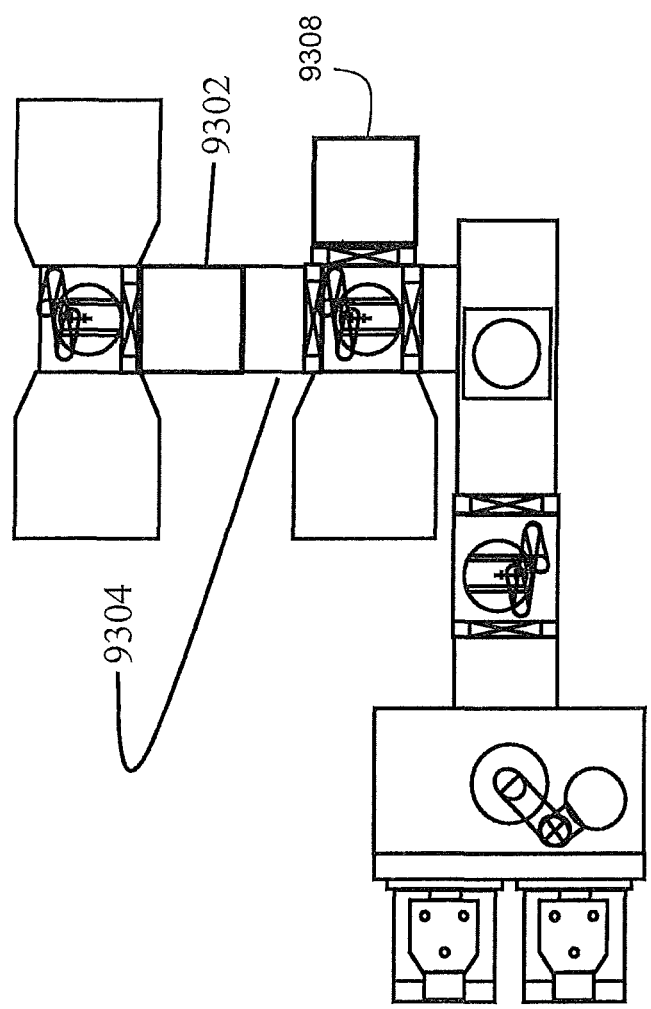
FIG. 93 shows a linear processing system combining a cart in a tunnel, a work piece handling vacuum module, process modules, and a multi-function module in-line and parallel to the processing flow.

As noted above, the cart and work piece handling vacuum module systems described herein may be combined with simple vacuum tube extensions that may be disposed in-line with, or adjacent to work piece handling vacuum modules 6130 to facilitate greater levels of flexibility in the arrangement and interconnection of different processing hardware. Referring to FIG. 93, a semiconductor work piece processing system may include a cart, a tunnel, an EFEM, a plurality of work piece handling vacuum modules, various process chambers, and a vacuum extension tunnel 9304.

In addition one or more link modules 9302, 9308 may be provided to interconnect any of the above hardware. In addition to accommodating hardware spacing (in the same manner as vacuum extensions), a module 9302, 9308 may provide a variety of supplemental functions associated with a semiconductor processing system. For example, a link module 9308 may provide storage, operating as a buffer in a wafer process flow. A link module 9302 may provide metrology, measurement, or testing of wafers. A link module 9308 may provide operator access to a work piece, in which case the link module 9308 may include an isolation valve and vacuum pump. A link module 9302, 9308 may provide thermal management, such as by cooling or heating a wafer between processes. A link module may provide buffering and/or aligning capacity for single and/or multiple wafers such as provided by the buffering aligner apparatus 9700 described below. With respect to the buffering aligner, it will be understood that this use in a link module is an example only, and that a buffering alignment module may also or instead be usefully employed at other points in a process, such as in an equipment front end module. For example, if process chambers process wafers in mini-batches of 2, 3, 4 or 5 or more wafers, then it may be efficient to employ a buffering system at an aligner to prevent the alignment time from becoming a bottleneck in a larger process. Once the proper number of wafers has been prepared in the buffer of an EFEM, an atmospheric robot can affect a batch transfer of these (aligned) wafers to a load lock.

A link module may provide bypass capabilities, permitting two or more wafers to cross paths between process modules. More generally, a link module 9302, 9308 may provide any function that can be usefully performed in a vacuum environment between processing tools, including any of those identified above as well as combinations of same.

As a significant advantage, such multi-function link modules can reduce the need for additional processing modules, and reduce wait times between processing modules in a variety of ways. For example, bypass capabilities alleviate the need to complete remove one wafer from a cluster or linear processing module before adding another, since conflicting paths can be resolved within the bypass module. As another example, thermal management within link modules can reduce the need to wait for heating or cooling once a wafer reaches a particular tool. Other advantages will be apparent to one of ordinary skill in the art.

More generally, using the systems and methods described herein, a workpiece may be processed during transport and/or wait time between process tools. This may include processing in a link module 9302, 9308 as described above, as well as processing on a transport cart 6150, processing in a tunnel 6150, processing in a buffer, processing in a load lock, or processing at any other point during wafer handling between process tools.

Figure 94:
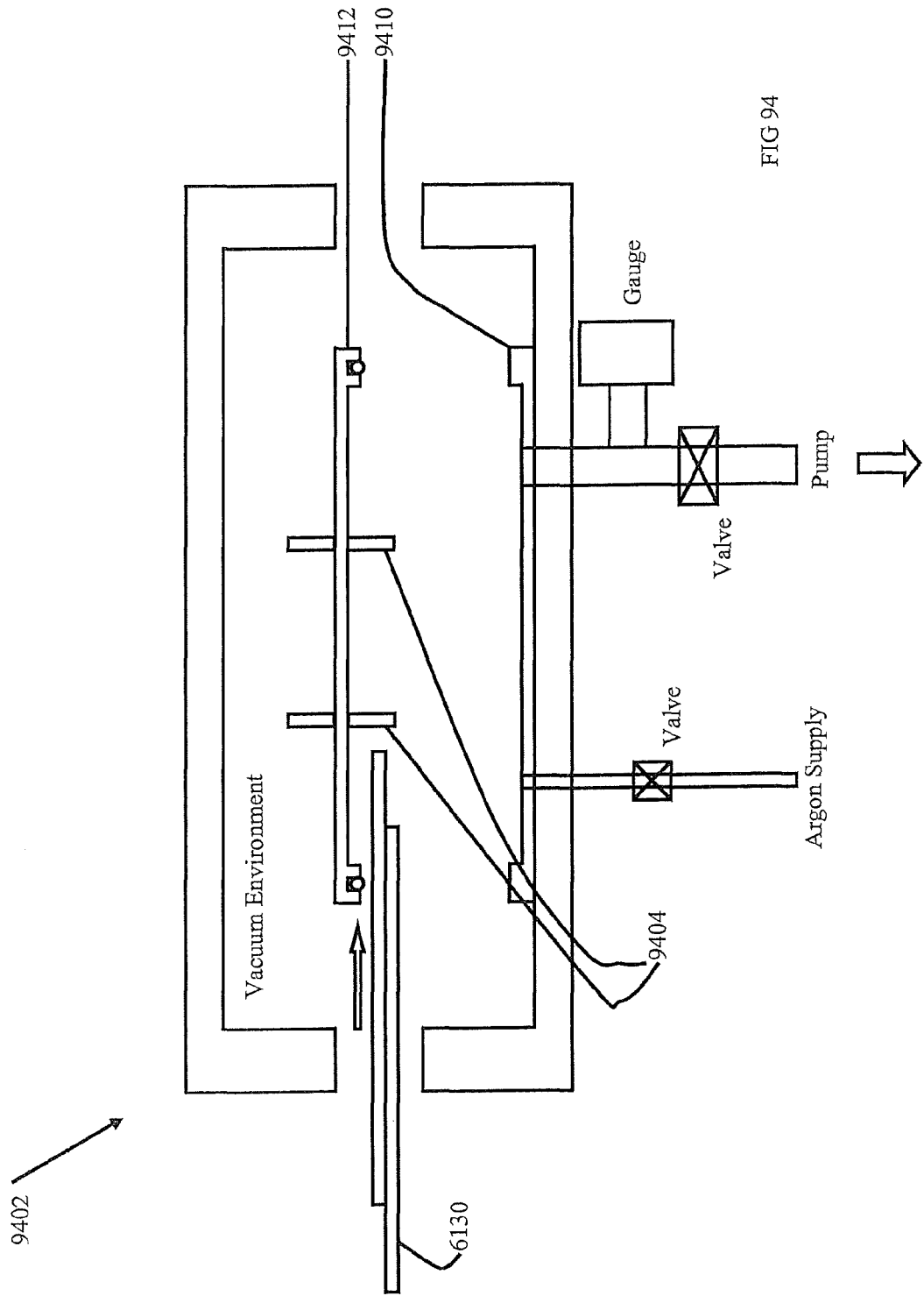
FIG. 94 depicts a side cut away view of a bypass capable thermal adjustment module with work piece handling vacuum module access.

FIG. 94 shows a thermal bypass adjusting vacuum module. It is frequently desirable to heat or cool work pieces between process steps of a semiconductor manufacturing process. It may also be desirable to simultaneously allow other work pieces to pass by the work piece being heated or cooled. Since cooling or heating a work piece may take approximately 20 to 60 or more seconds, it is also advantageous to facilitate transfer of other work pieces so that the cooling or heating does not block work piece flow. A vacuum module in which work pieces can be exchanged between robots while facilitating temperature adjustment of another work may also allow temporary storage of work pieces.

Such a vacuum module may include an environmentally sealable enclosure to capture and thermally adjust a work piece in transition before the work piece is transferred to the next process step, while allowing coordinated pass through of other work pieces during the heating or cooling process.

It may be advantageous to include such a vacuum module in close proximity to a process chamber in a vacuum semiconductor processing system, such that a work piece may be heated or cooled to meet the particular needs of the process chamber for improved processing. Additionally, including and utilizing such a vacuum module can facilitate effective use of process chambers in the system by allowing a second work piece to be brought up to temperature as a first work piece is being processed.

Additionally, a work piece may be returned to ambient temperature immediately after it is taken from a process chamber, before it is handled by additional transfer robots, thereby eliminating any waiting time while the work piece cools before transferring another work piece to the process chamber.

It may also be beneficial to include a bypass thermal adjuster in combination with cart/tunnel systems in a semiconductor processing system to further facilitate flexibility, utility, process efficiency, and the like. Disclosed in this specification are examples of beneficial configurations of the bypass thermal adjuster in combination with work piece handling vacuum modules, carts 6140, tunnels 6150, and other process and function modules.

Referring to FIG. 94, an end effector of a work piece handling vacuum module 6130 is transferring a work piece into a thermal adjustment buffer module 9402 for purposes of thermally adjusting the work piece.

FIG. 94 further shows a work piece handling vacuum module 6103 placing the work piece on support clips 9404 which are mounted to an upper interior surface of a moveable enclosure, and may include fingers or the like to support the edges of a work piece centered within the enclosure. The moveable enclosure consists of two portions, an enclosure bottom 9410 and an enclosure top 9412. When the enclosure top 9412 is lowered into contact with the bottom 9410, a work piece supported by support clips 9404 is fully isolated from the environment outside enclosure 9408. The bypass thermal adjuster 9402 also facilitates transferring a second work piece through the module when the moveable enclosure is closed.

Various embodiments of tunnel and cart systems have been described above, as well as other linking hardware such as vacuum extensions and linking modules. In general, these systems support modular use and reuse of semiconductor processing tools from different vendors, and having different processing times and other characteristics. In one aspect, such systems may be further improved through variations such as different tunnel shapes (curvilinear, L, U, S, and/or T shaped tunnels) and shapes supporting two, three, four, or more equipment front end modules. In another aspect, additional hardware may be employed to provide further flexibility in the design and use of semiconductor manufacturing systems. The following description identifies a number of additional components suitable for use with the systems described herein.

Figure 95:
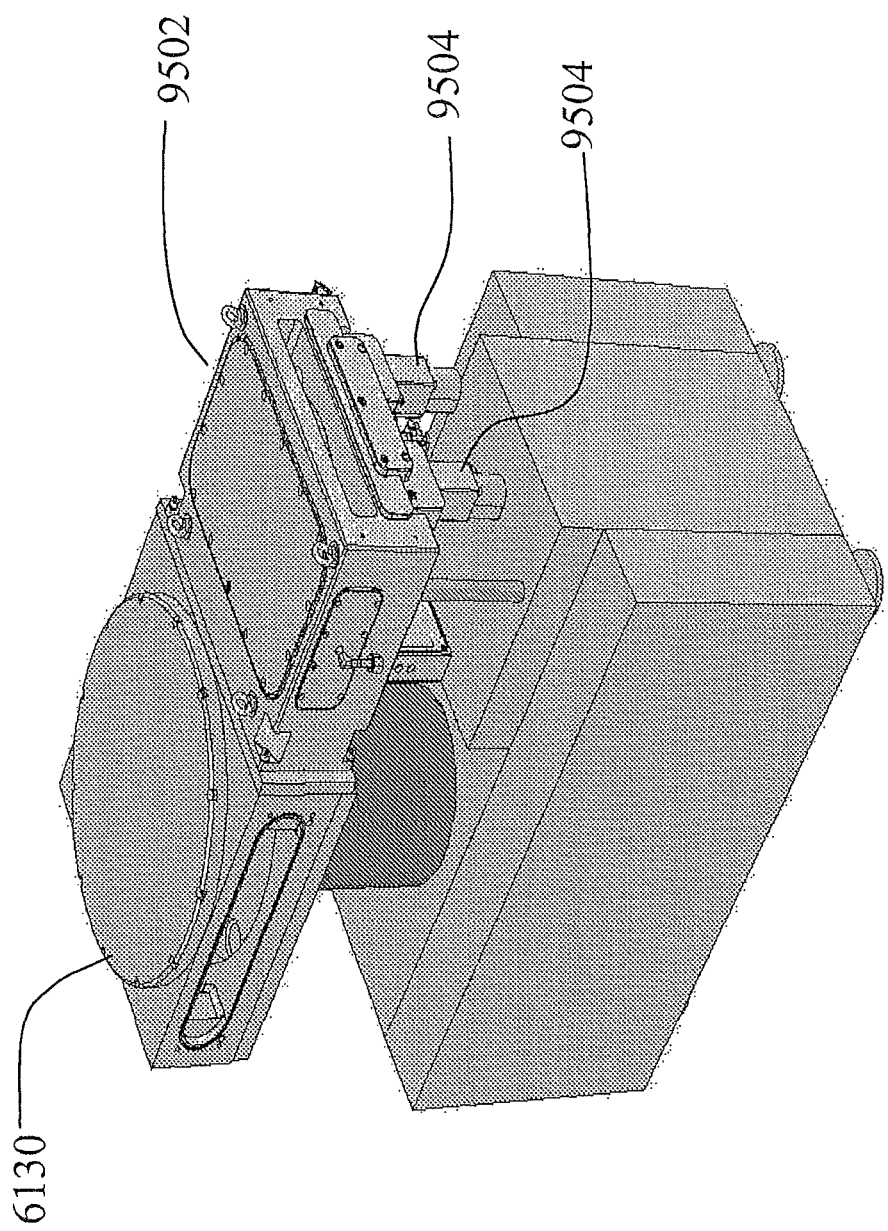
FIG. 95 is a perspective view of a configurable multi-function semiconductor vacuum module as it would be used in a semiconductor vacuum processing system.

Referring to FIG. 95, a semiconductor work piece handling robot 6130 may connect through a vacuum port to a configurable vacuum module 9502. The configurable vacuum module 9502 may include ports 9504 for utilities such as gas, water, air, and electricity used during processing.

The configurable vacuum module 9502 may include a removable bottom plate which may include a work piece heater for preheating a work piece before the handling robot 6130 transfers the work piece into an attached processing module.

The configurable vacuum module 9502 may include storage for a plurality of work pieces. As an example, work pieces may be placed by the handling robot 6130 on a rotating platform within the configurable vacuum module 9502. The maximum number of work pieces may be determined by the size of each work piece and the size of the rotating platform. Alternatively the configurable vacuum module 9502 may include a surface adapted to support semiconductor work pieces, with the surface sufficiently large to allow a plurality of work pieces to be placed on the surface in a non-overlapping arrangement. The storage within the configurable vacuum module 9502 may be enabled by a work piece elevator with a plurality of work piece support shelves, wherein the elevator can be controlled to adjust height for selection of a particular shelf to be accessed by the handling robot 6130.

The configurable vacuum module 9502 may include metrology devices for purposes of collecting metrics about the work piece. As an example, a metrology device such as an optical sensor, can be used to detect the presence of a work piece in the configurable vacuum module 9502 and initiate an automated inspection of the work piece by a machine vision system. Such metrics are useful to maintain and improve control and quality of the fabrication processes being performed on the work piece in associated process modules.

The configurable vacuum module 9502 may further include interface ports 9504 capable of supporting ultra high vacuum operation. The ultra high vacuum may be achieved by configurable vacuum module 9502 wherein the configurable vacuum module 9502 is constructed with materials such as stainless steel known to support an ultra high vacuum environment. Such an environment may be useful for removing trace gasses in the environment and reducing the introduction of gasses caused by outgassing of materials in the environment.

The configurable vacuum module 9502 may provide a load lock function for the vacuum processing environment. Such a function may be useful in work piece exchange between a user ambient environment and the vacuum processing environment by allowing work pieces supplied by a user to be introduced into the vacuum environment by sealing the work pieces in the configurable vacuum module 9502 and generating a vacuum environment around the sealed work pieces.

The configurable vacuum module 9502 may support fabrication processing of a work piece such as rapid thermal anneal or in-situ wafer cleaning. Rapid thermal anneal may be beneficial in a semiconductor vacuum processing environment for achieving specific changes in a semiconductor work piece such as activating dopants, and densifying deposited films. In-site wafer cleaning can be needed to remove residue or particles deposited during processing in the chambers from the wafer surfaces or edges.

The configurable vacuum module 9502 may also include combinations of any of the above, as well as any other capabilities suitable for use between processing tools in a semiconductor manufacturing environment.

In general, it is expected that the configurable vacuum module 9502 may be configured at a fabrication site through the addition or removal of hardware associated with desired functions. Thus, for example, temperature sensors and a heating element may be removed, and replaced with multiple shelves for wafer storage. Other aspects, such as construction from materials appropriate for high vacuum, may be implemented during manufacture of the module 9502. In general, a configurable vacuum module 9502 as described herein is characterized by the removability/replaceability of module hardware, or by an adaptation to a particular process using a combination of hardware that provides multiple capabilities (e.g., heating, cooling, aligning, temperature sensing, cleaning, metrology, annealing, scanning, identifying, moving, storing, and so forth).

The functions described above may also be implemented directly within the cart and tunnel systems described above, either as link modules within a tunnel, or in association with a cart or tunnel, to provide various processing functions during transportation of a wafer. As described herein, combining work piece handling vacuum modules and carts/tunnels provides greater flexibility to a semiconductor processing system by facilitating the interconnection of local processing groups that are separated by a large distance, and by facilitating the interconnection of large processing systems that are in close proximity. Combining a multifunction module 9502 with a cart/tunnel system can facilitate the productive use of transport time to achieve more rapid wafer processing.

Figure 96:
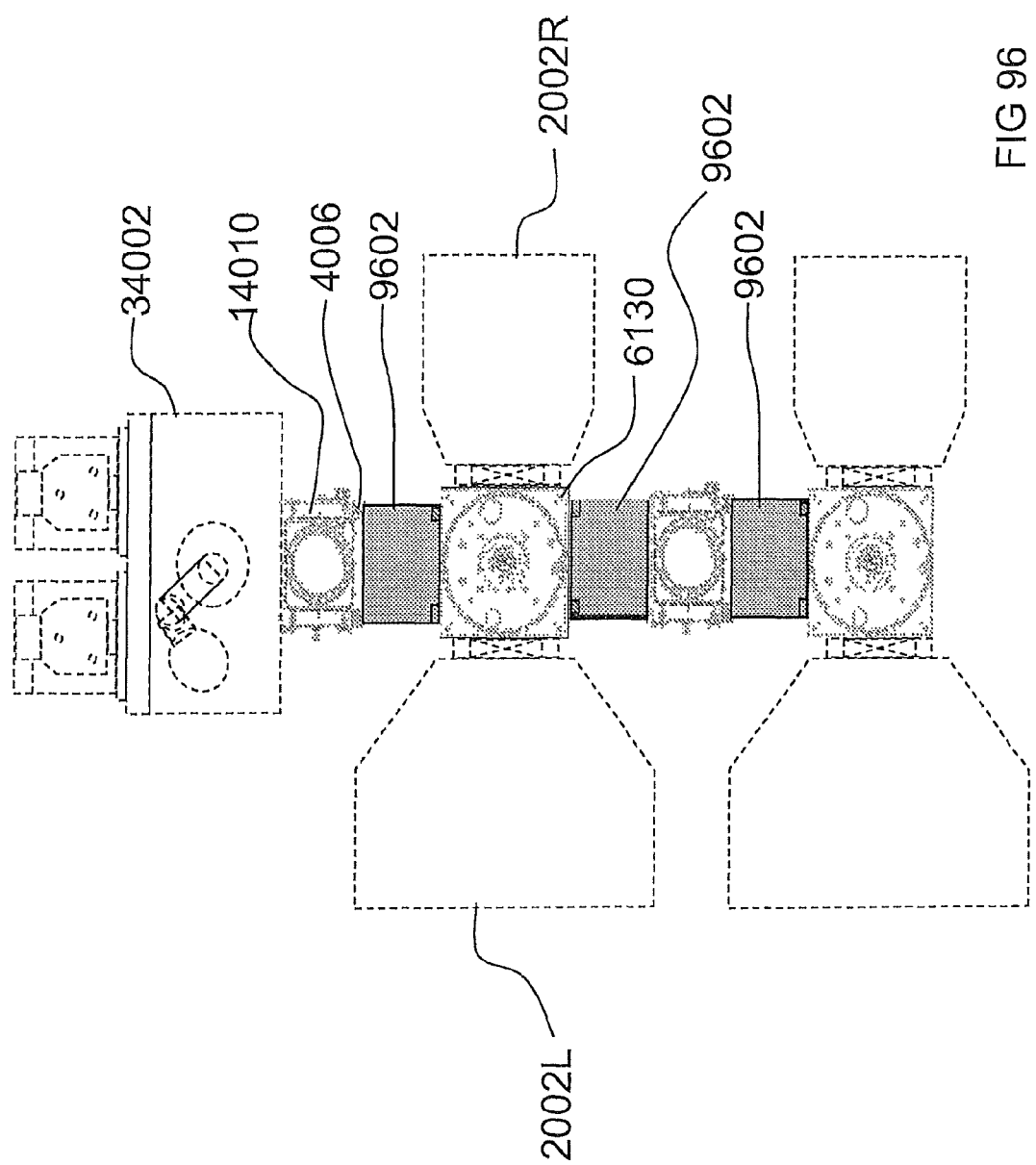
FIG. 96 shows a plurality of vacuum extension tunnels in a vacuum processing system.

Referring to FIG. 96 a vacuum extension tunnel 9602 is described in greater detail. The vacuum extension tunnel 9602, also referred to herein as a vacuum tube or vacuum extension, can be used in a variety of positions in a semiconductor vacuum processing system to provide a continuous vacuum connection between vacuum modules. Vacuum extension tunnel 9602 may have a substantially rectangular shape, with interface ports on one or more sides. Each interface port may provide a vacuum sealable industry standard interface for connection to a variety of vacuum modules. In embodiments, an isolation valve 4006 may be connected to each interface port to provide a means of ensuring vacuum isolation between vacuum extension tunnel 9602 and a connected vacuum module.

As shown in FIG. 96, a vacuum extension tunnel 9602 provides linear extension in a semiconductor processing system, facilitating the use of varying size process chambers. As an example in FIG. 96, a process chamber 2002L, which is substantially larger than process chamber 2002R, would interfere with an equipment front end module 34002 if it were connected without using vacuum extension tunnel 9602. An additional benefit of this use of vacuum extension tunnel 9602 is that large process chambers may be used without increasing the size of an associated robot vacuum chamber 4012 that provides wafer transport between adjoining pieces of equipment.

A vacuum tunnel extension 9602 can also be used with load locks 14010 to create service access between vacuum modules. Two such examples illustrated in FIG. 96 include a service access between an upper and lower pair of process chambers, and one between the upper pair of process chambers and an equipment front end module 34002. Service access requires a user to closely approach the process equipment and perhaps to gain direct access to work piece handling equipment. Without vacuum tunnel extension 9602, a user could not easily approach closely enough for servicing.

A vacuum tunnel extension 9602 may be employed in a variety of other locations within a system. For example, a vacuum tunnel extension 9602 may be employed to connect a linear processing system, a cluster tool, a shared metrology system or an equipment front end module to a cart and tunnel transport system. A vacuum tunnel extension 9602 may facilitate forming various layout shapes of semiconductor processing systems, and may be provided in various extension lengths.

More generally any of the above systems may be used in combination. For example, a linear processing system including work piece transport, such as that provided by a work piece handling vacuum module combined with a transport cart 6140 may be associated with a bypass thermal adjuster. A work piece handling vacuum module may facilitate transfer of a work piece to/from the bypass thermal adjuster. A linear processing system including work piece transport, such as that provided by a work piece handling vacuum module combined with a transport cart 6140 may be associated with a wafer center finding method or system. A work piece handling vacuum module may facilitate collecting data of a work piece being handled by the work piece handling vacuum module to support the wafer center finding methods and systems. A work piece handling vacuum module may include a plurality of work piece sensors to support wafer center finding. Wafer center finding may also be performed while the work piece is being transported by the transport cart 6140. In one embodiment, a work piece handling vacuum module, adapted to facilitate wafer center finding, may be assembled to a transport cart 6140 so that a wafer/work piece held within the work piece handling vacuum module may be subjected to a wafer finding process during transport.

A linear processing system including work piece transport, such as that provided by a work piece handling vacuum module combined with a transport cart 6140 may be associated with a process chamber. A work piece handling vacuum module may facilitate transfer of a work piece to/from the process chamber. As herein described, processing chambers of various types, sizes, functionality, performance, type, and the like may be combined with one or more transport carts 6140 to facilitate processing flexibility of a semiconductor processing system. A linear processing system including work piece transport, such as that provided by a work piece handling vacuum module combined with a transport cart 6140 may be associated with a load lock 10410 as herein described. In an example a work piece handling vacuum module may facilitate transfer of a work piece between the load lock and a transport cart 6140. A linear processing system including work piece transport, such as that provided by a work piece handling vacuum module combined with a transport cart 6140 may be associated with a work piece storage and handling cassette. A work piece handling vacuum module may facilitate transfer of a work piece to/from the cassette as shown in FIGS. 68 and 69. A work piece handling vacuum module may transfer a work piece such as a production wafer, a test wafer, a calibration wafer, a cleaning wafer, an instrumented wafer, a wafer centering fixture, and the like to/from the work piece storage.

A linear processing system including work piece transport, such as that provided by a work piece handling vacuum module combined with a transport cart 6140 may be associated with an equipment front end module 6110. A work piece handling vacuum module may facilitate transfer of a work piece to/from the equipment front end module 6110. The work piece handling vacuum module may transfer one or more work pieces between two equipment front end modules 6110 wherein one module is an input module, and one module is an output module, or wherein one of the modules is a mid entry input/output module. A transport cart 6140 may be associated with an equipment front end module 6110 through a work piece handling vacuum module as shown in FIG. 78. The work piece handling vacuum module in FIG. 78 may transfer a work piece between the equipment front end module 6110 and one of a process chamber 2002, another work piece handling vacuum module, or a transport cart 6140. As can be seen in FIG. 78, combining work piece handling vacuum modules and equipment front end modules 6110 with transport carts 6140 within vacuum tunnels 6150 can facilitate configuring arbitrarily complex or highly flexible processing systems.

A linear processing system including work piece transport, such as that provided by a work piece handling vacuum module combined with a transport cart 6140 may be associated with a work piece elevator. A work piece handling vacuum module may facilitate transfer of a work piece to/from the work piece elevator for transporting one or more work pieces between vertically separated work piece handling and/or processing systems. Vertically separated vacuum processing systems may include a processing level and a work piece return level that is vertically separated. The work piece return level may include a work piece transport cart or vehicle in a vacuum tunnel for transporting one or more work pieces to a different location in the vacuum processing system. FIGS. 88-91 depict exemplary configurations of linear processing systems including work piece handling vacuum modules, transport carts 6140, and work piece elevators, also known as lifters 8810.

A linear processing system including work piece transport, such as that provided by a work piece handling vacuum module combined with a transport cart 6140 may be associated with a cluster system as shown in FIGS. 70 and 86. A work piece handling vacuum module may facilitate transfer of a work piece to/from the cluster system. A work piece handling vacuum module may facilitate transfer of a work piece between a linear processing system including a transport cart 6140, and a cluster processing cell. The work piece handling vacuum module may transfer the work piece to/from an aspect of the cluster system such as a work piece handling robot, a load lock, a buffer, and the like. The work piece handling vacuum module may transfer a work piece through a vacuum extension tunnel 9602 to/from the aspect of the cluster processing system.

The work piece handling vacuum module may be modularly connected to the cluster system so that the work piece handling vacuum module may provide handling of work pieces while the cluster processing system may provide processing of semiconductor work pieces. The work piece handling vacuum module may be connected to the cluster system through a buffer module, such as a multifunction module, a passive single work piece buffer, a passive multi work piece buffer, a thermal bypass adapter, a buffering aligner 9700, and the like. The buffer module may provide a temporary storage facility for work pieces being transferred between the work piece handling vacuum module and the cluster system. A robot controller of the cluster system may access or deposit a work piece in the buffer module for the work piece handling vacuum module to transfer. A plurality of cluster systems may be connected to one work piece handling vacuum module so that the work piece handling vacuum module facilitates transfer from one cluster system to another. Such a configuration may include a load lock 1401 and/or equipment front end module 6110 for exchange of the work pieces with an operator. The work piece handling vacuum module may further include facilities for determining a center of a work piece being handled by the work piece handling vacuum module so that the work piece can be transferred to the cluster system centered accurately to a center reference of the cluster system.

A linear processing system including work piece transport, such as that provided by a work piece handling vacuum module combined with a transport cart 6140 may be associated with other work piece handling vacuum modules. A work piece handling vacuum module may facilitate transfer of a work piece to/from the other work piece handling vacuum module.

A linear processing system including work piece transport, such as that provided by a work piece handling vacuum module combined with a transport cart 6140 may be associated with a buffer. A work piece handling vacuum module may facilitate transfer of a work piece to/from the buffer. The buffer may facilitate holding work pieces queued to be processed. The buffer may further facilitate reducing bottlenecks associated with robotic work piece handlers, differences in processing time, delays associated with vacuum environment changes, and the like.

A linear processing system including work piece transport, such as that provided by a work piece handling vacuum module combined with a transport cart 6140 may be associated with a controller. The controller may direct the work piece handling vacuum module to facilitate transfer of a work piece from a first section of a semiconductor processing system to a second section of the system. Transfer from the first to second section of the system may be accomplished by using a transport cart 6140. A section may include one or more of a buffer, a buffering aligner 9700, another work piece handling vacuum module, a cluster system, a work piece storage, a work piece elevator, an equipment front end module, a load lock, a process chamber, a vacuum tunnel extension, a module including a low particle vent, a module including a pedestal, a module including a modular utility supply facility, a bypass thermal adjuster, a multifunction module, a robot (e.g. single arm, dual arm, dual end effector, frog leg, and the like), variously shaped process systems, and the like.

Figure 97:
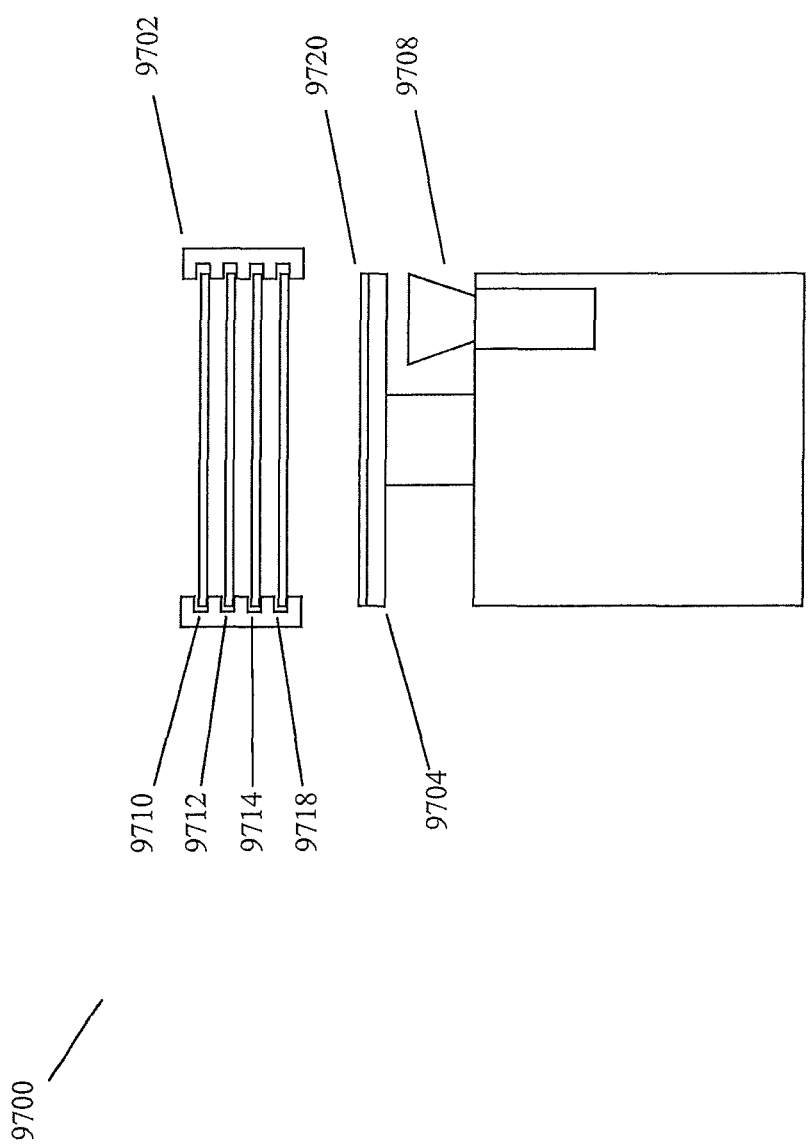
FIG. 97 depicts the buffer aligner module with four stored semiconductor work pieces.

Referring to FIGS. 97-100, work pieces may be temporarily stored in buffer modules. A buffer module may, for example, be placed between two transfer robot modules to facilitate handling and throughput, or between a tunnel 6150 and a robot for similar reasons. The buffer module may be accessible from multiple of sides and/or by multiple robots. The buffer module may have the capability to hold a plurality of semiconductor work pieces. In embodiments, the buffer may also be capable of performing alignment of the semiconductor work pieces that are placed into the buffer. Such a buffer may be referred to as a buffer aligner module 9700, an example of which is depicted in FIG. 97. The buffer aligner module 9700 may include a buffer work piece holder 9702, an aligner platform 9704, and an aligner vision system 9708. The buffer work piece holder 9702 may hold multiple semiconductor work pieces 9710, 9712, 9714, and 9718 at one time, which may be vertically stacked or otherwise arranged within the holder 9702. In embodiments, the aligner platform 9704 may be capable of holding a single semiconductor work piece and rotating or translating the work piece to a desired alignment position as determined by an aligner controller. The controller may initiate a rotation or translation once the semiconductor work piece has been placed on the aligner platform 9704, and determine a stopping position based on signals provided by the aligner vision system 9708.

The aligner vision system 9708 may sense a notch or other marking on the semiconductor work piece, and the controller may use the notch to determine a correct alignment of the work piece, such as by stopping rotation of the work piece when the notch is in a particular location. The aligner vision system 9708 may also employ optical character recognition (OCR) capabilities or other image processing techniques to read and record information presented on the semiconductor work piece, which may include alignment marks as well as textual information relating to the work piece. The controller may also, or instead, provide close-loop sense and control for the alignment of semiconductor work piece placed on the buffer aligner module 9700.

Figure 98C:
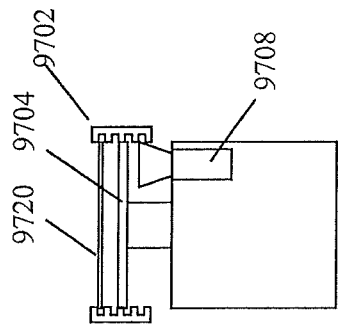
FIG. 98 depicts an alignment operation of the aligner of FIG. 97.
Figure 98B:
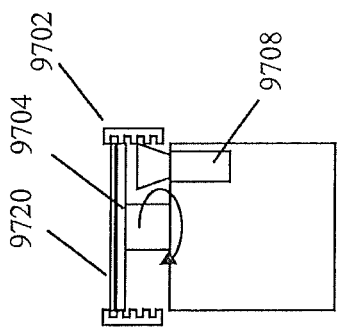
Figure 98A:
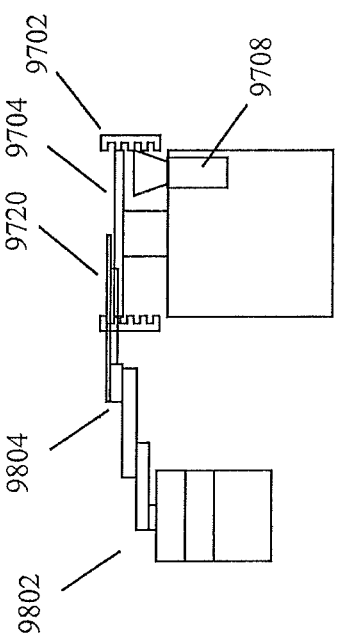

FIG. 98A shows a transfer robot 9802 transferring a semiconductor work piece 9720 onto the aligner platform 9704 of the buffer aligner module 9700 utilizing a single work piece end-effector. FIG. 98B shows the aligner platform 9704 rotating a semiconductor work piece to be aligned 9720. While the aligner platform 9704 is rotating, the aligner vision system 9708 may sense the position of the work piece 9720 through some physical indicator, such as a notch, a marking, or the like. The controller may stop rotation in response to an appropriate signal from the aligner vision system 9708 indicating that the work piece is properly aligned. When aligned, the semiconductor work piece 9720 may be transferred into the buffer work piece holder 9702 as shown in FIG. 98C.

FIG. 99A shows a transfer robot 9802 transferring a second semiconductor work piece 9720 onto the aligner platform 9704. Note that the first buffered work piece 9710 has been previously stored in the top slot of the buffer work piece holder. FIG. 99B shows the second semiconductor work piece 9720 being aligned. FIG. 99C shows the two aligned semiconductor work pieces stored as a first 9710 and second buffered work piece 9712. Finally, FIG. 100A shows all aligned and stored work pieces 9710, 9712, 9714, and 9718, being transferred from the buffer aligner module 9700 by a transfer robot 9802 utilizing a batch end-effector 10002 to simultaneously move the work pieces 9710, 9712, 9714, and 9718. FIG. 100B shows the transfer robot 9802 moving the batch of semiconductor work pieces 9710, 9712, 9714, and 9718 to their destination with the batch end-effector 10002.

A linear processing system including work piece transport, such as that provided by a work piece handling vacuum module combined with a transport cart 6140 may be associated with a buffering aligner 9700. A work piece handling vacuum module may facilitate transfer of a work piece to/from the buffering aligner 9700 such as to/from an equipment front end module, load lock, and other semiconductor fabrication system modules, handlers, and processors. A buffering aligner 9700 may be beneficially combined with other elements of a linear processing system to improve throughput. In an example, a buffering aligner 9700 may be combined with a transport cart 6140 system that provides transport of a plurality of aligned wafers in a vacuum environment. A buffering aligner can be employed when a process chamber requires delivery of multiple wafers at the same time, in which case buffering at the alignment can significantly increase the system throughput by allowing the system to align wafers in the background during processing and effecting a batch transfer to the process module or load lock.

Figure 101:
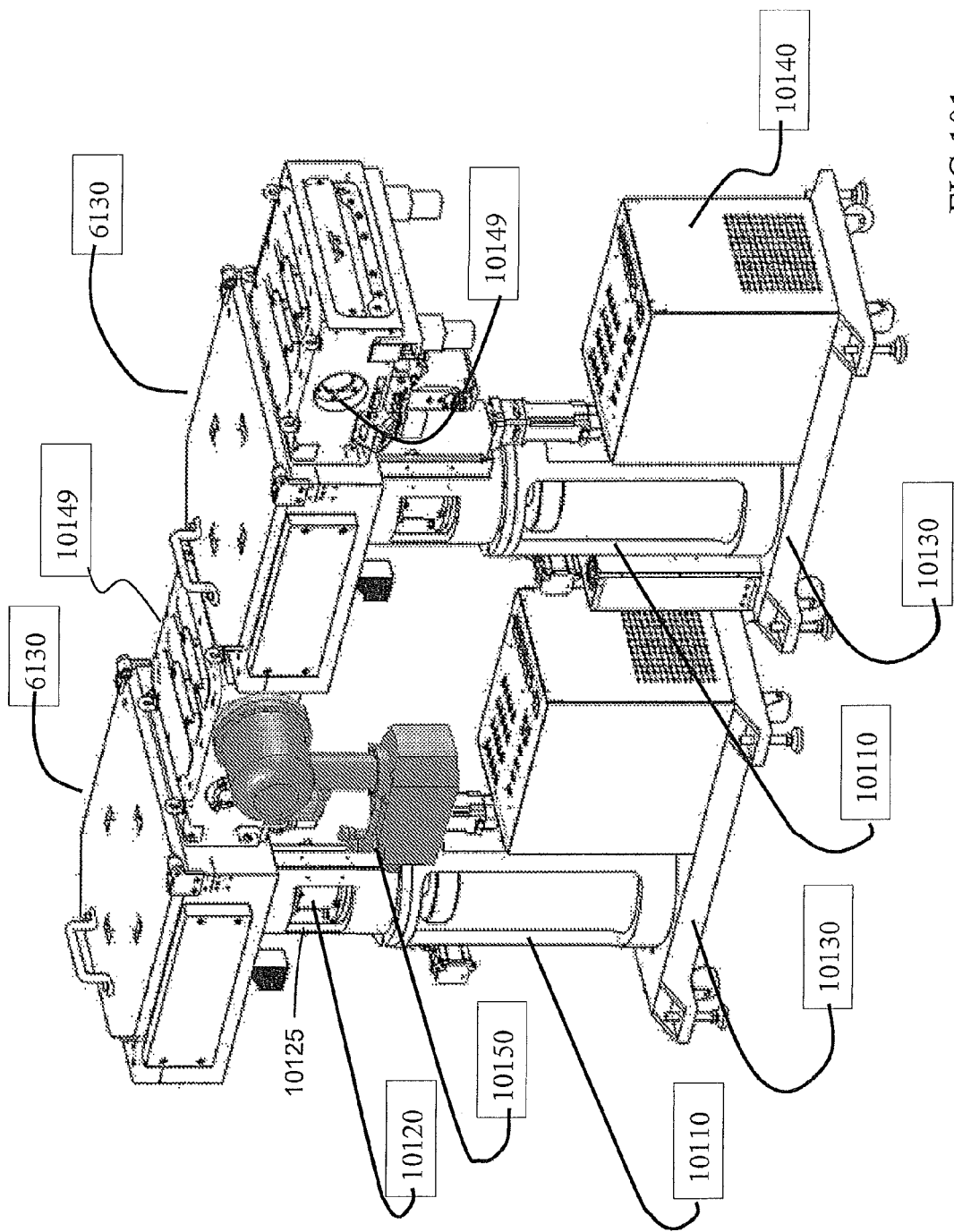
FIG. 101 depicts a vacuum module support pedestal in a vacuum processing system environment.

FIG. 101 shows a number of modular linkable handling modules 6130. Each linkable module 6130 may be supported by a pedestal 10110. The pedestal 10110 may form a unitary support structure for a vacuum robotic handler and any associated hardware, including, for example, the linking modules described above. The pedestal 10110 may be generally cylindrical in form with adequate external diameter to physically support robotics and other hardware, and adequate internal diameter to permit passage of robotic drives, electricity, and other utilities.

A robot drive mechanism 10120 may be integrated within the pedestal 10110. Integration of the robot drive mechanism 10120 into the support structure may advantageously eliminate the need for separate conduits or encasements to house the robot drive mechanism 10120. An access port 10125 within the pedestal 10110 may provide user access to various components of the robot drive 10120 such as motors, amplifiers, seals etc., so that these components can be removed as individual units for servicing and the like.

The pedestal configuration depicted in FIG. 101 provides additional advantages. By raising the modular linkable handling modules 6130 substantially above floor level while preserving significant unused space between the floor and the modules 6130, the pedestal 10110 offers physical pathways for process chamber utilities such as water, gas, compressed air, and electricity, which may be routed below the modular linkable handling modules 6130 and alongside the pedestals 10110. Thus, even without planning for utility access, a simple arrangement of pedestal-based modules in close proximity ensures adequate access for wires, tubes, pipes, and other utility carriers. In order to achieve this result, the pedestal 10110 preferably has top projection surface area (i.e., a shape when viewed from the top) that is completely within the top projection surface area of the module 6130 supported above. Thus space is afforded all the way around the pedestal.

The pedestal 10110 may include a rolling base 10130 (with adjustable stand-offs for relatively permanent installation) on which additional controls, or equipment 10140 may be included. The rolling base 10130 further facilitates integration of vacuum modules 6130 into a modular vacuum processing and handling system.

A linear processing system including work piece transport, such as that provided by a work piece handling vacuum module combined with a transport cart 6140 may be associated with a pedestal. A work piece handling vacuum module may be modularly mounted to the pedestal so that the pedestal may provide at least support for the work piece handling vacuum module. The pedestal may further support drive mechanism that provide rotation and other motion of a robotic work piece handler in the work piece handling vacuum module. The pedestal may be integrated with the work piece handling vacuum module as herein described. The pedestal may further facilitate supporting a work piece handling vacuum module in a position that facilitates transferring a work piece to a transport cart 6140 in a tunnel 6150.

Linking modules 10149 between the vacuum modules 6130 may provide any of the functions or tools described herein with reference to, for example, the configurable vacuum modules 9502 described above. This includes auxiliary equipment 10150 such as a vacuum pump, machine vision inspection tool, heating element, or the like, as well as various machine utilities (gas, electric, water, etc.) which may be removably and replaceably affixed in a vacuum or other functional seal to an opening 10155 in the linking module 10149.

Figure 102:
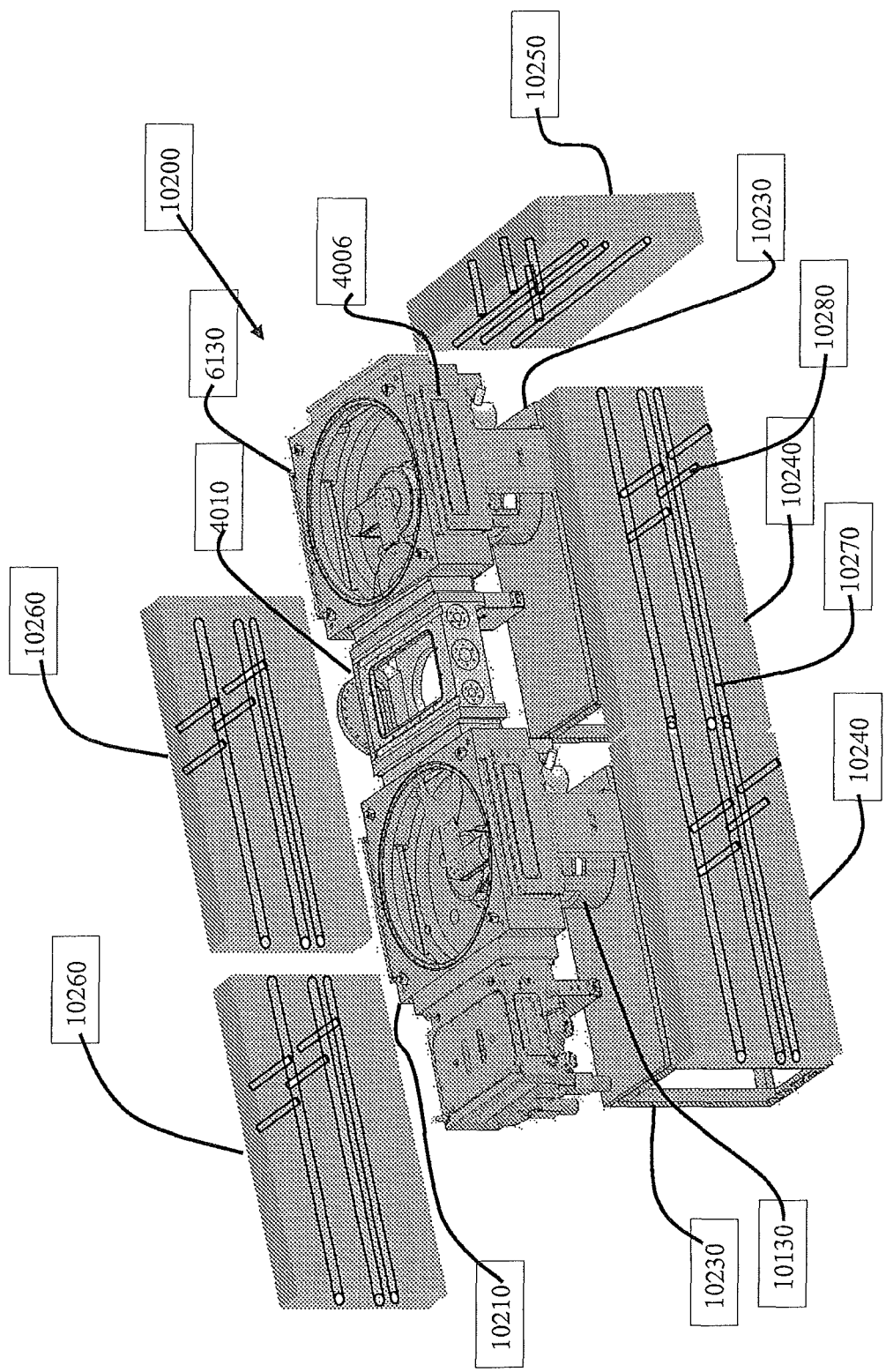
FIG. 102 is an exploded perspective view of a portion of a semiconductor processing system incorporating modular utility delivery modules.

FIG. 102 shows how unused space (created by a pedestal support structure) around a link module may be coherently allocated among various utilities that might be required to support a semiconductor manufacturing process. Referring to FIG. 102, a portion of a modular vacuum processing system is shown in an exploded view. The portion of the system shown in FIG. 102 includes a work piece handling and processing system 10200 which may include one or more linkable vacuum modules 6130. The linkable modules 6130 may be interconnected to each other or to another module such as an inspection module 4010, a vacuum extension, or any other vacuum component. As depicted, each linkable module 6130 is mounted on a pedestal 10130 which is in turn mounted on base 10230.

Processing tools can connect to the work piece handling system 10200 at any one of the ports of one of the linkable modules 6130. By applying industry standards for utility hookup type and position in a process chamber, the position of the utility hookups outside the volume of the linking modules may be substantially predetermined based on the position of the linkable module(s) 6130. Due to the pedestal configuration, however, it is also possible to allocate the void space around each pedestal to ensure a buffer zone 10240, 10250, 10260 around the linking modules that affords substantially arbitrary routing of utilities throughout an installation using the linkable modules. The handling system 10200 enables a user to take advantage of modular utility delivery components 10240, 10250, and 10260 when preparing to install process chambers.

The buffer zones 10240, 10250, and 10260 facilitate delivery of utilities such as gas, water, and electricity to any process chambers connected to the linkable modules 6130. These buffer zones 10240, 10250, and 10260 may specifically accommodate positioning requirements of industry standards, and may also accommodate any industry standard requirements for capacity, interfacing, cleanliness, delivery pressure, and the like (without, of course, requiring conformity to these standards within the buffer zones).

Conceptually, the buffer zones 10240, 10250, and 10260 may have a structural frame which supports a plurality of conduits 10270 adequate for delivery of the corresponding utilities. Each conduit 10270 may be constructed with appropriate materials selected to meet the specific requirements for delivery of a specific utility, and may be arranged within the buffer zones in any preferred pattern. Additionally, each conduit device port hookup 10280, may be arrayed in a predetermined pattern (e.g. meeting industry standards for utility hookup position) to facilitate connections outside the buffer zones while ensuring alignment of utility conduits from module to module within the buffer zones.

Device port hookups 10280 may be selected for each utility type. For example, a hookup for water may provide reliable interconnect that can withstand water pressure, temperature, and flow rate requirements, while a hookup for electricity may provide a reliable interconnect or conduit that meets electrical impedance, safety, and current capacity requirements. In embodiments, the position of the device port hookups 10280 within the buffer zones may be mechanically identified and/or adjustable (e.g. by means of a flexible conduit).

In an embodiments, a physical device such as a foam mold or other structural frame containing hookups 10280 and conduits for various utilities in each buffer zone 10240, 10250, and 10260 may be provided as a kit, which may allow for a variety of configurations to meet installation needs such as height, width, position of conduit, position of device hookups, and frame mounting within the constraints of the corresponding standard(s).

In embodiments, the buffer zones 10240, 10250, 10260 may be fully customized to meet a specific user installation and operational needs. In such an embodiment the user may provide specifications covering aspects of the system such as height, width, position of conduit, position of device hookups, mounting method, and optional aspects such as enclosure, and base to a manufacturer.

In embodiments, the buffer zones 10240, 10250, and 10260 may be arranged with one or more of the conduits 10270 in predetermined patterns forming one or more standard layers for utilities, and one or more customizable layers. The standard layers for example, may be for water and electricity, while the customizable layers may be for gas. The standard layers may additionally incorporate predetermined conduits for water electrical wiring.

Figure 103:
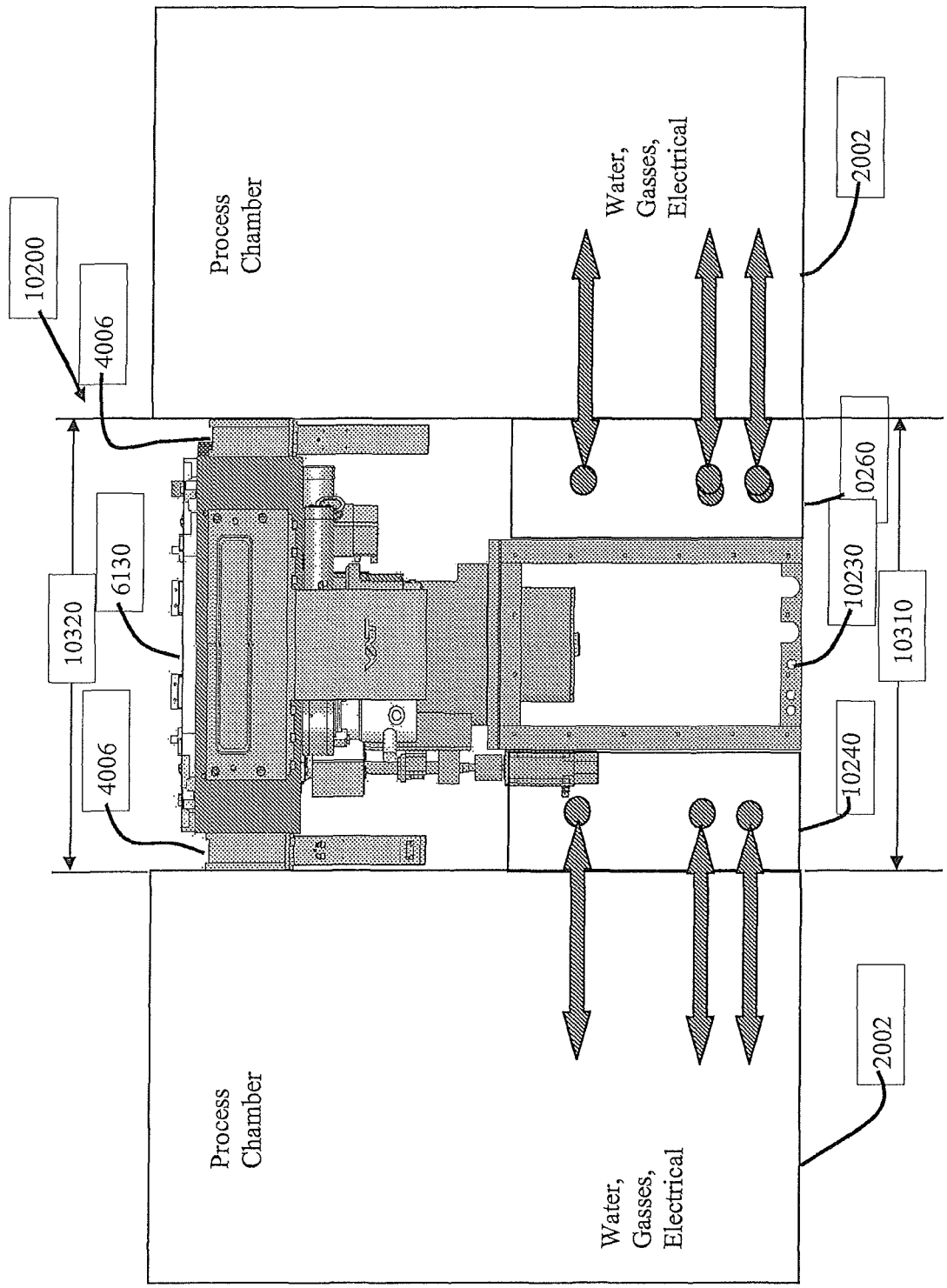
FIG. 103 is a side view of a modular utility delivery system in an application with process chambers and elevated vacuum handing modules.

As shown in FIG. 103, the overall size of the buffer zones 10240, 10250, and 10260 may be predetermined to facilitate integration with process chambers 2002 and the handling system 10200. As described above, and as depicted in FIG. 103, the buffer zones may have a volume defined in at least one dimension by the volume of the associated linkable module 6130.

In embodiments with differently shaped process chambers, such as a chamber that is wider in the isolation valve connection area than in the utility components connection area, the width of the buffer zones 10240 and 10260 may be different than the embodiment shown in FIG. 103. Alternatively, the device port hookups 10280 may be expandable in length to accommodate differently shaped process chambers.

The embodiment shown in FIG. 103 allows buffer zones 10240, 10250, and 10260 to be installed under a linkable module and, for example the inspection module 4010, thereby reducing the foot print of the combined handling system 10200 while ensuring routing capability for utilities.

Figure 104:
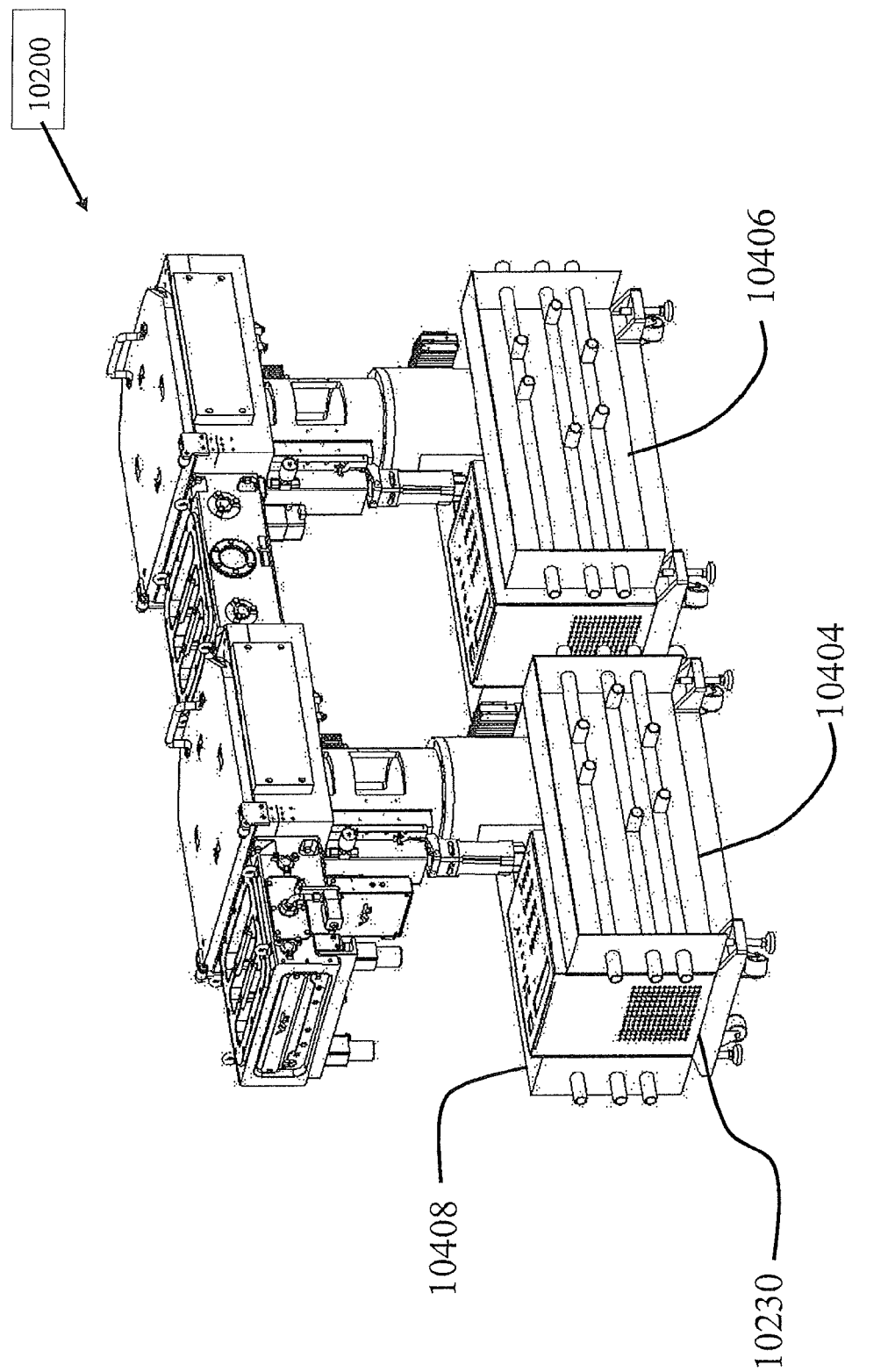
FIG. 104 shows a modular utility delivery modules attached to a modular vacuum processing system.

FIG. 104 shows a number of linkable modules using utility conduits adapted to the buffer zones described above. As depicted, utility delivery components 10404, 10406, 10408 are attached to the base 10230 of each linkable module. Each one of the utility deliver components may include conduits, interconnects, and connection ports conforming to any appropriate standards as generally described above.

In embodiments, the utility delivery components 10404, 10406, 10408 may include sensors for sensing aspects of each utility (e.g., fluid flow, gas flow, temperature, pressure, etc.) and may include a means of displaying the sensed aspects or transmitting sensor data to a controller or other data acquisition system. Sensors and associated displays may be useful for installation, setup, troubleshooting, monitoring, and so forth. For example, a modular utility delivery component 10404 delivering water may include a water pressure sensor, a water flow rate sensor, and/or a water temperature sensor, while a display may display the corresponding physical data. Other sensors for display or monitoring may include gas pressure, type, flow rate, electricity voltage, and current. Additionally, the sensors may transmit an externally detectable signal which may be monitored by a utility control computer system.

A linear processing system including work piece transport, such as that provided by a work piece handling vacuum module combined with a transport cart 6140 may be associated with a modular utility delivery component 10240 that may supply utilities such as air, water, gas, and electricity to a sections of a semiconductor processing system through modular connection. Groups of vacuum modules that are being provided utilities though the modular utility delivery component, such as process chambers 2002, multifunction modules 9702, bypass thermal adjusters 9402, work piece handling vacuum modules, one or more load locks 14010, wafer storage, and the like may be combined with a transport cart 6140 to facilitate transport of one or more work pieces between distal groups. Referring to FIG. 67, linear processing groups 6610 may be locally configured with modular utility delivery components 10240, 10250, 10260, while transport cart 6140 provides work piece transport from one group 6610 to another.

Figure 105:
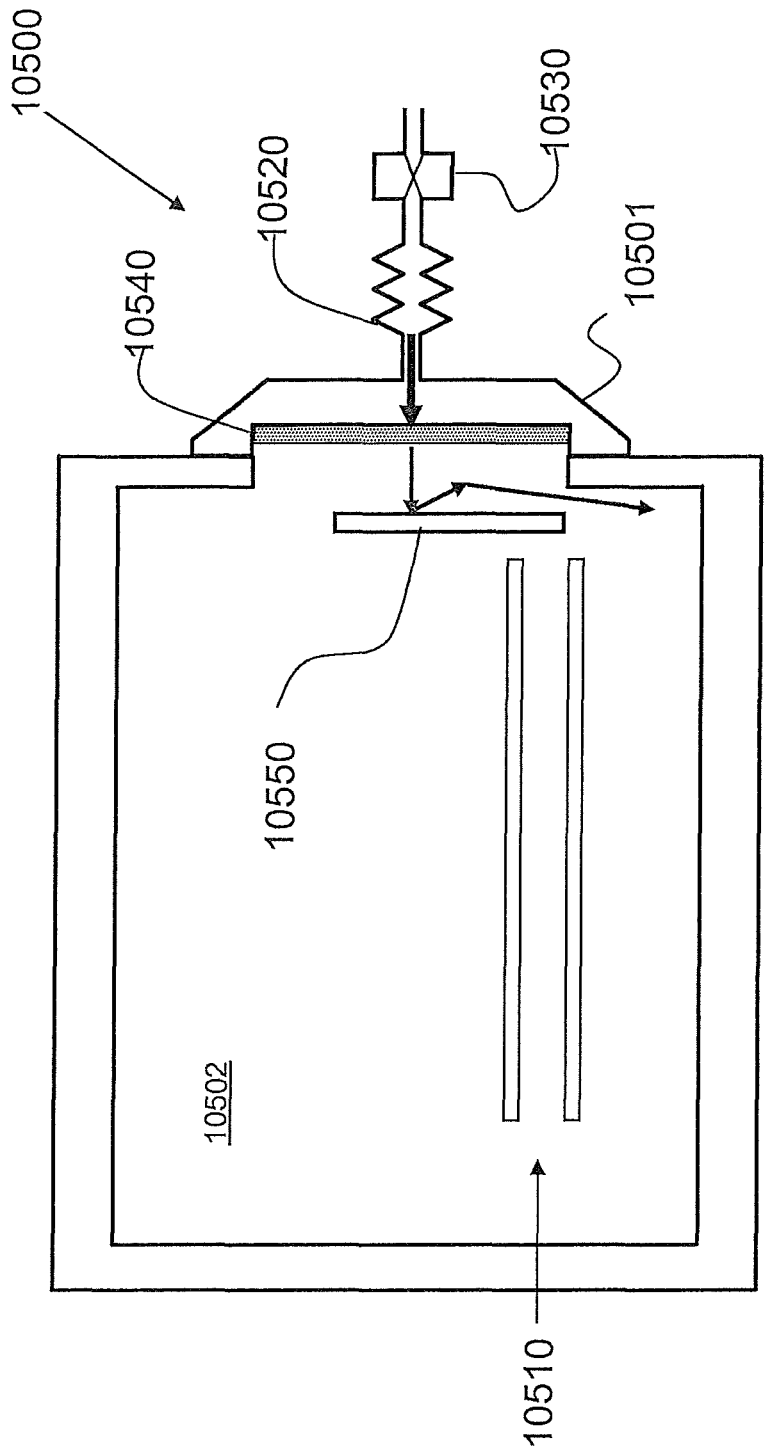
FIG. 105 shows a side view of an embodiment of a low particle vent system used with a semiconductor vacuum module.

FIG. 105 shows a low particle vent system. The system 10500 transfers work pieces to an from a vacuum processing environment, and may include work pieces 10510 loaded and ready to be processed in a semiconductor processing facility once a proper vacuum environment is created within the system 10500. The system 10500 further includes an adapted gas line 10520 connected to a gas line valve 10530, a particle filter 10540, and a shock wave baffle 10550.

In general operation, the system 10500 seals in work pieces with a door 10501 that may be opened and closed using any of a variety of techniques known to one or ordinary skill in the art to isolate the interior 10502 from an exterior environment. In operation, the system opens and closes the door 10501 to the chamber 10502, opens the gas valve 10530 to supply gas to an interior 10502 of the system 10500, closes the gas valve 10530, and then evacuates the interior 10502 to form a vacuum for the work pieces 10510. Unloading the work pieces 10510 may be accomplished in a similar way except that the system 10500 begins with a vacuum environment and is pressurized by the gas flowing through the open gas line valve 10530 and the adapted gas line 10520.

Once the work pieces 10510 are placed in the interior 10502, venting and pumping may be performed. During this process, the particle filter 10540, configured in-line with the adapted gas line 10520 or across the opening of the chamber interior 10502, filters large particles being transported by the gas. In addition, the baffle 10550 and the adapted gas line 10520 combine to absorb the supersonic shock waves that result from releasing a vacuum seal for the interior 10502, thereby preventing or mitigating disruption of particles within the interior 10502.

The gas line, typically a cylindrical shaped tube for passing gas from the valve 10530 to the module, is adapted by modifying its shape to facilitate absorbing the supersonic shock wave. In one embodiment, the adapted gas line 10520 may be shaped similar to a firearm silencer, in that it may have inner wall surfaces that are angled relative to the normal line of travel of the gas. More generally, the gas line may include any irregular interior surfaces, preferably normal to a center axis of the gas line. Such surfaces disperse, cancel, and or absorb the energy of the supersonic shock wave (e.g., from releasing a vacuum seal).

To further reduce the impact of the supersonic shock wave, the baffle 10550 obstructs travel of any remaining shock wave and protects the work pieces 10510 from perturbations that might otherwise carry particle contamination. The baffle 10550 may be positioned to reflect incident portions of the supersonic shock wave, canceling some of its energy, resulting in a substantially reduced shock wave impacting surfaces throughout the interior which may have particles. The baffle 10550 may be larger than the opening, as large as the opening, or smaller than the opening, and may be generally displaced toward the interior of the chamber from the opening. In one embodiment, the baffle 10550 may be moveable, so that it may be selectively positioned to obstruct shockwaves or admit passage of workpieces.

A low particle vent system as described above may be deployed at any location within any of the above systems where a vacuum seal might be released or created.

Many of the above systems such as the multi-function modules, batch storage, and batch end effectors may be employed in combination with the highly modular systems described herein to preserve floor space and decrease processing time, particularly for processes that are complex, or for installations that are intended to accommodate several different processes within a single vacuum environment. A number of batch processing concepts, and in particular uses of a batch aligner, are now described in greater detail.

Figure 106:
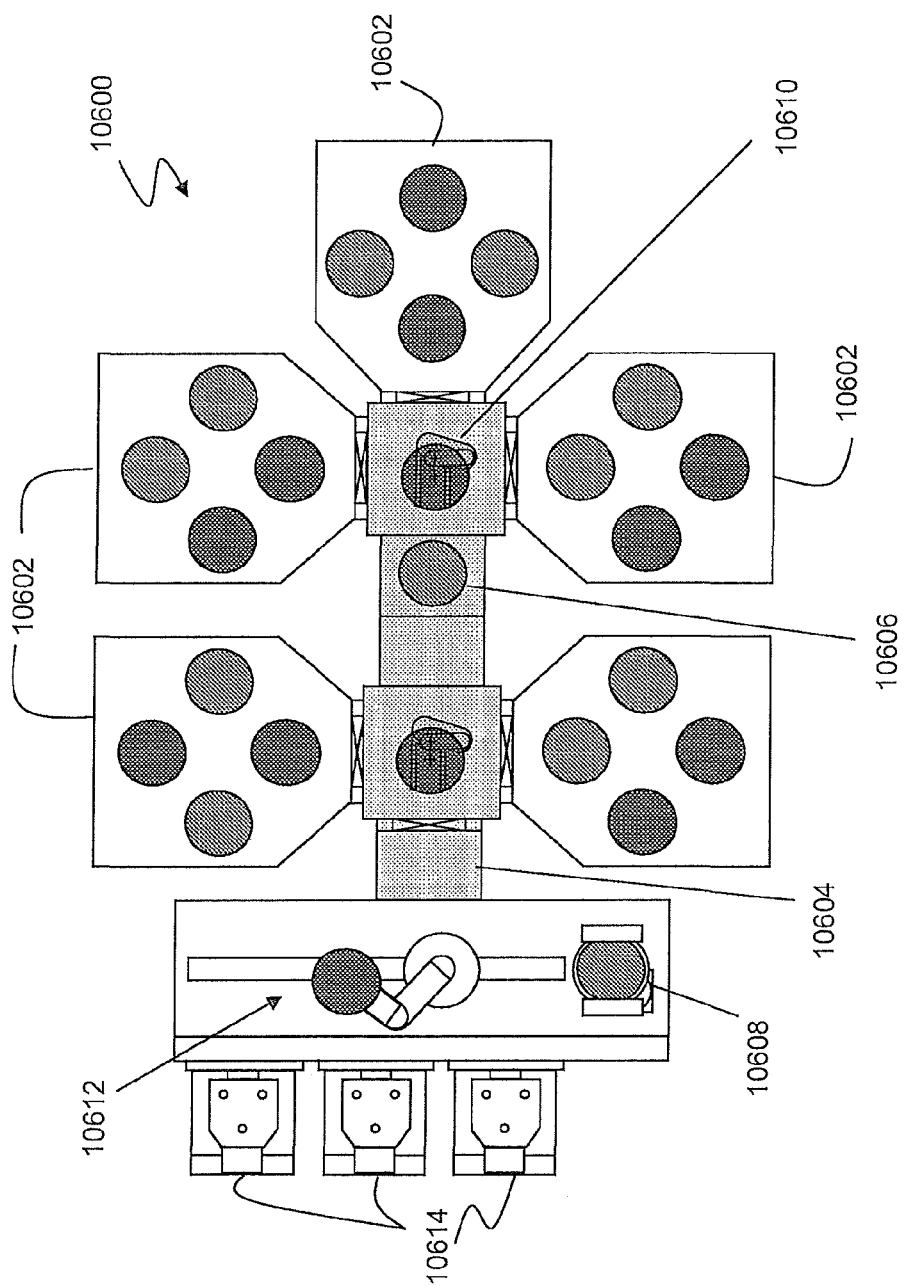
FIG. 106 shows a batch processing system.

FIG. 106 shows a system 10600 including a number of batch processing modules 10602 that can process a number of wafers at one time. Each module 10602 may, for example, process 2, 3, 4, or more wafers simultaneously. The system 10600 may also include a batch load lock 10604, an in vacuum batch buffer 10606, a buffering aligner 10608, one or more vacuum robot arms 10610, an atmospheric robot arm 10612 and one or more front opening unified pods 10614. Each of the foregoing components may be adapted for batch processing of wafers.

The front opening unified pods 10614 may store wafers in groups, such as four. While a four wafer system is provided for purposes of illustration, it will be understood that the system 10600 may also, or instead, be configured to accommodate groups of 2, 3, 4, 5, 6, or more wafers, or combinations of these, and all such groupings may be considered batches as that term is used herein.

An in-atmosphere robot 10612 may operate to retrieve groups of wafers from the FOUPs 10614 which generally manage atmospheric handling of wafers for processing in the system 10600. The robot 10612 may travel on a track, cart or other mechanism to access the FOUP's 10614, the load lock 10604, and the buffering aligner 10608. The robot may include a batch end effector for simultaneously handling a batch of wafers (or other workpieces. The robot 10612 may also, or instead, include dual arms or the like so that a first arm can pick and place between the FOUPs 10614 and the batch aligner 10608 while the other arm provides a batch end effector for batch transfers of the aligned wafers in the buffer 10608 to the batch load lock 10604 and from the load lock 10604 back to the FOUPs 10614.

The buffering aligner 10608 may accommodate a corresponding number of wafers (e.g., four) that are physically aligned during the buffering process. It will be understood that while a single buffering aligner is shown, a number of buffering aligners may be arranged around the in-atmosphere robot, or may be vertically stacked, in order to accommodate groups of batches for processing. It will also be understood that the buffering aligner 10608 may employ any active or passive techniques, or combinations of these, known to one of skill in the art to concurrently align two or more wafers for subsequent batch handling.

As a significant advantage, an aligned batch of wafers can be processed more quickly in batch form downstream. Thus, for example, an aligned batch of wafers can be transferred to the batch load lock 10604 by the robot 10612 in a manner that preserves alignment for transfer to the in vacuum robot 10610, which may include a dual arm and/or dual end effectors for batch handling of wafers within the vacuum. Further, the in-vacuum batch buffer 10606 may accommodate batches of wafers using, e.g., shelves or the like to preserve alignment during in vacuum buffering and/or hand off between robots. The batch buffer 10606 may, of course, provide cooling, temperature control storage, or any of the other functions described above that might be useful between processing modules in a semiconductor manufacturing process.

FIG. 107 shows a robotic arm useful with the batch processing system of FIG. 106. FIG. 107A shows a cross sectional view of the robot 10700 while FIG. 107B shows a perspective drawing. In general, a robot 10700 may include a first robotic arm 10702 having a single end effector 10704 and a second robotic arm 10706 having a dual or other batch end effector 10708.

Using this robotic arm configuration, the single end effector 10704 may be employed for individual picks and placements of wafers within modules while the dual end effector 10708 may be employed for batch transfers between processing modules via, e.g., batch buffers 10606, robot-to-robot hand offs, or any other suitable batch processing technique.

It will be appreciated that numerous variations to this batch technique are possible. For example, the batch end effector may include two blades, three blades, or any other number of blades (or other suitable wafer supports) suitable for use in a batch process. At the same time, each robotic arm 10702, 10706 may be a multi-link SCARA arm, frog leg arm, or any other type of robot described herein. In addition, depending on particular deployments of manufacturing processes, the two arms may be fully independent, or partially or selectively dependent. All such variations are intended to fall within the scope of this disclosure. In addition to variations in batch size and robotic arm configurations, it will be understood that any number of batch processing modules may be employed. In addition, it may be efficient or useful under certain circumstances to have one or more non-batch or single wafer process modules incorporated into a system where process times are suitably proportional to provide acceptable utilization of the single and batch process modules in cooperation.

FIG. 108 illustrates how multiple transfer planes may be usefully employed to conserve floor space in a batch processing system. FIG. 108A shows a linking module including multiple transfer planes to accommodate single or multiple access to wafers within the linking module. Slot valves or the like are provided to isolate the linking module. FIG. 108B shows an alternative configuration in which multiple shelves are positioned between robots without isolation. In this configuration, the shelves may, for example, be positioned above the robots to permit a full range of robotic motion that might otherwise cause a collision between a robotic arm and wafers on the shelves. This configuration nonetheless provides batch processing and or multiple wafer buffering between robots. FIG. 108C shows a top view of the embodiment of FIG. 108B. As visible in FIG. 108C, the small adapter with shelves between robots in FIG. 108B permits relatively close positioning of two robots without requiring direct robot-to-robot handoffs. Instead each wafer or group of wafers can be transferred to the elevated shelves for subsequent retrieval by an adjacent robot. As a significant advantage, this layout reduces the footprint of two adjacent robots while reducing or eliminating the extra complexity of coordinating direct robot-to-robot handoffs.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present invention to accomplish the same or different objectives. In particular, acts, elements, and features discussed in connection with one embodiment are not intended to be excluded from similar or other roles in other embodiments. Accordingly, the foregoing description and attached drawings are by way of example only, and are not intended to be limiting.

The elements depicted in flow charts and block diagrams throughout the figures imply logical boundaries between the elements. However, according to software or hardware engineering practices, the depicted elements and the functions thereof may be implemented as parts of a monolithic software structure, as standalone software modules, or as modules that employ external routines, code, services, and so forth, or any combination of these, and all such implementations are within the scope of the present disclosure. Thus, while the foregoing drawings and description set forth functional aspects of the disclosed systems, no particular arrangement of software for implementing these functional aspects should be inferred from these descriptions unless explicitly stated or otherwise clear from the context.

Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods or processes described above, and steps thereof, may be realized in hardware, software, or any combination of these suitable for a particular application. The hardware may include a general-purpose computer and/or dedicated computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as computer executable code created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, means for performing the steps associated with the processes described above may include any of the hardware and/or software described above. All such permutations and combinations are intended to fall within the scope of the present disclosure.

While the invention has been disclosed in connection with the preferred embodiments shown and described in detail, various modifications and improvements thereon will become readily apparent to those skilled in the art. Accordingly, the spirit and scope of the present invention is not to be limited by the foregoing examples, but is to be understood in the broadest sense allowable by law.

All documents referenced herein are hereby incorporated by reference.

What is claimed is:

1. A method for moving a wafer in a semiconductor manufacturing process, the method comprising:

providing a tunnel capable of being sealed for holding a sealed environment, a plurality of process ports disposed in a wall of the tunnel, an exchange zone having at least one exchange zone port, an exchange port disposed in the wall of the tunnel and being distinct from the plurality of process ports and at least one exchange zone port, and a track for guiding cart motion within the tunnel, where the exchange zone is communicably coupled to a sealable wafer handling interface, the sealable wafer handling interface having an external atmosphere and including a wafer handling interface robotic arm, each one of the at least one exchange zone port and the plurality of process ports having an isolation valve that opens and closes a respective one of the ports, and a sealable workpiece handling module is communicably coupled to the tunnel through a respective one of the process ports or exchange port of the tunnel and including a robotic arm operable to reach through the respective one of the process ports or the exchange port from outside the tunnel;

retrieving a wafer with a respective one of the robotic arms;

positioning the wafer outside at least one of the plurality of process ports or the exchange port of the tunnel;

positioning a cart inside the tunnel adjacent the at least one of the plurality of process ports or the exchange port of the tunnel;

opening the at least one of the plurality of process ports or the exchange port of the tunnel;

inserting a respective one of the robotic arms into the tunnel through the at least one of the plurality of process ports or the exchange port of the tunnel and transferring the wafer to the cart;

withdrawing the robotic arm from the tunnel;

closing the at least one of the plurality of process ports or the exchange port of the tunnel; and transferring the wafer between the tunnel and the external atmosphere wherein the tunnel includes a first end and a second end, at least one of the first end and second end being communicably coupled to the sealable workpiece handling module including the robotic arm at the at least one exchange zone port for reaching into the exchange zone through the at least one exchange zone port and indirectly transferring the wafer between the tunnel and the external atmosphere of the sealable wafer handling interface through the sealable workpiece handling module and the at least one exchange zone port.

2. The method of claim 1, wherein indirectly transferring the wafer between the tunnel and the external atmosphere includes transferring, within the exchange zone, the wafer from the wafer handling interface robotic arm to the robotic arm at the at least one exchange zone port and transferring the wafer to the cart with the robotic arm at the at least one exchange zone port.

* * * * *